(12) United States Patent
Masuda et al.

(10) Patent No.: US 9,263,374 B2
(45) Date of Patent: Feb. 16, 2016

(54) SEMICONDUCTOR DEVICE AND MANUFACTURING METHOD THEREFOR

(75) Inventors: Masachika Masuda, Tokorozawa (JP); Koji Tomita, Kawagoe (JP); Tadashi Okamoto, Tokyo-to (JP); Yasunori Tanaka, Asaka (JP); Hiroshi Ohsawa, Saitama (JP); Kazuyuki Miyano, Sayama (JP); Atsushi Kurahashi, Tsurugashima (JP); Hiromichi Suzuki, Machida (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 45 days.

(21) Appl. No.: 13/230,128

(22) Filed: Sep. 12, 2011

(65) Prior Publication Data

US 2012/0074544 A1 Mar. 29, 2012

(30) Foreign Application Priority Data

| Sep. 28, 2010 | (JP) | 2010-217494 |
| Mar. 29, 2011 | (JP) | 2011-071928 |
| Mar. 29, 2011 | (JP) | 2011-071961 |
| Mar. 29, 2011 | (JP) | 2011-072003 |
| Mar. 29, 2011 | (JP) | 2011-072410 |

(51) Int. Cl.
*H01L 29/72* (2006.01)
*H01L 23/495* (2006.01)
(Continued)

(52) U.S. Cl.
CPC ...... *H01L 23/49548* (2013.01); *H01L 21/4832* (2013.01); *H01L 21/568* (2013.01); *H01L 21/6836* (2013.01); *H01L 23/3107* (2013.01); *H01L 23/3121* (2013.01); *H01L 23/3128* (2013.01); *H01L 23/36* (2013.01); *H01L 23/49503* (2013.01); *H01L 23/49517* (2013.01);
(Continued)

(58) Field of Classification Search
CPC ............................................. H01L 2924/01079
USPC .................................................. 257/673, 676
See application file for complete search history.

(56) References Cited

U.S. PATENT DOCUMENTS

| 4,549,036 | A | 10/1985 | Reichbach | |
| 6,071,755 | A * | 6/2000 | Baba et al. | 438/106 |
| 6,379,997 | B1 * | 4/2002 | Kawahara et al. | 438/106 |

FOREIGN PATENT DOCUMENTS

| JP | 02-067649 U | 5/1990 |
| JP | A-07-211852 | 8/1995 |

(Continued)

OTHER PUBLICATIONS

Oct. 25, 2013 Office Action issued in Chinese Patent Application No. 201110299569.9 (with English Translation).

(Continued)

*Primary Examiner* — Edward Wojciechowicz
(74) *Attorney, Agent, or Firm* — Oliff PLC

(57) ABSTRACT

A semiconductor device includes, a lead frame having a die pad and a plurality of leads each disposed around the die pad, a semiconductor element rested on the die pad of the lead frame, and bonding wires for electrically interconnecting the lead of the lead frame and the semiconductor element. The lead frame, the semiconductor element, and the bonding wires are sealed with a sealing resin section. The sealing resin section includes a central region provided over and around the semiconductor device, and a marginal region provided in the periphery of the central region. Thickness of the central region is greater than that of the marginal region.

38 Claims, 103 Drawing Sheets

(51) Int. Cl.
  *H01L 21/48* (2006.01)
  *H01L 21/56* (2006.01)
  *H01L 21/683* (2006.01)
  *H01L 23/31* (2006.01)
  *H01L 23/36* (2006.01)
  *H01L 25/10* (2006.01)
  *H01L 23/00* (2006.01)

(52) U.S. Cl.
  CPC .... *H01L 23/49541* (2013.01); *H01L 23/49582* (2013.01); *H01L 24/49* (2013.01); *H01L 24/83* (2013.01); *H01L 24/85* (2013.01); *H01L 25/105* (2013.01); *H01L 24/45* (2013.01); *H01L 24/48* (2013.01); *H01L 2221/68327* (2013.01); *H01L 2221/68331* (2013.01); *H01L 2224/2919* (2013.01); *H01L 2224/32225* (2013.01); *H01L 2224/32245* (2013.01); *H01L 2224/45144* (2013.01); *H01L 2224/48091* (2013.01); *H01L 2224/48227* (2013.01); *H01L 2224/48235* (2013.01); *H01L 2224/48247* (2013.01); *H01L 2224/48257* (2013.01); *H01L 2224/48639* (2013.01); *H01L 2224/48664* (2013.01); *H01L 2224/4912* (2013.01); *H01L 2224/49171* (2013.01); *H01L 2224/49173* (2013.01); *H01L 2224/49433* (2013.01); *H01L 2224/73265* (2013.01); *H01L 2224/834* (2013.01); *H01L 2224/83005* (2013.01); *H01L 2224/85005* (2013.01); *H01L 2224/85439* (2013.01); *H01L 2224/85464* (2013.01); *H01L 2224/92247* (2013.01); *H01L 2225/1023* (2013.01); *H01L 2225/1029* (2013.01); *H01L 2225/1058* (2013.01); *H01L 2924/014* (2013.01); *H01L 2924/01005* (2013.01); *H01L 2924/0105* (2013.01); *H01L 2924/01006* (2013.01); *H01L 2924/01013* (2013.01); *H01L 2924/01014* (2013.01); *H01L 2924/01019* (2013.01); *H01L 2924/01028* (2013.01); *H01L 2924/01029* (2013.01); *H01L 2924/0132* (2013.01); *H01L 2924/01033* (2013.01); *H01L 2924/01047* (2013.01); *H01L 2924/01079* (2013.01); *H01L 2924/01082* (2013.01); *H01L 2924/0665* (2013.01); *H01L 2924/1301* (2013.01); *H01L 2924/15311* (2013.01); *H01L 2924/15313* (2013.01); *H01L 2924/15331* (2013.01); *H01L 2924/15787* (2013.01); *H01L 2924/15788* (2013.01); *H01L 2924/181* (2013.01); *H01L 2924/1815* (2013.01); *H01L 2924/3511* (2013.01)

(56) References Cited

FOREIGN PATENT DOCUMENTS

| JP | 08-227964 | * | 3/1996 |
|----|-----------|---|--------|
| JP | A-8-138988 |   | 5/1996 |
| JP | A-8-227964 |   | 9/1996 |
| JP | A-10-154768 |   | 6/1998 |
| JP | 11-354675 A |   | 12/1999 |
| JP | 2000-124259 A |   | 4/2000 |
| JP | 2000-208665 A |   | 7/2000 |
| JP | 2000-228453 A |   | 8/2000 |
| JP | 2000-311841 A |   | 11/2000 |
| JP | A-2001-230338 |   | 8/2001 |
| JP | 2003-078076 A |   | 3/2003 |
| JP | 2003-258009 A |   | 9/2003 |
| JP | A-2004-165525 |   | 6/2004 |
| JP | 2006-294656 A |   | 10/2006 |
| JP | 2006-344898 A |   | 12/2006 |
| JP | 2008-113021 A |   | 5/2008 |
| JP | A-2008-227531 |   | 9/2008 |
| JP | 2009-049173 A |   | 3/2009 |
| JP | 2009-141274 A |   | 6/2009 |
| JP | 2009-152253 A |   | 7/2009 |
| JP | A-2009-231322 |   | 10/2009 |
| JP | 2010-129728 A |   | 6/2010 |
| JP | A-2010-199412 |   | 9/2010 |
| WO | 2006/132151 A1 |   | 12/2006 |

OTHER PUBLICATIONS

Feb. 4, 2014 Office Action issued in Japanese Patent Application No. 2010-217494 w/translation.

May 30, 2014 Office Action issued in Chinese Patent Application No. 201110299569.9 (with English Translation).

Dec. 4, 2014 Office Action issued in Chinese Application 201110299569.9.

Jan. 30, 2015 Office Action issued in Japanese Patent Application No. 2011-072410.

Jan. 30, 2015 Office Action issued in Japanese Patent Application No. 2011-071928.

Feb. 13, 2015 Office Action issued in Japan Patent Application No. 2011-072003.

Oct. 7, 2014 Office Action issued in Japanese Patent Application No. 2011-071961.

Oct. 21, 2014 Office Action issued in Japanese Patent Application No. 2011-072003.

Dec. 18, 2015 Office Action issued in Japanese Patent Application 2015-021512.

Dec. 4, 2015 Office Action issued in Chinese Patent Application No. 2011-10299569.9.

* cited by examiner

SEMICONDUCTOR DEVICE AND MANUFACTURING METHOD THEREFOR

CROSS-REFERENCE TO RELATED APPLICATIONS

The present patent application benefits from Japanese patent application number 2010-217494, filed on Sep. 28, 2010, Japanese patent application number 2011-072410, filed on Mar. 29, 2011, Japanese patent application number 2011-071928, filed on Mar. 29, 2011, Japanese patent application number 2011-071961, filed on Mar. 29, 2011, and Japanese patent application number 2011-072003, filed on Mar. 29, 2011. The entire disclosure in these prior applications is hereby incorporated herein by reference.

BACKGROUND OF THE INVENTION

1. Field of the Invention

The present invention generally relates to semiconductor devices and methods for manufacturing the same. More particularly, the present invention is directed to a semiconductor device capable of improving mounting reliability and to a method for manufacturing the same.

2. Description of the Related Art

In recent years, high-density integration and miniaturization technology of semiconductor devices has been progressed, and electronic appliances tend to be more miniaturized, light-weighted, and have higher performance. Due to these facts, semiconductor devices are increasingly accelerated to have higher-density integration and higher functionality, such as the ASICs (Application-Specific Integrated Circuits) in LSI (Large Scale Integration). In such semiconductor devices with high-density integration and high functionality, the total number of external terminals (pins) and the layout of more terminals (pins) are being required to be increased.

Examples of such semiconductor devices are semiconductor packages that include IC chips, LSI chips, or other semiconductor chips mounted on a lead frame and sealed with dielectric-resin. As these semiconductor packages, types that are thin and have small mounting area such as QFN (Quad-Flat No-lead) packages and SON (Small Outline No-lead) packages are known. The resin-sealed types of semiconductor devices, called BGAs (Ball Grid Arrays), that are surface-mounted types of packages with solder balls serving as external terminals of the package, are also mass-produced. In addition, semiconductor devices called LGAs (Land Grid Arrays) are present as another surface-mounted type of packages. In LGAs, matrix-formed planar electrodes are provided as external terminals thereof instead of the solder balls provided in a BGA.

Examples of these conventional semiconductor devices are described in, for example, JP-A-8-227964 (1996) and JP-A-8-138988 (1996).

The semiconductor integrated circuit device disclosed in JP-A-8-227964 includes a lead frame with a circular outline and leads extending radially from a die pad disposed centrally. According to JP-A-8-227964, this conventional semiconductor-integrated circuit device has high mounting reliability for a gull-wing lead package. However, this conventional circuit device does not meet the needs of recent years for the thinning-down and downsizing of packages.

In addition, although JP-A-8-138988 describes a package including a chip of a polygonal shape with at least six sides (or of a circular shape), it is considered to be difficult to fabricate such a polygonal or circular chip.

Recently, compact semiconductor devices of lead frame types (QFN, SON, LGA, etc.), for example, are being required to have further improved mounting reliability. When a semiconductor is used in a high-temperature environment, for example in an automobile, thermal stresses are applied to the semiconductor device. Mounting reliability against such thermal stresses is particularly expected to be further improved by bringing a thermal expansion coefficient of the semiconductor device close to that of its mounting substrate.

Meanwhile, the semiconductor package of a BGA type semiconductor device disclosed in JP-A-2001-230338 has an insulating substrate formed in a circular shape so that the stresses do not concentrate at corners, and instead be applied equally according to the distance from the center. This BGA type of semiconductor device is enhanced in reliability against thermal shocks and other environmental changes. However, when mounting reliability against thermal stresses is to be further improved, such construction may be insufficient.

SUMMARY OF THE INVENTION

The present invention has been made with consideration of above mentioned points. An object of the present invention is to provide a semiconductor device capable of improving reliability against thermal stresses and a manufacturing method for the same.

A semiconductor device according to a first aspect of the present invention comprises: a lead frame including a die pad and a plurality of leads each disposed around the die pad; a semiconductor element rested on the die pad of the lead frame; a plurality of electroconductive portions that each electrically interconnects one of the leads in the lead frame and the semiconductor element; and a sealing resin section that seals the lead frame, the semiconductor element, and electroconductive portions; wherein the sealing resin section includes a central region provided over and around the semiconductor device, and a marginal region provided in the periphery of the central region, and wherein the thickness of the central region is greater than that of the marginal region.

Preferably, each lead has a band-like shape radially extending outward from the die pad side and includes external terminal exposed to the exterior. The external terminals of the leads are arranged on at least one circumference in a plane view.

Preferably, each lead has two external terminals, one external terminal as an upper terminal provided at an upper surface of the lead, and the other external terminal as a lower terminal provided at a lower surface of the lead.

Preferably, each lead has a stepped portion between an internal terminal of the lead and the lower terminal thereof.

Preferably, solder balls are mounted on at least one upper terminal of the leads.

Preferably, a heatsink fin is mounted on at least one upper terminal of the leads.

Preferably, an electronic component is mounted on at least one upper terminal of the leads.

Preferably, each lead is exposed at an upper surface of the marginal region of the sealing resin section.

Preferably, the central region of the sealing resin section has a truncated conical shape, a columnar shape, a polygonal columnar shape, a truncated polygonal pyramidal shape, or a dome-like shape.

Preferably, the die pad is circular in a top view.

Preferably, the die pad is circular in a bottom view.

Upper and lower surfaces of the die pad may have different shapes.

Preferably, hanging leads each including an external terminal are connected to the die pad.

Preferably, upper and lower surfaces of each hanging lead have recessed portions that sealing resin portion flows into. Layout of the recessed portions of the upper surface and the lower surface of the hanging lead differ from each other in a plane view.

A lower surface of the die pad may be exposed to the exterior of the sealing resin section.

A lower surface of the die pad may be not exposed to the exterior of the sealing resin section.

Preferably, the level of an upper surface of the die pad is lower than that of an upper surface of each lead.

Preferably, a flange is provided along a rim of an upper surface of the die pad.

In the first aspect of the present invention, the thickness of the marginal region of the sealing resin section is smaller than that of the central region. Thus, the thickness of the marginal region is suppressed and the volume of the sealing resin section having a relatively low thermal expansion coefficient is reduced. This allows a thermal expansion coefficient of the entire semiconductor device to be brought close to that of a substrate on which the device is mounted. Hence, reliability of the semiconductor device against heat applied thereto during or after mounting can be improved.

A semiconductor device according to a second aspect of the present invention comprises: a lead frame including a die pad and a plurality of leads each disposed around the die pad; a semiconductor element rested on the die pad of the lead frame; electroconductive portions for electrically interconnecting one of the leads in the lead frame and the semiconductor element; and a sealing resin section for sealing the lead frame, the semiconductor element, and electroconductive portions; wherein the leads each include external terminals each exposed at a lower surface of the sealing resin section, each lead is disposed on at least one circumference in a plane view around the die pad, and the die pad and the lead protrude downward from the sealing resin section.

Preferably, each lead is disposed on any of a plurality of circumferences in a plane view.

Preferably, the sealing resin section has a rectangular parallelepipedic shape.

Preferably, a sealing resin section has a columnar shape.

Preferably, a portion of the sealing resin section positioning above an upper surface of the lead frame has a trapezoidal shape in cross section.

Preferably, an additional external terminal that has an area larger than that of the external terminal of the lead and has a shape progressively tapered towards the die pad is disposed at a corner of the sealing resin section.

Preferably, the additional external terminal extends from a side of the corner of the sealing resin section to the circumference on which each lead is disposed.

Preferably, the sealing resin section includes a central region provided over and around the semiconductor device, and a marginal region provided in the periphery of the central region; wherein thickness of the central region is greater than that of the marginal region.

Preferably, the sealing resin section includes a central region of a truncated conical shape.

Preferably, a die pad and leads in a semiconductor device are fabricated from a metallic substrate; the metallic substrate including a section corresponding to the die pad, sections corresponding to the leads arranged around the section corresponding to the die pad, and a half-etch section formed between the section corresponding to the die pad and the sections corresponding to the leads. The metallic substrate is sealed with a sealing resin section, and the half-etch section is removed by etching to form the die pad and the leads.

Preferably, an externally protruding terminal is formed on at least one upper surface of the leads. The externally protruding terminal is connectable to a lower surface of another semiconductor device.

A method for manufacturing a semiconductor device according to a second aspect of the present invention comprises the steps of: providing a metallic substrate; half-etching the metallic substrate from an upper surface thereof to form a section corresponding to a die pad of a lead frame and sections corresponding to leads, sections corresponding to leads are arranged around the section corresponding to the die pad and the leads are to be arranged on at least one circumference in a plane view; resting a semiconductor element including a plurality of terminals on the section of the metallic substrate that corresponds to the die pad; interconnecting the terminals of the semiconductor element and the section of the metallic substrate that corresponds to the leads with electroconductive portions; sealing the upper surface of the metallic substrate, the semiconductor element, and the electroconductive portions, with a sealing resin section; and etching the metallic substrate from the lower surface thereof so as to form the die pad and the leads from the respective corresponding sections on the metallic substrate and make the die pad and the leads protruded downward from the sealing resin section.

In the second aspect of the present invention, the external terminals of each lead are disposed on at least one circumference in a plane view around the die pad. Thus, thermal stresses due to a difference in thermal expansion ratio between the semiconductor device and the substrate for mounting the device are equally applied to the solder portions on each external terminal, so that a specific solder portion would not be damaged. Hence, reliability of the semiconductor device against heat applied thereto during or after mounting can be improved.

A semiconductor device according to a third aspect of the present invention comprises: a lead frame including a die pad and a plurality of leads arranged around the die pad; a semiconductor element rested on the die pad of the lead frame; electroconductive portions that each electrically interconnect one of the leads in the lead frame and the semiconductor element; and a sealing resin section that seals the lead frame, the semiconductor element, and each electroconductive portion; wherein the leads each include external terminal exposed to the exterior of the sealing resin section, and each external terminal is disposed on at least one circumference in a plane view around the die pad.

Preferably, the external terminals of each lead are disposed on any of a plurality of circumferences in a plane view.

Preferably, an entire lower surface of the die pad is exposed to the exterior of the sealing resin section.

Preferably, hanging leads each including an additional external terminal are connected to the die pad.

Preferably, the additional external terminal extends from a side of a corner of the sealing resin section to the circumference on which the external terminals of each lead are disposed.

Preferably, the sealing resin section has a rectangular parallelepipedic shape.

Preferably, the sealing resin section has a columnar shape.

Preferably, a portion of the sealing resin section positioning above an upper surface of the lead frame has a trapezoidal shape in cross section.

Preferably, an exposed face that is exposed to the exterior of the sealing resin section is provided at a lower surface of each lead at edges of the sealing resin section.

Preferably, the die pad is thinned down from an upper surface of the pad.

Preferably, an externally protruding terminal is formed on at least one upper surface of the leads. The externally protruding terminal is connectable to a lower surface of another semiconductor device.

A method for manufacturing a semiconductor device according to a third aspect of the present invention comprises the steps of: providing a metallic substrate; half-etching the metallic substrate from upper and lower surfaces thereof to fabricate thereupon a lead frame including a die pad and a plurality of leads disposed around the die pad; resting a semiconductor element on the die pad of the lead frame; electrically interconnecting the leads of the lead frame and the semiconductor element via electroconductive portions; and sealing the lead frame, the semiconductor element, and the electroconductive portions, with a sealing resin section; wherein the leads each includes an external terminal exposed to the exterior of the sealing resin section, and the external terminals of the leads are disposed on at least one circumference in a plane view around the die pad.

In the third aspect of the present invention, the external terminals of each lead are disposed on at least one circumference in a plane view around the die pad. Thus, thermal stresses due to a difference in thermal expansion ratio between the semiconductor device and the substrate for mounting the device are equally applied to solder portions present on each external terminal, so that a specific solder portion would not be particularly damaged. Hence, reliability of the semiconductor device against heat applied thereto during or after mounting can be improved.

A semiconductor device according to a fourth aspect of the present invention comprises: a semiconductor element; a plated portion for semiconductor element placement on which the semiconductor element is rested; a plurality of plated portions for leads disposed around and on the same plane as the plated portions for semiconductor element placement; electroconductive portions that each electrically interconnect one of the plated portions for leads and the semiconductor element; and a sealing resin section for sealing the plated portion for semiconductor element placement, the plated portions for leads, the semiconductor element, and the electroconductive portions; wherein the plated portions for leads are each disposed on at least one circumference in a plane view, around the plated portion for semiconductor element placement.

Preferably, the plated portions for leads are each disposed on any one of a plurality of circumferences in a plane view.

Preferably, the sealing resin section has a rectangular parallelepipedic shape.

Preferably, the sealing resin section has a columnar shape.

Preferably, the sealing resin section has a trapezoidal shape in cross section.

Preferably, an additional external terminal that has an area larger than that of the plated portion for lead and has a shape tapered towards the plated portion for semiconductor element is disposed at a corner of the sealing resin section.

Preferably, the additional external terminals extend from a side of the corner of the sealing resin section to the circumference on which each plated portion for lead is disposed.

Preferably, the sealing resin section includes a central region provided over and around the semiconductor device, and a marginal region positioned in the periphery of the central region; wherein thickness of the central region is greater than that of the marginal region.

Preferably, the sealing resin section includes a central region of a truncated conical shape.

Preferably, an externally protruding terminal is each formed on an upper surface of at least one plated portion for leads. The externally protruding terminal is connectable to a lower surface of another semiconductor device.

A method for manufacturing a semiconductor device according to a fourth aspect of the present invention comprises the steps of: providing a substrate; plating the substrate to form thereon a plated portion for a semiconductor element and plated portions for leads, the plated portions for leads being disposed around the plated portion for the semiconductor element on at least one circumference in a plane view; resting the semiconductor element on the plated portion for the semiconductor element of the substrate; electrically interconnecting the semiconductor element and the plated portions for leads that are formed on the substrate with electroconductive portions: sealing the plated portion for the semiconductor element, the plated portions for leads, the semiconductor element, and the electroconductive portions, with a sealing resin section; and removing the substrate from the sealing resin section.

In the fourth aspect of the present invention, the plated portions for leads are disposed on at least one circumference in a plane view around the plated portions for the semiconductor element. Thus, thermal stresses due to a difference in thermal expansion ratio between the semiconductor device and the substrate for mounting the device are equally applied to solder portions provided at external terminals, so that a specific solder portion would not be particularly damaged. Hence, reliability of the semiconductor device against heat applied thereto during or after mounting can be improved.

A semiconductor device according to a fifth aspect of the present invention comprises: a non-electroconductive substrate; a semiconductor element-mounting section provided at an upper-surface of the non-electroconductive substrate; internal terminals each disposed around the semiconductor element-mounting section; external terminals each provided at a lower-surface of the non-electroconductive substrate; a semiconductor element rested on the semiconductor element-mounting section; electroconductive portions for each electrically interconnecting one of the internal terminals and the semiconductor element; and a sealing resin section for sealing the semiconductor element-mounting section, the internal terminals, the semiconductor element, and the electroconductive portions; wherein the non-electroconductive substrate includes vias each extending through the non-electroconductive substrate, a conductor is provided within or on a side face of each via in the non-electroconductive substrate for electrically interconnecting the internal terminal and the external terminal, a strengthening layer is provided on a lower surface of the semiconductor element-mounting section, and the external terminals are each disposed on at least one circumference in a plane view around the semiconductor element-mounting section.

Preferably, the strengthening layer is of a circular shape in a plane view.

Preferably, the strengthening layer is of an electroconductive plate layer.

Preferably, the external terminals are disposed on any one of a plurality of circumferences in a plane view.

Preferably, the sealing resin section has a rectangular parallelepipedic shape.

Preferably, a sealing resin section: has a columnar shape.

Preferably, an additional external terminal that has an area larger than that of the internal terminal and has a shape tapered towards the semiconductor element-mounting section is disposed at a corner of the sealing resin section.

Preferably, the sealing resin section has a truncated conical shape, a columnar shape, a dome-like shape, or a truncated polygonal pyramidal shape.

Preferably, an externally protruding terminal is formed on at least one upper surface of the internal terminals. The externally protruding terminal is connectable to a lower surface of another semiconductor device.

A method for manufacturing a semiconductor device according to a fifth aspect of the present invention comprises the steps of: providing a wiring substrate that includes a non-electroconductive substrate, a semiconductor element-mounting section provided at an upper-surface of the non-electroconductive substrate, internal terminals each disposed around the semiconductor element-mounting section, external terminals each provided at a lower-surface of the non-electroconductive substrate, vias each extending through the non-electroconductive substrate, and conductors each placed within or on a side face of each via in the non-electroconductive substrate in order to electrically interconnect one internal terminal and one external terminal; resting a semiconductor element on the semiconductor element-mounting section; interconnecting the semiconductor element and the internal terminals of the wiring substrate through the electroconductive portions; and sealing the semiconductor element-mounting section of the wiring substrate, the internal terminals of the wiring substrate, the semiconductor element, and the electroconductive portions; wherein a strengthening layer is provided at a lower surface of the semiconductor element-mounting section, and the external terminals are disposed on at least one circumference in a plane view around the semiconductor element-mounting section.

In the fifth aspect of the present invention, the strengthening layer is provided on the lower surface of the semiconductor element-mounting section and the external terminals are disposed on at least one circumference in a plane view around the semiconductor element-mounting section. Thus, thermal stresses due to a difference in thermal expansion ratio between the semiconductor device and the substrate for mounting the device are equally applied to solder portions provided to the external terminals, so that a specific solder portion would not be particularly damaged. Hence, reliability of the semiconductor device against heat applied thereto during or after mounting can be improved.

BRIEF DESCRIPTION OF THE DRAWINGS

FIG. 120 is a bottom view showing the semiconductor device according to the sixth variation of the fourth embodiment of the present invention (i.e., variation 4-6);

FIG. 121 is a plan view showing a semiconductor device according to a seventh variation of the fourth embodiment of the present invention (i.e., variation 4-7);

FIG. 122 is a bottom view showing the semiconductor device according to the seventh variation of the fourth embodiment of the present invention (i.e., variation 4-7);

FIG. 123 is a plan view showing a semiconductor device according to an eighth variation of the fourth embodiment of the present invention (i.e., variation 4-8);

FIG. 124 is a bottom view showing the semiconductor device according to the eighth variation of the fourth embodiment of the present invention (i.e., variation 4-8);

FIG. 125 is a plan view showing a semiconductor device according to a ninth variation of the fourth embodiment of the present invention (i.e., variation 4-9);

FIG. 126 is a bottom view showing the semiconductor device according to the ninth variation of the fourth embodiment of the present invention (i.e., variation 4-9);

FIG. 127 is a cross-sectional view showing a semiconductor device according to a tenth variation of the fourth embodiment of the present invention (i.e., variation 4-10);

FIG. 128 is a cross-sectional view showing a semiconductor device according to an eleventh variation of the fourth embodiment of the present invention (i.e., variation 4-11);

FIG. 129 is a cross-sectional view showing a semiconductor device according to a twelfth variation of the fourth embodiment of the present invention (i.e., variation 4-12);

FIG. 130 is a cross-sectional view showing a semiconductor device according to a thirteenth variation of the fourth embodiment of the present invention (i.e., variation 4-13);

FIG. 131 is a plan view showing a semiconductor device according to a fourteenth variation of the fourth embodiment of the present invention (i.e., variation 4-14);

Figure 132:
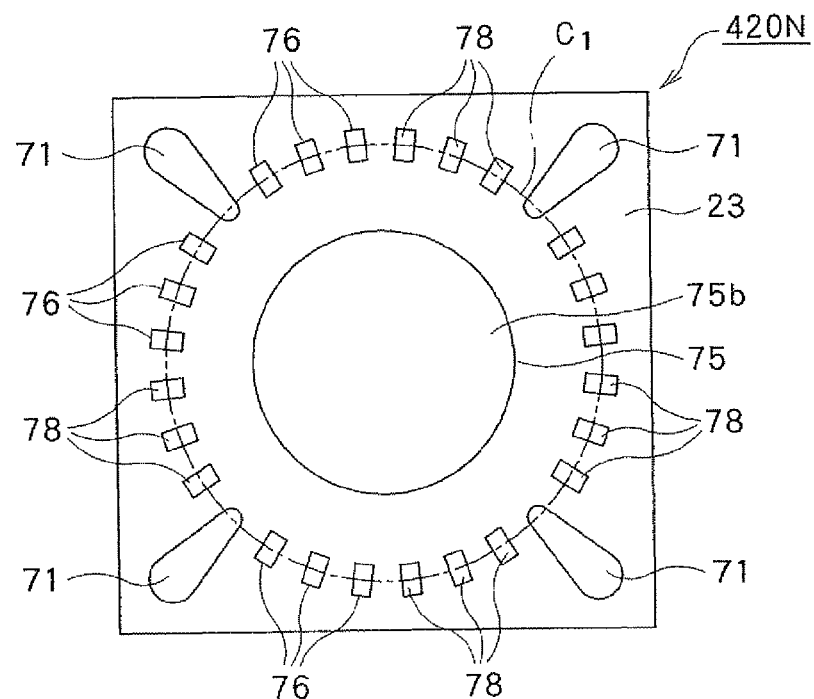
Figure 133:
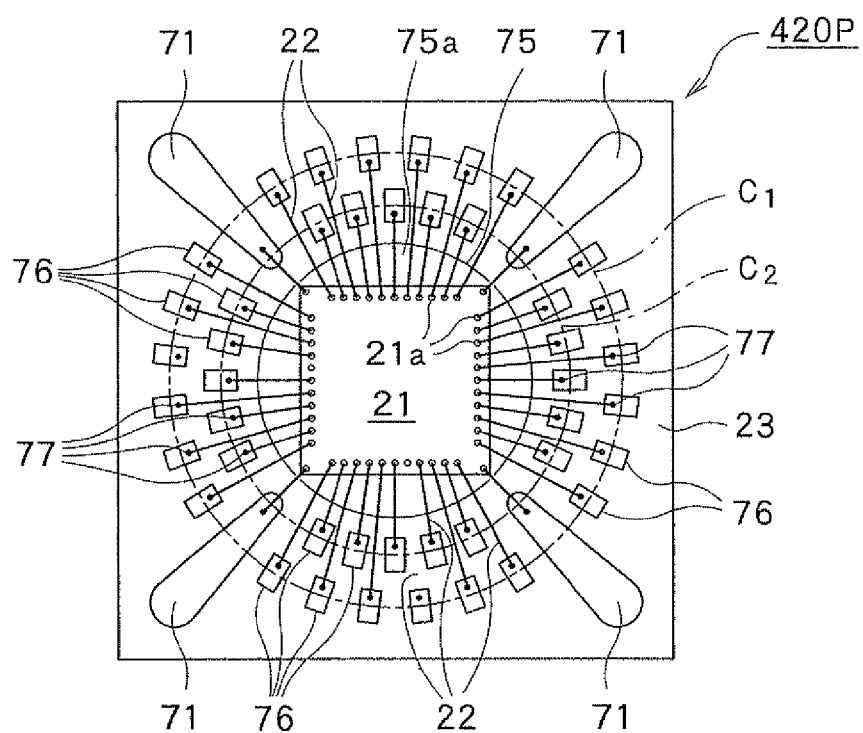
Figure 134:
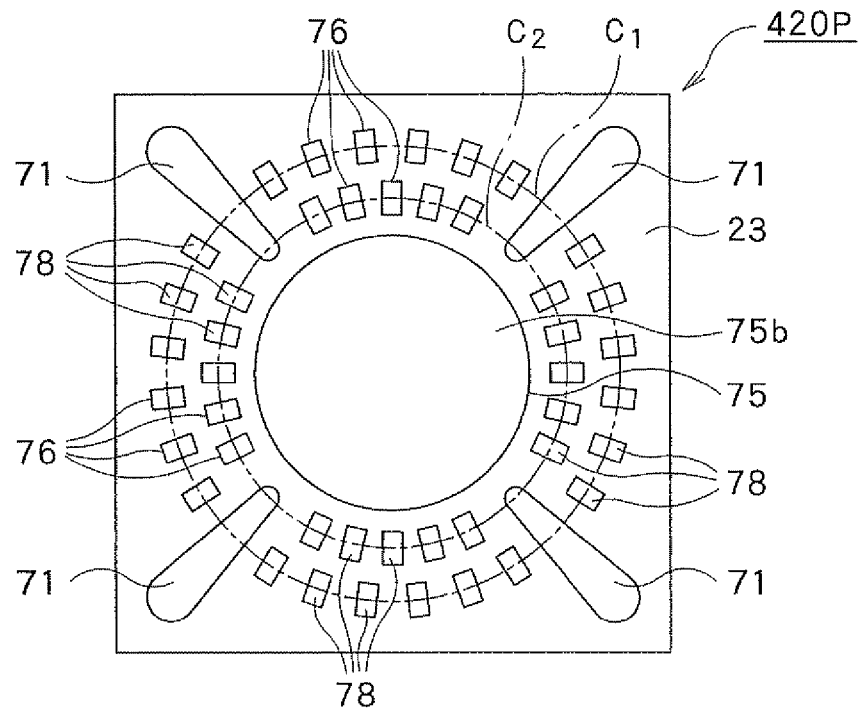
Figure 135:
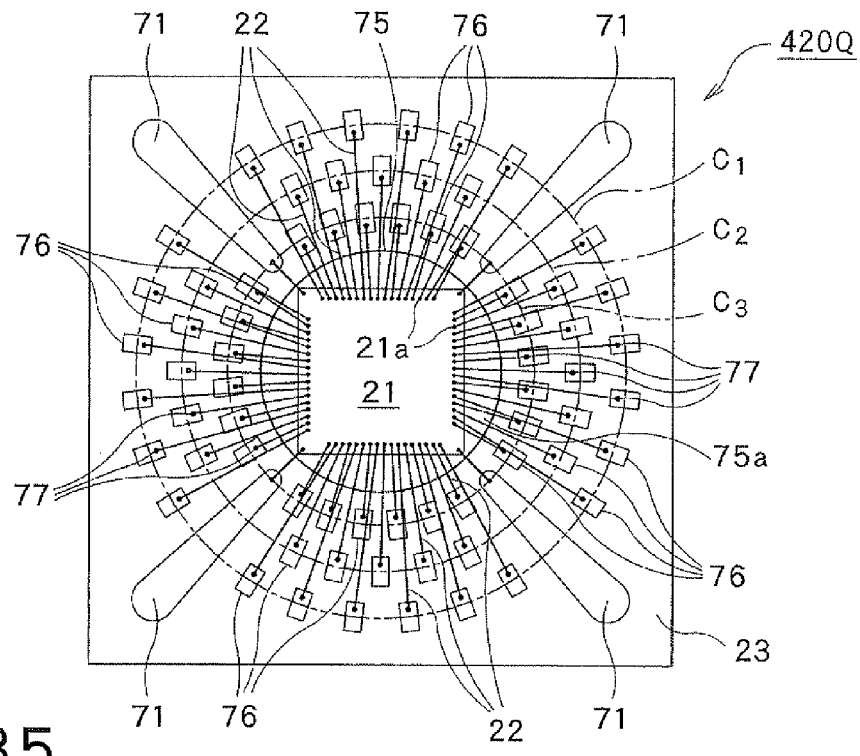
Figure 136:
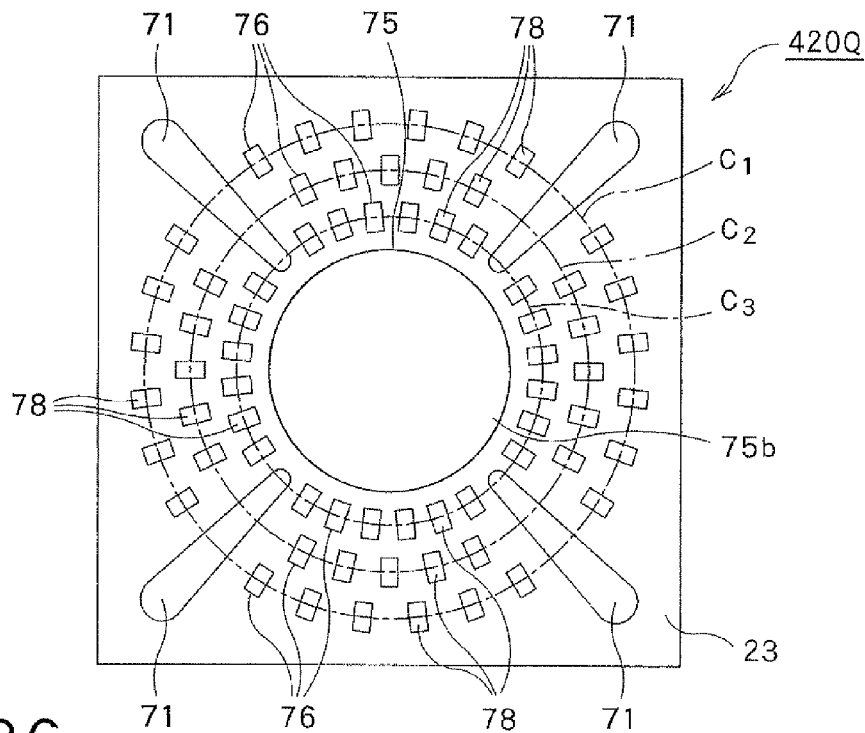
Figure 137:
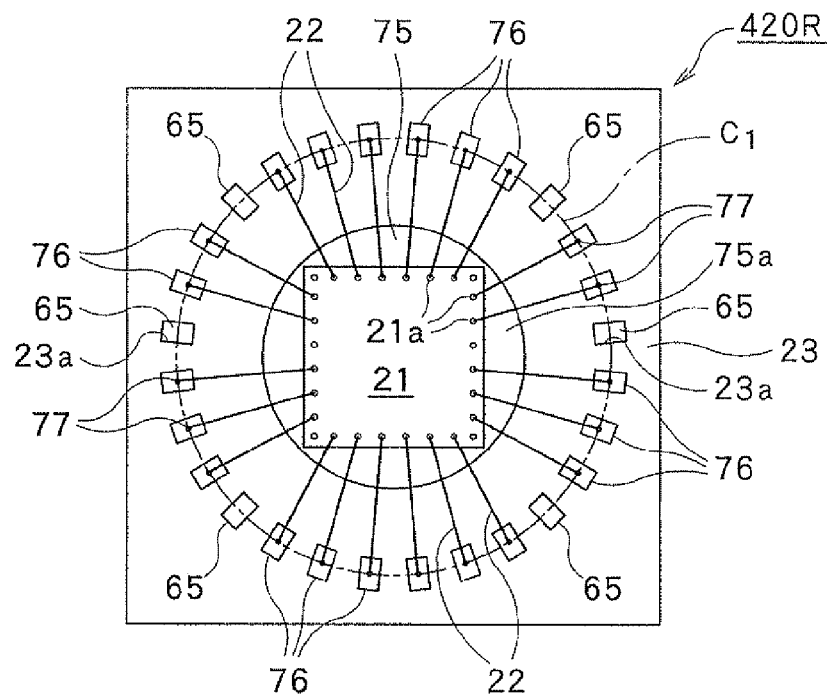
Figure 138:
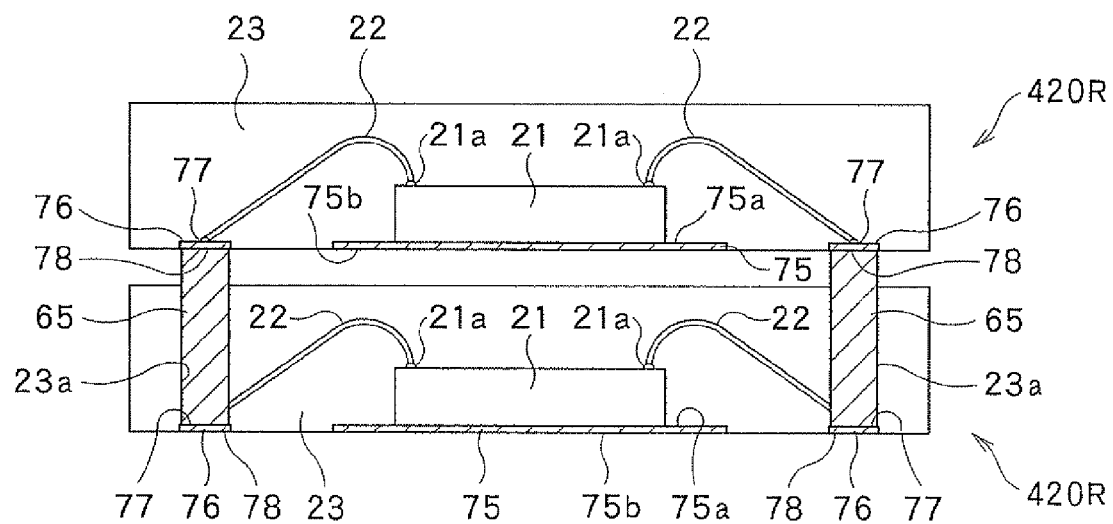
Figure 139:
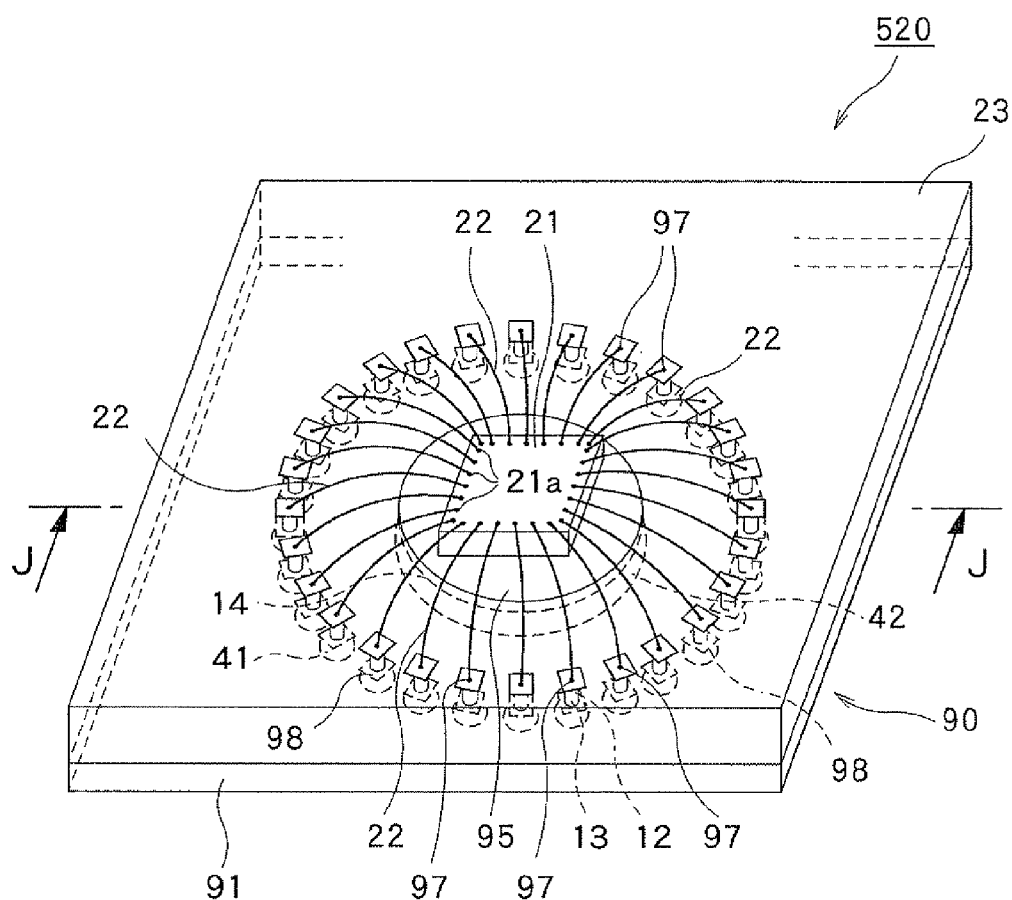
Figure 140:
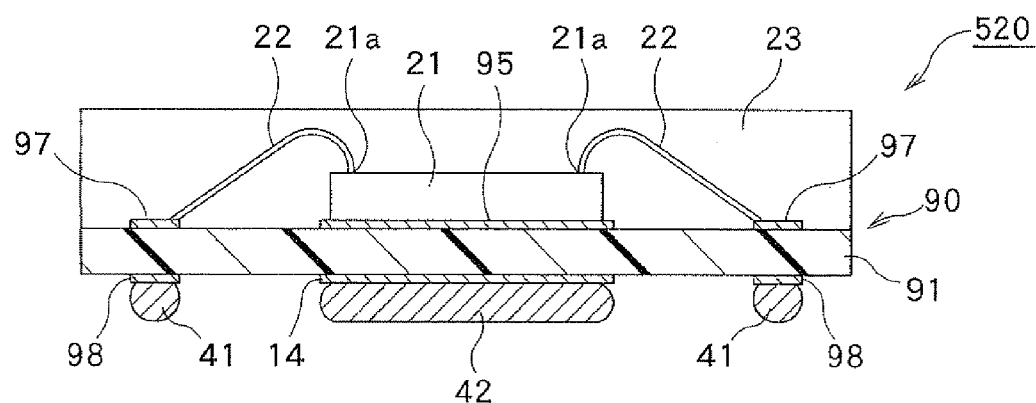
Figure 141:
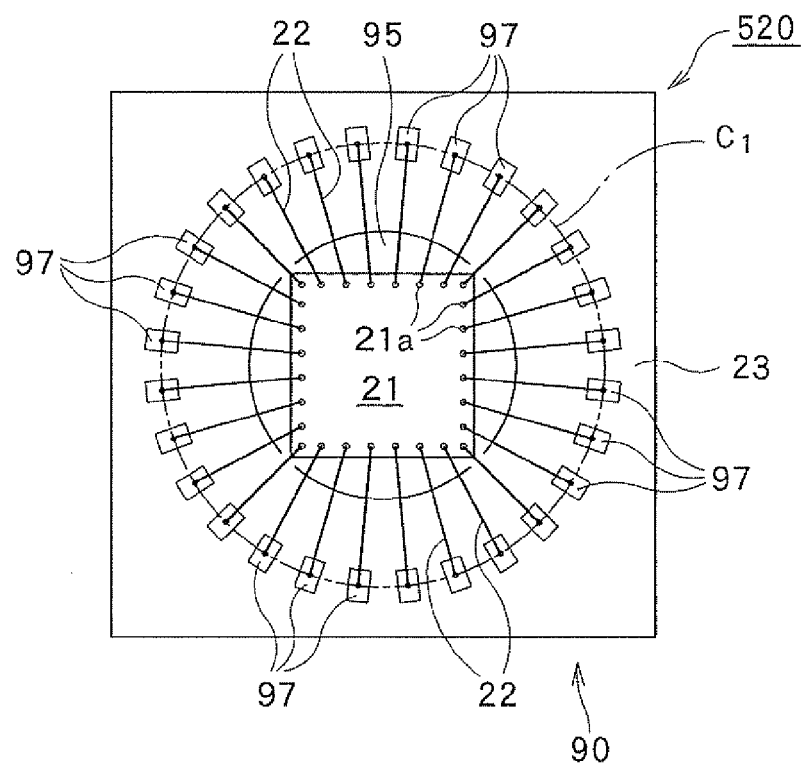
Figure 142:
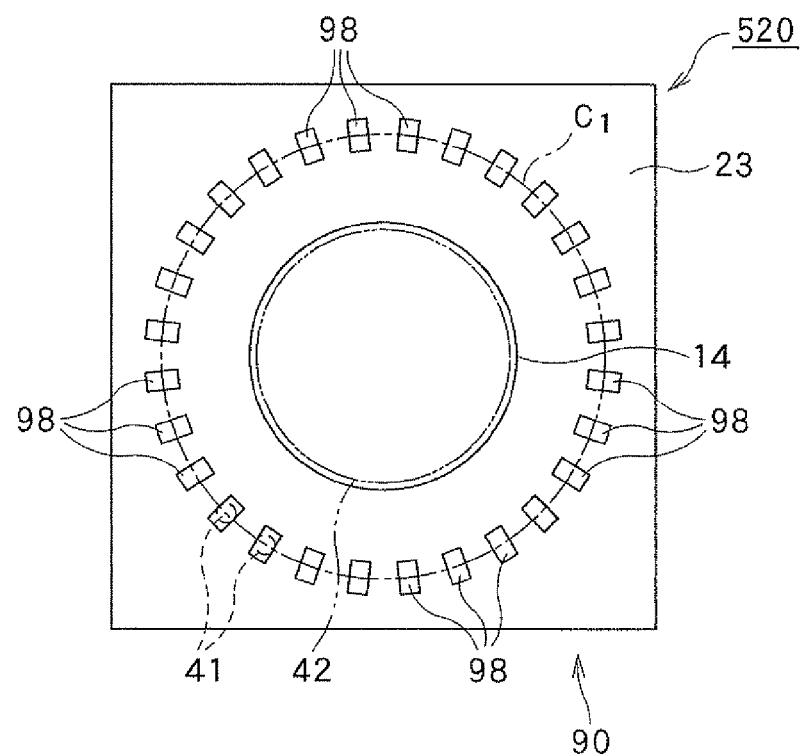
Figure 143:
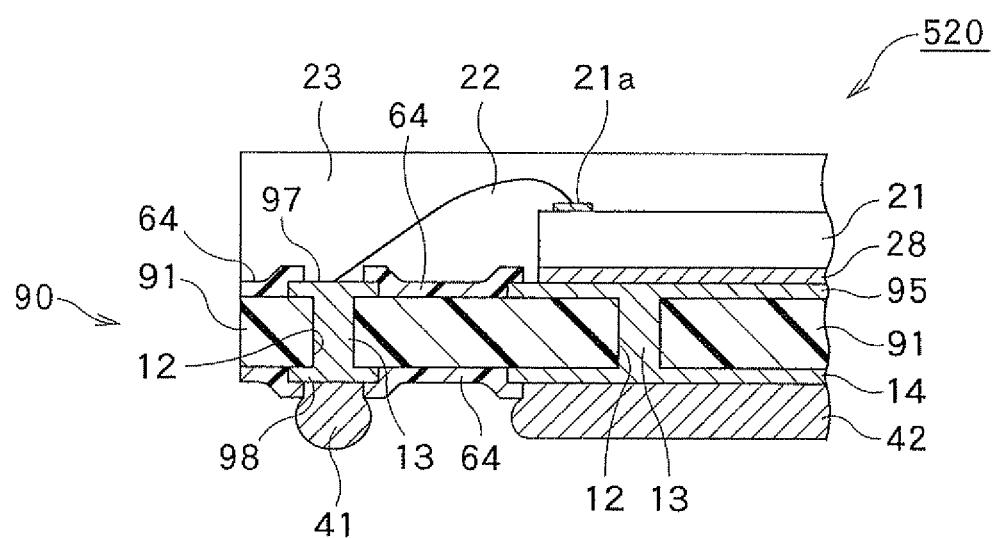
Figure 144:
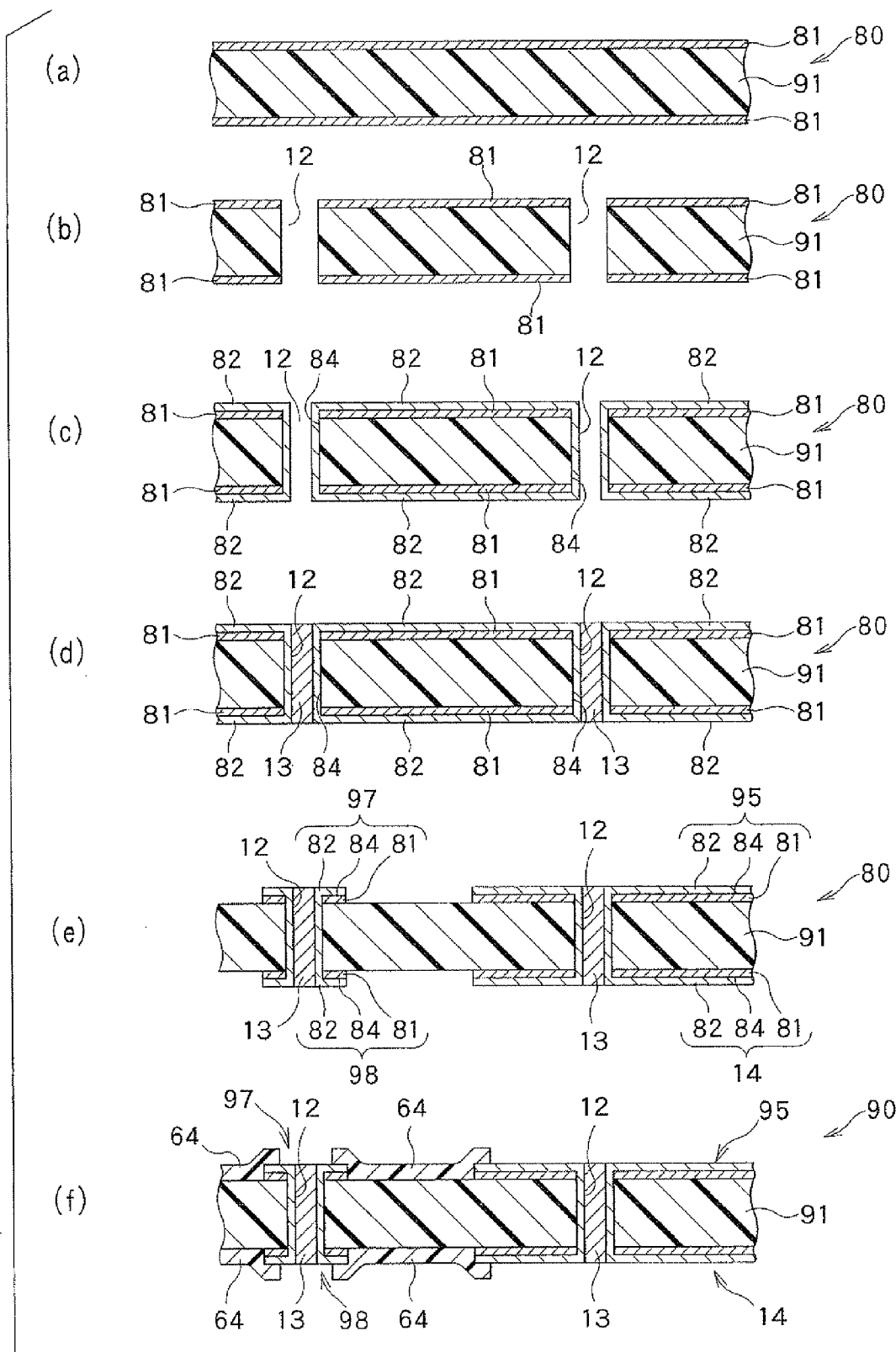
Figure 145:
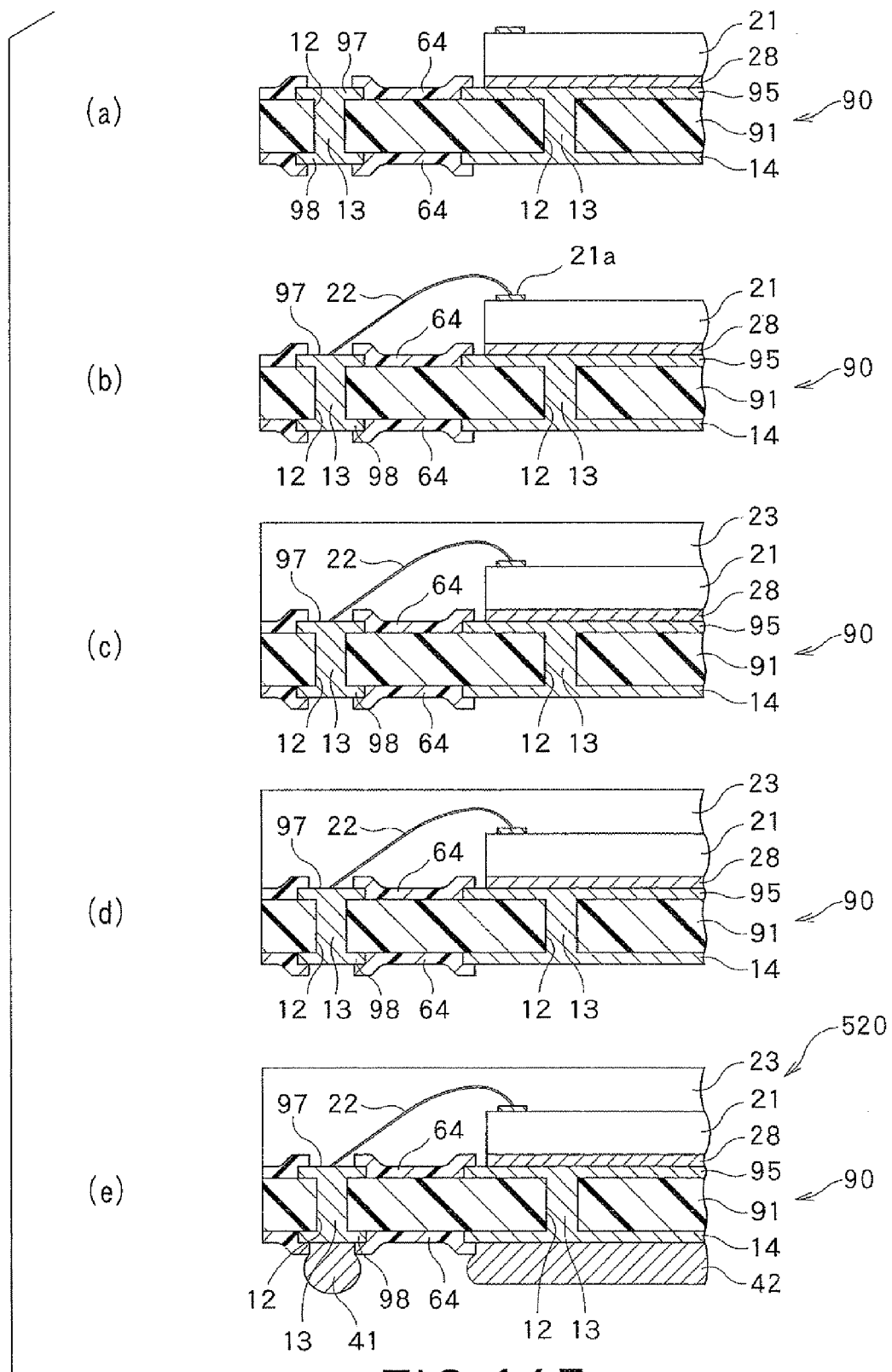
Figure 146:
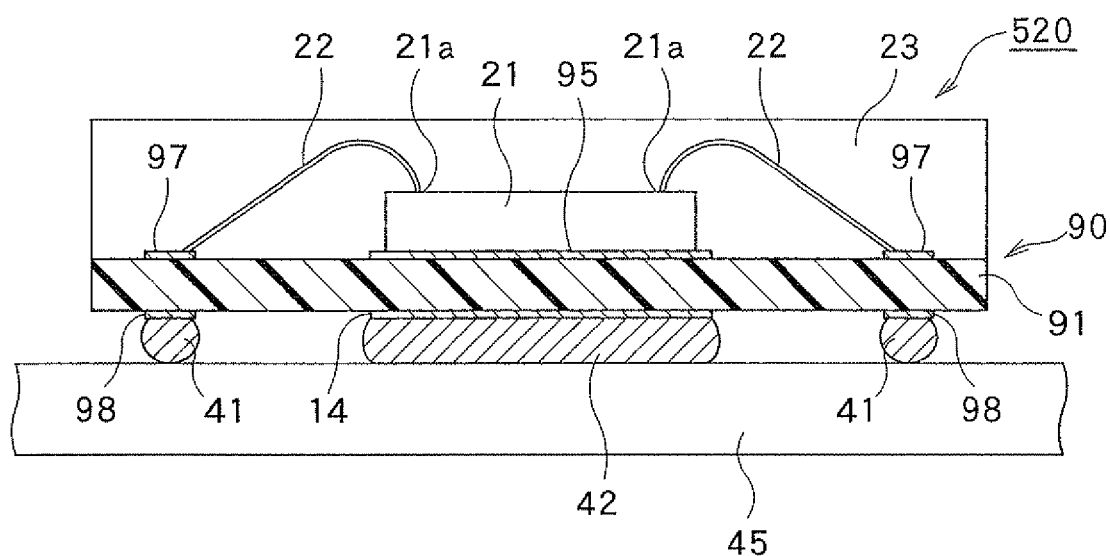
Figure 147:
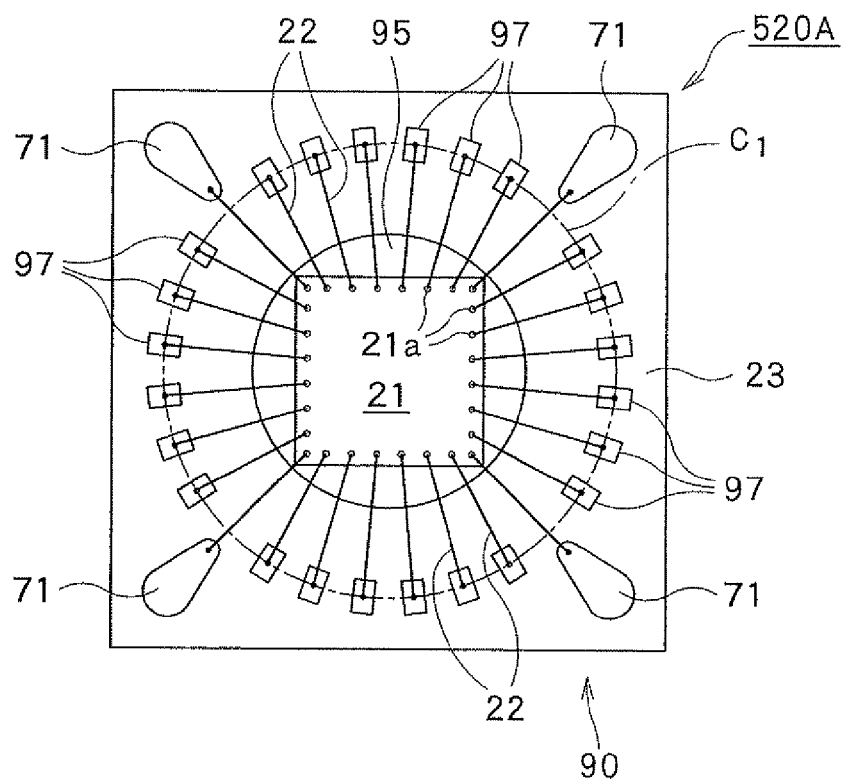
Figure 148:
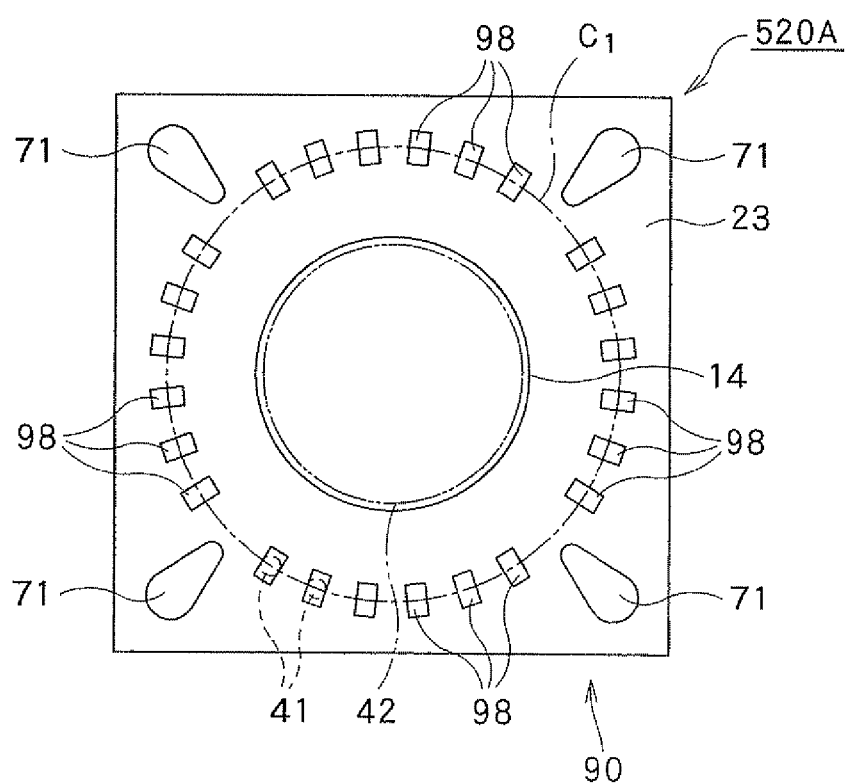
Figure 149:
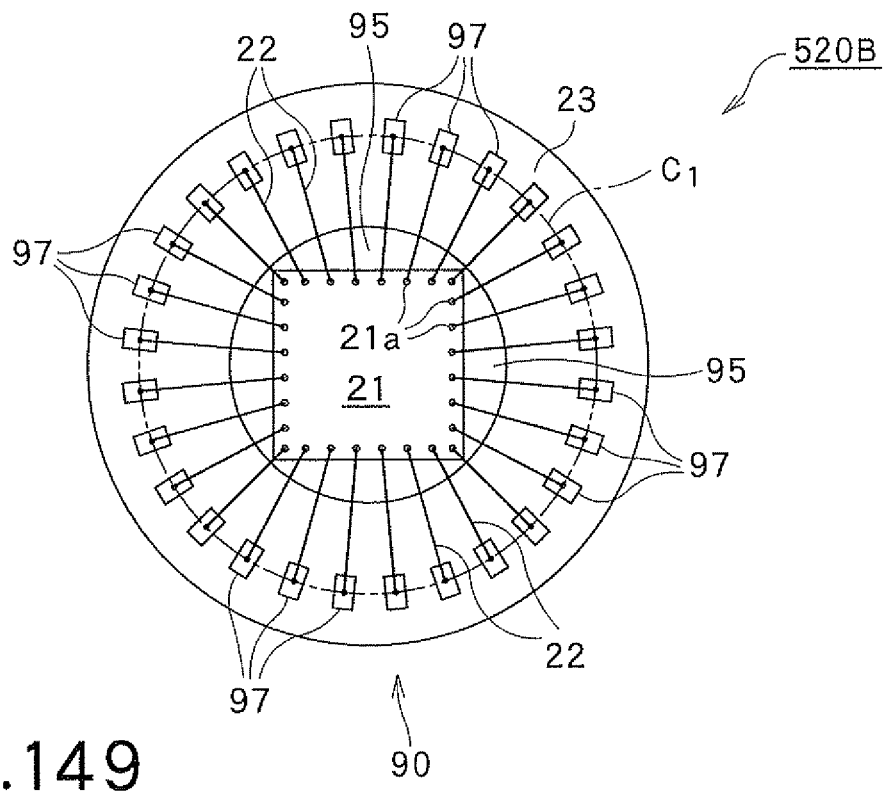
Figure 150:
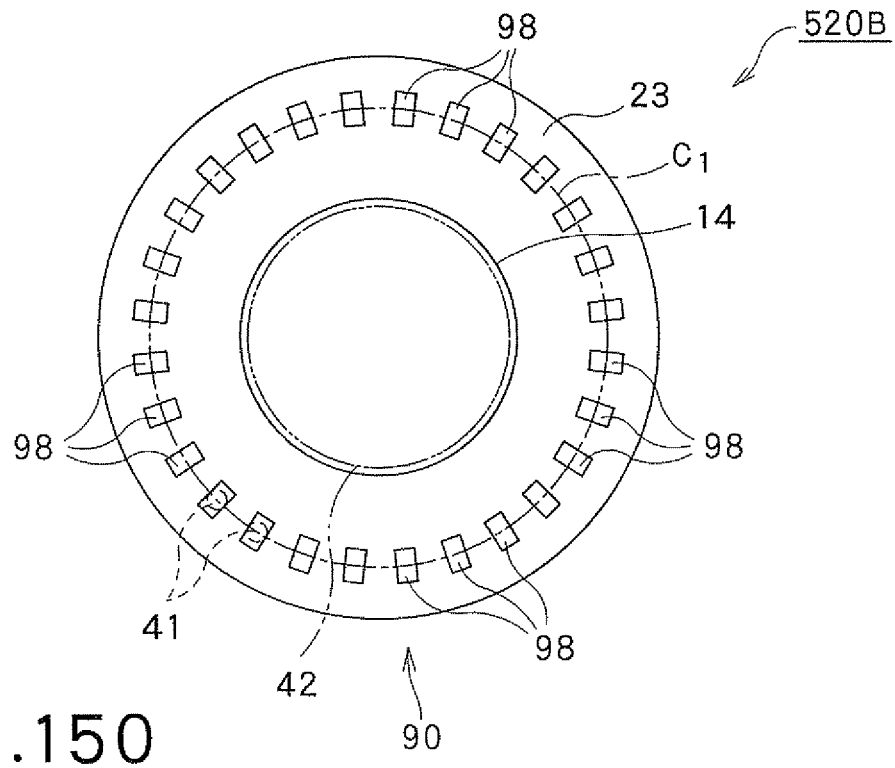
Figure 151:
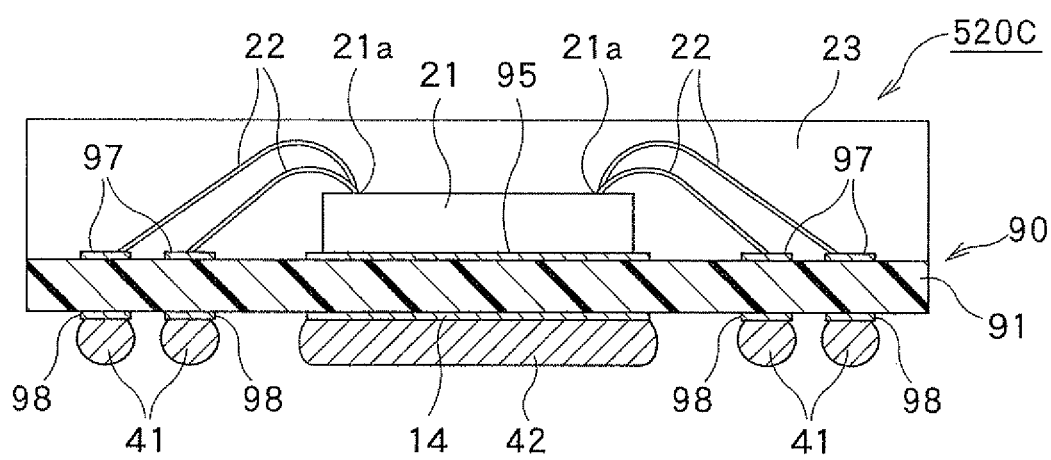
Figure 152:
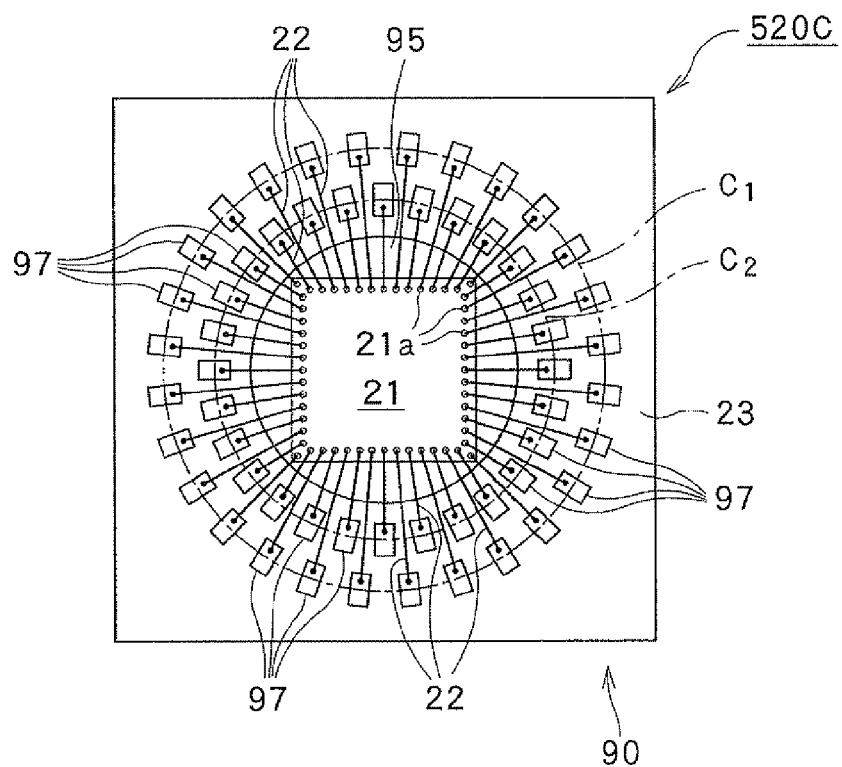
Figure 153:
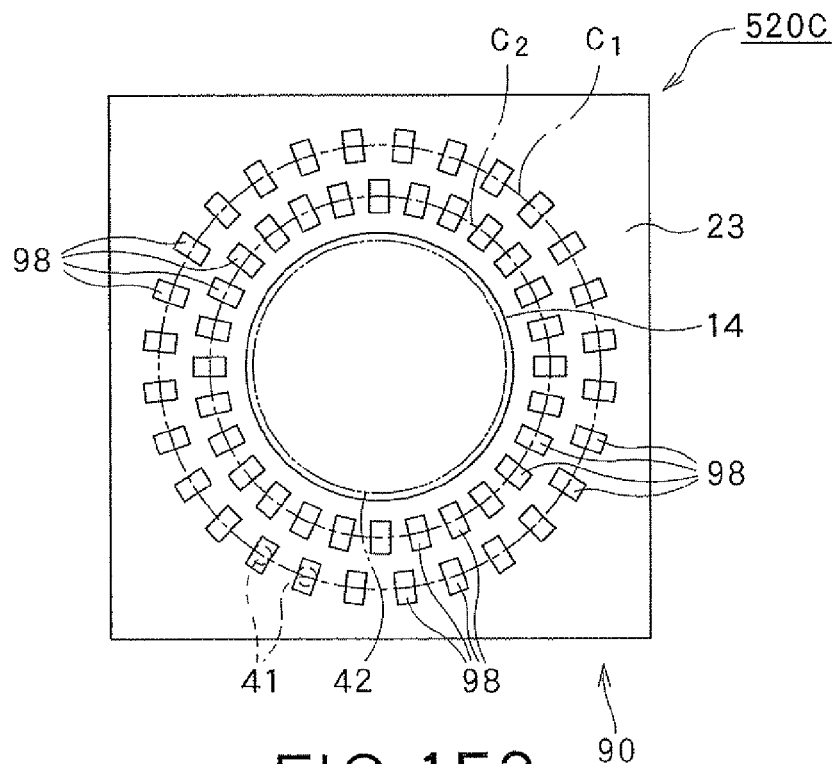
Figure 154:
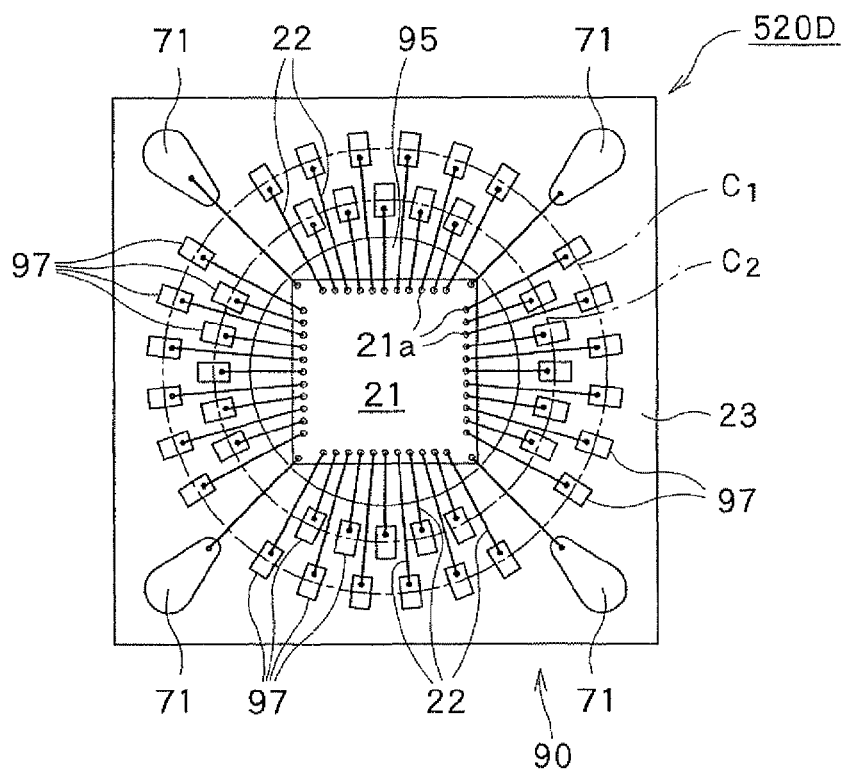
Figure 155:
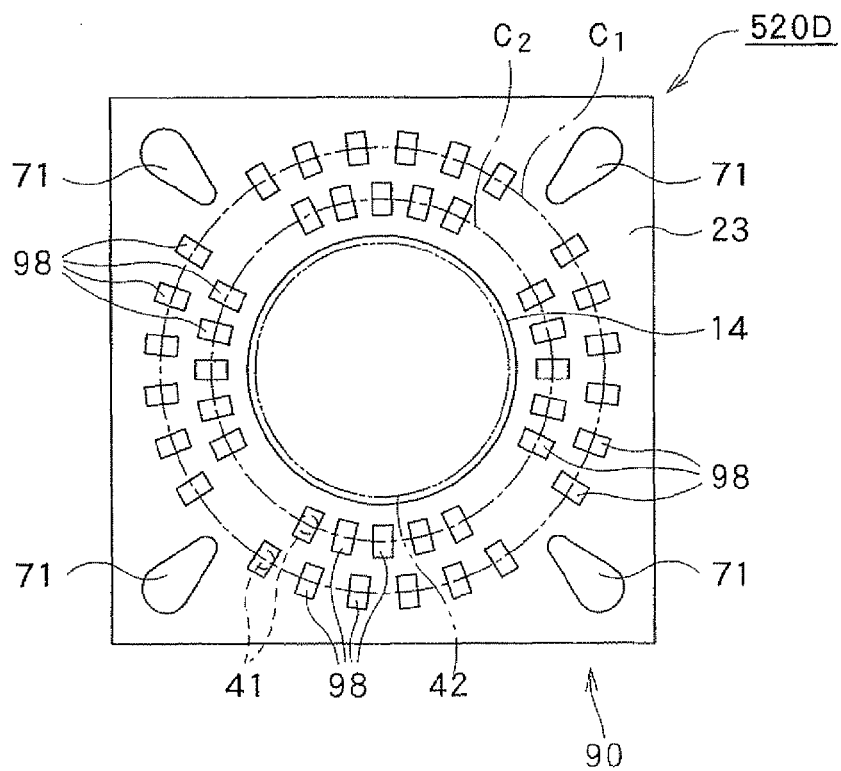
Figure 156:
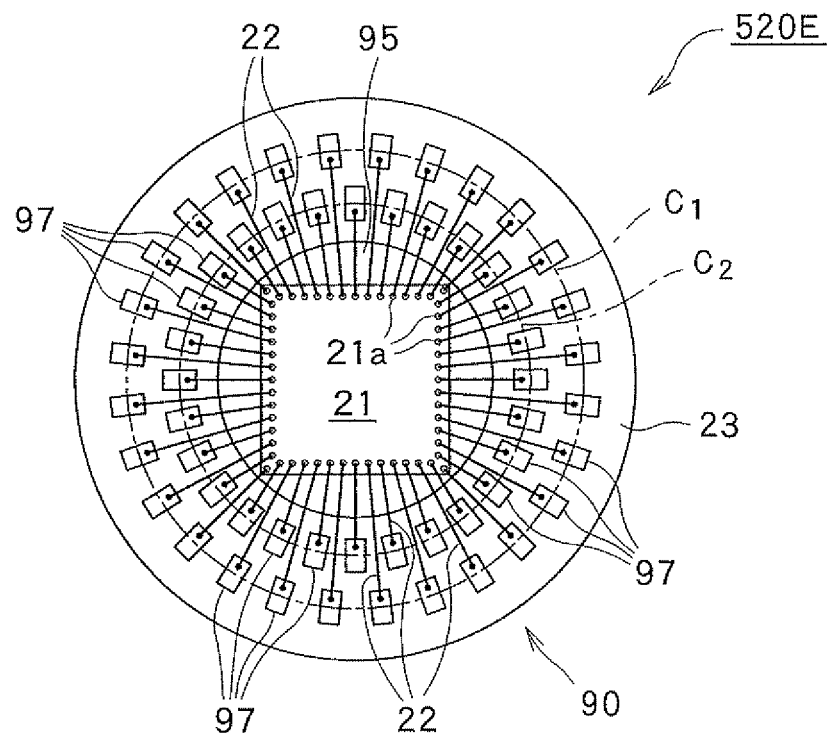
Figure 157:
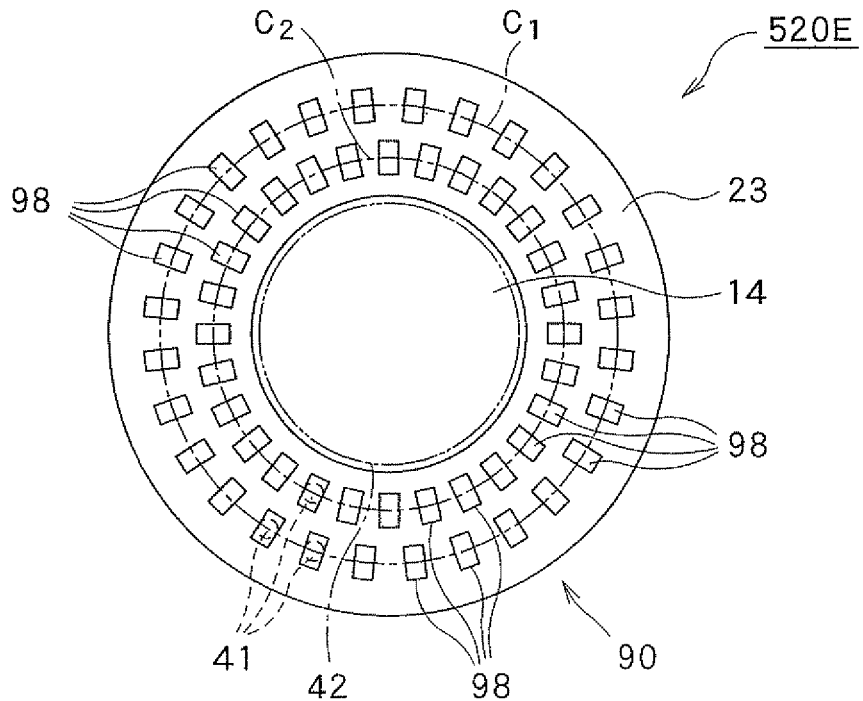
Figure 158:
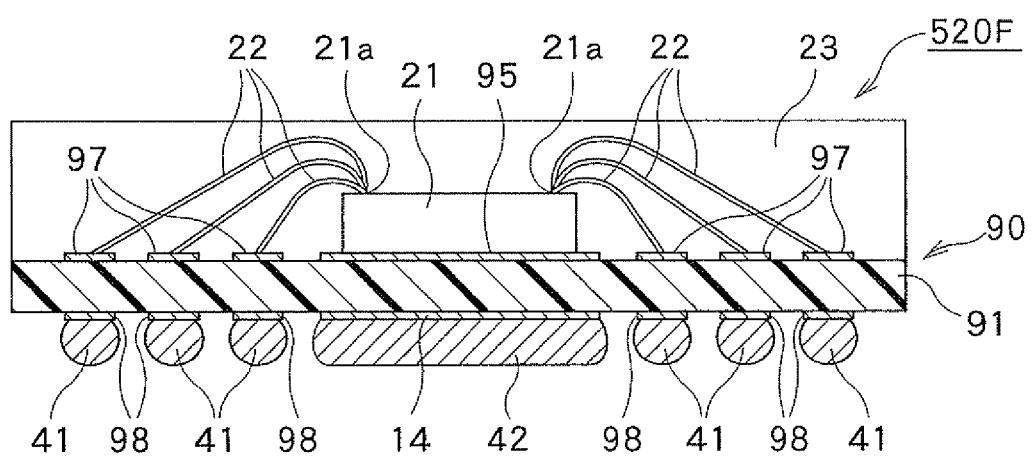
Figure 159:
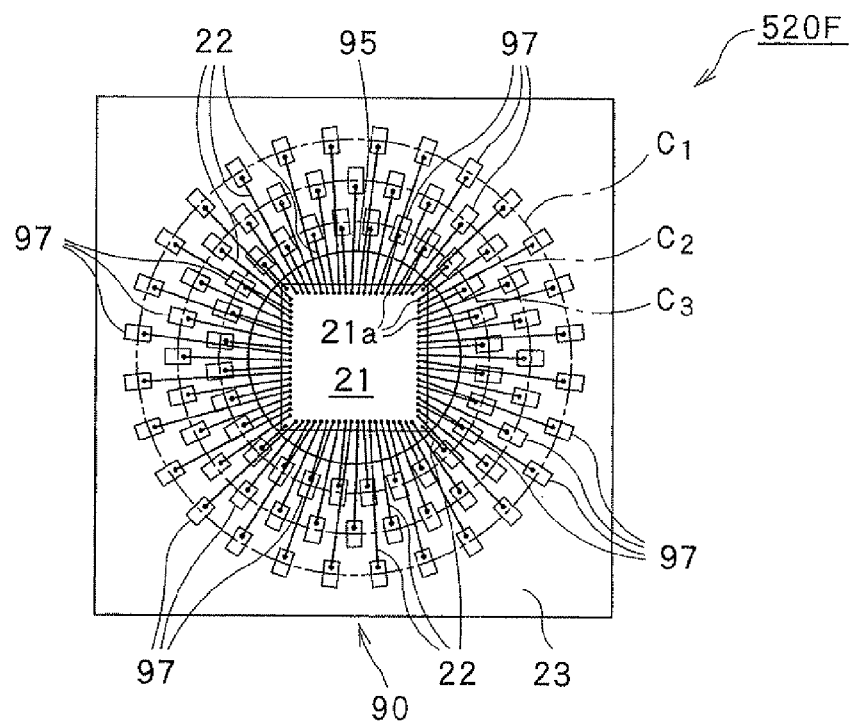
Figure 160:
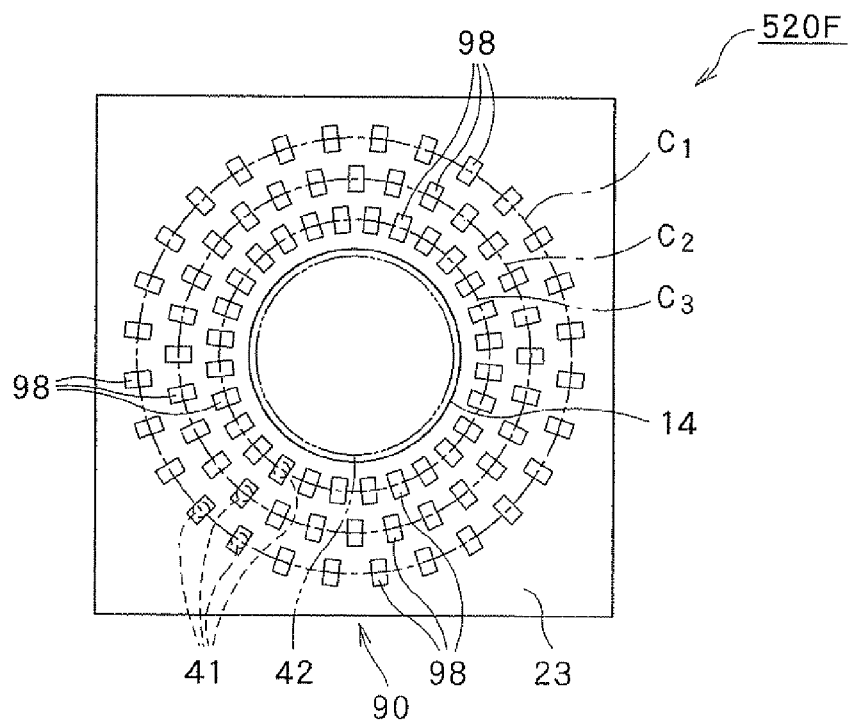
Figure 161:
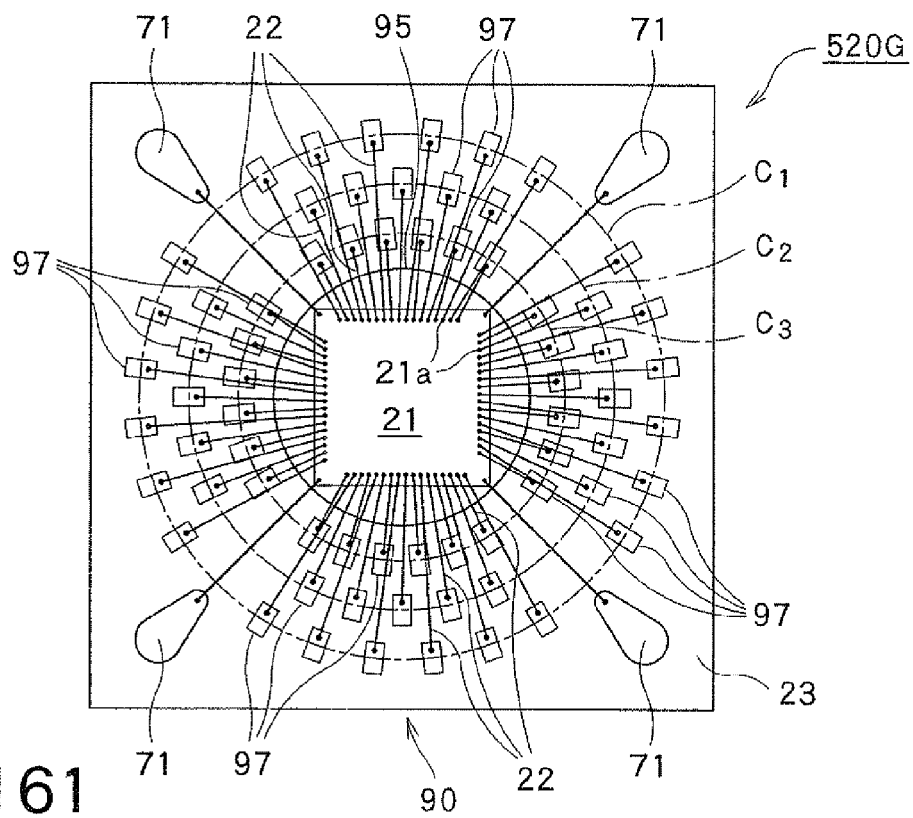
Figure 162:
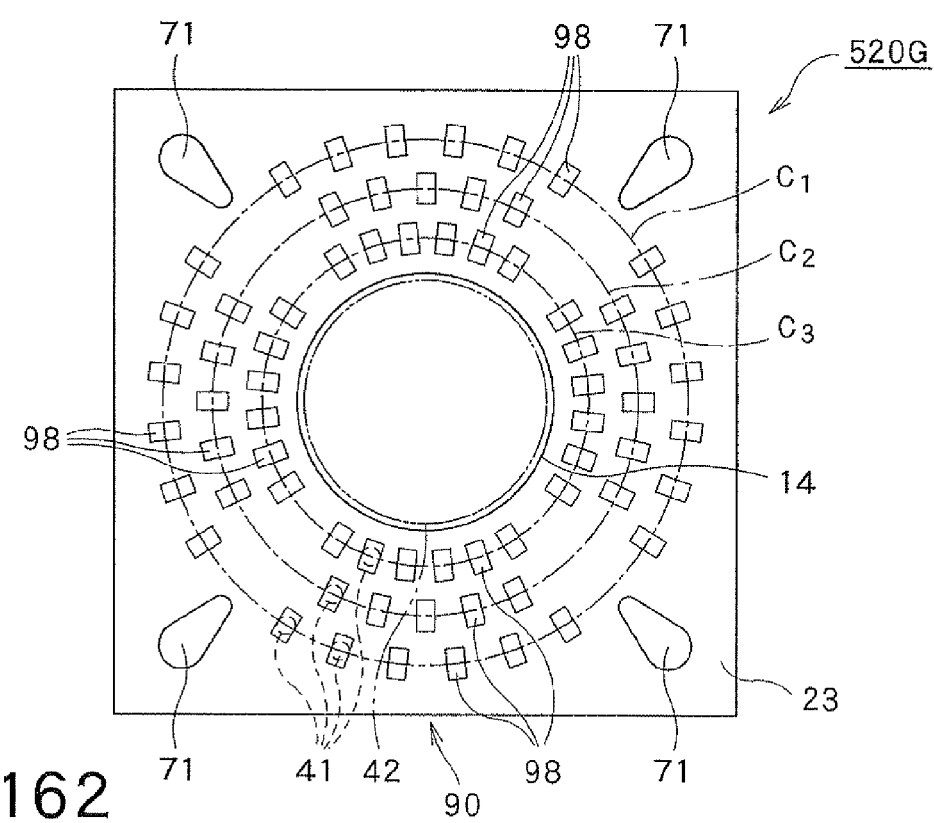
Figure 163:
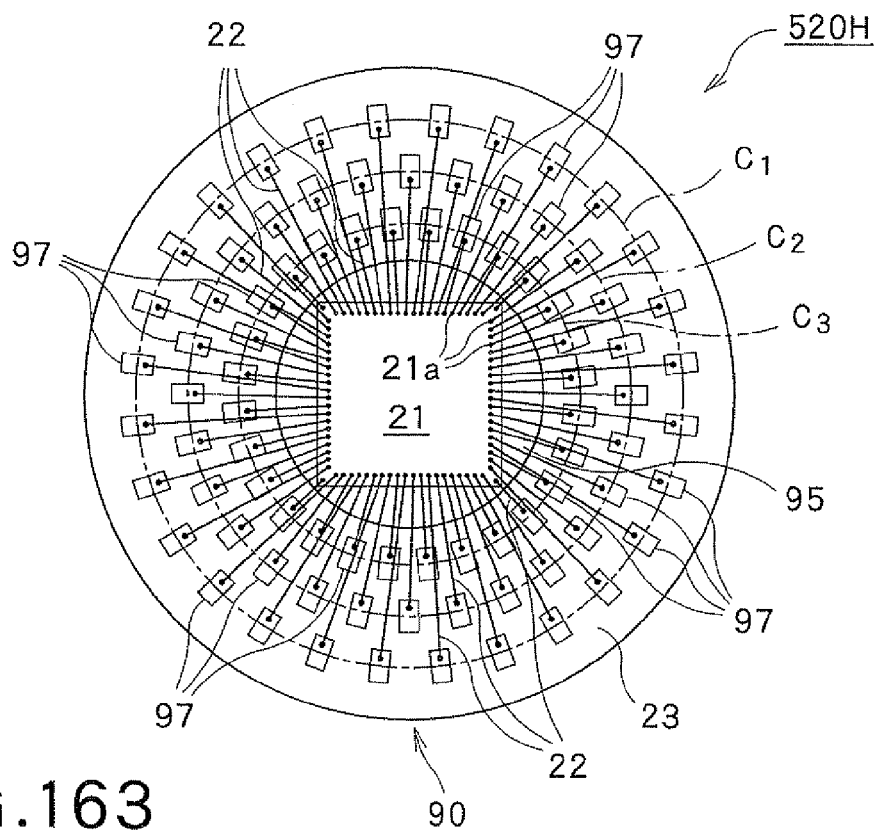
Figure 164:
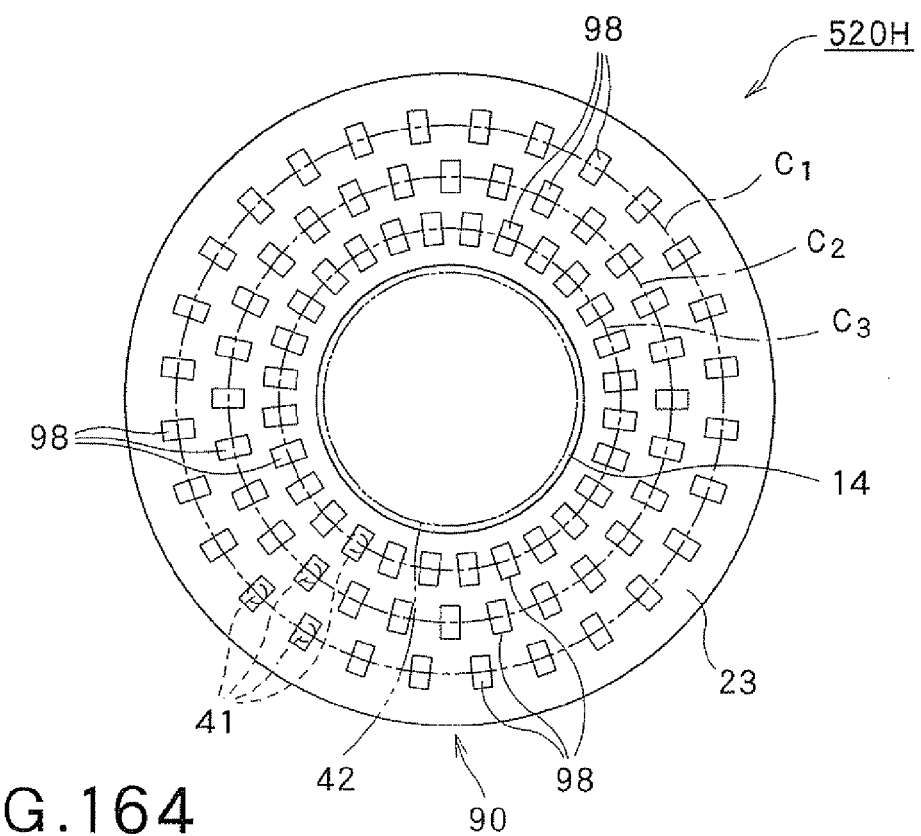
Figure 165:
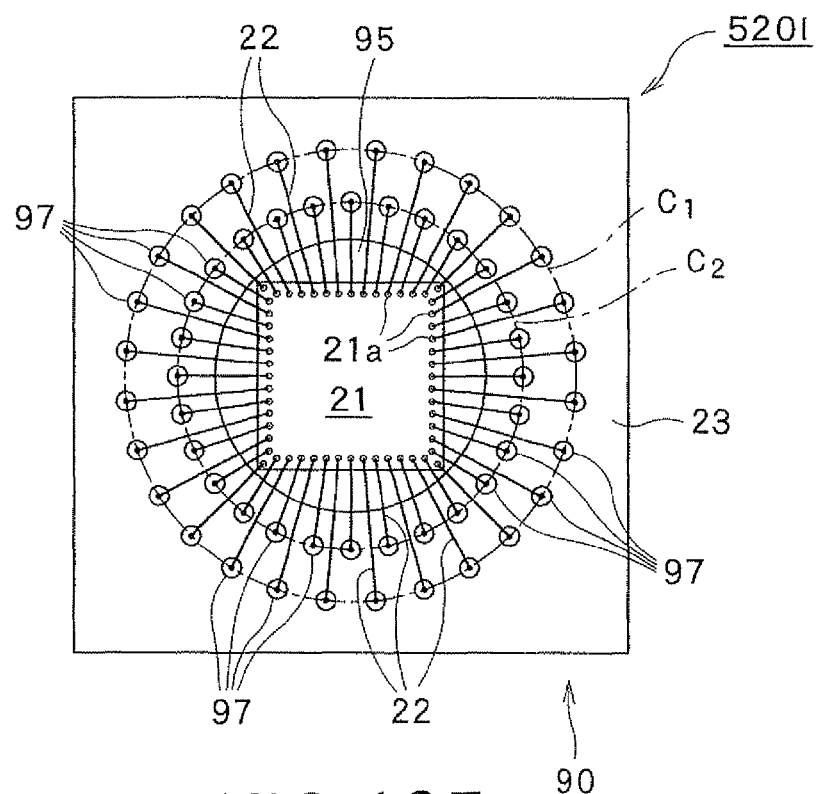
Figure 166:
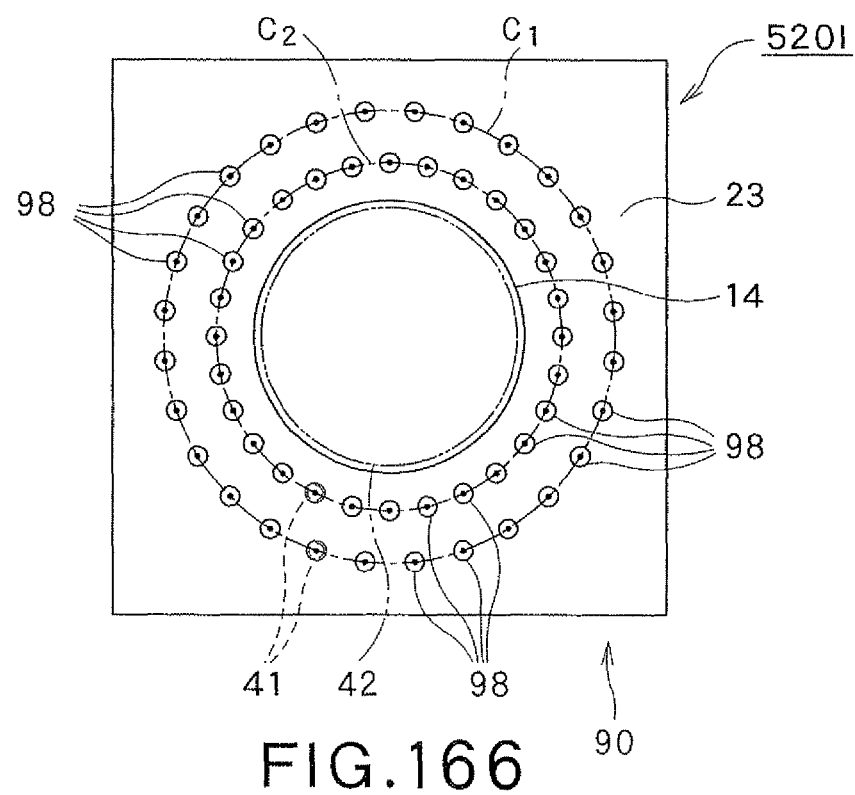
Figure 167:
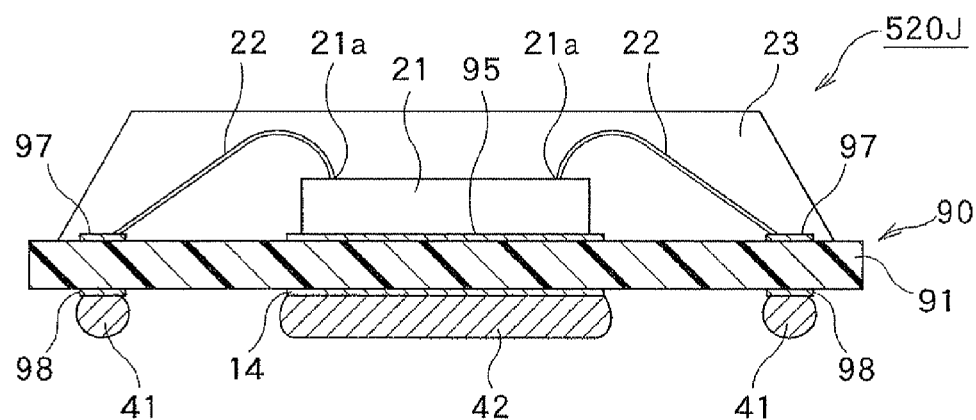
Figure 168:
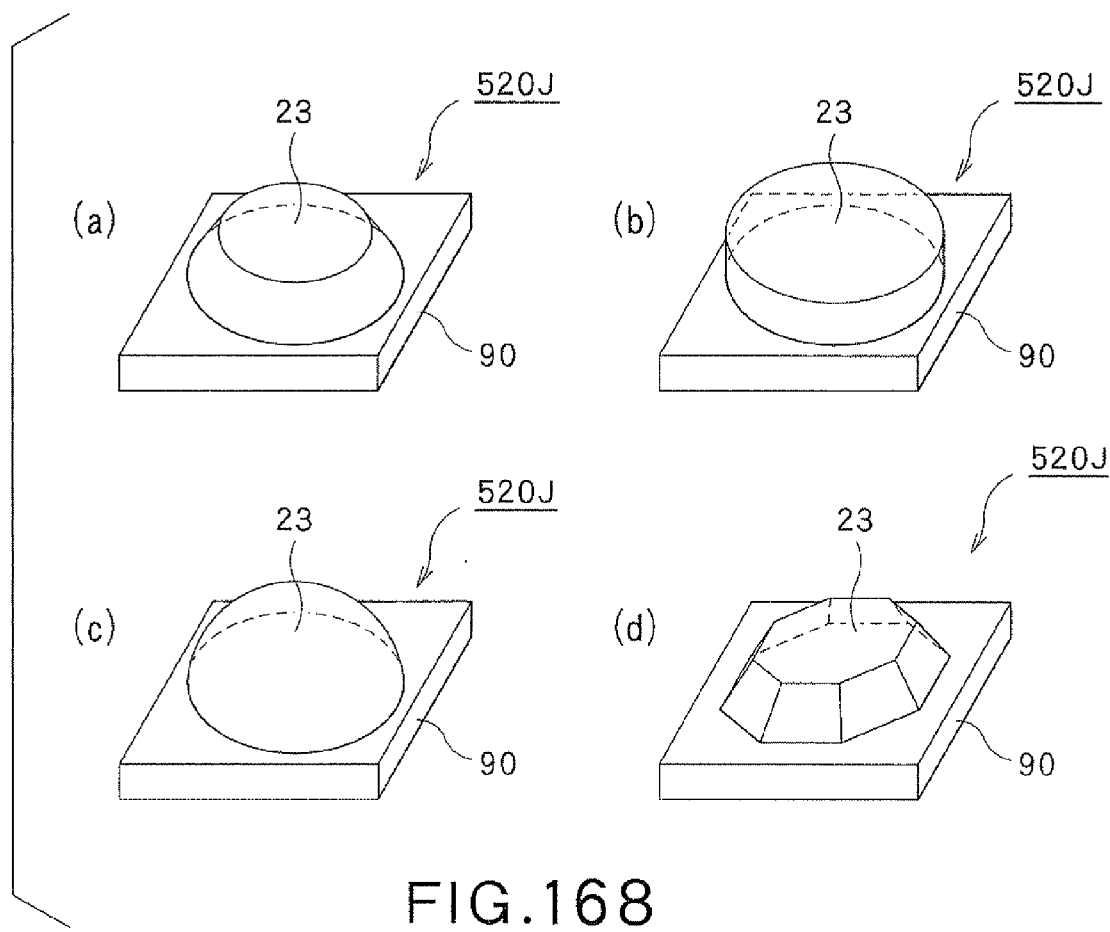
Figure 169:
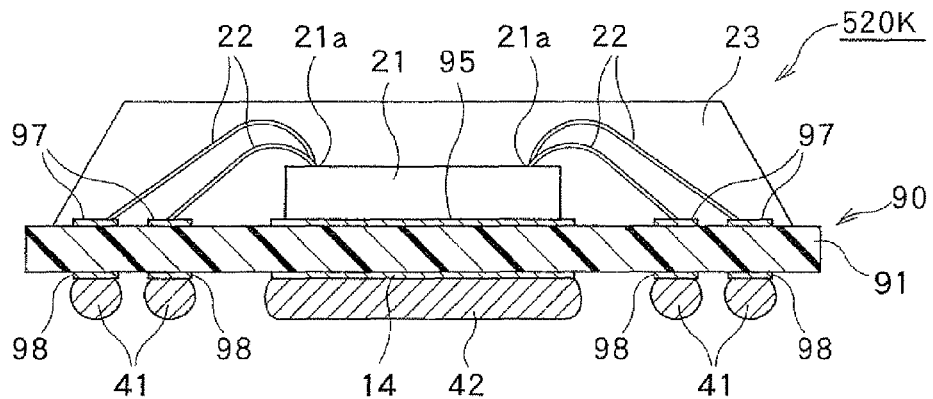
Figure 170:
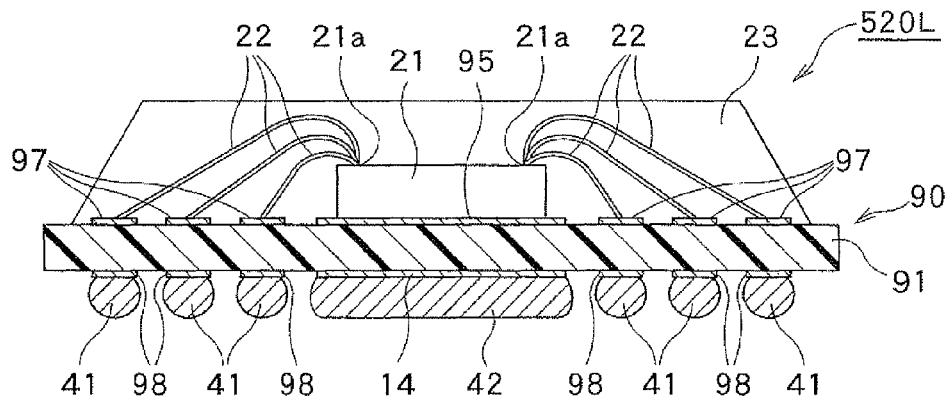
Figure 171:
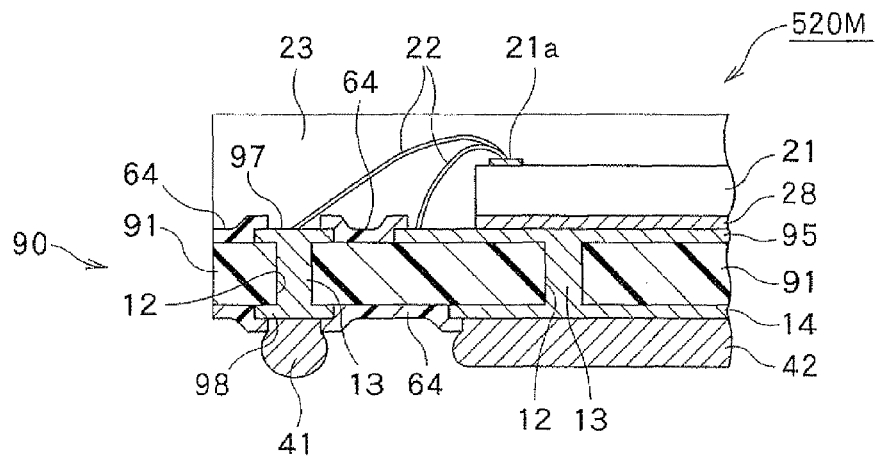
Figure 172:
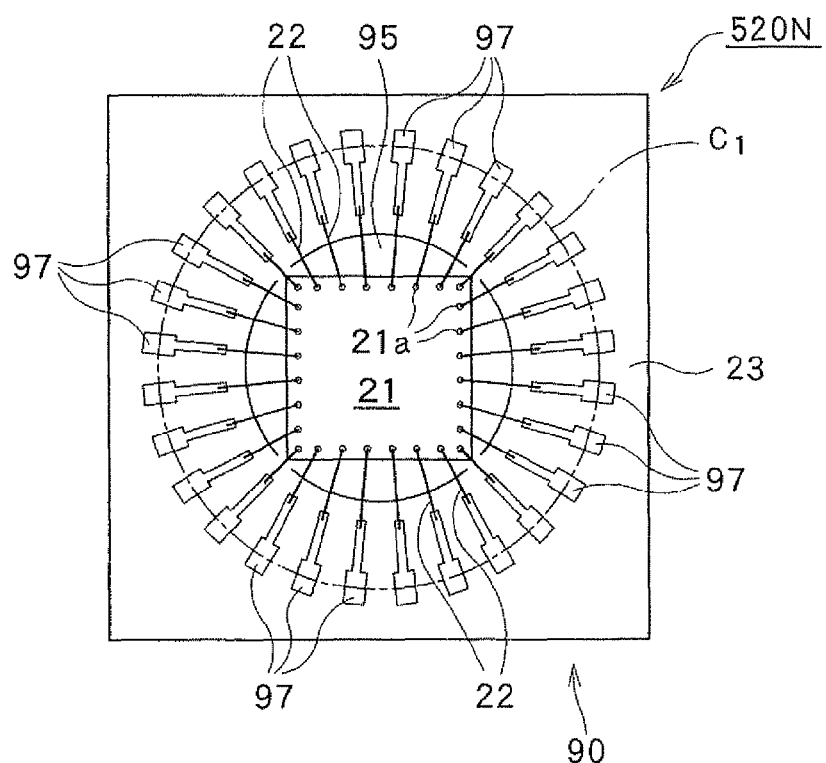
Figure 173:
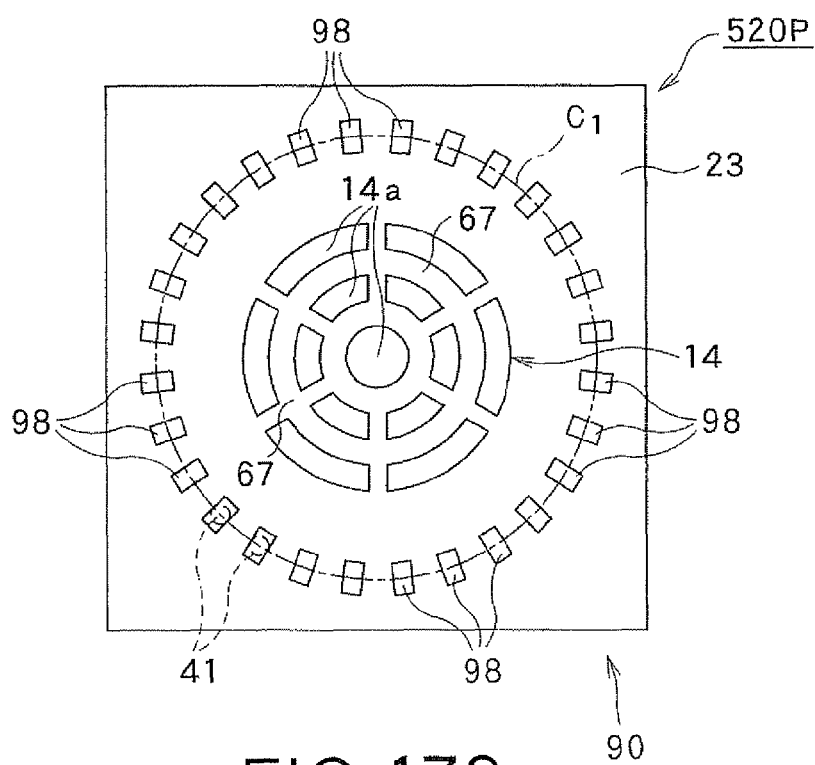
Figure 174:
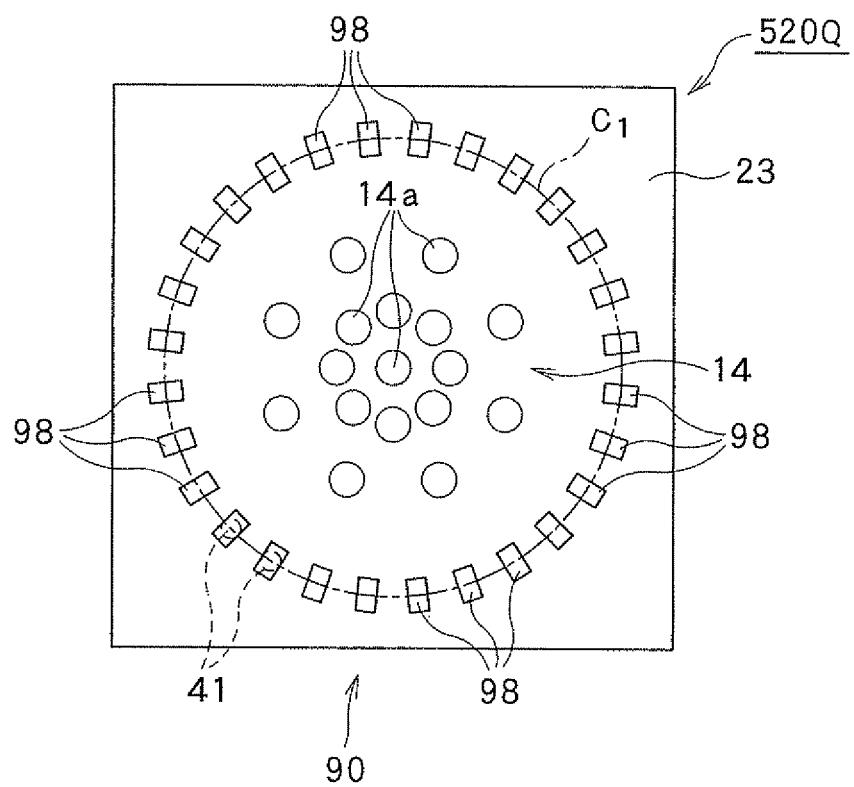
Figure 175:
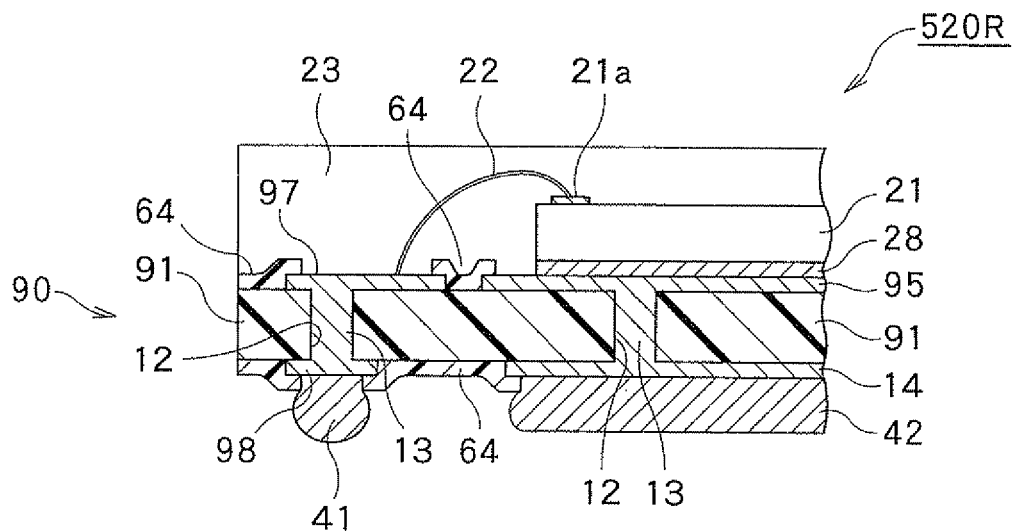
Figure 176:
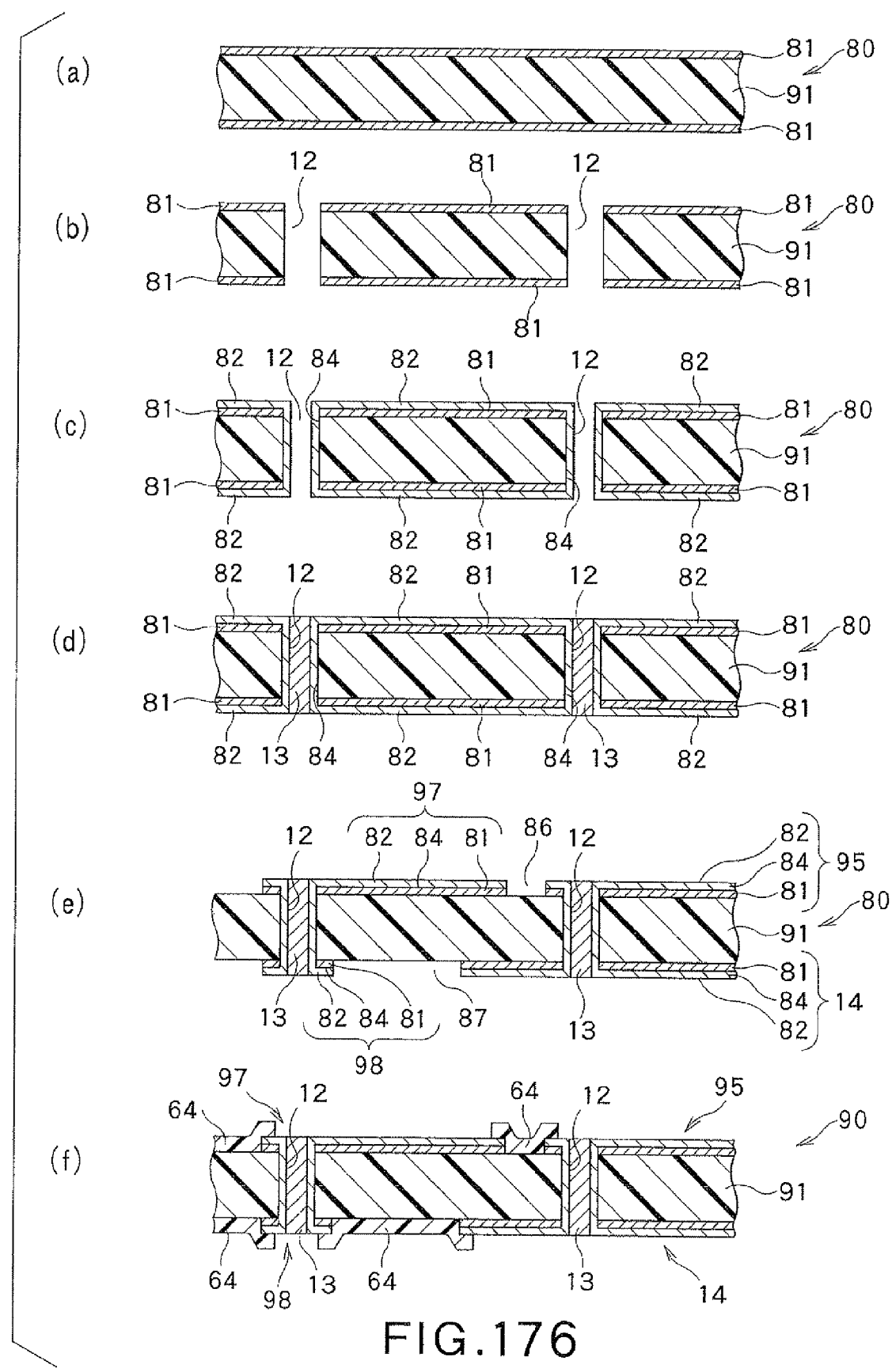
Figure 177:
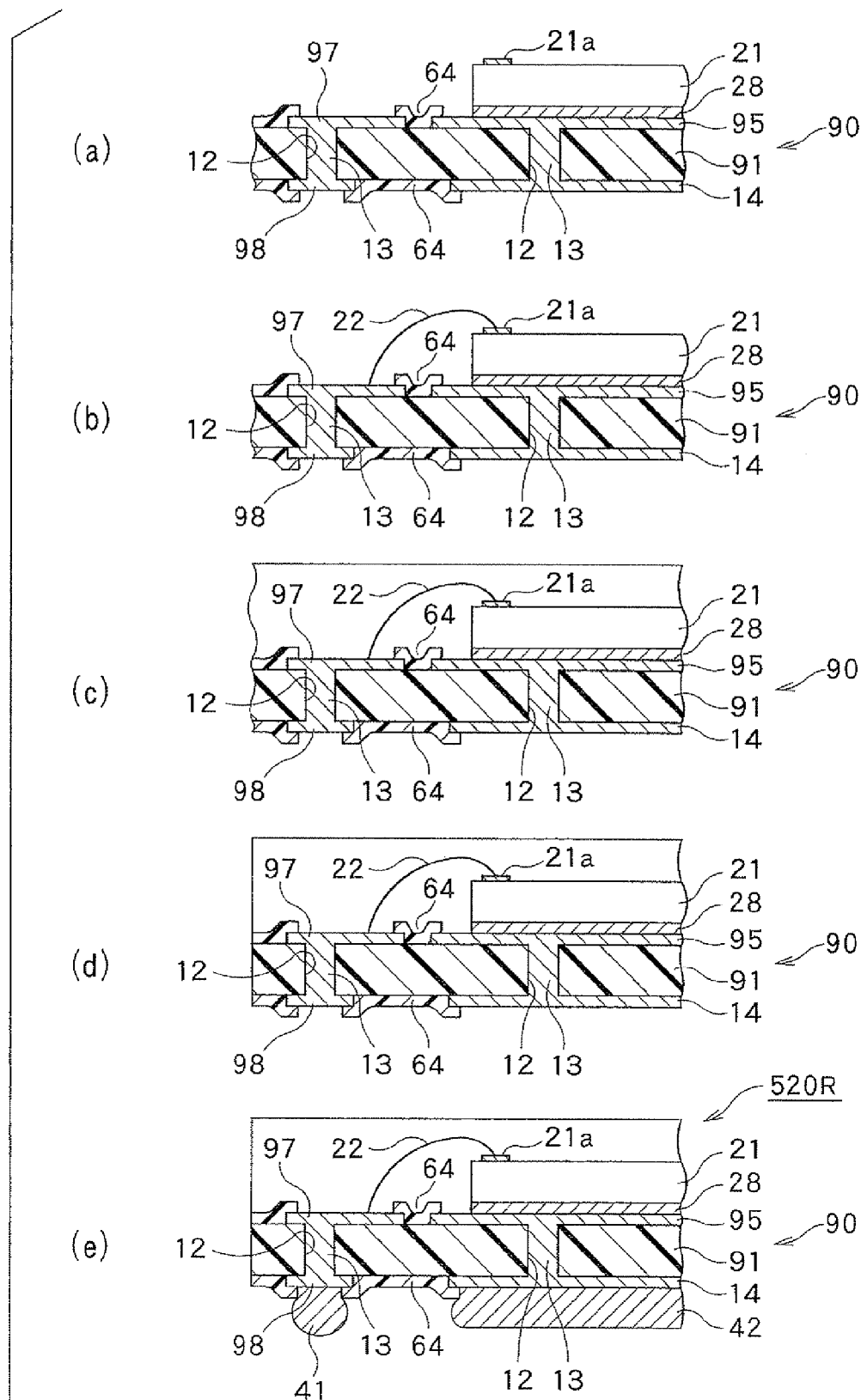
Figure 178:
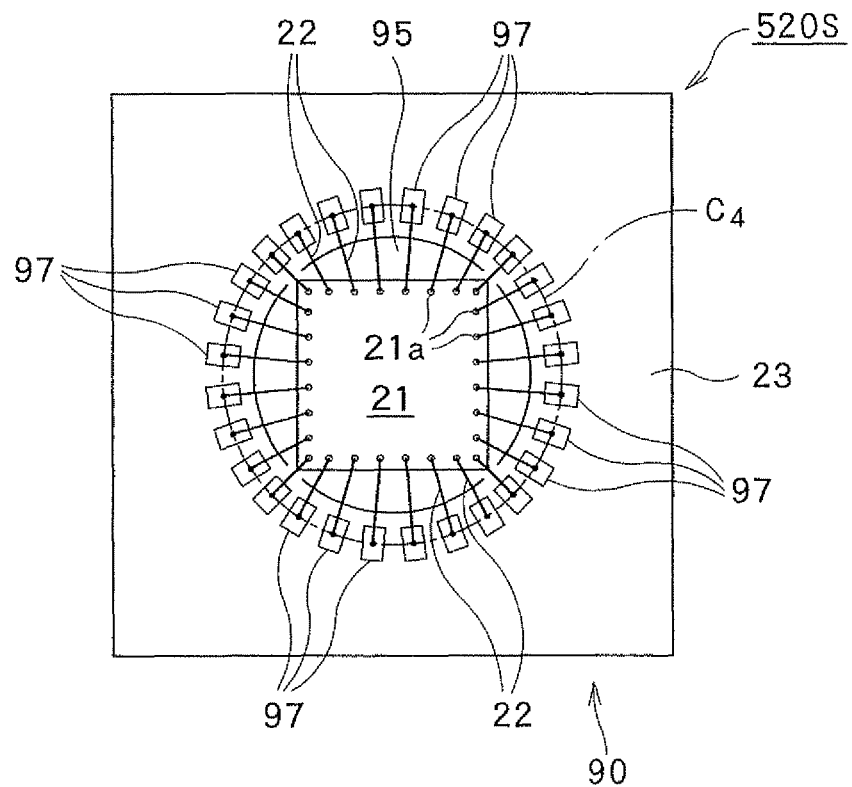
Figure 179:
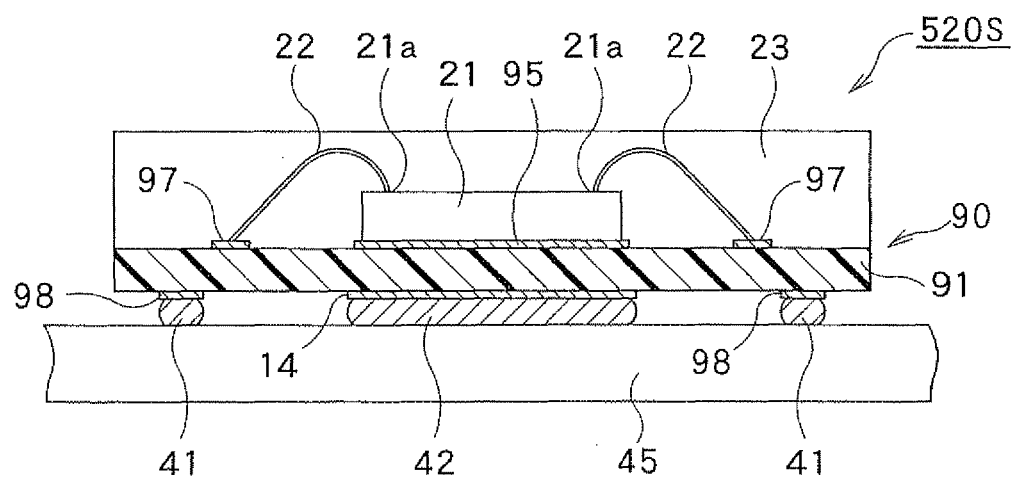
Figure 180:
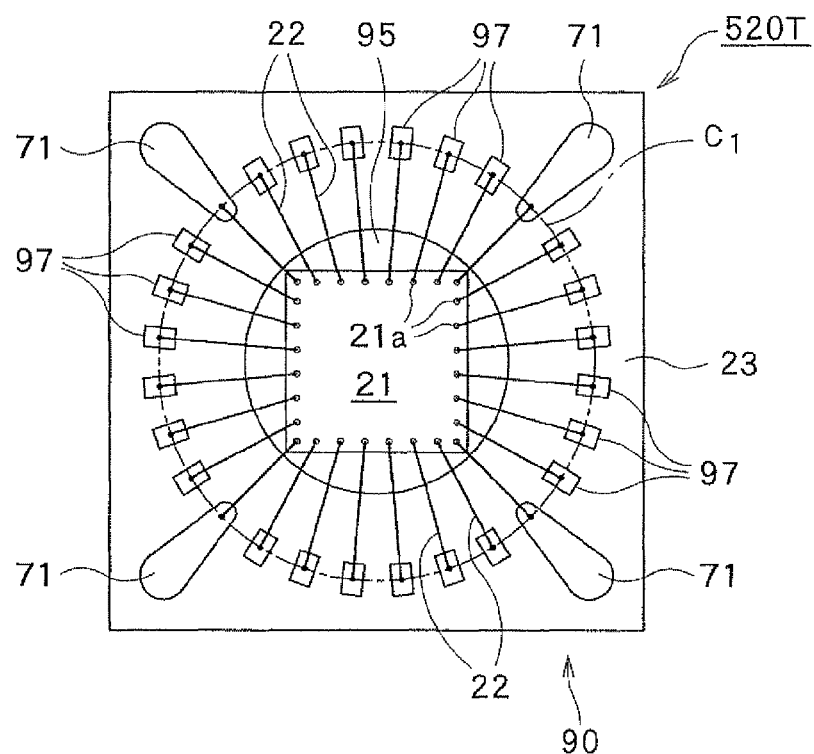
Figure 181:
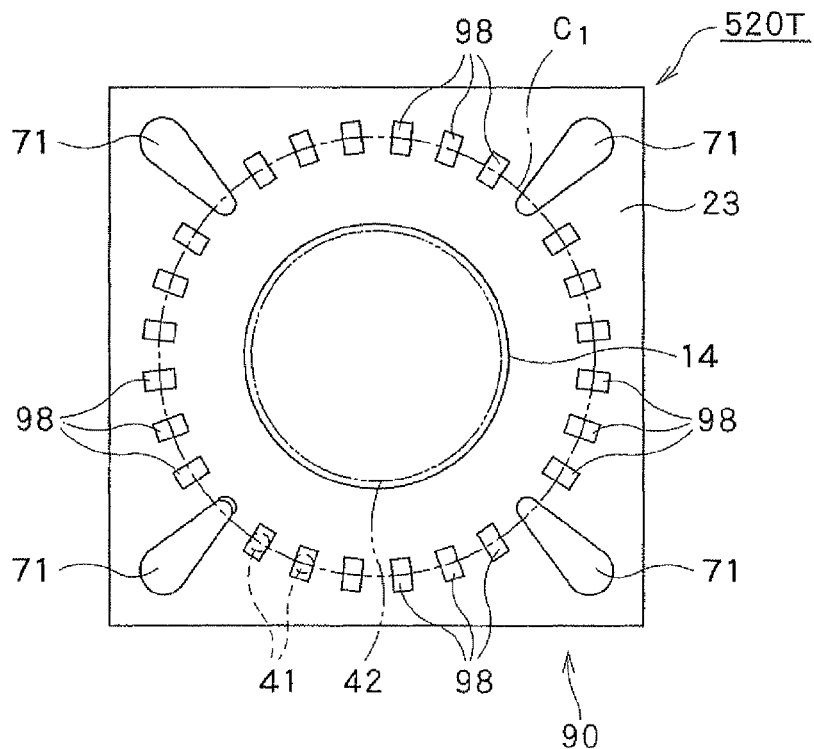
Figure 182:
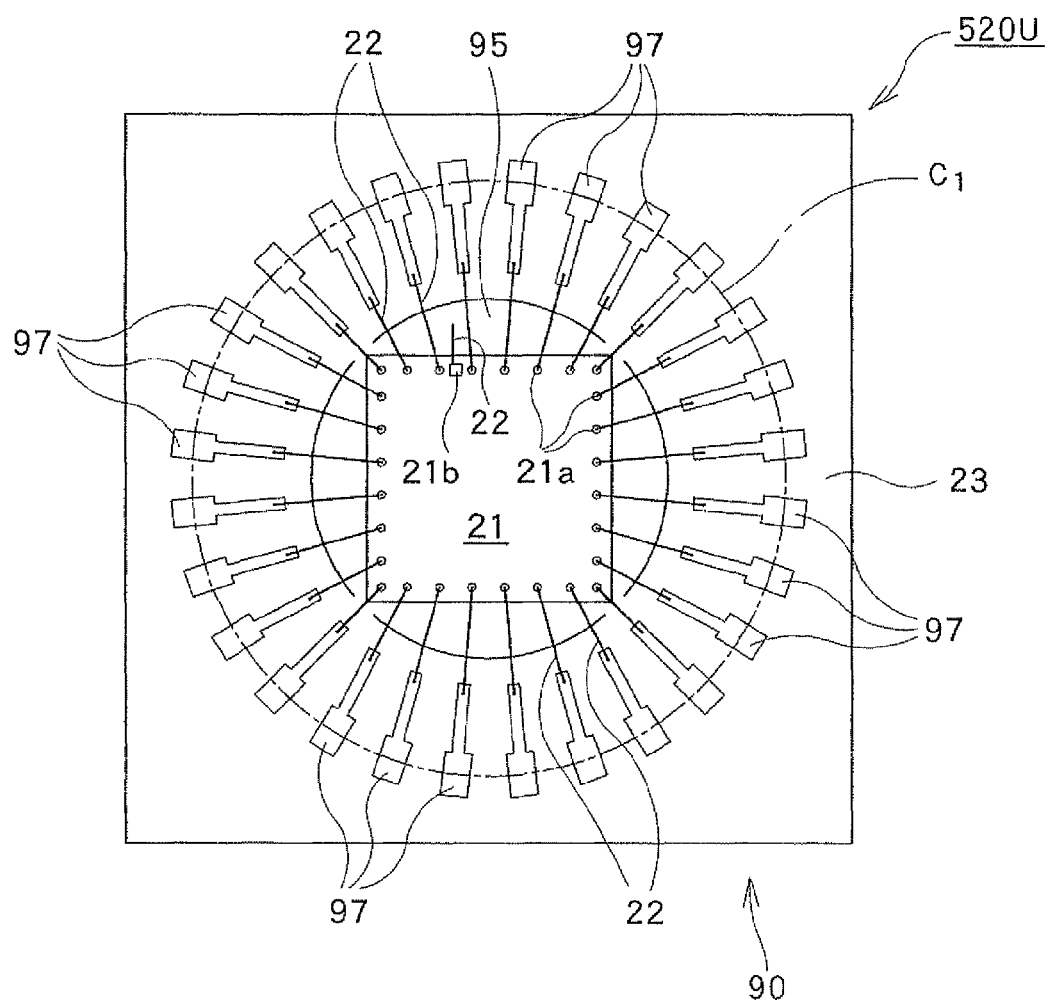
Figure 183:
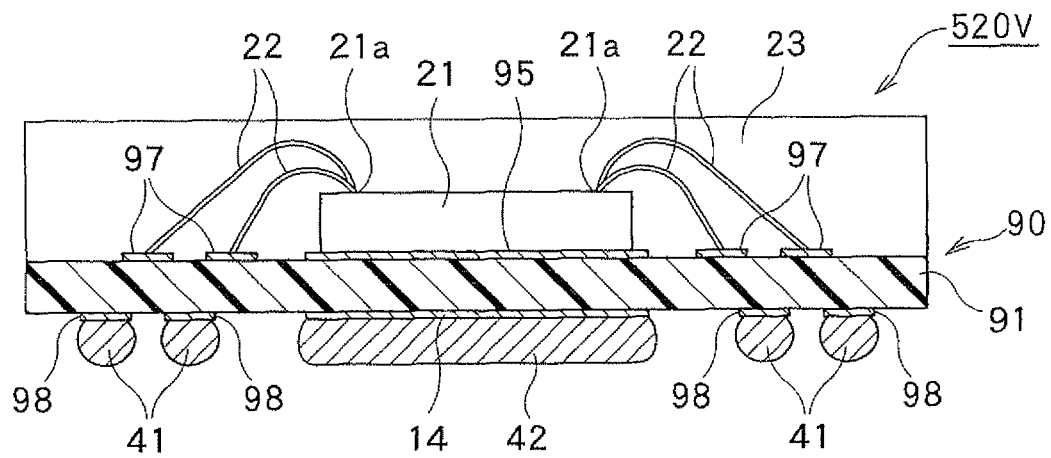
Figure 184:
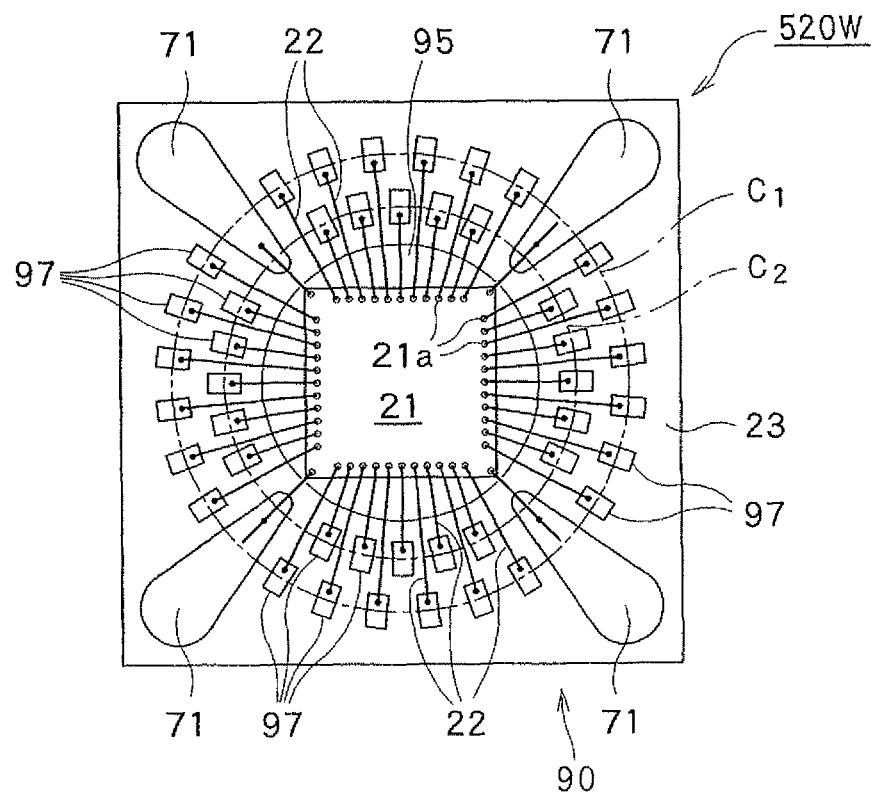
Figure 185:
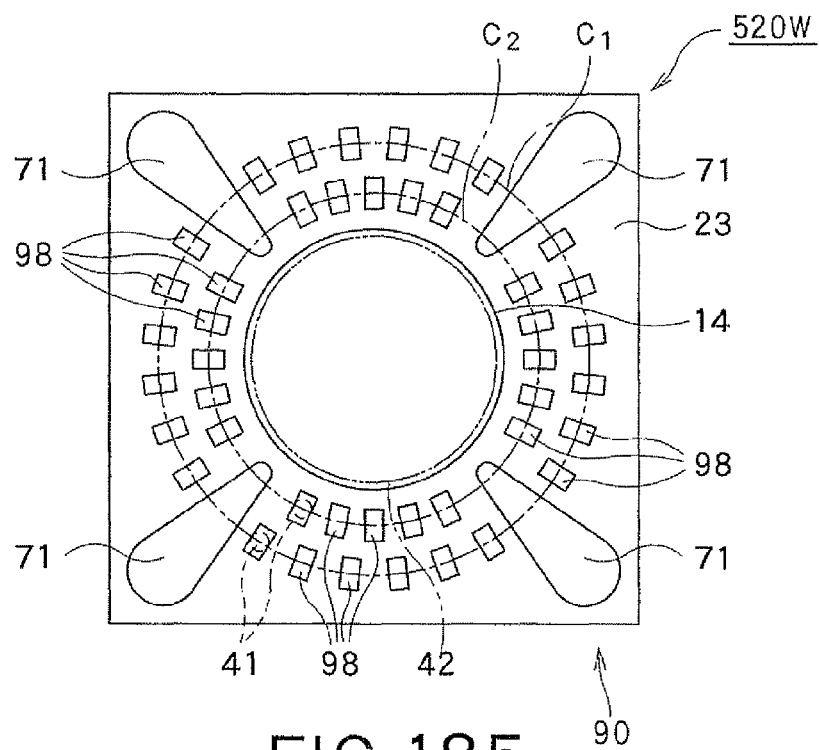
Figure 186:
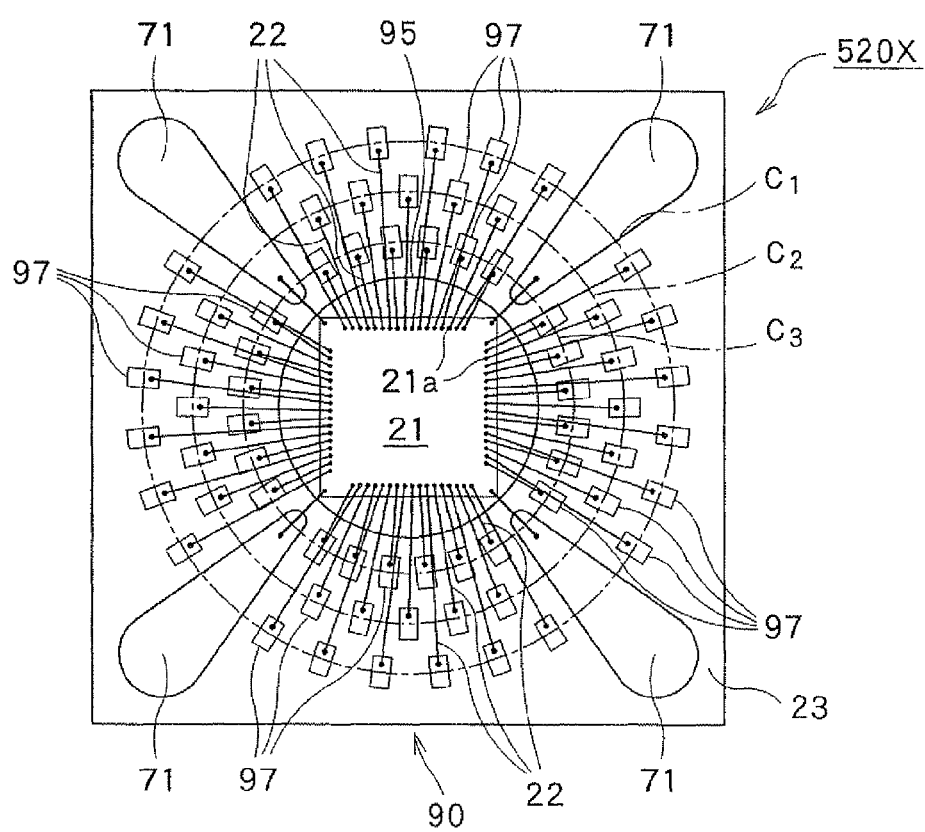
Figure 187:
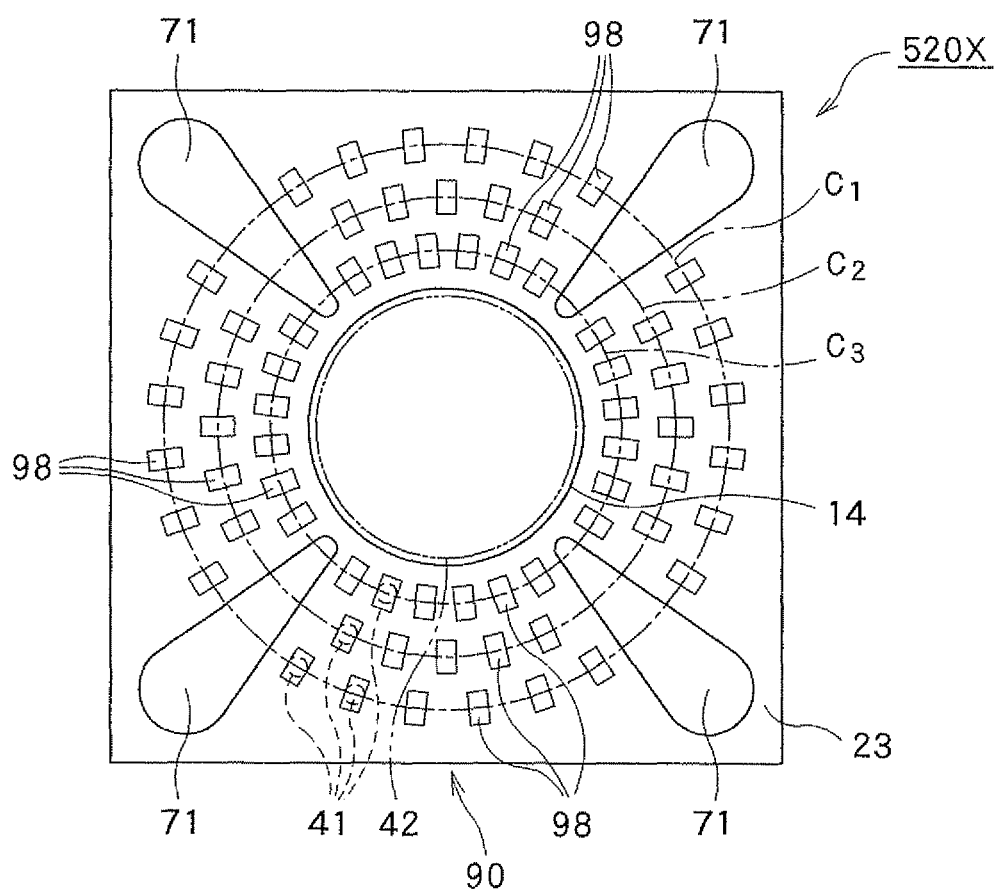
Figure 188:
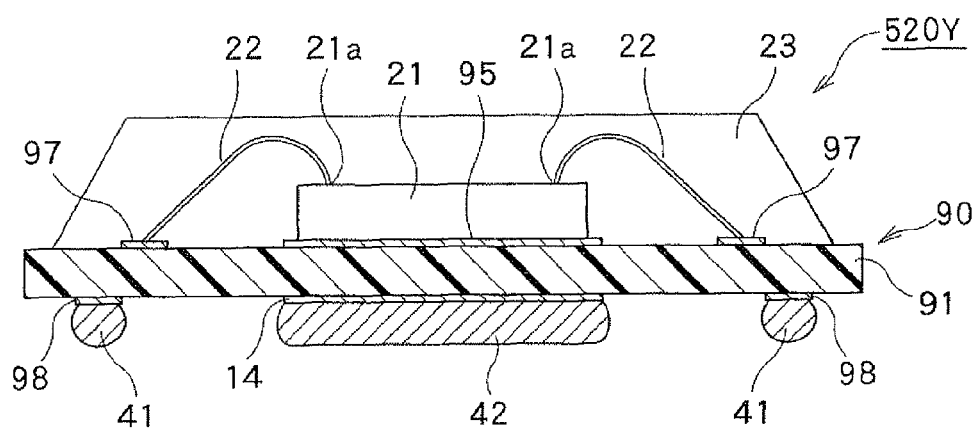
Figure 189:
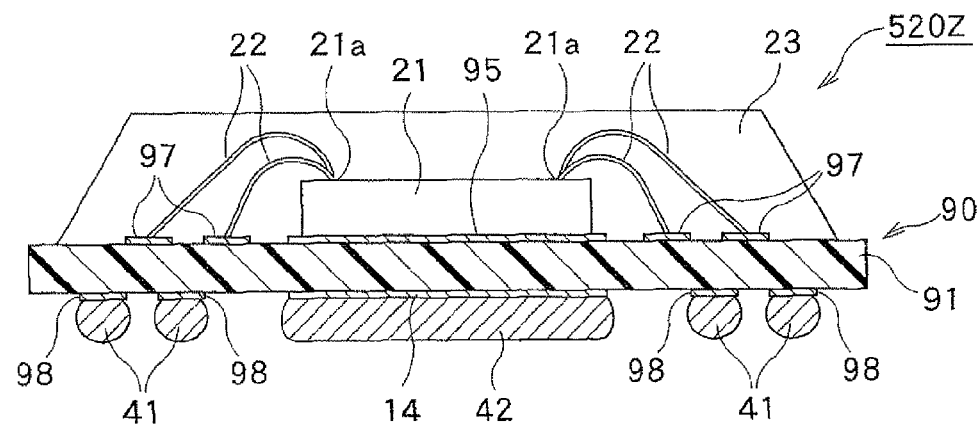
Figure 190:
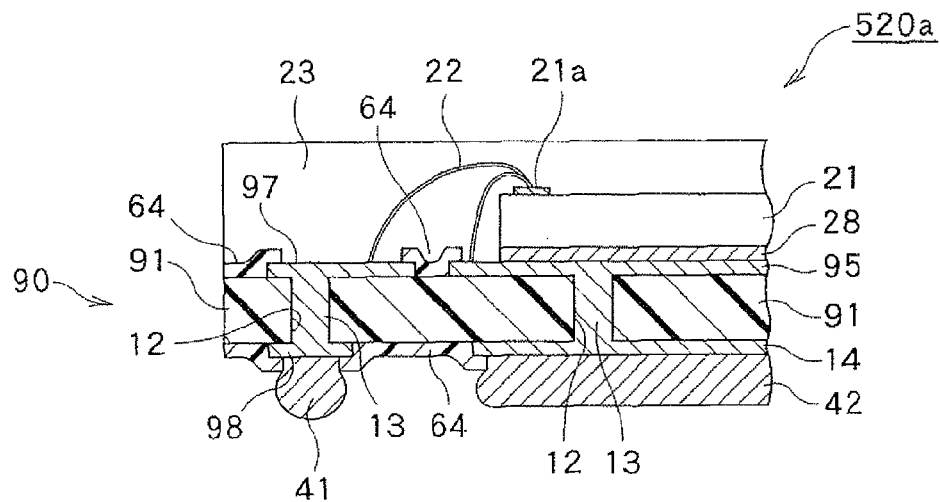
Figure 191:
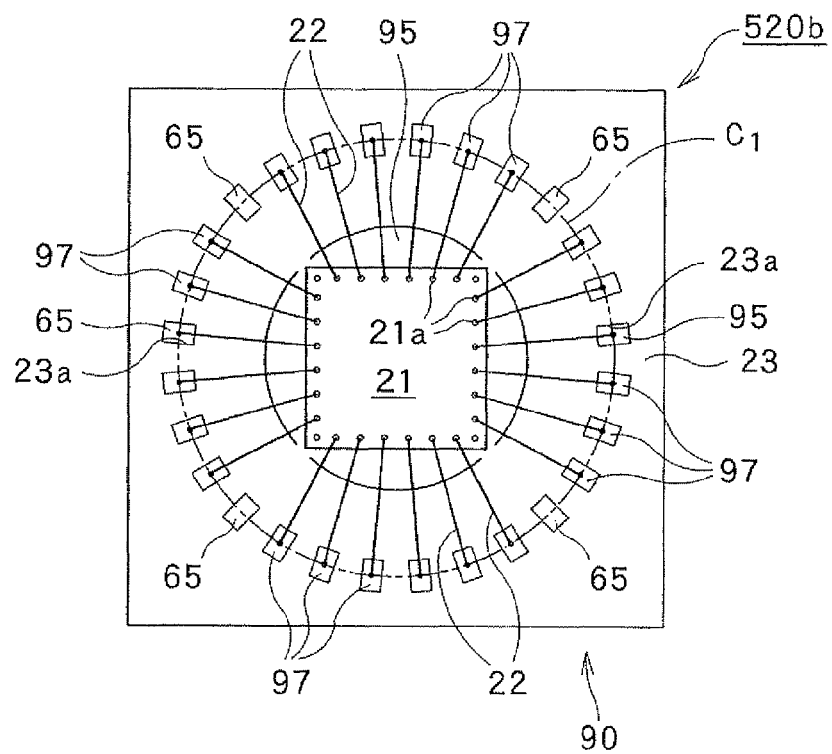
Figure 192:
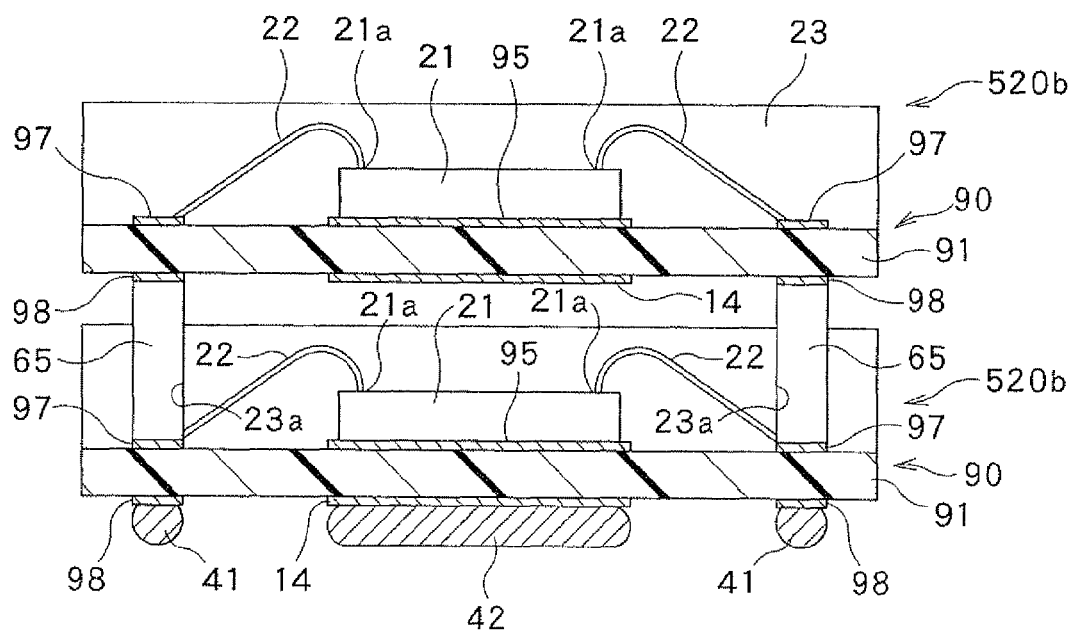

FIG. 132 is a bottom view showing the semiconductor device according to the fourteenth variation of the fourth embodiment of the present invention (i.e., variation 4-14);

FIG. 133 is a plan view showing a semiconductor device according to a fifteenth variation of the fourth embodiment of the present invention (i.e., variation 4-15);

FIG. 134 is a bottom view showing the semiconductor device according to the fifteenth variation of the fourth embodiment of the present invention (i.e., variation 4-15);

FIG. 135 is a plan view showing a semiconductor device according to a sixteenth variation of the fourth embodiment of the present invention (i.e., variation 4-16);

FIG. 136 is a bottom view showing the semiconductor device according to the sixteenth variation of the fourth embodiment of the present invention (i.e., variation 4-16);

FIG. 137 is a plan view showing a semiconductor device according to a seventeenth variation of the fourth embodiment of the present invention (i.e., variation 4-17);

FIG. 138 is a cross-sectional view showing the semiconductor device according to the seventeenth variation of the fourth embodiment of the present invention (i.e., variation 4-17);

FIG. 139 is a perspective view showing a semiconductor device according to a fifth embodiment of the present invention;

FIG. 140 is a cross-sectional view (taken along line J-J in FIG. 139) that shows the semiconductor device according to the fifth embodiment of the present invention;

FIG. 141 is a plan view showing the semiconductor device according to the fifth embodiment of the present invention;

FIG. 142 is a bottom view showing the semiconductor device according to the fifth embodiment of the present invention;

FIG. 143 is a partly enlarged view showing the semiconductor device according to the fifth embodiment of the present invention;

FIG. 144 is a partly enlarged cross-sectional view showing a method of manufacturing the semiconductor device according to the fifth embodiment of the present invention;

FIG. 145 is another partly enlarged cross-sectional view showing the method of manufacturing the semiconductor device according to the fifth embodiment of the present invention;

FIG. 146 is a cross-sectional view showing a state in which the semiconductor device according to the fifth embodiment of the present invention is mounted on a mounting substrate;

FIG. 147 is a plan view showing a semiconductor device according to a first variation of the fifth embodiment of the present invention (i.e., variation 5-1);

FIG. 148 is a bottom view showing the semiconductor device according to the first variation of the fifth embodiment of the present invention (i.e., variation 5-1);

FIG. 149 is a plan view showing a semiconductor device according to a second variation of the fifth embodiment of the present invention (i.e., variation 5-2);

FIG. 150 is a bottom view showing the semiconductor device according to the second variation of the fifth embodiment of the present invention (i.e., variation 5-2);

FIG. 151 is a cross-sectional view showing a semiconductor device according to a third variation of the fifth embodiment of the present invention (i.e., variation 5-3);

FIG. 152 is a plan view showing the semiconductor device according to the third variation of the fifth embodiment of the present invention (i.e., variation 5-3);

FIG. 153 is a bottom view showing the semiconductor device according to the third variation of the fifth embodiment of the present invention (i.e., variation 5-3);

FIG. 154 is a plan view showing a semiconductor device according to a fourth variation of the fifth embodiment of the present invention (i.e., variation 5-4);

FIG. 155 is a bottom view showing the semiconductor device according to the fourth variation of the fifth embodiment of the present invention (i.e., variation 5-4);

FIG. 156 is a plan view showing a semiconductor device according to a fifth variation of the fifth embodiment of the present invention (i.e., variation 5-5);

FIG. 157 is a bottom view showing the semiconductor device according to the fifth variation of the fifth embodiment of the present invention (i.e., variation 5-5);

FIG. 158 is a cross-sectional view showing a semiconductor device according to a sixth variation of the fifth embodiment of the present invention (i.e., variation 5-6);

FIG. 159 is a plan view showing the semiconductor device according to the sixth variation of the fifth embodiment of the present invention (i.e., variation 5-6);

FIG. 160 is a bottom view showing the semiconductor device according to the sixth variation of the fifth embodiment of the present invention (i.e., variation 5-6);

FIG. 161 is a plan view showing a semiconductor device according to a seventh variation of the fifth embodiment of the present invention (i.e., variation 5-7);

FIG. 162 is a bottom view showing the semiconductor device according to the seventh variation of the fifth embodiment of the present invention (i.e., variation 5-7);

FIG. 163 is a plan view showing a semiconductor device according to an eighth variation of the fifth embodiment of the present invention (i.e., variation 5-8);

FIG. 164 is a bottom view showing the semiconductor device according to the eighth variation of the fifth embodiment of the present invention (i.e., variation 5-8);

FIG. 165 is a plan view showing a semiconductor device according to a ninth variation of the fifth embodiment of the present invention (i.e., variation 5-9);

FIG. 166 is a bottom view showing the semiconductor device according to the ninth variation of the fifth embodiment of the present invention (i.e., variation 5-9);

FIG. 167 is a cross-sectional view showing a semiconductor device according to a tenth variation of the fifth embodiment of the present invention (i.e., variation 5-10);

FIG. 168 is a bottom view showing the semiconductor device according to the tenth variation of the fifth embodiment of the present invention (i.e., variation 5-10);

FIG. 169 is a cross-sectional view showing a semiconductor device according to an eleventh variation of the fifth embodiment of the present invention (i.e., variation 5-11);

FIG. 170 is a cross-sectional view showing a semiconductor device according to a twelfth variation of the fifth embodiment of the present invention (i.e., variation 5-12);

FIG. 171 is a partly enlarged cross-sectional view showing a semiconductor device according to a thirteenth variation of the fifth embodiment of the present invention (i.e., variation 5-13);

FIG. 172 is a plan view showing a semiconductor device according to a fourteenth variation of the fifth embodiment of the present invention (i.e., variation 5-14);

FIG. 173 is a bottom view showing a semiconductor device according to a fifteenth variation of the fifth embodiment of the present invention (i.e., variation 5-15);

FIG. 174 is a bottom view showing a semiconductor device according to a sixteenth variation of the fifth embodiment of the present invention (i.e., variation 5-16);

FIG. 175 is a partly enlarged cross-sectional view showing a semiconductor device according to a seventeenth variation of the fifth embodiment of the present invention (i.e., variation 5-17);

FIG. 176 is a partly enlarged cross-sectional view showing a method of manufacturing the semiconductor device according to the seventeenth variation of the fifth embodiment of the present invention (i.e., variation 5-17);

FIG. 177 is another partly enlarged cross-sectional view showing the method of manufacturing the semiconductor device according to the seventeenth variation of the fifth embodiment of the present invention (i.e., variation 5-17);

FIG. 178 is a plan view showing a semiconductor device according to an eighteenth variation of the fifth embodiment of the present invention (i.e., variation 5-18);

FIG. 179 is a cross-sectional view showing a state in which the semiconductor device according to the eighteenth variation of the fifth embodiment of the present invention is mounted on a mounting substrate (i.e., variation 5-18);

FIG. 180 is a plan view showing a semiconductor device according to a nineteenth variation of the fifth embodiment of the present invention (i.e., variation 5-19);

FIG. 181 is a bottom view showing the semiconductor device according to the nineteenth variation of the fifth embodiment of the present invention (i.e., variation 5-19);

FIG. 182 is a plan view showing a semiconductor device according to a twentieth variation of the fifth embodiment of the present invention (i.e., variation 5-20);

FIG. 183 is a cross-sectional view showing a semiconductor device according to a twenty-first variation of the fifth embodiment of the present invention (i.e., variation 5-21);

FIG. 184 is a plan view showing a semiconductor device according to a twenty-second variation of the fifth embodiment of the present invention (i.e., variation 5-22);

FIG. 185 is a bottom view showing the semiconductor device according to the twenty-second variation of the fifth embodiment of the present invention (i.e., variation 5-22);

FIG. 186 is a plan view showing a semiconductor device according to a twenty-third variation of the fifth embodiment of the present invention (i.e., variation 5-23);

FIG. 187 is a bottom view showing the semiconductor device according to the twenty-third variation of the fifth embodiment of the present invention (i.e., variation 5-23);

FIG. 188 is a cross-sectional view showing a semiconductor device according to a twenty-fourth variation of the fifth embodiment of the present invention (i.e., variation 5-24);

FIG. 189 is a cross-sectional view showing a semiconductor device according to a twenty-fifth variation of the fifth embodiment of the present invention (i.e., variation 5-25);

FIG. 190 is a partly enlarged cross-sectional view showing a semiconductor device according to a twenty-sixth variation of the fifth embodiment of the present invention (i.e., variation 5-26);

FIG. 191 is a plan view showing a semiconductor device according to a twenty-seventh variation of the fifth embodiment of the present invention (i.e., variation 5-27); and FIG. 192 is a cross-sectional view showing the semiconductor device according to the twenty-seventh variation of the fifth embodiment of the present invention (i.e., variation 5-27).

DESCRIPTION OF THE PREFERRED EMBODIMENTS

First Embodiment

Hereunder, a first embodiment of the present invention will be described referring to FIGS. 1 to 32.

Semiconductor Device Configuration

Figure 1:
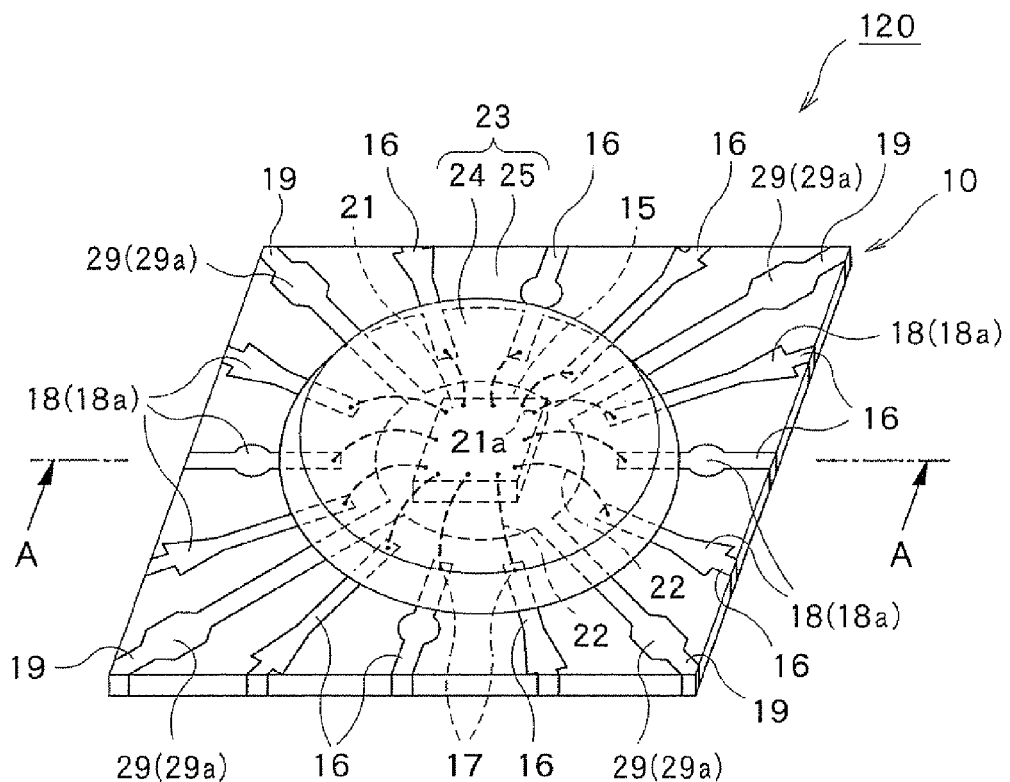
FIG. 1 is a perspective view showing a semiconductor device according to a first embodiment of the present invention.

First, a semiconductor device according to the first embodiment of the present invention is described below per FIGS. 1 to 6. FIGS. 1 to 6 show the semiconductor device according to the first embodiment of the present invention. For convenience' sake, the number of leads shown in FIG. 1 is smaller than actually used. The same also applies to FIGS. 10, 12, 14, 16, and 18.

As shown in FIGS. 1 to 4, the semiconductor device 120 includes a lead frame 10 that has a die pad 15 and a plurality of leads 16 arranged around the die pad 15. The semiconductor device 120 also includes a semiconductor element 21 rested on the die pad 15 of the lead frame 10, and a plurality of bonding wires 22 (electroconductive portions) that each electrically interconnect one of the leads 16 and the semiconductor element 21. The lead frame 10, the semiconductor element 21, and the bonding wires 22 are resin sealed with a sealing resin section 23. The semiconductor device 120 has a rectangular shape in a plane view.

The sealing resin section 23 includes a central region 24 provided over and around the semiconductor element 21, and a marginal region 25 provided in the periphery of the central region 24. The central region 24 protrudes upward compared to the surface of the marginal region 25, and thickness of the central region 24 is greater than that of the marginal region 25. An upper surface of the marginal region 25 is on the same plane as an upper surface 16a of the lead 16. That is, the lead 16 is exposed to the exterior at an upper-surface of the marginal region 25. Thus, the sealing resin section 23 as a whole is formed in a hat-like shape.

In addition, as shown in FIG. 1, the central region 24 of the sealing resin section 23 is of a truncated conical shape. In other words, the central region 24 has a flat upper surface and a side face with an inclined tapered form. When the side face of the central region 24 has such tapered form, a thermal expansion coefficient of the area between the central region 24 and the marginal region 25 changes gradually, and thus sudden changes in the thermal expansion coefficient can be alleviated. The sealing resin section 23 may be a thermosetting resin such as a silicone resin or an epoxy resin, or a thermoplastic resin such as a polyphenylene sulfide (PPS) resin.

The lead frame 10 as a whole is composed of metallic materials such as copper, copper alloy, and alloy 42 (Fe alloy with 42% Ni). The die pad 15 and leads 16 of the lead frame 10 are each formed by, for example, etching one metallic substrate composed of those metallic materials.

Figure 2:
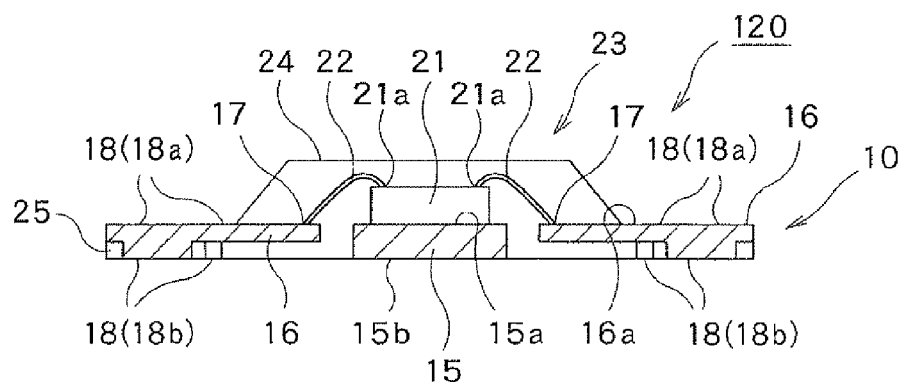
FIG. 2 is a cross-sectional view (taken along line A-A in FIG. 1) that shows the semiconductor device according to the first embodiment of the present invention.
Figure 4:
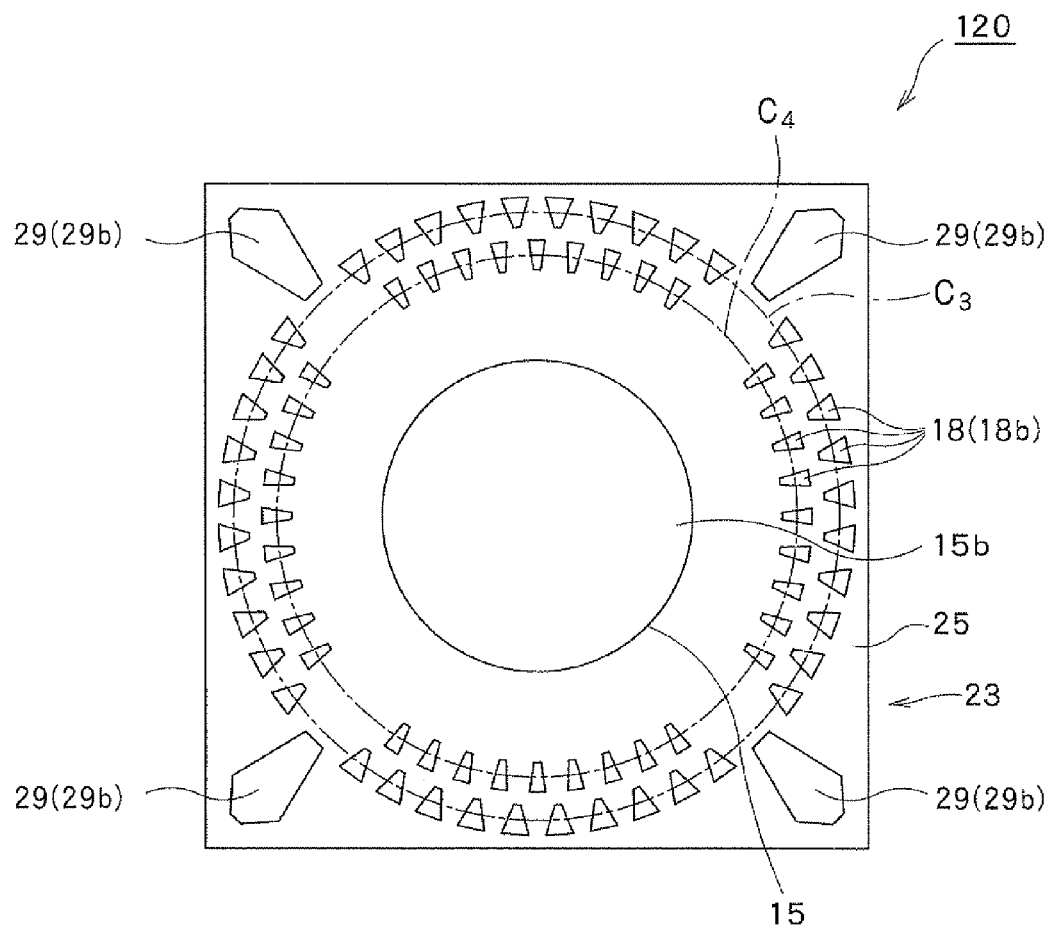
FIG. 4 is a bottom view showing the semiconductor device according to the first embodiment of the present invention.

As shown in FIGS. 1 and 4, the die pad 15 is circular in both top view and bottom view. In addition, as shown in FIG. 2, a lower surface 15b of the die pad 15 is exposed to the exterior of the sealing resin section 23. The upper surface of the die pad 15, on the other hand, serves as a resting surface for the semiconductor element 21 and is completely shrouded in the central region 24 of the sealing resin section 23.

The leads 16 each have a band-like shape radially extending outward from a side of the die pad 15, and adjacent leads 16 are electrically insulated from each other. Each lead 16 also includes an internal terminal 17 to which the bonding wire 22 is connected, and external terminals 18 provided in a radially external direction relative to the internal terminal 17. The external terminals 18 are exposed to the exterior. In this case, each lead 16 includes two external terminals 18. One external terminal is an upper terminal 18a provided on the upper surface of the lead 16, and the other external terminal is a lower terminal 18b provided on a lower surface of the lead 16.

Figure 5:
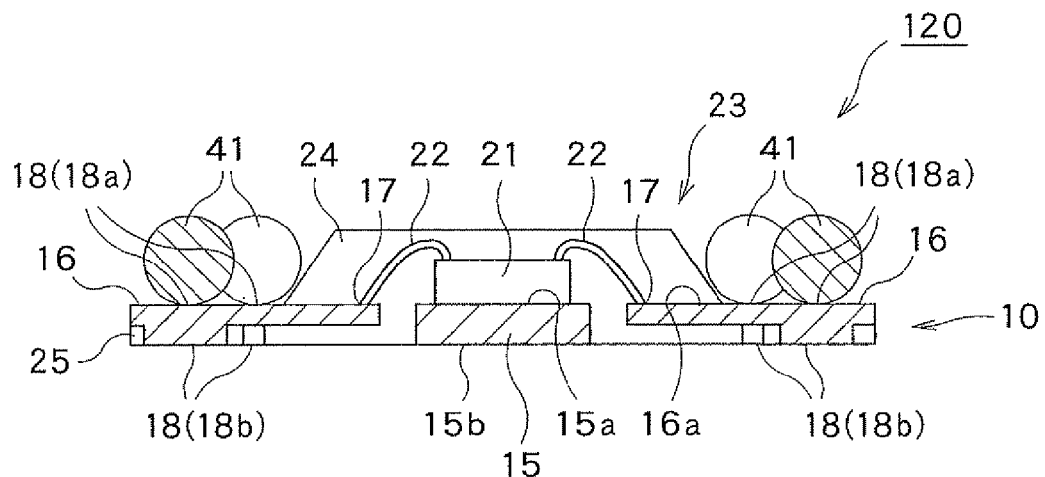
FIG. 5 is another cross-sectional view showing the semiconductor device according to the first embodiment of the present invention.
Figure 6:
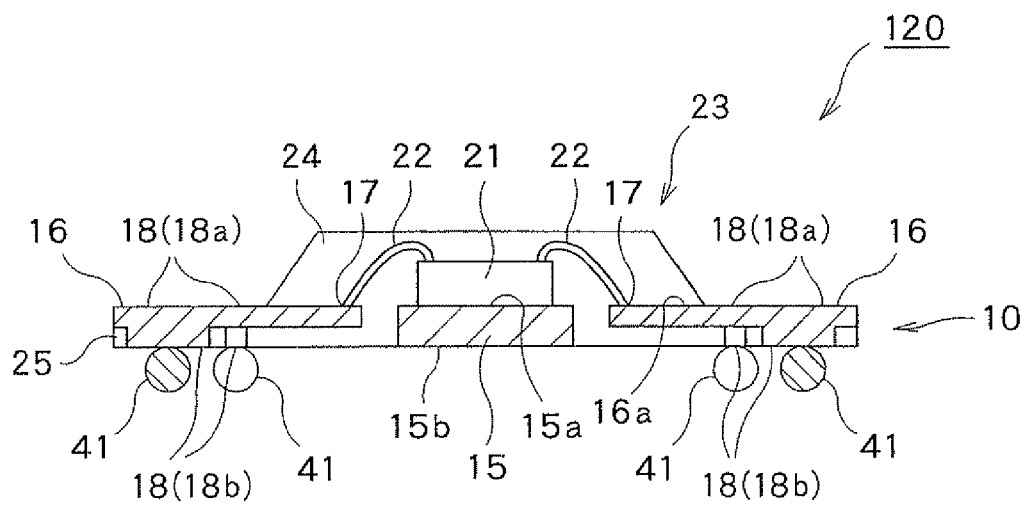
FIG. 6 is yet another cross-sectional view showing the semiconductor device according to the first embodiment of the present invention.
Figure 7:
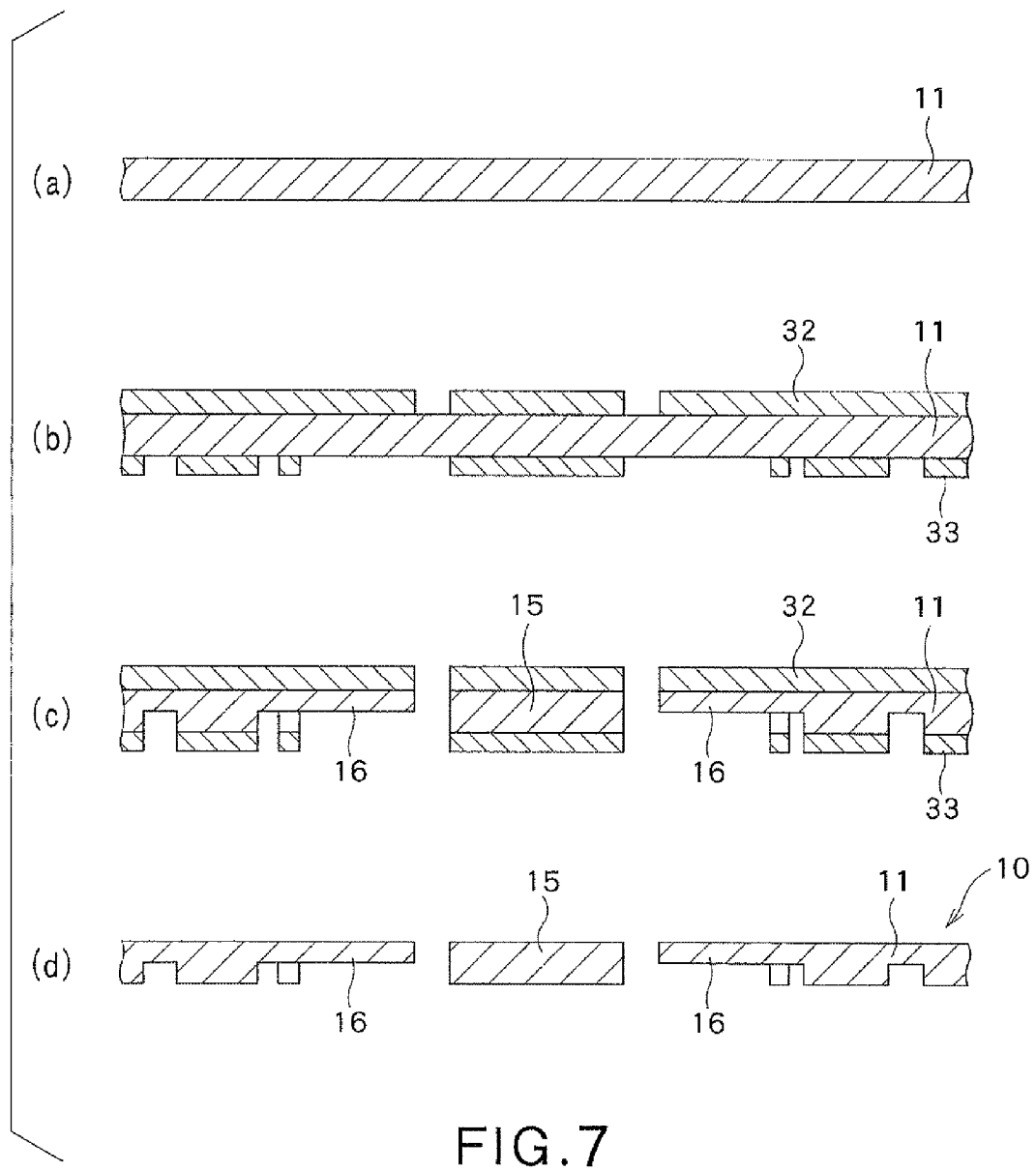
FIG. 7 is a cross-sectional view showing a method of manufacturing a lead frame.
Figure 8:
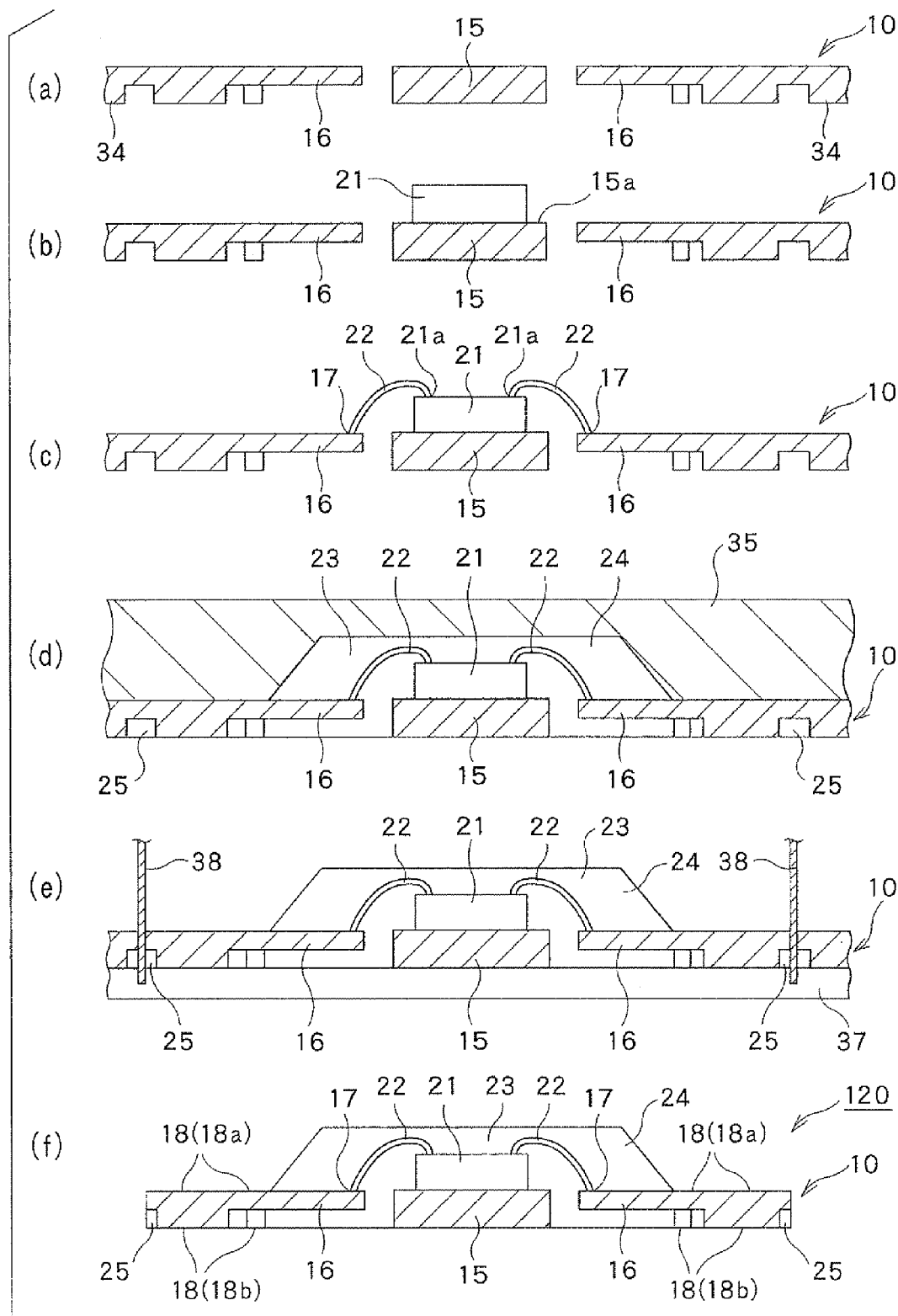
FIG. 8 is a cross-sectional view showing a method of manufacturing the semiconductor device according to the first embodiment of the present invention.

As shown in FIGS. 5 and 6, a solder ball 41 (solder portion) can be provided on each of the external terminals 18 (the upper terminal 18a and the lower terminal 18b). FIG. 5 shows an example where the solder ball 41 is provided on the upper terminal 18a, and FIG. 6 shows an example where the solder ball 41 is provided on the lower terminal 18b. As shown in FIG. 5, if the solder ball 41 is to be provided on the upper terminal 18a of each lead 16, the height of each solder ball 41 is preferably greater than that of the central region 24 (the height of the central region 24 above the upper surface 16a of the lead 16). In the present embodiment, the central region 24 of the sealing resin section 23 is thicker than the marginal region 25, as described above. The solder ball 41 can therefore be provided on each upper terminal 18a of the marginal region 25, and consequently the entire semiconductor device 120 including the solder balls 41 can be reduced in thickness.

Figure 3:
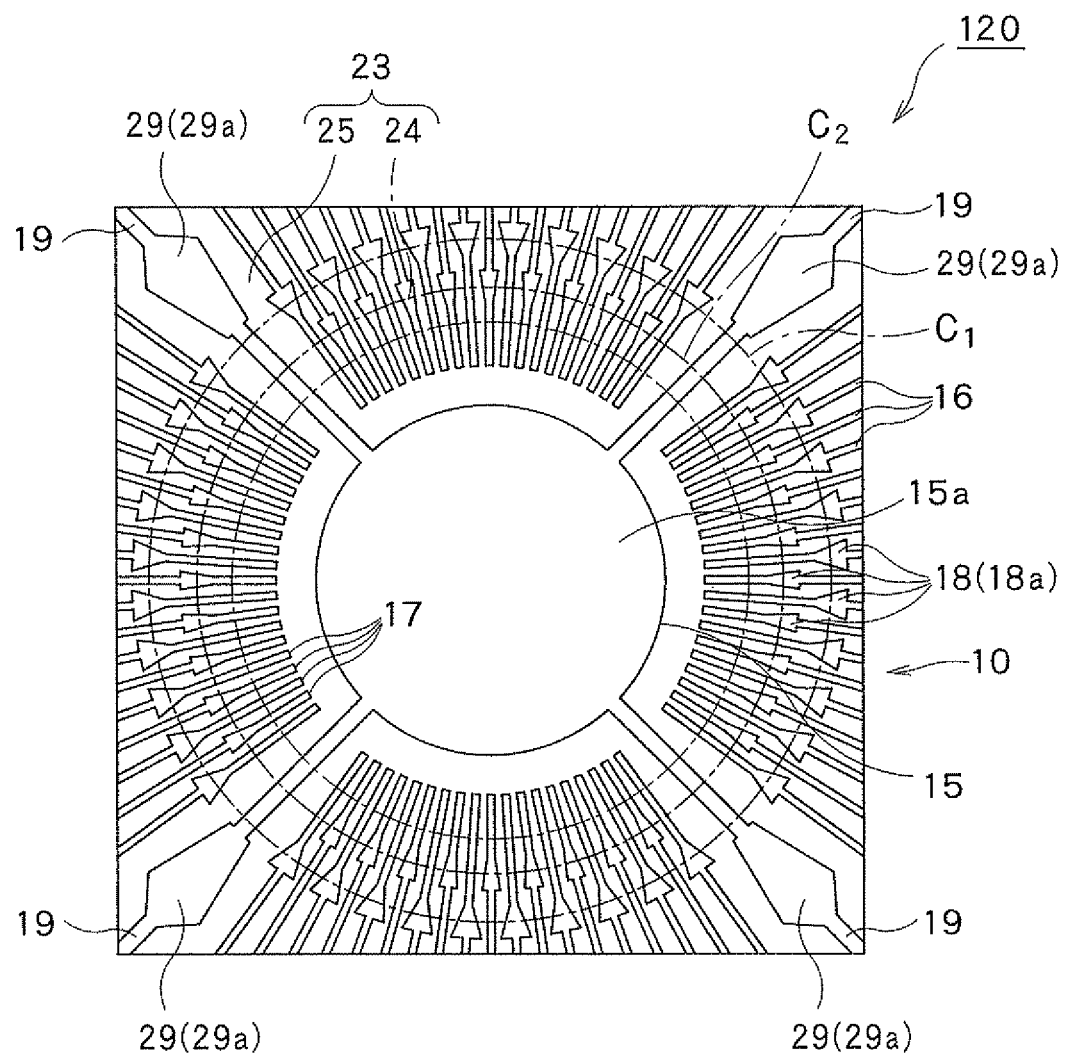
FIG. 3 is a plan view showing the semiconductor device according to the first embodiment of the present invention, of which portions above the surface of leads being omitted from the view.

Additionally, as shown in FIGS. 3 and 4, the external terminals 18 (upper terminals 18a and lower terminals 18b) of the leads 16 are arranged on circumferences in a plane view. More specifically, as shown in FIG. 3, the upper terminals 18a are arranged on either of two circumferences $C_1$ and $C_2$, in a staggered layout viewed as a whole. The circumferences $C_1$ and $C_2$ are concentric with each other and the diameter of the circumference $C_1$ is greater. In order to arrange the upper terminals 18a in a dense layout, each upper terminal 18a is preferably of a shape that is narrowed down as it gets closer to the center of the circumference $C_1$ and $C_2$. An example of such a shape is a trapezoidal shape shown in FIG. 3. In addition, for a similar reason, upper terminals 18a arranged on the inner circumference $C_2$ are preferred to have a smaller size than that of upper terminals 18a arranged on the outer circumference $C_1$.

In a lower surface of the semiconductor device 120 shown in FIG. 4, the lower terminals 18b are arranged similarly to the upper terminals 18a. The lower terminals 18b are arranged on either of two circumferences, $C_3$ and $C_4$, in a staggered layout. The circumferences $C_3$ and $C_4$ are concentric with each other and the diameter of the circumference $C_3$ is greater. The shape of the lower terminals 18b is also similar to that of the upper terminals 18a. Each lower terminal 18b is preferably of a shape that narrows down its width as it gets closer to the center of the circumference $C_3$ and $C_4$. The lower terminals 18b arranged on the inner circumference $C_4$ are preferred to have a size smaller than that of the lower terminals 18b arranged on the outer circumference $C_3$. Layout of the external terminals 18 (the upper terminals 18a and the lower terminals 18b) are not limited to the described example, and the external terminals 18 may be on one, three, or more circumferences.

Meanwhile, hanging leads 19 each having an external terminal 29 are connected to the die pad 15, as shown in FIGS. 1 and 3. Each of the hanging leads 19 is provided at four corners of the die pad 15 and extends radially from the pad 15. The external terminal 29 of the hanging lead 19 has an upper terminal 29a (see FIGS. 1 and 3) that is provided at an upper-surface of the hanging lead 19, and a lower terminal 29b (see FIG. 4) that is provided at a lower-surface of the hanging lead 19. The external terminal 29 (the upper terminal 29a and the lower terminal 29b) can be used as a grounding (GND) terminal, for example. Adopting the construction described above enables effective use of the hanging leads 19 and the external terminals 29. The number of hanging leads 19 is not limited to four and may be two or others.

Referring to FIGS. 1 and 2, the semiconductor element 21 may be of any conventional type commonly used, for example, an integrated circuit, a large-scale integrated circuit, a transistor, a thyristor, a diode, or the like (not limited to these). The semiconductor element 21 includes a plurality of terminals 21a each fitted with a bonding wire 22. The semiconductor element 21 is also fixed to the upper surface 15a of the die pad 15 by means of a die-bonding paste, for example.

Each bonding wire 22 is formed from a highly electroconductive material such as gold. One end of the bonding wire 22 is connected to one terminal 21a of the semiconductor element 21, and the other end is connected to the internal terminal 17 of one lead 16.

Method of Manufacturing the Semiconductor Device

Next, a method of manufacturing the semiconductor device 120 shown in FIGS. 1 to 4 is described below using FIGS. 7(a) to 7(d) and 8(a) to 8(f). While the following description refers to processes for manufacturing a plurality of semiconductor devices 120 from one metallic substrate 11, the present invention is not limited to the description and one semiconductor device 120 may be manufactured from one metallic substrate 11.

First, as shown in FIG. 7(a), the metallic substrate 11 constituting the lead frame 10 is provided. A substrate formed of materials such as copper, copper alloy, and alloy 42 (Fe alloy with 42% Ni), as described above, can be used as the metallic substrate 11. The metallic substrate 11 is preferred to have both of its upper and lower surfaces being cleaned by degreasing or the like.

Next, the upper and lower surfaces of the metallic substrate 11 are coated with a photosensitive resist, then dried, and exposed to light via a desired photomask. After the exposure, developing is conducted to form resist layers 32 and 33 for etching, as shown in FIG. 7(b). The photosensitive resist can be a conventional, known one.

The metallic substrate 11 is next etched with an etchant by using the resist layers 32, 33 as corrosion-resistant films (see FIG. 7(c)). An appropriate etchant is selected according to the material of the metallic substrate 11. For example, if copper is used as the material of the metallic substrate 11, spray etching with a ferric chloride solution is usually performed to both surfaces of the metallic substrate 11.

After etching, the resist layers 32, 33 for etching are stripped and removed. Thus, the lead frame 10 including the die pad 15 and the leads 16 arranged around the pad 15 is obtained (FIG. 7(d)).

The thus-obtained lead frame 10 is a muiltifaced lead frame that includes a plurality of die pads 15 and a plurality of leads 16. Each die pad 15 and each lead 16 are interconnected via a tie bar 34, as shown in FIG. 8(a).

Next, the semiconductor element 21 is mounted on the upper surface 15a of the die pad 15 of the lead frame 10. In this case, the semiconductor element 21 is rested on and fixed to the upper surface 15a of the die pad 15 using a die-bonding paste (die attachment), as shown in FIG. 8(b).

After die attachment, the terminals 21a of the semiconductor element 21 and the internal terminals 17 of each lead 16 are electrically interconnected by bonding wires 22 (wire bonding), as shown in FIG. 8(c).

Next, a thermosetting resin or a thermoplastic resin is injection molded or transfer molded with a mold 35 to form a sealing resin section 23 on the lead frame 10, as shown in FIG. 8(d). The lead frame 10, the semiconductor element 21, and the bonding wires 22 are thereby sealed. A central region 24 is formed over and around the semiconductor element 21, and a marginal region 25 is formed in the periphery of the central region 24.

Next, the sealing resin section 23 between the semiconductor elements 21 is diced to separate the lead frame 10 for each semiconductor element 21, as shown in FIG. 8(e). The lead frame 10 is first rested on and fixed to the surface of a dicing tape 37. Then, the lead frame 10 and sealing resin section 23 between the semiconductor elements 21 are cut by a rotational blade 38 constructed of a diamond grinding wheel, for example.

Through these processes, the semiconductor device 120 shown in FIGS. 1 to 4 can be obtained (FIG. 8(f)).

Operational Effects of the Present Embodiment

Figure 9:
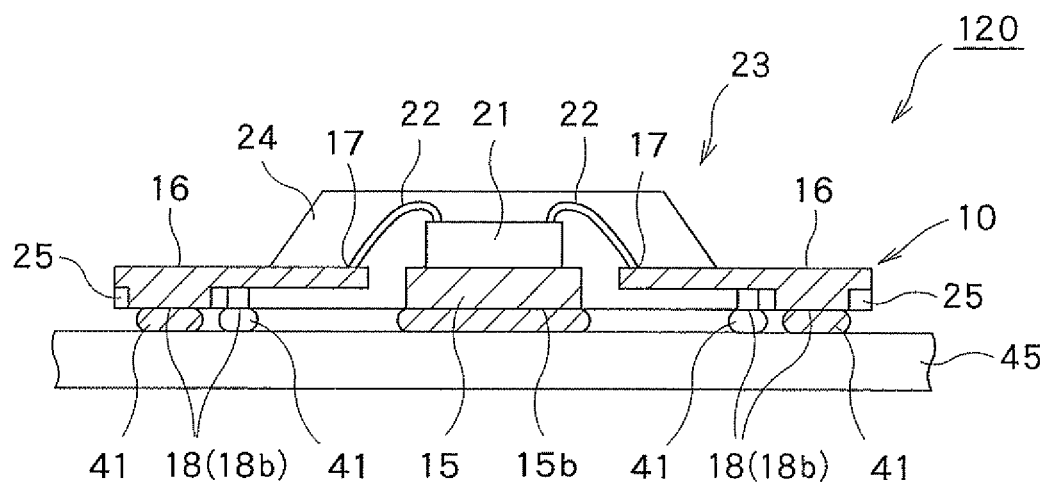
FIG. 9 is a cross-sectional view showing a state in which the semiconductor device according to the first embodiment of the present invention is mounted on a mounting substrate.

Next, operational effects of the thus-constructed present embodiment are described below using FIG. 9. FIG. 9 is a cross-sectional view showing a state in which the semiconductor device according to the present embodiment is mounted on a mounting substrate.

That is, as shown in FIG. 9, the semiconductor device 120 according to the present embodiment is disposed and mounted on the mounting substrate 45. In this case, the semiconductor device 120 is fixed to and mounted on the mounting substrate 45 by use of solder balls 41 and solder portion 42, respectively provided to the lower terminals 18b of each lead 16 and the lower surface 15b of the die pad 15. The mounting substrate 45 is formed primarily from a glass epoxy resin.

During the mounting to the mounting substrate 45 with soldering, or upon actual operation of the semiconductor device 120 (depending on the operational environment), the semiconductor device 120 may be subjected to various heat. In such case, if the thermal expansion coefficient of the entire semiconductor device 120 differs from that of the mounting substrate 45, the difference between them causes thermal stresses. This may particularly damage the solder balls 41 and solder portion 42 that are positioning between the semiconductor device 120 and the mounting substrate 45.

The lead frame 10 and the mounting substrate 45 generally have a relatively close thermal expansion coefficient. In contrast, the thermal expansion coefficient of the sealing resin section 23 is smaller than that of the lead frame 10. For example (not limited to the followings), a lead frame 10 formed of copper, the mounting substrate 45 formed primarily of a glass epoxy resin, and a sealing resin section 23 formed of an epoxy resin have thermal expansion coefficients of about $17\times10^{-6}$ (/K), about $16\times10^{-6}$ (/K), and about $10\times10^{-6}$ (/K), respectively. Additionally, a semiconductor element 21 formed of silicon (Si) has a thermal expansion coefficient of about $3.5\times10^{-6}$ (/K).

Therefore, as the rate of volume of the sealing resin section 23 to that of the semiconductor device 120 increases, the thermal expansion coefficient of the entire semiconductor device 120 tends to depart more significantly from that of the mounting substrate 45.

In the present embodiment, however, the central region 24 of the sealing resin section 23 is thicker than the marginal region 25 (i.e., the marginal region 25 is thinner), and the volume of the sealing resin section 23, whose thermal expansion coefficient is relatively low, is reduced. This in turn brings the thermal expansion coefficient of the entire semiconductor device 120 closer to that of the mounting substrate 45, reduces thermal stresses due to the application of heat to the semiconductor device 120, and improves mounting reliability.

In addition, according to the present embodiment, the external terminals 18 (upper terminals 18a and lower terminals 18b) of the leads 16 are arranged on the circumferences in a plane view. Thermal stresses caused by the difference in thermal expansion coefficient between the semiconductor device 120 and the mounting substrate 45 are therefore equally applied to the solder balls 41 of the external terminals 18. This prevents a specific solder ball 41 being damaged.

Furthermore, according to the present embodiment, the lower surface 15b of the die pad 15 is exposed to the exterior of the sealing resin section 23. The die pad 15 can be mounted on the mounting substrate 45 with solder portion 42 put on the entire lower surface 15b. Heat from the semiconductor element 21 can be released through the lower surface 15b of the die pad 15. Additionally, since the die pad 15 has a circular shape, when heat is applied to the semiconductor device 120, the thermal stresses caused by the difference in thermal expansion coefficient of the semiconductor device 120 and the mounting substrate 45 will be uniformly distributed in a circumferential direction. Therefore, heat would not concentrate to a specific portion of the solder portions 42 provided at the lower surface 15b of the die pad 15, and the solder portion 42 can be prevented from being damaged.

In the present embodiment, each lead 16 is exposed at the upper-surface of the marginal region 25 of the sealing resin section 23, and the upper terminals 18a are also provided at an upper-surface of each lead 16. Thus, the semiconductor device 120 can be tested using the upper terminals 18a only, without accidentally damaging the lower terminals 18b. The solder balls 41 can also be provided at the upper-surface side of each lead 16, which allows the semiconductor device 120 to have various ways of mounting. In addition, the thickness of the semiconductor device 120 including the solder balls 41 can be reduced.

Variations of the Semiconductor Device

Variations of the semiconductor device according to the present embodiment are described below per FIGS. 10 to 32. In each of these figures, the same constituent elements as those of the embodiment shown in FIGS. 1 to 9 are each assigned the same reference number or symbol, and detailed description of these elements is omitted.

(Variation 1-1)

Figure 10:
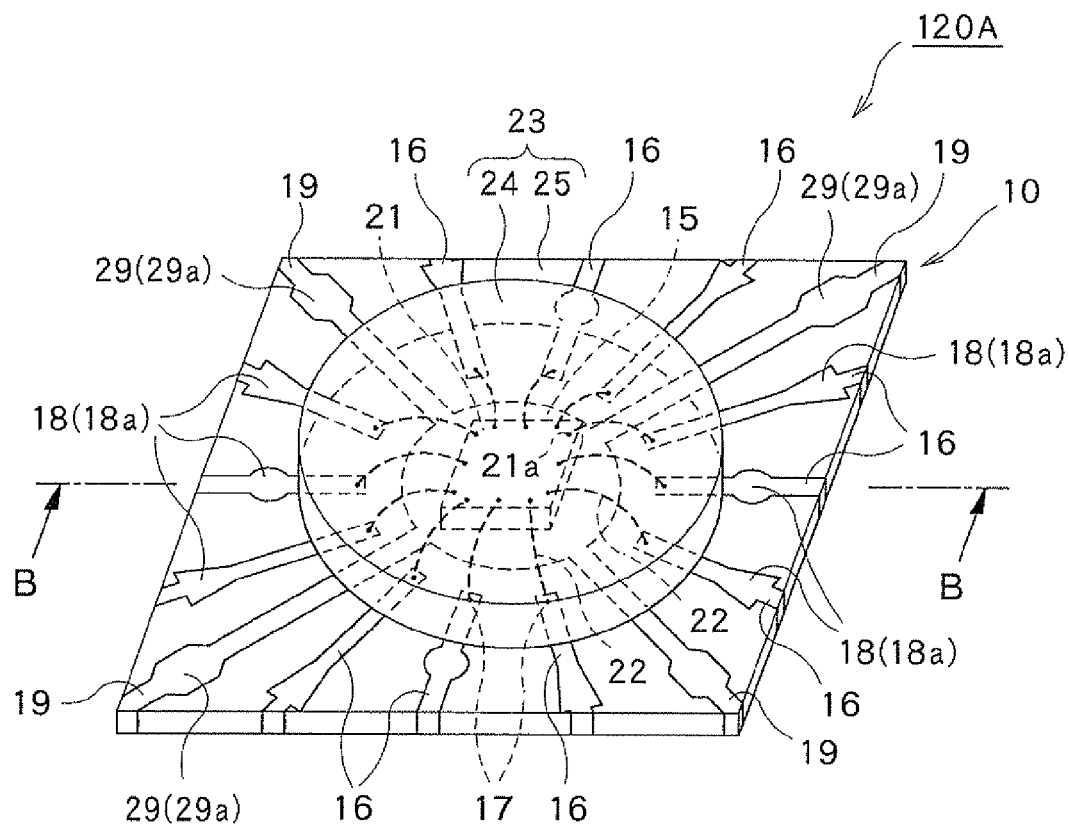
FIG. 10 is a perspective view showing a semiconductor device according to a first variation of the first embodiment of the present invention (i.e., variation 1-1)
Figure 11:
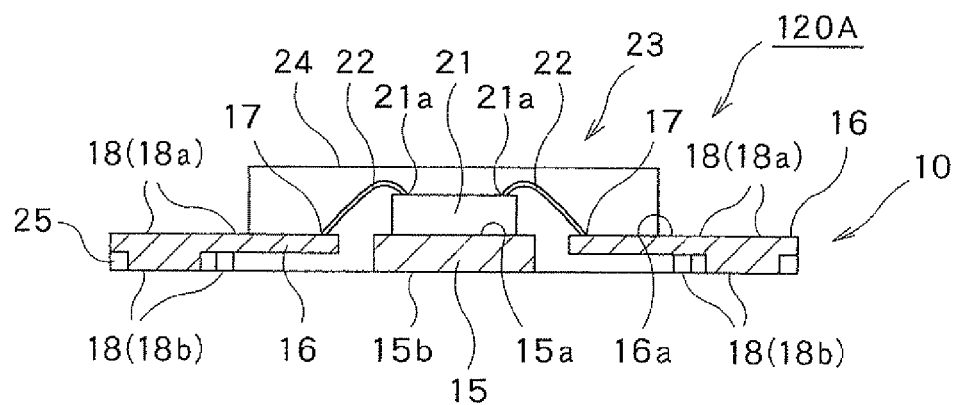
FIG. 11 is a cross-sectional view (taken along line B-B in FIG. 10) that shows the semiconductor device according to the first variation of the first embodiment of the present invention (i.e., variation 1-1)

FIGS. 10 and 11 show a semiconductor device 120A according to a first variation of the first embodiment. FIG. 10 is a perspective view of the semiconductor device 120A, and FIG. 11 is a cross-sectional view thereof. The semiconductor device 120A shown in FIGS. 10 and 11 differs from the embodiment shown in FIGS. 1 to 9, in that the central region 24 of the sealing resin section 23 is in a columnar shape. More specifically, the central region 24 has a planar upper surface and a side face perpendicular to the upper surface 16a of each lead 16. This structure produces substantially the same effects as those produced by the embodiment shown in FIGS. 1 to 9 as well. The central region 24 may instead have a polygonal column shape or a truncated polygonal pyramid shape. The sealing resin section 23 preferably includes a tapered or round region at a boundary between the central region 24 and the marginal region 25. This tapered or round region at the boundary makes the difference of thermal expansion coefficient between the central region 24 and the marginal region 25 change gradually. Sudden changes in the thermal expansion coefficient can be alleviated to thereby prevent warping and concentration of strain.

(Variation 1-2)

Figure 12:
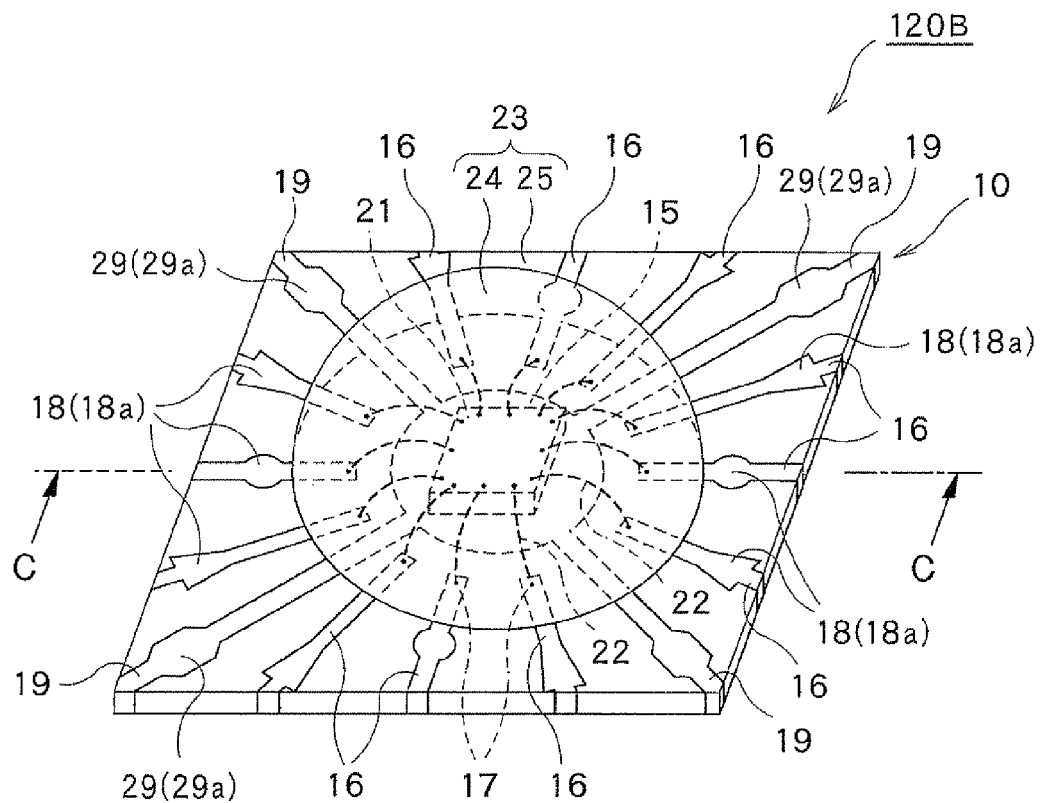
FIG. 12 is a perspective view showing a semiconductor device according to a second variation of the first embodiment of the present invention (i.e., variation 1-2)
Figure 13:
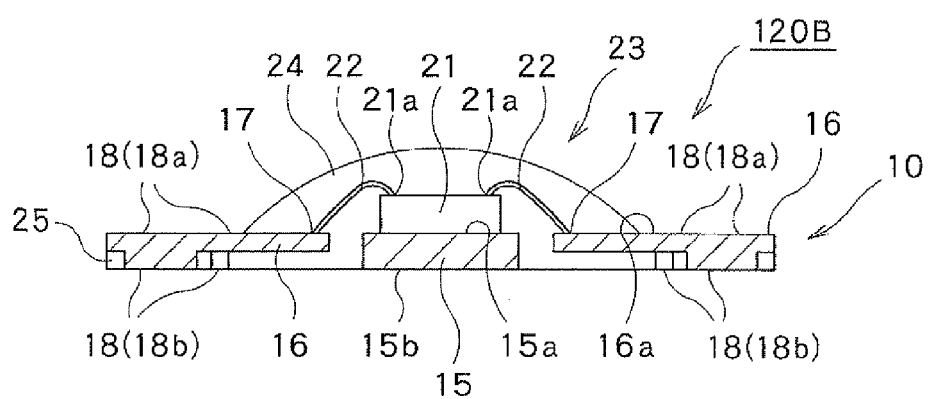
FIG. 13 is a cross-sectional view (taken along line C-C in FIG. 12) that shows the semiconductor device according to the second variation of the first embodiment of the present invention (i.e., variation 1-2)

FIGS. 12 and 13 show a semiconductor device 120B according to a second variation of the first embodiment. FIG. 12 is a perspective view of the semiconductor device 120B, and FIG. 13 is a cross-sectional view thereof. The semiconductor device 120B shown in FIGS. 12 and 13 differs from the embodiment shown in FIGS. 1 to 9, in that the central region 24 of the sealing resin section 23 is in a dome-like shape. More specifically, the entire upper surface of the central region 24 is a curved surface, which may be part of a spherical surface. The configuration also produces substantially the same effects as those produced by the embodiment shown in FIGS. 1 to 9.

(Variations 1-3, 1-4, 1-5)

Figure 14:
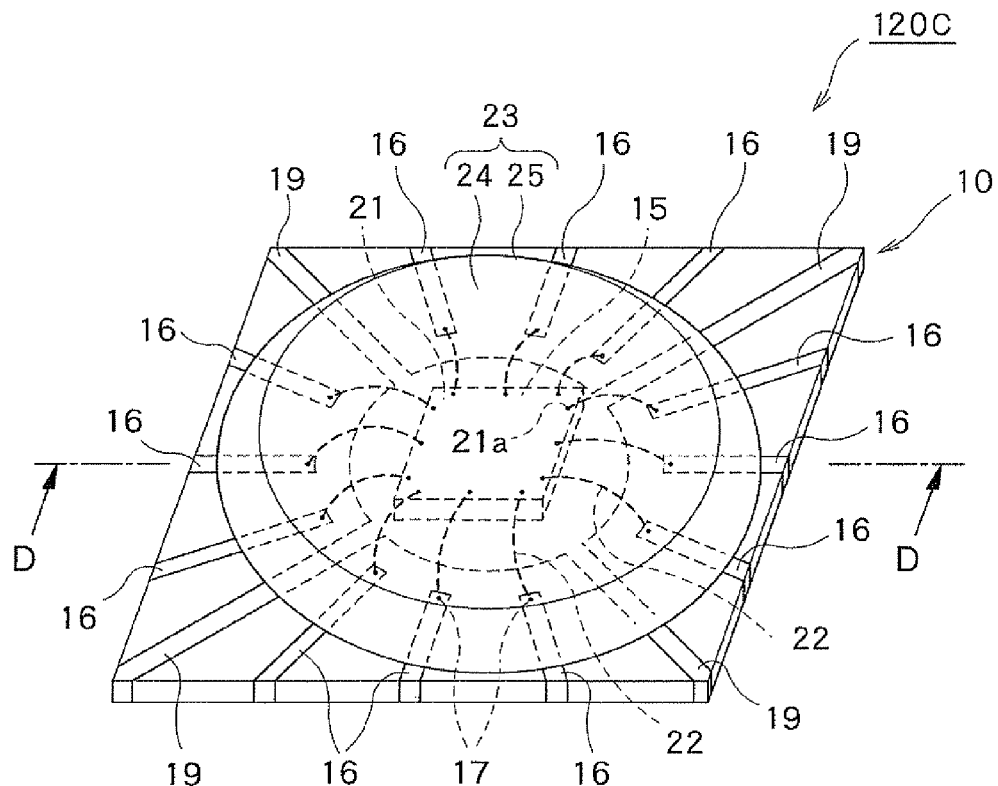
FIG. 14 is a perspective view showing a semiconductor device according to a third variation of the first embodiment of the present invention (i.e., variation 1-3)
Figure 15:
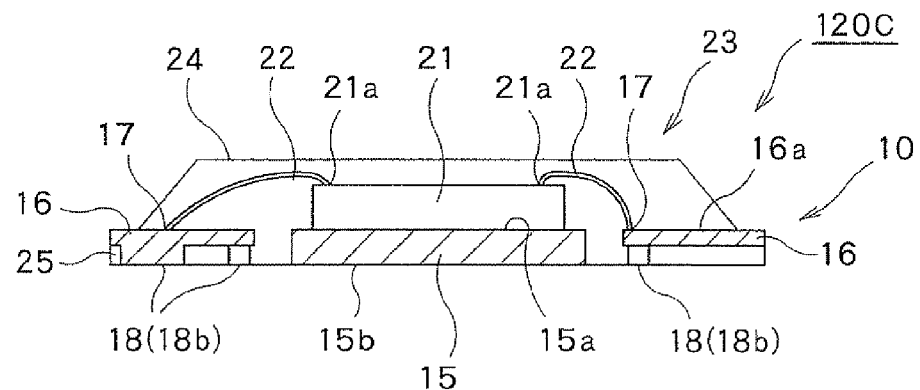
FIG. 15 is a cross-sectional view (taken along line D-D in FIG. 14) that shows the semiconductor device according to the third variation of the first embodiment of the present invention (i.e., variation 1-3)
Figure 16:
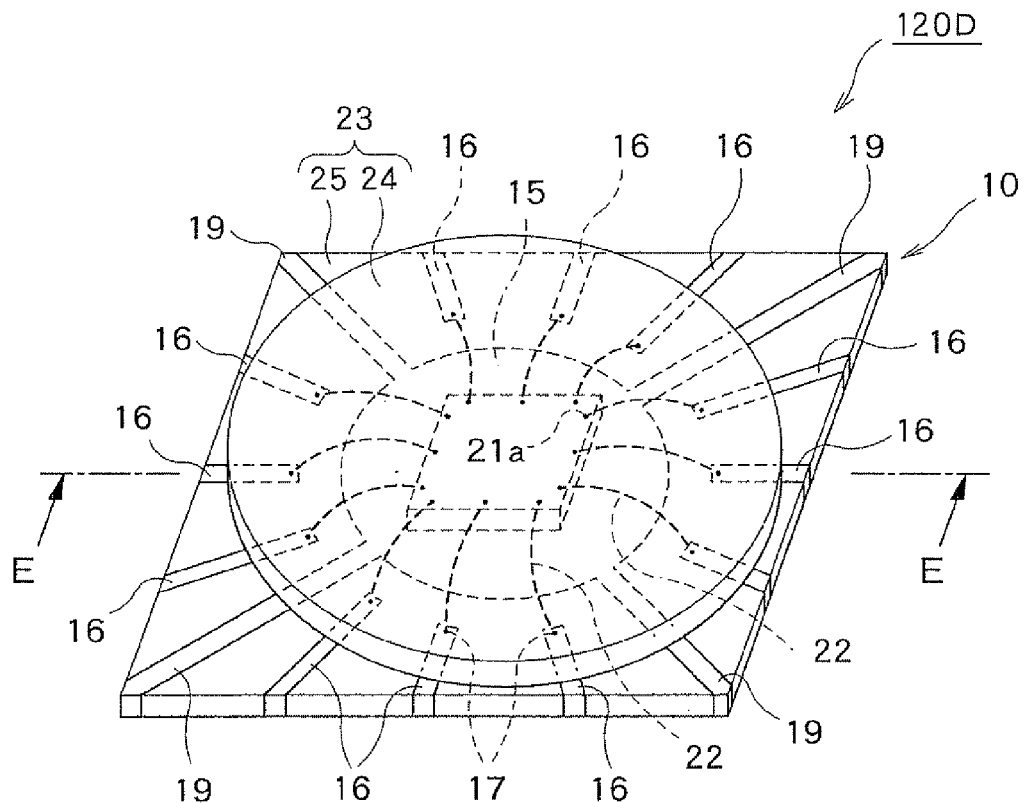
FIG. 16 is a perspective view showing a semiconductor device according to a fourth variation of the first embodiment of the present invention (i.e., variation 1-4)
Figure 17:
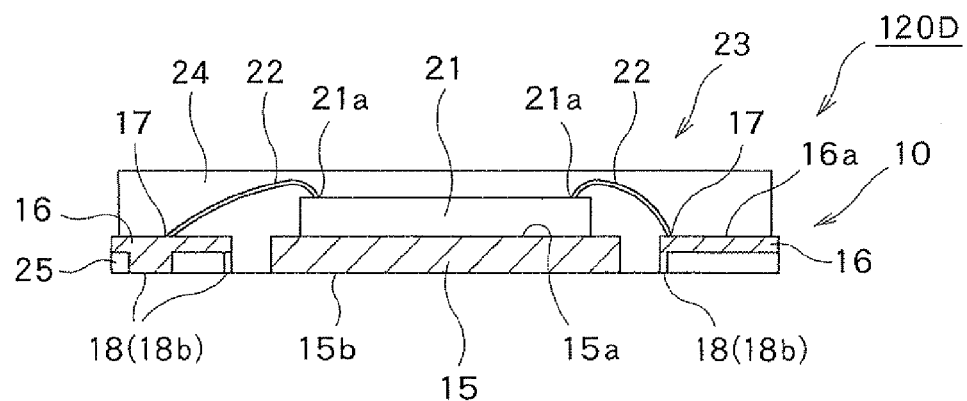
FIG. 17 is a cross-sectional view (taken along line E-E in FIG. 16) that shows the semiconductor device according to the fourth variation of the first embodiment of the present invention (i.e., variation 1-4)
Figure 18:
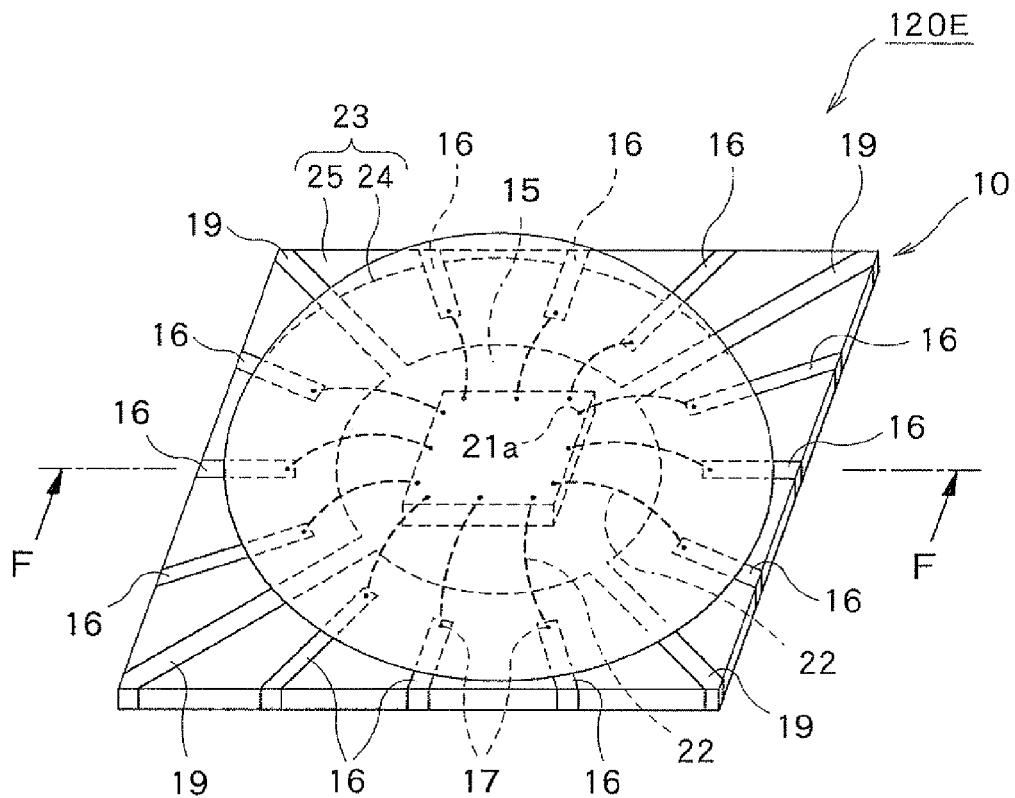
FIG. 18 is a perspective view showing a semiconductor device according to a fifth variation of the first embodiment of the present invention (i.e., variation 1-5)
Figure 19:
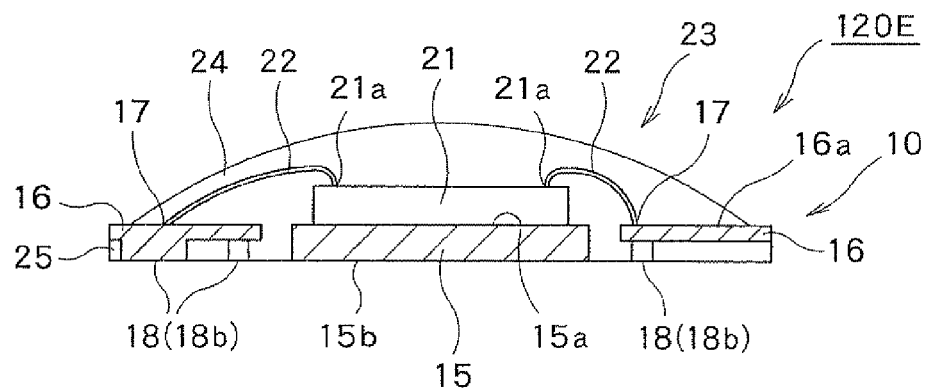
FIG. 19 is a cross-sectional view (taken along line F-F in FIG. 18) that shows the semiconductor device according to the fifth variation of the first embodiment of the present invention (i.e., variation 1-5)

FIGS. 14 to 19 show semiconductor devices 120C, 120D, and 120E according to a third, fourth, and fifth variations of the first embodiment. FIG. 14 is a perspective view of the semiconductor device 120C, and FIG. 15 is a cross-sectional view thereof. FIG. 16 is a perspective view of the semiconductor device 120D, and FIG. 17 is a cross-sectional view thereof. FIG. 18 is a perspective view of the semiconductor device 120E, and FIG. 19 is a cross-sectional view thereof.

The third, fourth, and fifth variations in FIGS. 14 to 19 differ from the embodiment shown in FIGS. 1 to 9, in that no upper terminal 18a is provided at the upper-surface of each lead 16 and no upper terminal 29a is provided at the upper-surface of each hanging lead 19. Other differences are that in the variations shown in FIGS. 14 to 19, the diameter of the central region 24 is equivalent to, or slightly smaller than the length of one side of the semiconductor device 120C, 120D, or 120E. With such configuration, in addition to the foregoing effects produced by the embodiment shown in FIGS. 1 to 9, the entire semiconductor device 120C, 120D, or 120E can be miniaturized relative to the size of the semiconductor element 21. The central region 24 may be of a truncated conical shape as shown in FIGS. 14 and 15, a columnar shape as shown in FIGS. 16 and 17, or a dome-like shape as shown in FIGS. 18 and 19.

(Variation 1-6)

Figure 20:
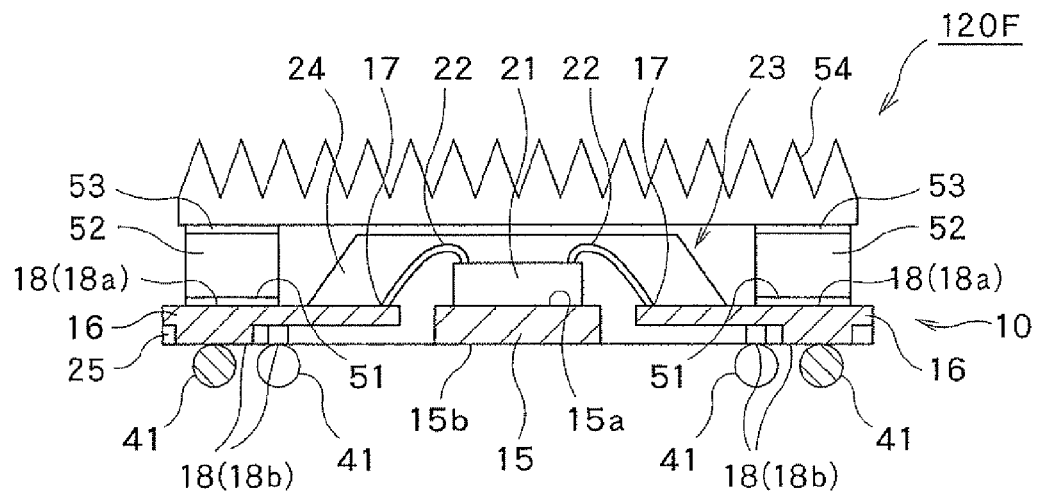
FIG. 20 is a cross-sectional view showing a semiconductor device according to a sixth variation of the first embodiment of the present invention (i.e., variation 1-6)

FIG. 20 shows a semiconductor device 120F according to a sixth variation of the first embodiment. In FIG. 20A, a planar annular ring stiffener 52 is bonded to the upper terminals 18a of each lead 16 via an adhesive layer 51. Additionally, a heatsink fin array 54 is mounted on the ring stiffener 52 via another adhesive layer 53. The ring stiffener 52 can be constructed, for example, from copper or from alloy 42, and the heatsink fin array 54 can be constructed from aluminum, etc. Heat from the semiconductor element 21 can be released via the heatsink fin array 54, and hence reliability of the semiconductor device 120F can be further improved.

(Variation 1-7)

Figure 21:
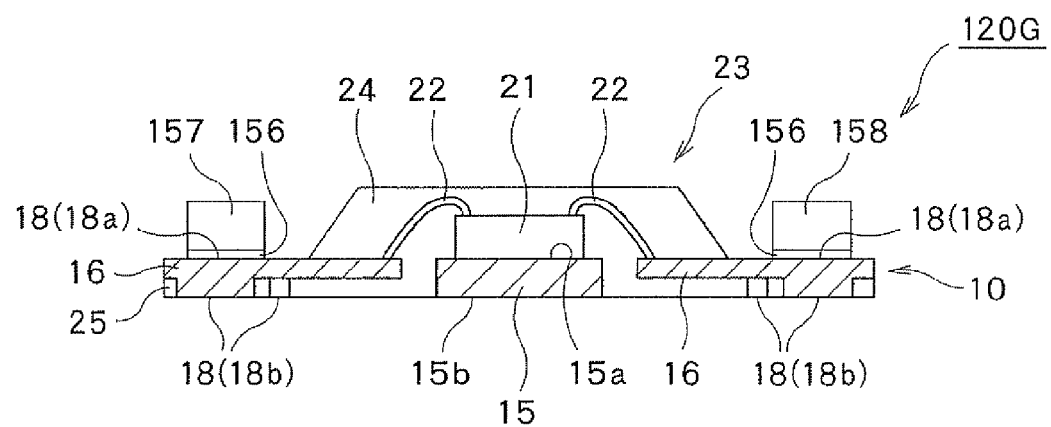
FIG. 21 is a cross-sectional view showing a semiconductor device according to a seventh variation of the first embodiment of the present invention (i.e., variation 1-7)

FIG. 21 shows a semiconductor device 120G according to a seventh variation of the first embodiment. In FIG. 21, electronic components 157 and 158 are mounted on the upper terminals 18a of each lead 16 via solder portions or electro-conductive paste 156. Examples of electronic components 157, 158 include capacitors, resistive elements, ring interposers, and the like. The electronic components 157 and 158 may either be the same type or dissimilar types. With such configuration, space above the marginal region 25 can be used for setting the electronic components 157 and 158, and a more compact semiconductor device can be provided.

(Variations 1-8, 1-9)

Figure 22:
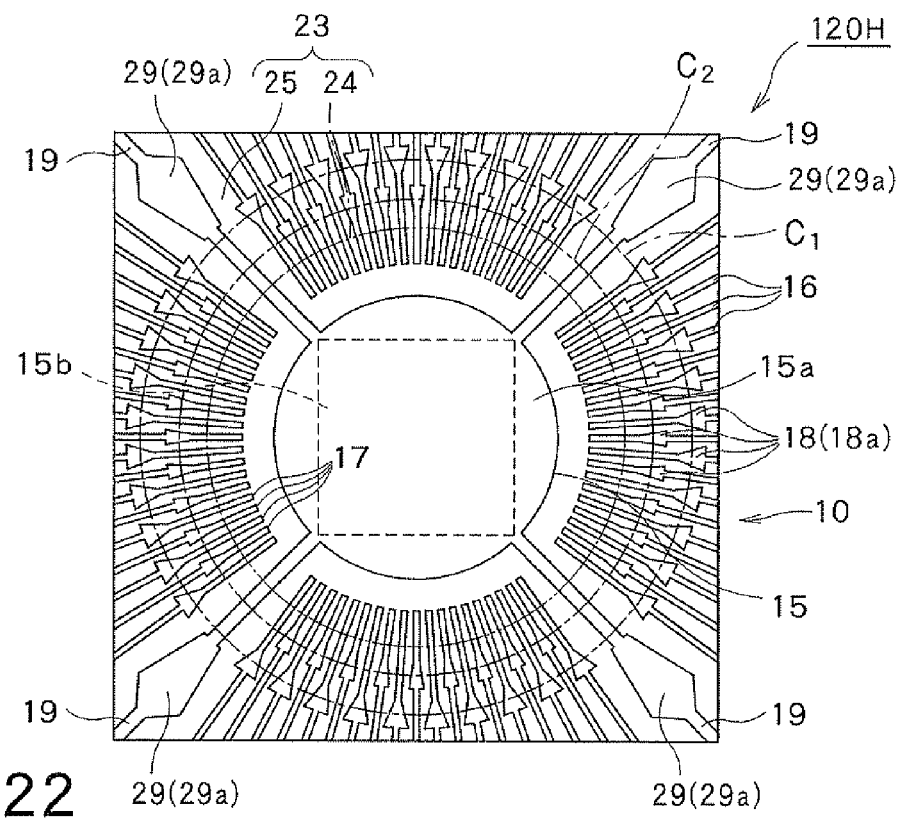
FIG. 22 is a plan view showing a semiconductor device according to an eighth variation of the first embodiment of the present invention (i.e., variation 1-8), with portions above the surface of leads being omitted from the view.
Figure 23:
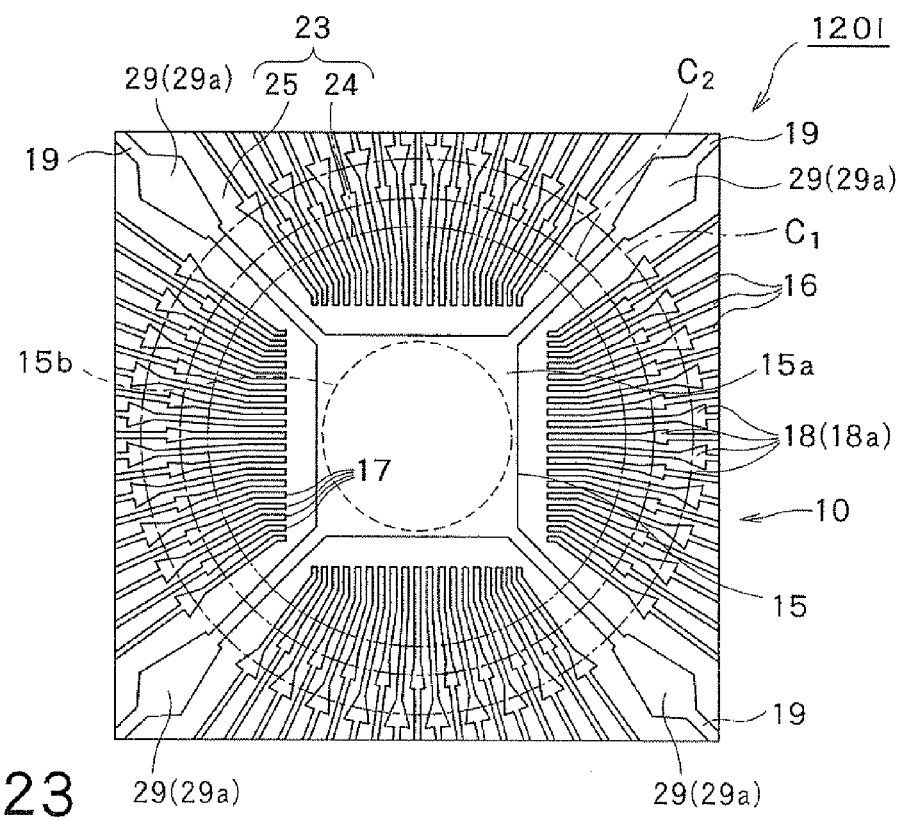
FIG. 23 is a plan view showing a semiconductor device according to a ninth variation of the first embodiment of the present invention (i.e., variation 1-9), with portions above the surface of leads being omitted from the view.

FIGS. 22 and 23 are plan views that respectively show semiconductor devices 120H and 120I according to an eighth and ninth variations of the first embodiment. Portions above the surface of each lead 16 are omitted in the views (these plan views correspond to FIG. 3). The semiconductor devices 120H and 120I shown in FIGS. 22 and 23 differ from the embodiment shown in FIGS. 1 to 9 in that the shapes of the upper surface 15a and lower surface 15b of the die pad 15 are different. More specifically, referring to FIG. 22, the upper surface 15a of the die pad 15 is circular, while the lower surface 15b of the die pad 15 is rectangular. Referring to FIG. 23, the upper surface 15a of the die pad 15 is rectangular, while the lower surface 15b of the die pad 15 is circular. The sealing resin portion 23 is formed from the periphery into the center of the die pad 15, which enhances the adhesion between the die pad 15 and the sealing resin section 23.

(Variation 1-10)

Figure 24:
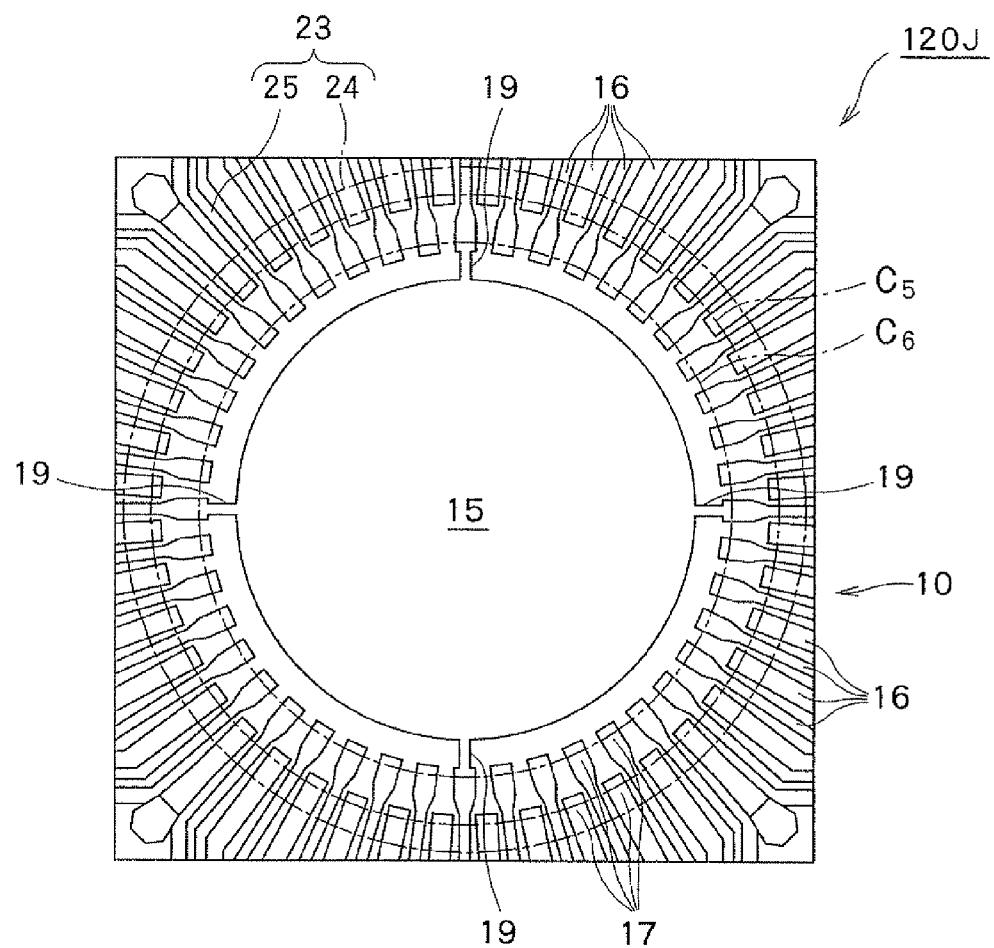
FIG. 24 is a plan view showing a semiconductor device according to a tenth variation of the first embodiment of the present invention (i.e., variation 1-10), with portions above the surface of leads being omitted from the view.

FIG. 24 is a plan view showing a semiconductor device 120J according to a tenth variation of the first embodiment. Portions above the surface of each lead 16 are omitted from the view (this plan view corresponds to FIG. 3). The semiconductor device 120J shown in FIG. 24 differs from the embodiment shown in FIGS. 1 to 9, in that each hanging lead 19 extends from the die pad 15 to the middle of the four sides of the semiconductor device 120J. In addition, no upper terminals 18a are provided at the upper-surface side of each lead 16. The internal terminals 17 of each lead 16 are arranged on either of two circumferences, $C_5$ and $C_6$. In this case, since no hanging lead 19 is present at the four corners of the semiconductor device 120J, the number of leads 16 and the number of pins can be increased.

(Variation 1-11)

Figure 25:
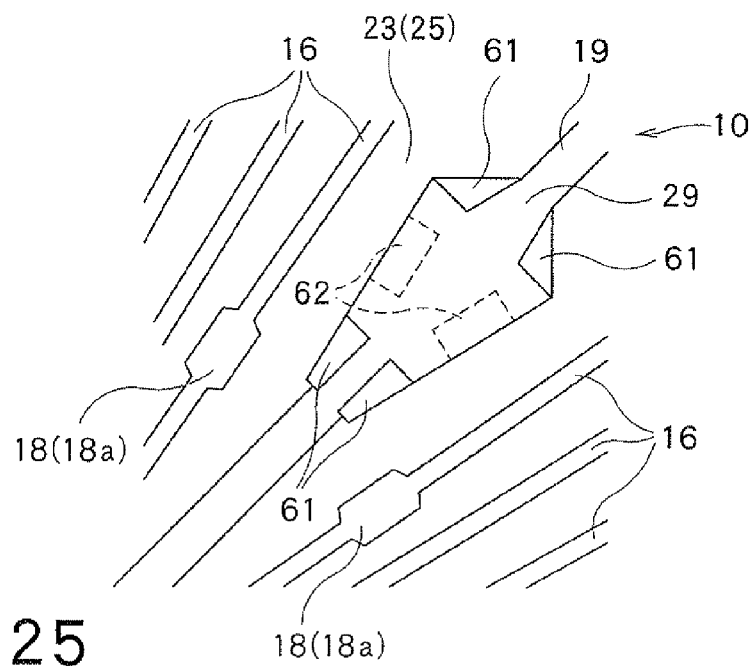
FIG. 25 is a plan view showing a hanging lead in an eleventh variation (variation 1-11)

FIG. 25 is a plan view showing a variation of the hanging leads 19 of the lead frame 10. In FIG. 25, upper and lower surfaces of an external terminal 29 of the hanging lead 19 respectively have recesses 61 and 62, where the sealing resin section 23 gets into. The recesses 61, 62 of the upper and lower surfaces of the hanging lead 19 are positioned differently in a staggered way in the plane view. The recesses 61, 62 are each formed by half-etching in the step of forming the lead frame 10 from the metallic substrate 11 (see FIGS. 7(a)-7(d)). In such configuration, the sealing resin section 23 flows into the recesses 61, 62 to thereby enhance the connection between the hanging lead 19 and the sealing resin section 23.

(Variations 1-12, 1-13)

Figure 26:
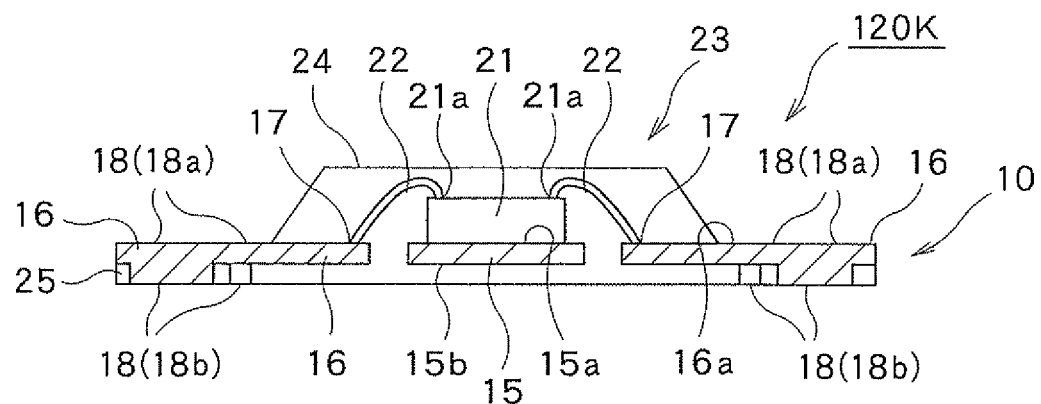
FIG. 26 is a cross-sectional view showing the semiconductor device according to a twelfth variation of the first embodiment of the present invention (i.e., variation 1-12)
Figure 27:
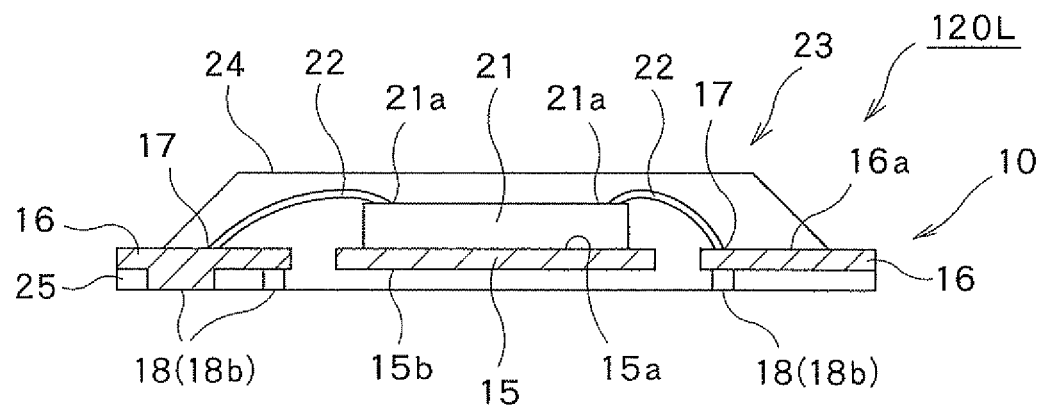
FIG. 27 is a cross-sectional view showing the semiconductor device according to a thirteenth variation of the first embodiment of the present invention (i.e., variation 1-13)

FIGS. 26 and 27 are cross-sectional views that show semiconductor devices 120K and 120L respectively according to a twelfth and thirteenth variations of the first embodiment. The semiconductor devices 120K and 120L shown in FIGS. 26 and 27 differ from the embodiment shown in FIGS. 1 to 9, in that the lower surface 15b of the die pad 15 is not exposed to the exterior of the sealing resin section 23 and is completely shrouded by the sealing resin section 23. The adhesion of die pad 15 and the sealing resin section 23 can be thus enhanced by shrouding the lower surface 15b of the die pad 15 with the sealing resin section 23.

(Variations 1-14, 1-15)

Figure 28:
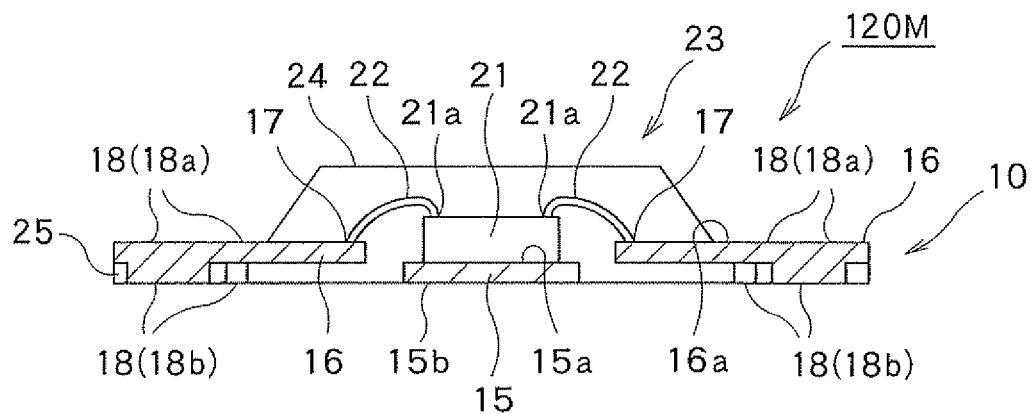
FIG. 28 is a cross-sectional view showing the semiconductor device according to a fourteenth variation of the first embodiment of the present invention (i.e., variation 1-14)
Figure 29:
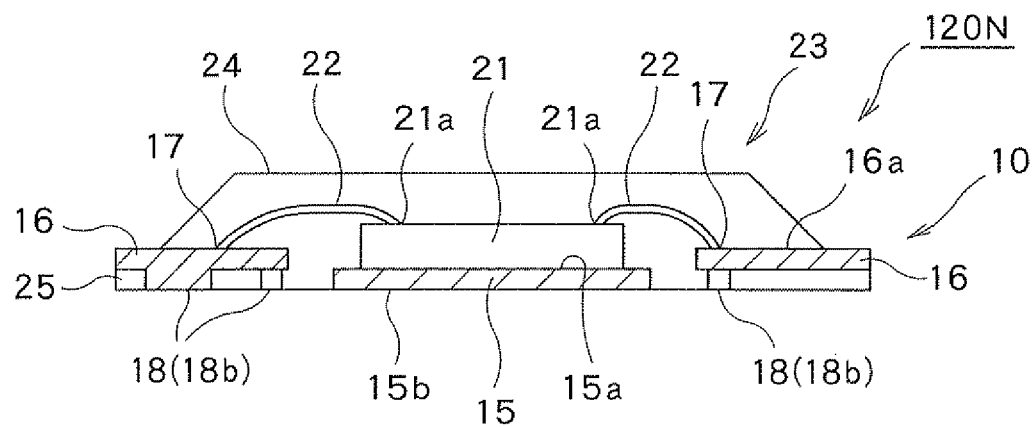
FIG. 29 is a cross-sectional view showing the semiconductor device according to a fifteenth variation of the first embodiment of the present invention (i.e., variation 1-15)

FIGS. 28 and 29 are cross-sectional views that show semiconductor devices 120M and 120N respectively according to a fourteenth and fifteenth variations of the first embodiment. The die pad 15 of the devices shown in FIGS. 28 and 29 are thin compared with that of the embodiment shown in FIGS. 1 to 9. That is, the level of upper surface 15a of the die pad 15 is lower than the level of upper surface 16a of lead 16 (the upper surface 15a is closer to the lower surface of the sealing resin section 23). The lower surface 15b of the die pad 15 is exposed to the exterior of the sealing resin section 23 in the variations. The semiconductor devices 120M, 120N can have thin profile by thinning down the die pad 15 and lowering the level of upper surface 15a of the die pad 15.

(Variations 1-16, 1-17)

Figure 30:
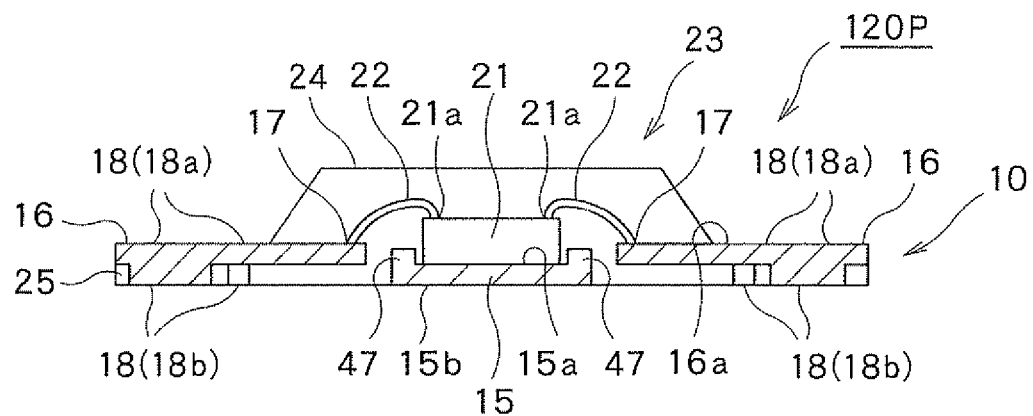
FIG. 30 is a cross-sectional view showing the semiconductor device according to a sixteenth variation of the first embodiment of the present invention (i.e., variation 1-16)
Figure 31:
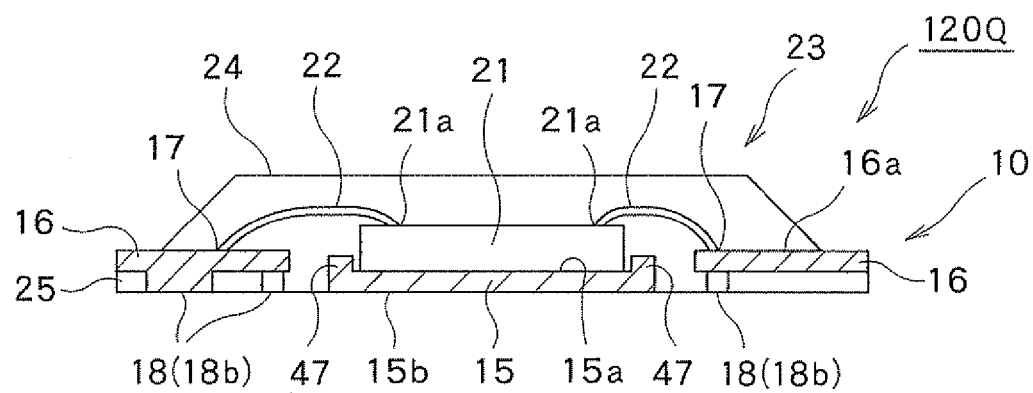
FIG. 31 is a cross-sectional view showing the semiconductor device according to a seventeenth variation of the first embodiment of the present invention (i.e., variation 1-17)

FIGS. 30 and 31 are cross-sectional views that show semiconductor devices 120P and 120Q respectively according to a sixteenth and seventeenth variations of the first embodiment. The semiconductor devices 120P and 120Q shown in FIGS. 30 and 31 differ from the embodiment shown in FIGS. 1 to 9, in that an annular flange 47 is provided along the rim of the upper surface 15a of the die pad 15. The semiconductor element 21 is accommodated within the annual flange 47. Providing the flange 47 around the upper surface 15a of the die pad 15 as mentioned prevents sagging and deformation of the die pad 15.

(Variation 1-18)

Figure 32:
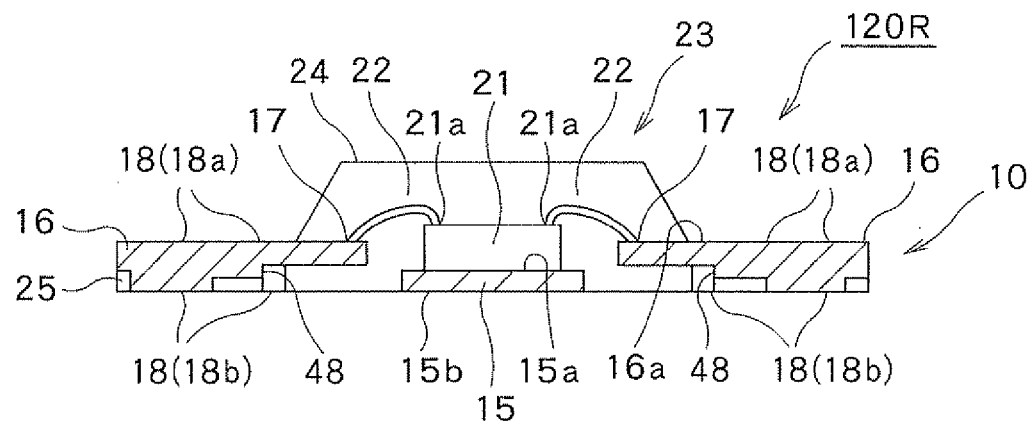
FIG. 32 is a cross-sectional view showing the semiconductor device according to an eighteenth variation of the first embodiment of the present invention (i.e., variation 1-18)
Figure 33:
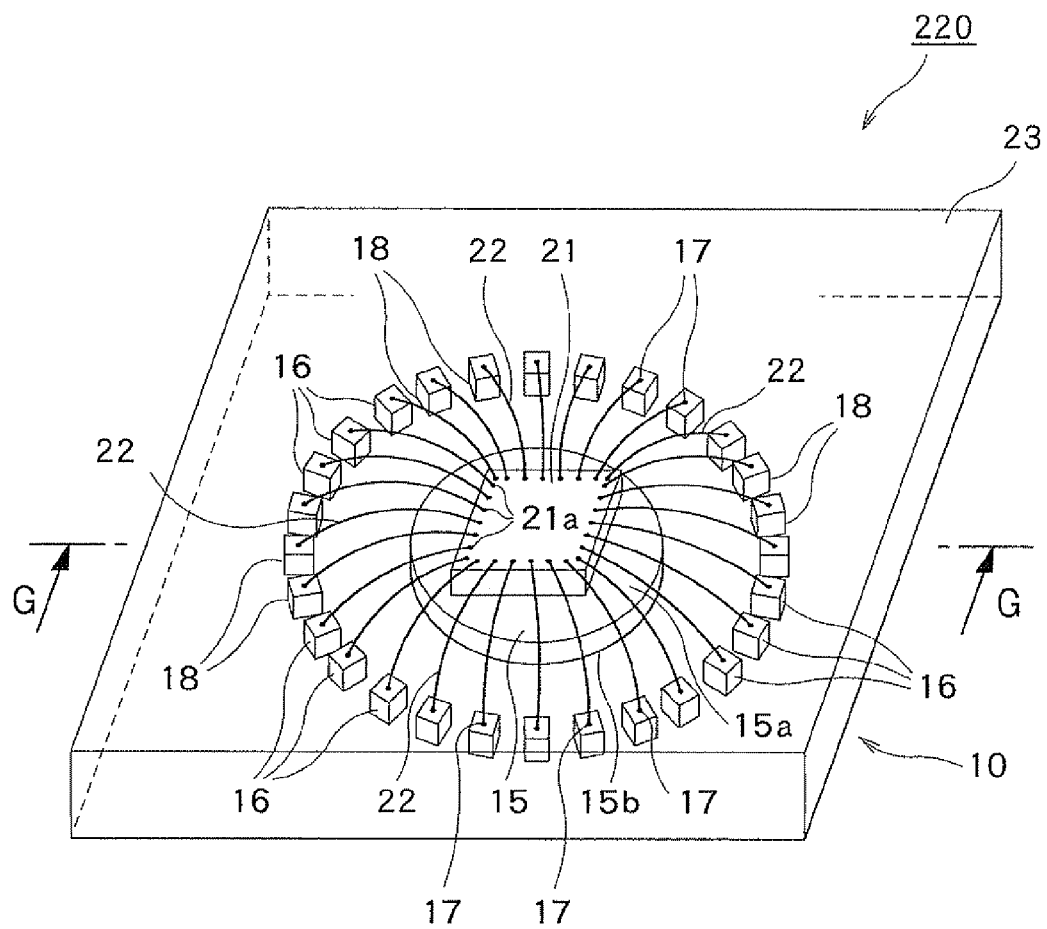
FIG. 33 is a perspective view showing a semiconductor device according to a second embodiment of the present invention.

FIG. 32 is a cross-sectional view showing a semiconductor device 120R according to an eighteenth variation of the first embodiment. As shown in FIG. 32, a stepped portion 48 is formed between the internal terminal 17 and the lower terminal 18b of each lead 16. The thickness of stepped portion 48 is thinner than that of the part of lead 16 near the lower terminal 18b, and thicker than that of the part of lead 16 near the internal terminal 17. The stepped portion 48 can be formed by conducting two-step etching to the lead 16. The part of lead 16 near the lower terminal 18b is thickened and its strength can be increased. Meanwhile, the part of lead 16 near the internal terminal 17 is thinned, and the internal terminals 17 can be fine-pitched. In FIG. 32, the level of upper surface 15a of the die pad 15 is positioned lower than that of the upper surface 16a of the lead 16 (the upper surface 15a is closer to the lower surface of the sealing resin section 23), in order to thin down the semiconductor device 120R.

The construction of the central region 24 in the semiconductor devices 120K, 120M, 120P, and 120R respectively shown in FIGS. 26, 28, 30, and 32, correspond to that of the semiconductor device 120 shown in FIGS. 1 to 4. On the other hand, the construction of the central region 24 in the semiconductor devices 120L, 120N, and 120Q respectively shown in FIGS. 27, 29, and 31, correspond to that of the semiconductor device 120A shown in FIGS. 10 and 11.

The constituent elements disclosed in the above embodiment and variations may be appropriately combined as required. Alternatively, several of all the constituent elements described in the above embodiment or variations may be deleted.

Second Embodiment

Next, a second embodiment of the present invention will be described referring to FIGS. 33 to 67.

Semiconductor Device Configuration

A semiconductor device configuration according to the second embodiment of the present invention is described below per FIGS. 33 to 36. FIGS. 33 to 36 show the semiconductor device according to the second embodiment of the present invention.

As shown in FIGS. 33 to 36, the semiconductor device 220 includes a lead frame 10 formed with a die pad 15 and a plurality of leads 16 arranged around the die pad 15.

A semiconductor element 21 is rested on the die pad 15 of the lead frame 10. The leads 16 of the lead frame 10 and terminals 21a of the semiconductor element 21 are electrically interconnected by a plurality of bonding wires 22 (electroconductive portions).

The lead frame 10, the semiconductor element 21, and the bonding wires 22 are resin sealed with a sealing resin section 23.

The lead frame 10 as a whole is formed of metallic materials such as copper, copper alloy, and alloy 42 (Fe alloy with 42% Ni). The die pad 15 and leads 16 of the lead frame 10 are formed by, for example, etching one metallic substrate formed of the metallic material. Details of the etching will be described later herein.

Figure 34:
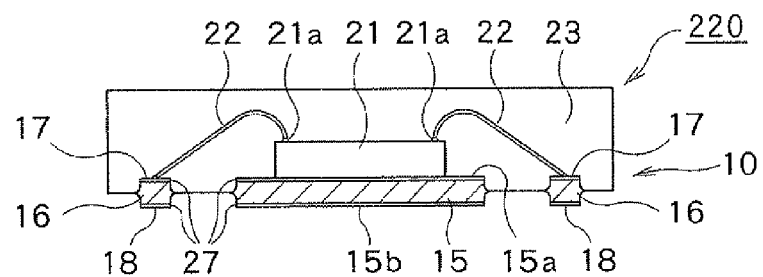
FIG. 34 is a cross-sectional view (taken along line G-G in FIG. 33) that shows the semiconductor device according to the second embodiment of the present invention.
Figure 35:
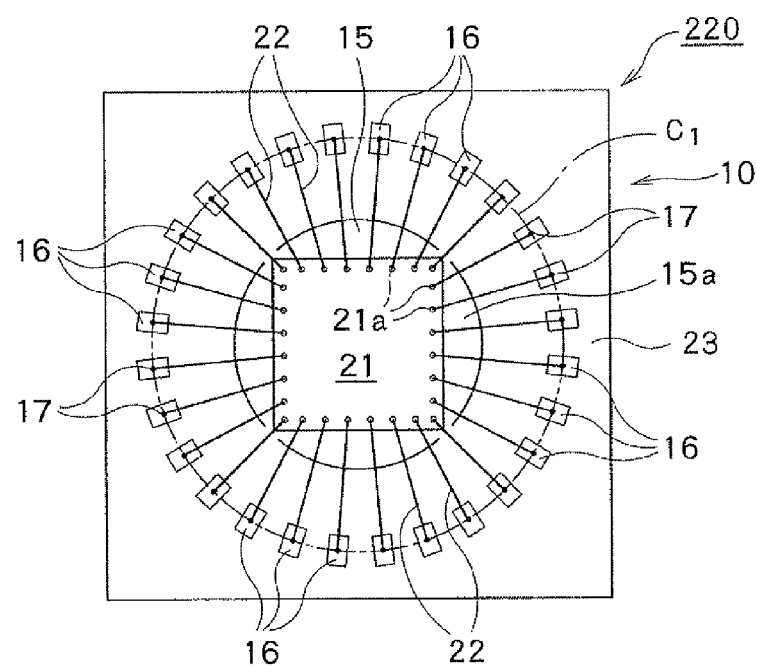
FIG. 35 is a plan view showing the semiconductor device according to the second embodiment of the present invention.
Figure 36:
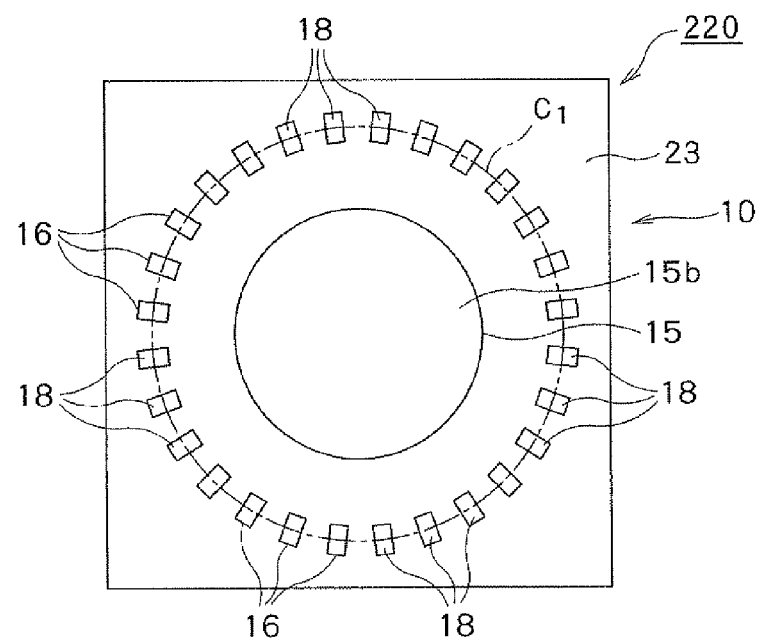
FIG. 36 is a bottom view showing the semiconductor device according to the second embodiment of the present invention.

The die pad 15 has circular shape in both top view (see FIG. 35) and bottom view (see FIG. 36). In addition, as shown in FIG. 34, the die pad 15 protrudes downward from the sealing resin section 23 and a lower surface 15b thereof is entirely exposed to the exterior of the sealing resin section 23. On the other hand, an upper surface 15a of the die pad 15 serves as a resting surface for the semiconductor element 21, and is completely shrouded by the sealing resin section 23.

Each of the leads 16 protrudes downward from the sealing resin section 23. Adjacent leads 16 are electrically insulated from each other.

Each lead 16 includes an internal terminal 17 to which one bonding wire 22 is connected and an external terminal 18 exposed to the exterior of a lower surface of the lead 16. The internal terminal 17 is formed at an upper-surface of the lead 16, and the external terminal 18 is formed at a lower-surface of the lead 16.

As shown in FIG. 34, a plated layer 27 is formed on each of the internal terminals 17 and external terminals 18 of the lead frame 10. The plated layers 27 may be formed of, for example, silver (Ag) or palladium (Pd).

As shown in FIGS. 35 and 36, the internal terminals 17 and the external terminals 18 each have a planar rectangle shape. An alternative shape of each internal terminal 17 and external terminal 18 may be, for example, a polygon, trapezoid, circle, or ellipse.

In the present embodiment, the leads 16 are arranged on the same circumference in a plane view.

More specifically, as shown in FIGS. 35 and 36, the leads 16 are arranged on one circumference $C_1$ around the die pad 15. In this case, the internal terminals 17 are arranged on the circumference $C_1$ at the upper-surface, and the external terminals 18 are arranged on the circumference $C_1$ at the lower-surface. The wording or phrasing of "the leads 16 are arranged on the circumference" here means that the center of each lead 16 is disposed on the circumference.

The semiconductor element 21 and each bonding wire 22 can be substantially the same as those used in the first embodiment.

The sealing resin section 23 has a regularly parallelepiped shape. A thermosetting resin such as a silicone resin or epoxy resin, or a thermoplastic resin such as a PPS resin can be used as the sealing resin section 23. Although the sealing resin section 23 is shown as a transparent element for convenience in FIGS. 33 and 35, the resin may instead be of black or other opaque color.

In FIG. 34, about half of the thickness of the die pad 15 and each lead 16 protrude from the sealing resin section 23. However, the degree of the protrusion of the die pad 15 and the lead 16 from the sealing resin section 23 is not limited to this and may differ.

Method of Manufacturing the Semiconductor Device

Next, a method of manufacturing the semiconductor device 220 shown in FIGS. 33 to 36 is described below using FIGS. 37(*a*) to 37(*f*) and 38(*a*) to 38(*g*). While the following description refers to processes for manufacturing a plurality of semiconductor devices 220 from one metallic substrate 11, the present invention is not limited to this, and one semiconductor device 220 may be manufactured from one metallic substrate 11.

Figure 37:
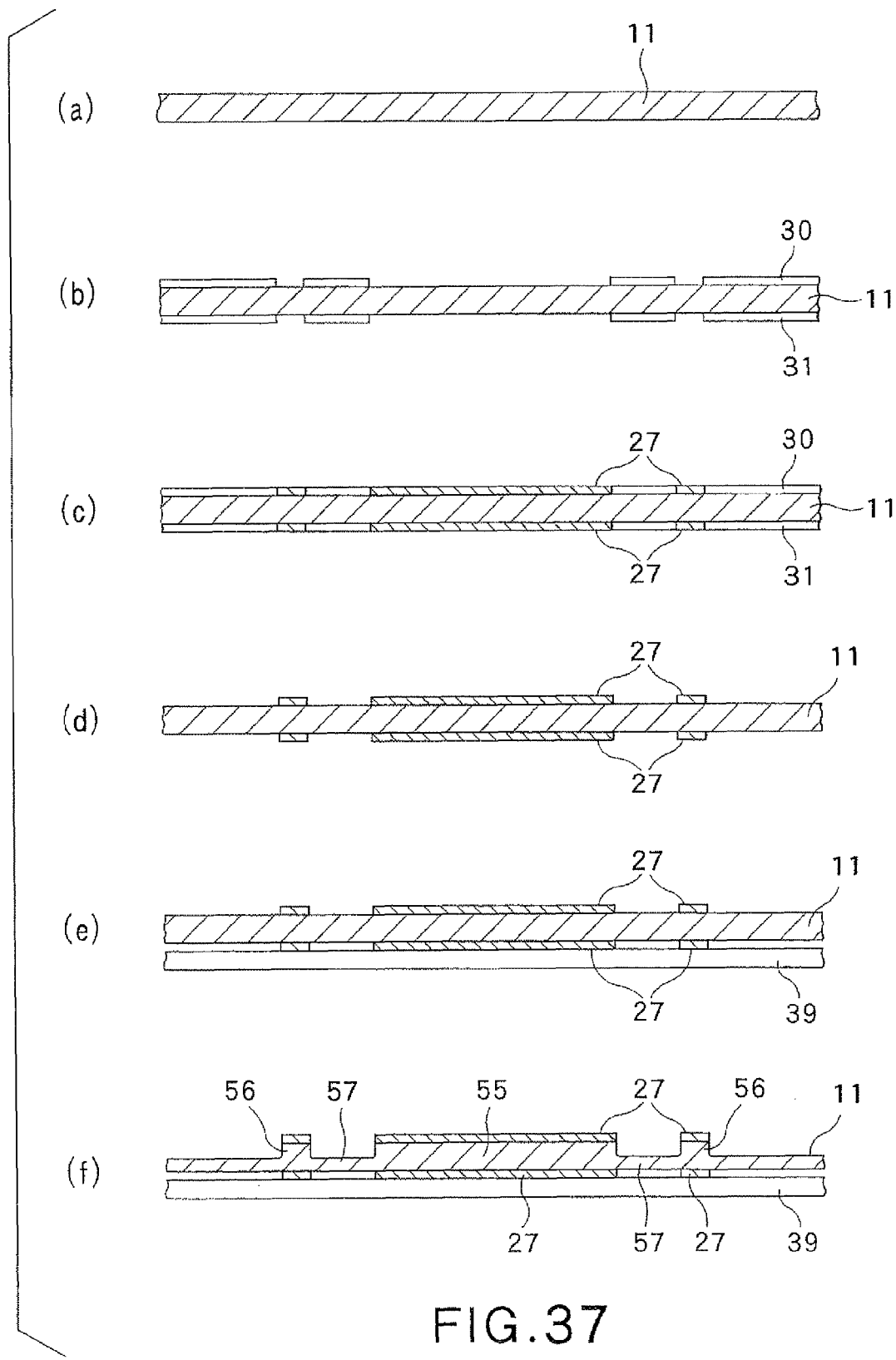
FIG. 37 is a cross-sectional view showing another method of manufacturing a lead frame.

First, as shown in FIG. 37(*a*), a planar metallic substrate 11 constituting the lead frame 10 is provided. A substrate formed from materials such as copper, copper alloy, and alloy 42 (Fe alloy with 42% Ni), as described above, can be used as the metallic substrate 11. It is preferred that both upper and lower surfaces of the metallic substrate 11 have been cleaned by degreasing or the like.

Next, the upper and lower surfaces of the metallic substrate 11 are coated with a photosensitive resist, then dried, and exposed to light via a desired photomask. After the exposure, developing is conducted to form plating resist layers 30 and 31 each having a desired pattern (FIG. 37(*b*)). The photosensitive resist can be a conventional, known one.

Then, the upper and lower surfaces of the metallic substrate 11, both being covered with the plating resist layers 30 and 31, are subjected to electrolytic plating (FIG. 37(*c*)). A metal (e.g., silver) deposits on the regions of the metallic substrate 11 that are not covered with the resist layers 30, 31, and the plated layer 27 can be formed on the metallic substrate 11. If the plated layer 27 is formed of silver, a silver-plating solution mainly composed of silver cyanide and potassium cyanide can be used as the electrolytic plating operation. Thickness of the plated layer 27 is desired to be, for example, in the range of 0.5 μm to 10.0 μm.

The plating resist layers 30, 31 are next removed (FIG. 37(*d*)). In this case, for example, a resist removal solution may be used to strip and remove the plating resist layers 30, 31.

A backside tape 39 is attached to the lower-surface side of the metallic substrate 11 (FIG. 37(*e*)).

After that, only the upper surface of the metallic substrate 11 is half-etched with an etchant by using the plated layer 27 on the upper surface of the metallic substrate 11 as a corrosion-resistant film (FIG. 37(*f*)). An appropriate etchant can be selected based on the kind of material of the metallic substrate. For example, if copper is used as the metallic substrate material, spray etching with a ferric chloride solution is usually performed to both surfaces of the metallic substrate 11.

According to these processes, a section 55 corresponding to the die pad 15, and sections 56 corresponding to the leads 16 and arranged around the section 55 corresponding to the die pad 15 on one circumference $C_1$ in a plane view, are formed at the upper-surface of the metallic substrate 11 (FIG. 37(*f*)). In addition, a section 57 that has been thinned down by half-etching is formed between the section 55 corresponding to the die pad 15 and the sections 56 corresponding to the leads 16. The upper surface of the die pad 15 may also be half-etched to thereby thin down the internal structure of the semiconductor device 220 and achieve a thin semiconductor device 220.

Next, the semiconductor element 21 is mounted on the section 55 corresponding to the die pad 15. In this case, the semiconductor element 21 is rested on and fixed to the section 55 corresponding to the die pad 15 using, for example, a die-bonding paste (die attachment)(FIG. 38(*a*)).

Figure 38:
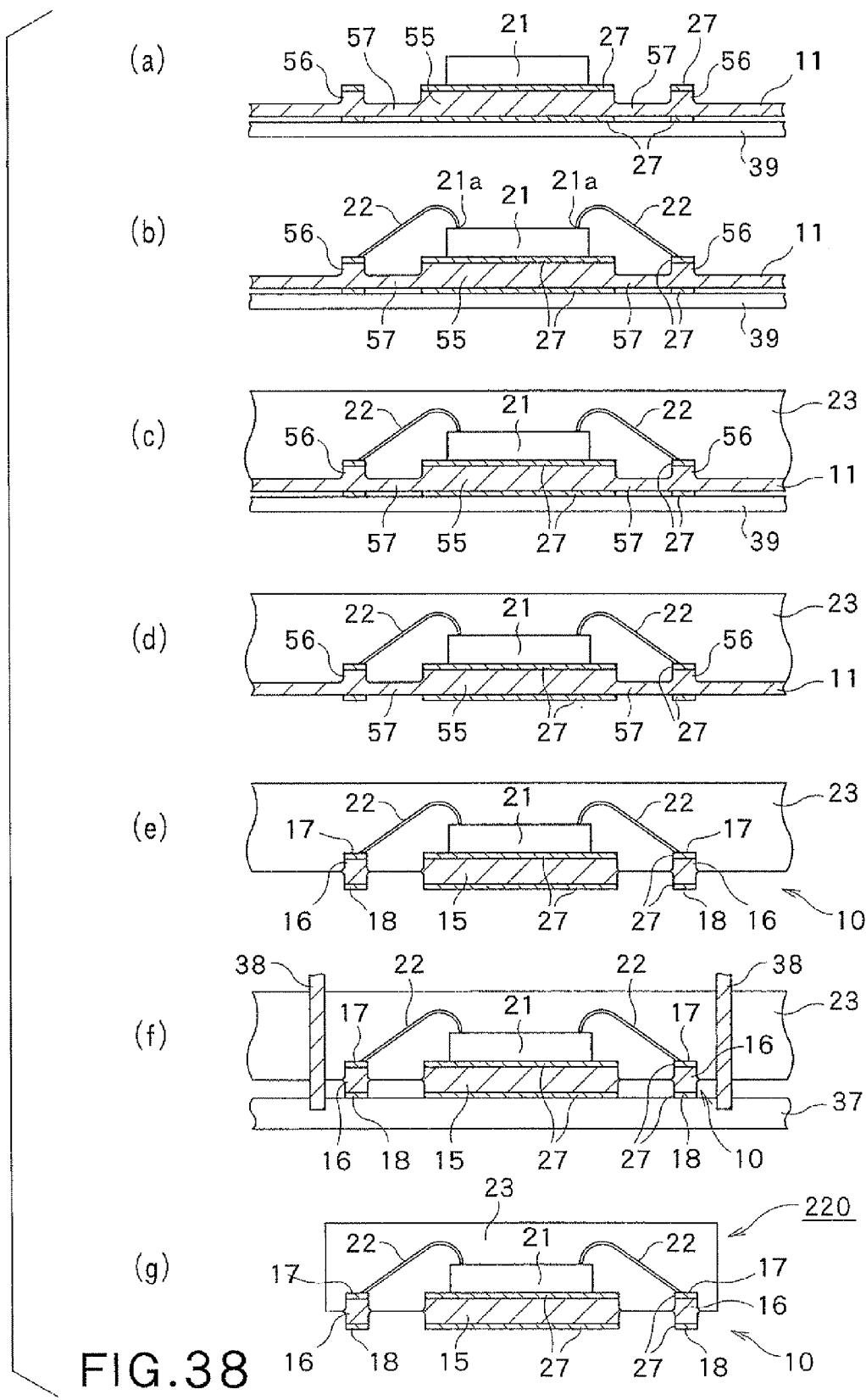
FIG. 38 is a cross-sectional view showing a method of manufacturing the semiconductor device according to the second embodiment of the present invention.

After die attachment, the terminals 21*a* of the semiconductor element 21 and the sections 56 corresponding to the leads 16 are electrically interconnected by bonding wires 22 (wire bonding)(FIG. 38(*b*)).

Next, a thermosetting resin or a thermoplastic resin is injection molded or transfer molded to the metallic substrate 11 to form a sealing resin section 23 (FIG. 38(*c*)). The upper surface of the metallic substrate 11, the semiconductor element 21, and the bonding wires 22 are thereby sealed.

The backside tape 39 is removed from the lower-surface side of the metallic substrate 11 (FIG. 38(*d*)).

Next, only the lower surface of the metallic substrate 11 is etched with an etchant by using the plated layer 27 on the lower surface of the metallic substrate 11 as a corrosion-resistant film. The etchant can be the same chemical used to half-etch the upper surface of the metallic substrate 11 (see FIG. 37(*f*)).

When the etching is completed, the die pad 15 of the lead frame 10 is formed from the die pad corresponding section 55, and the leads 16 of the lead frame 10 are formed from the leads corresponding sections 56. In this case, the leads 16 are arranged on one circumference $C_1$ around the die pad 15 in a plane view.

In addition, the half-etched section 57 is removed by etching the lower surface of the metallic substrate 11, and hence the die pad 15 and the leads 16 each protrudes downward from the sealing resin section 23.

Next, parts that are to be outer edges of the semiconductor device 220 is diced to separate the lead frame 10 for each semiconductor elements 21 (FIG. 38(*f*)). Upon dicing, the lead frame 10 is first rested on and fixed to the surface of a dicing tape 37. Then, the part of the sealing resin section 23 between the semiconductor elements 21 are cut with a rotational blade 38 constructed of a diamond grinding wheel or the like.

According to these processes, the semiconductor device 220 shown in FIGS. 33 to 36 can be obtained (FIG. 38(*g*)).

Operational Effects of the Present Embodiment

Figure 39:
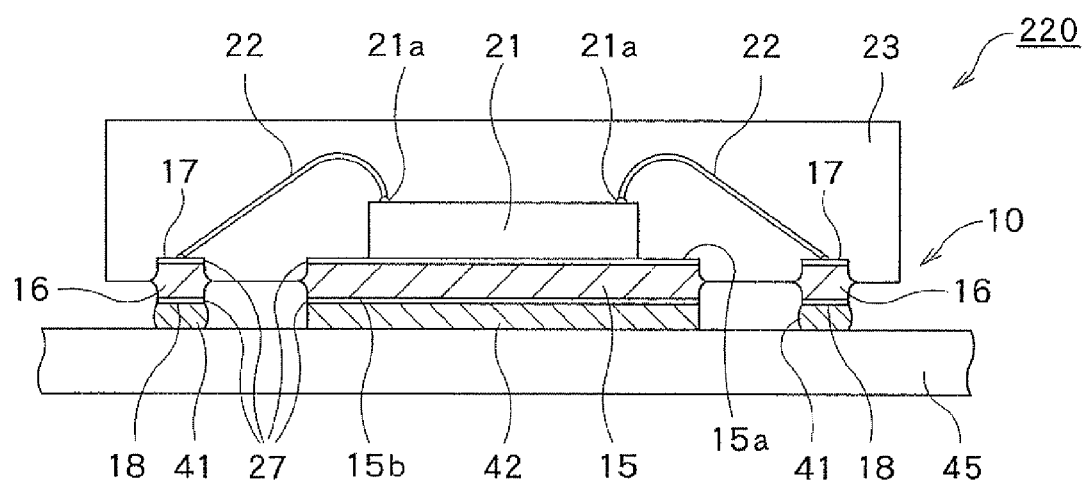
FIG. 39 is a cross-sectional view showing a state in which the semiconductor device according to the second embodiment of the present invention is mounted on a mounting substrate.

Next, operational effects of the thus-constructed present embodiment are described below using FIG. 39. FIG. 39 is a cross-sectional view showing a state in which the semiconductor device according to the present embodiment is mounted on a mounting substrate.

That is, as shown in FIG. 39, the semiconductor device 220 according to the present embodiment is disposed and mounted on the mounting substrate 45. In this case, the semiconductor device 220 is fixed to and mounted on the mounting substrate 45 by use of solder portions 41 provided on the external terminals 18 of each lead 16, and a solder portion 42 provided on the lower surface 15*b* of the die pad 15. The mounting substrate 45 is formed primarily from a glass epoxy resin. The solder portion 42 may be such that the entire lower surface 15b is soldered, or such that approximately the same amount of solder dots as that of solder portions 41 are arranged radially from or circumferentially around the center of the die pad 15.

During the solder-mounting of the semiconductor device 220 onto the mounting substrate 45, or upon actual usage of the semiconductor device 220 (according to operational environment), various kinds of heat is considered to be applied to the semiconductor device. In such situation, if a thermal expansion coefficient of the entire semiconductor device 220 differs from that of the mounting substrate 45, the difference between them will cause thermal stresses. Particularly, the solder portions 41 and solder portion 42 positioned between the semiconductor device 220 and the mounting substrate 45 may be damaged or interfacial peeling may occur at those portions.

According to the present embodiment, on the other hand, the external terminals 18 of the leads 16 are arranged on one circumference $C_1$ in a plane view. Thermal stresses caused by the difference in thermal expansion coefficient between the semiconductor device 220 and the mounting substrate 45, are therefore equally applied to the solder portions 41 at the external terminals 18, which prevents a specific solder portion 41 being damaged.

Furthermore, according to the present embodiment, since the lower surface 15b of the die pad 15 is exposed to the exterior of the sealing resin section 23, the die pad 15 can be mounted on the mounting substrate 45 with a solder portion 42 being provided on the entire lower surface 15b. Heat from the semiconductor element 21 can be released through the lower surface 15b of the die pad 15.

In the present embodiment, the shape of the die pad 15 is not limited, but is preferred to have a circular (disc-like) shape. If the shape of the die pad 15 is circular, when heat is applied to the semiconductor device 220, the thermal stresses caused by the difference in thermal expansion coefficient of the semiconductor device 220 and the mounting substrate 45 will be uniformly distributed in a circumferential direction. This will prevent the thermal stresses concentrating on a specific portion of the solder portion 42, provided at the lower surface 15b of the die pad 15. The solder portion 42 can thus be prevented from being damaged.

Notably, the die pad 15 is provided at the center of the semiconductor device 220 and its area accounts for a high percentage in the whole area of the semiconductor device 220, so that the die pad 15 and the mounting substrate 45 can be securely connected via the solder portion 42. As mentioned, the die pad 15 is strongly connected to the mounting substrate 45 at the center of the semiconductor device 220. Even when the semiconductor device 220 is thermally stressed, impacts of the thermal stresses upon the solder portions 41 connected to the external terminals 18 around the die pad 15 can be alleviated.

Moreover, according to the present embodiment, since the die pad 15 and the leads 16 each protrude downward from the sealing resin section 23, a space is formed between the sealing resin section 23 and the mounting substrate 45. The amount of absorption of the thermal stresses applied to the connections increases, and thus life of the substrate mounting in the semiconductor device 220 can be prolonged.

Variations of the Semiconductor Device

Next, variations of the semiconductor device according to the present embodiment are described below per FIGS. 40 to 67. In each of these figures, the same constituent elements as those of the embodiment shown in FIGS. 33 to 39 are assigned the same reference number or symbol, and detailed description of these elements is omitted.

(Variation 2-1)

Figure 40:
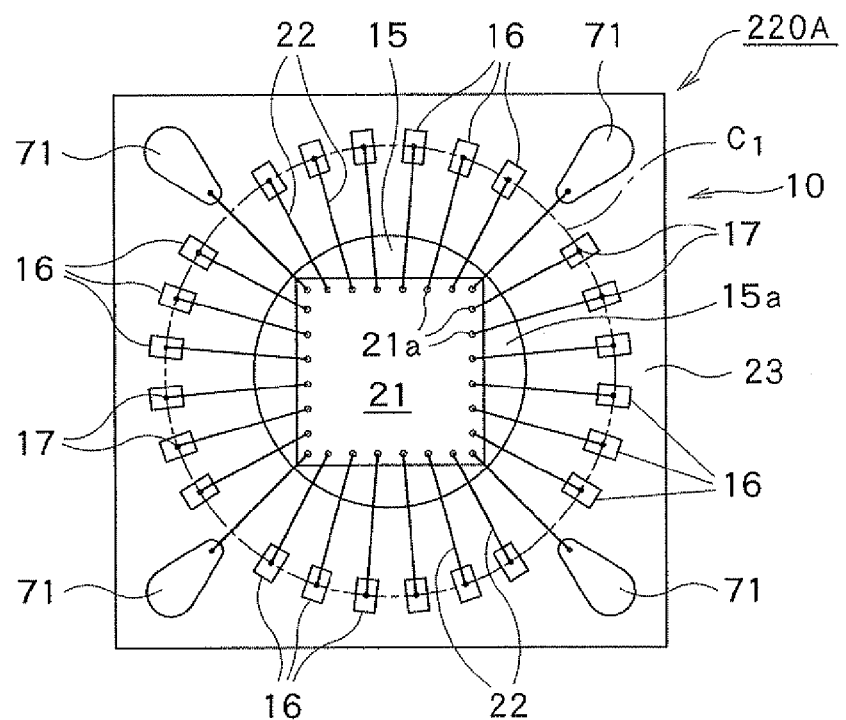
FIG. 40 is a plan view showing a semiconductor device according to a first variation of the second embodiment of the present invention (i.e., variation 2-1)
Figure 41:
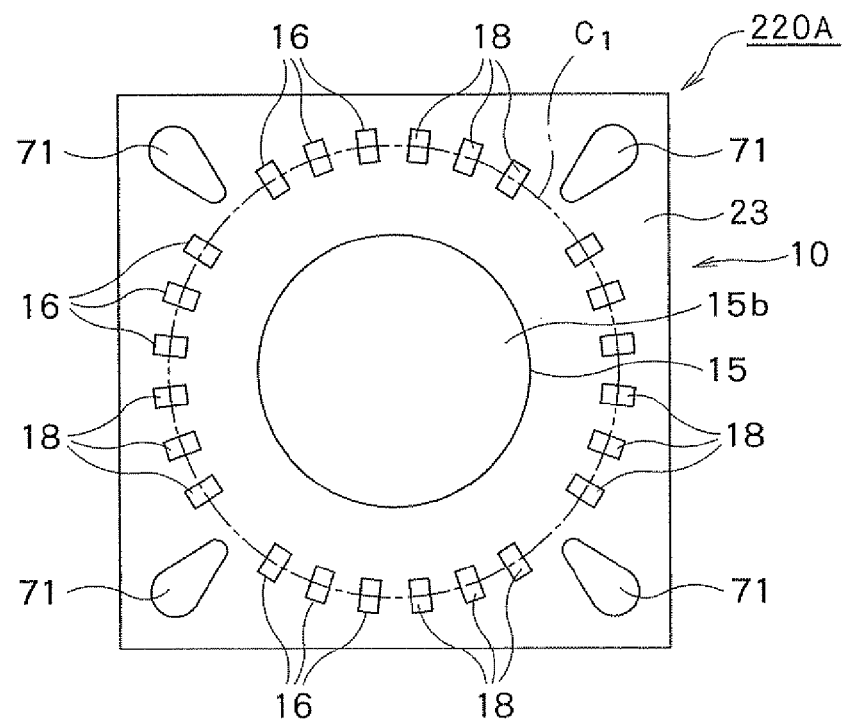
FIG. 41 is a bottom view showing the semiconductor device according to the first variation of the second embodiment of the present invention (i.e., variation 2-1)

FIGS. 40 and 41 show a semiconductor device 220A according to a first variation of the second embodiment. FIG. 40 is a plan view of the semiconductor device 220A (this plan view corresponds to FIG. 35), and FIG. 41 is a bottom view thereof (this bottom view corresponds to FIG. 36).

The semiconductor device 220A (variation 2-1) shown in FIGS. 40 and 41 differs from the embodiment shown in FIGS. 33 to 39, in that an external terminal 71 (additional external terminal) of a planar substantially oval shape is provided at each of four corners of a sealing resin section 23. The external terminals 71 are each exposed at the lower-surface side of the semiconductor device 220A, and similar to leads 16, each external terminal 71 protrudes downward from the sealing resin section 23. In addition, the external terminals 71 have a larger area than external terminals 18, and have a shape tapered toward a die pad 15.

The external terminals 71 can be used as grounding (GND) terminals for example. The use of such relatively large external terminals 71 enables the external terminals 71 to be strongly connected to a mounting substrate 45 via a solder portion 41 when the semiconductor device 220A is mounted on the mounting substrate 45. The mounting reliability of the semiconductor device 220A against thermal stresses applied thereto further improves.

The external terminals 71 do not need to be arranged at all of the four corners of the sealing resin section 23, and may be provided at one or some corners.

(Variation 2-2)

Figure 42:
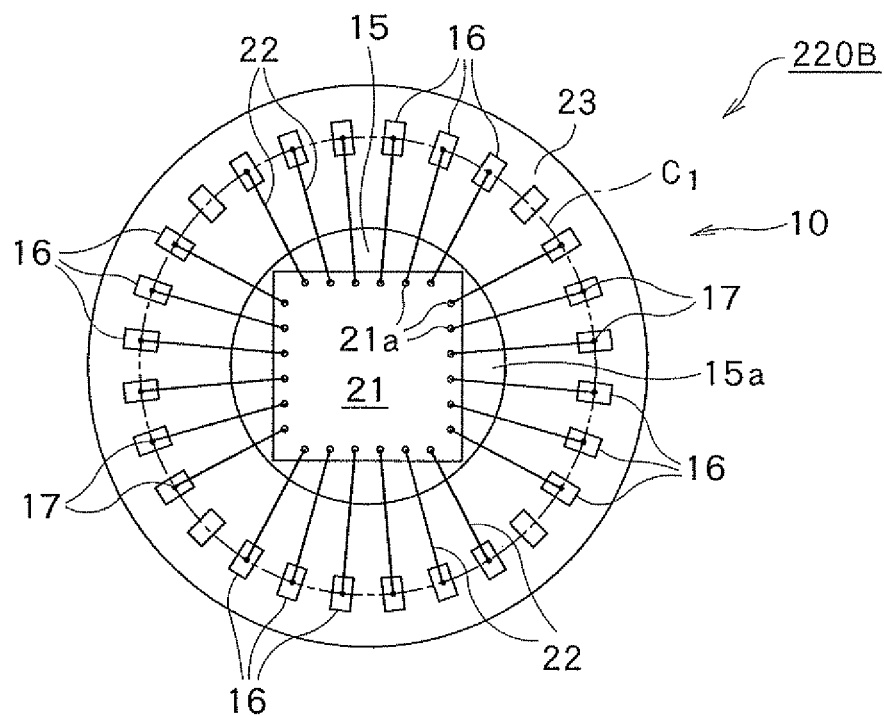
FIG. 42 is a plan view showing a semiconductor device according to a second variation of the second embodiment of the present invention (i.e., variation 2-2)
Figure 43:
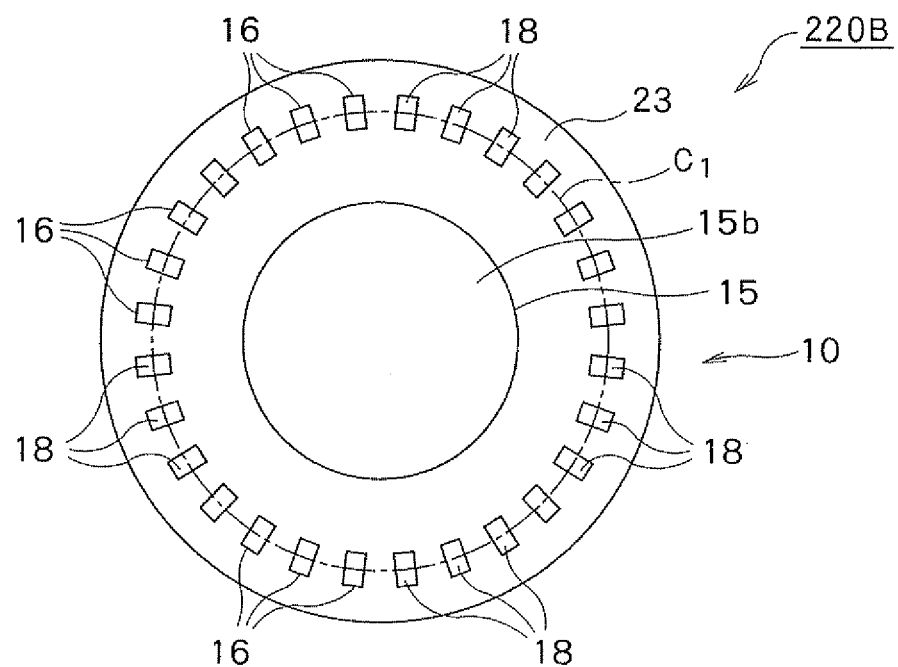
FIG. 43 is a bottom view showing the semiconductor device according to the second variation of the second embodiment of the present invention (i.e., variation 2-2)

FIGS. 42 and 43 show a semiconductor device 220B according to a second variation of the second embodiment. FIG. 42 is a plan view of the semiconductor device 220B (this plan view corresponds to FIG. 35), and FIG. 43 is a bottom view thereof (this bottom view corresponds to FIG. 36).

The semiconductor device 220B (variation 2-2) shown in FIGS. 42 and 43 differs from the embodiment shown in FIGS. 33 to 39, in that a sealing resin section 23 has a columnar shape. Circular surfaces of the sealing resin section 23 are concentric with a circumference $C_1$.

When such semiconductor device 220B is to be manufactured, the columnar sealing resin section 23 can be formed with a columnar mold in a process for forming the sealing resin section 23 (see FIG. 38(c)).

In this variation, the sealing resin section 23 is circular in a plane view. When heat is applied to the semiconductor device 220B, thermal stresses caused by a difference in thermal expansion coefficient between the semiconductor device 220B and the mounting substrate 45 are uniformly distributed in a circumferential direction. Mounting reliability of the semiconductor device 220B can be therefore further improved.

(Variation 2-3)

Figure 44:
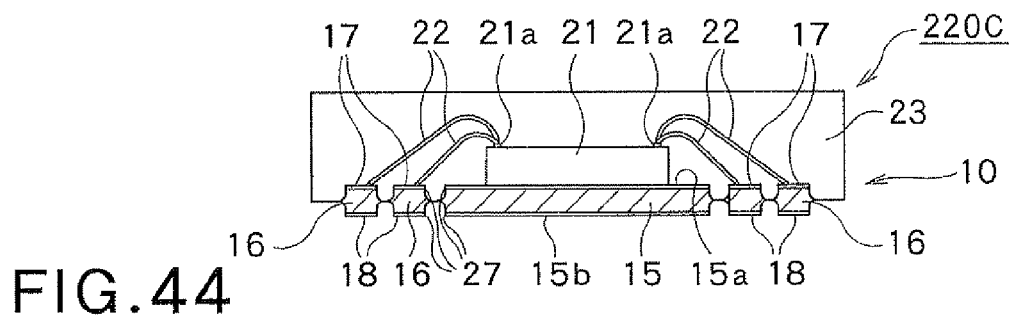
FIG. 44 is a cross-sectional view showing a semiconductor device according to a third variation of the second embodiment of the present invention (i.e., variation 2-3)
Figure 45:
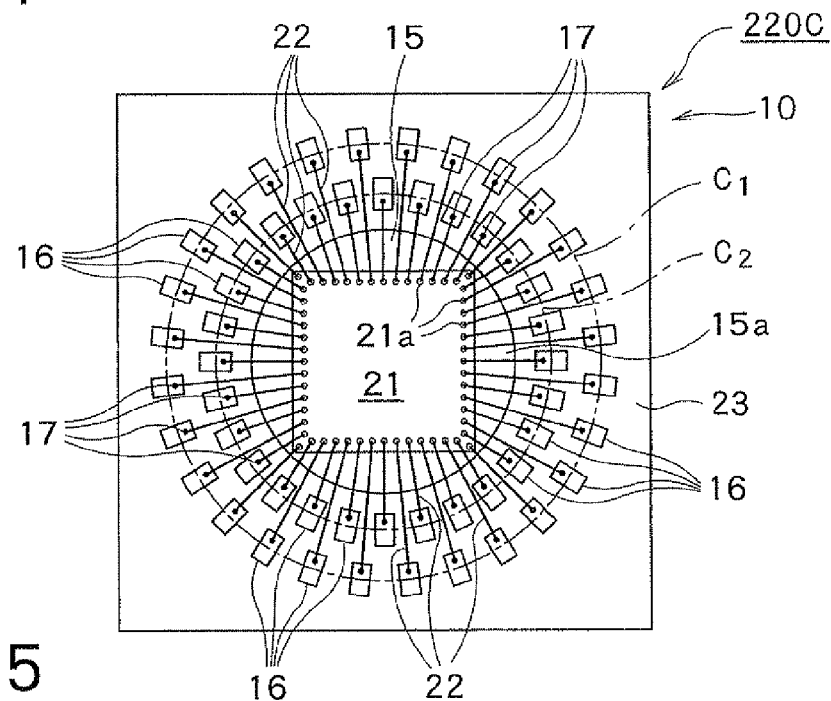
FIG. 45 is a plan view showing the semiconductor device according to the third variation of the second embodiment of the present invention (i.e., variation 2-3)
Figure 46:
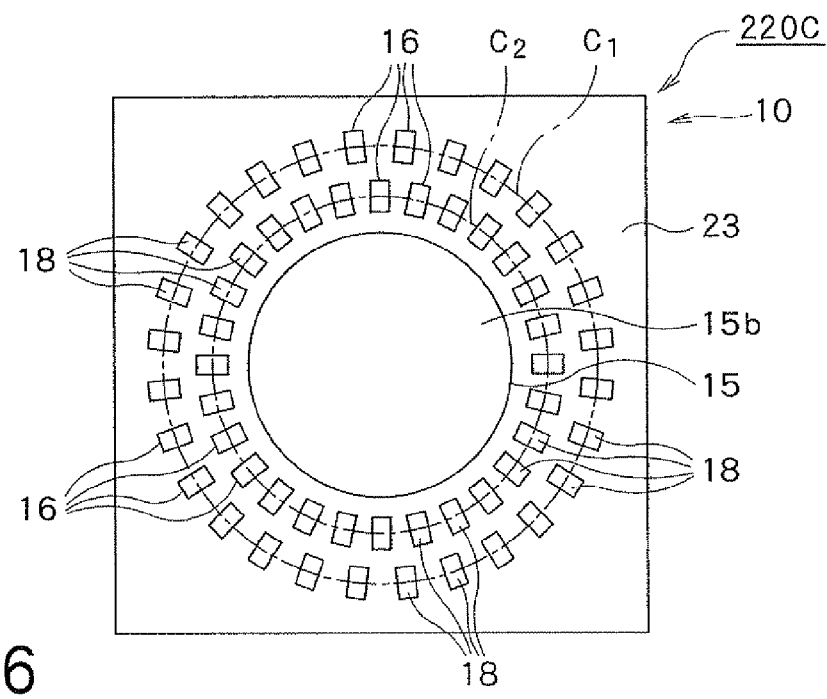
FIG. 46 is a bottom view showing the semiconductor device according to the third variation of the second embodiment of the present invention (i.e., variation 2-3)

FIGS. 44 to 46 show a semiconductor device 220C according to a third variation of the second embodiment. FIG. 44 is a cross-sectional view of the semiconductor device 220C (this cross-sectional view corresponds to FIG. 34), FIG. 45 is a plan view thereof (this plan view corresponds to FIG. 35), and FIG. 46 is a bottom view thereof (this bottom view corresponds to FIG. 36).

The semiconductor device 220C (variation 2-3) shown in FIGS. 44 to 46 differs from the embodiment shown in FIGS. 33 to 39, in that leads 16 are arranged on either of a plurality of (two) circumferences, $C_1$ and $C_2$, in a plane view.

More specifically, as shown in FIG. 45, internal terminals 17 of each lead 16 are arranged on either of the two circumferences $C_1$ and $C_2$ in a staggered layout. The circumferences $C_1$ and $C_2$ are concentric with each other, and the circumference $C_1$ has a larger diameter.

Similarly, at a lower surface of the semiconductor device 220C shown in FIG. 46, external terminals 18 of each lead 16 are arranged on either of the two circumferences $C_1$ and $C_2$ in staggered layout.

Areas and shapes of the internal terminals 17 and external terminals 18 may differ for each circumference on which they are arranged.

The arrangement of the leads 16 on the plurality of circumferences $C_1$ and $C_2$ in such way improves the mounting reliability of a solder portion 41, when the semiconductor device 220C is subjected to thermal stresses. In addition, the external terminals 18 at the lower surface of the semiconductor device 220C can be arranged in an efficient layout, so that the semiconductor device 220C can be adapted for multipin semiconductor element 21.

(Variation 2-4)

Figure 47:
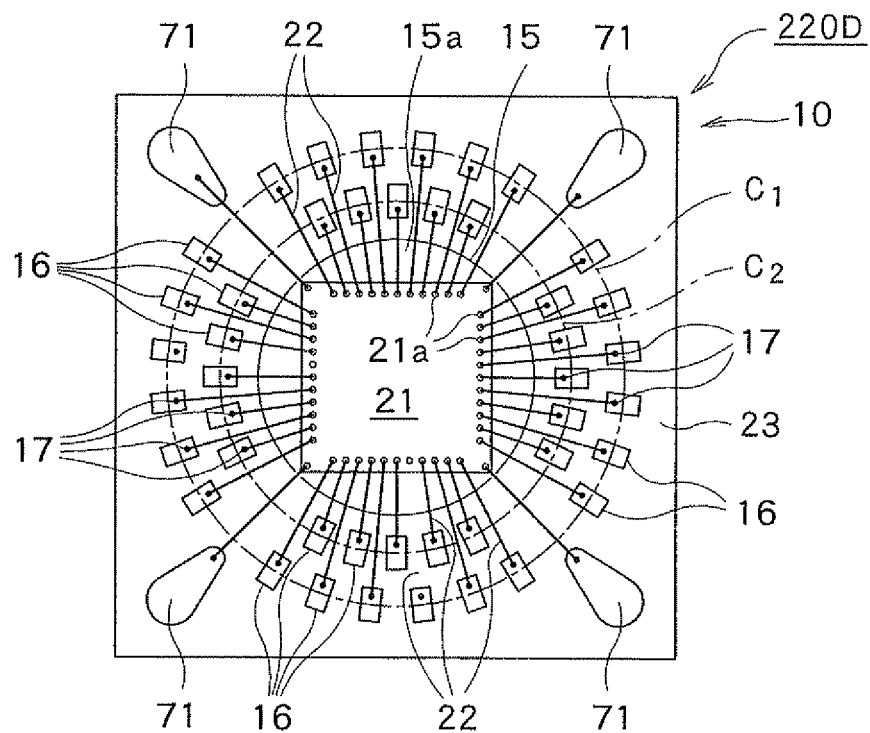
FIG. 47 is a plan view showing a semiconductor device according to a fourth variation of the second embodiment of the present invention (i.e., variation 2-4)
Figure 48:
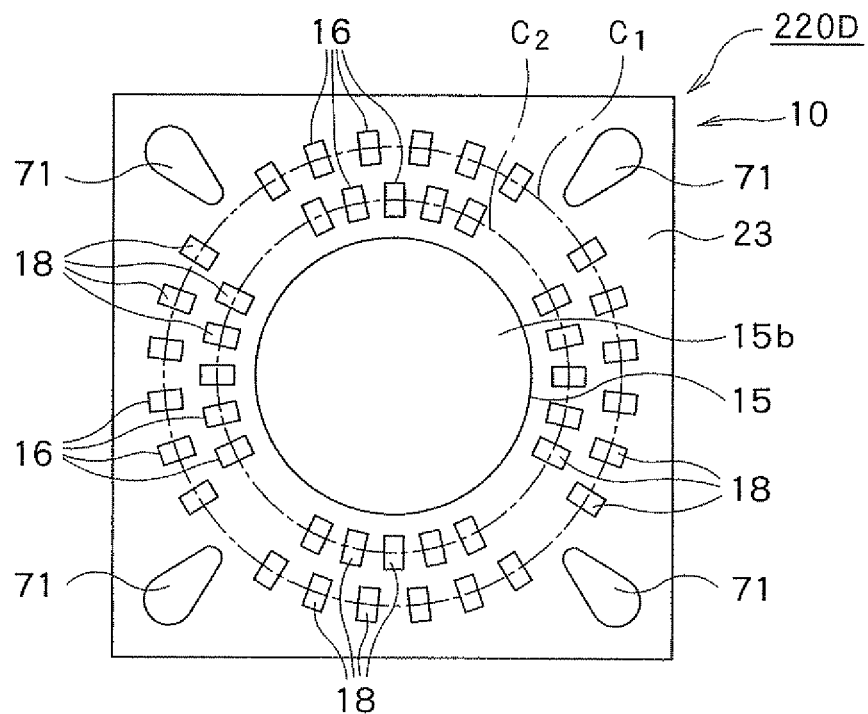
FIG. 48 is a bottom view showing the semiconductor device according to the fourth variation of the second embodiment of the present invention (i.e., variation 2-4)

FIGS. 47 and 48 show a semiconductor device 220D according to a fourth variation of the second embodiment. FIG. 47 is a plan view of the semiconductor device 220D (this plan view corresponds to FIG. 35), and FIG. 48 is a bottom view thereof (this bottom view corresponds to FIG. 36).

The semiconductor device 220D (variation 2-4) shown in FIGS. 47 and 48 is a combination of variation 2-1 shown in FIGS. 40 and 41, and variation 2-3 shown in FIGS. 44 to 46.

More specifically, in the semiconductor device 220D of FIGS. 47 and 48, an external terminal 71 (additional external terminal) of a planar oval shape is disposed at each of four corners of a sealing resin section 23, and leads 16 are arranged on either of two circumferences, $C_1$ and $C_2$, in a plane view.

(Variation 2-5)

Figure 49:
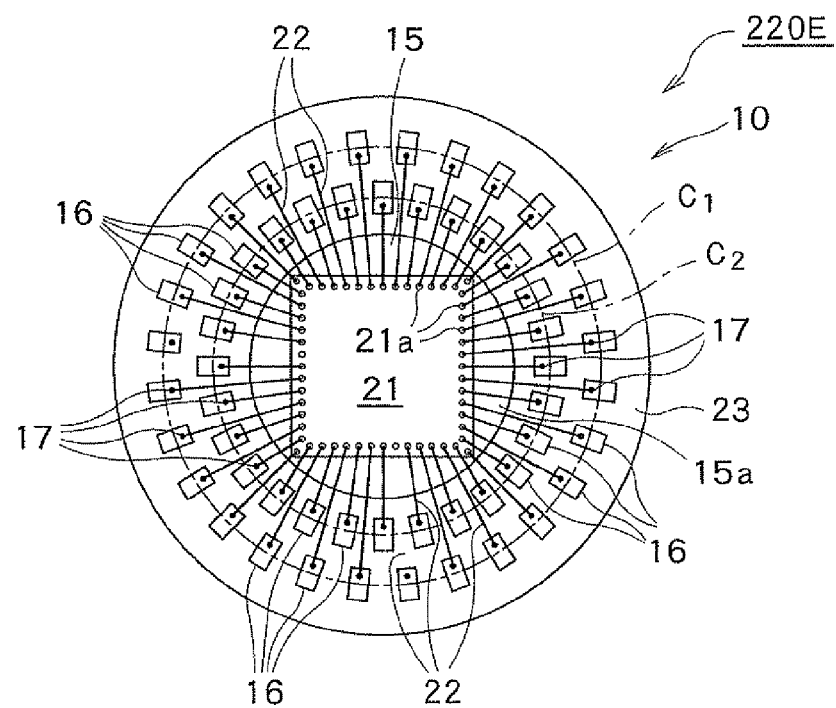
FIG. 49 is a plan view showing a semiconductor device according to a fifth variation of the second embodiment of the present invention (i.e., variation 2-5)
Figure 50:
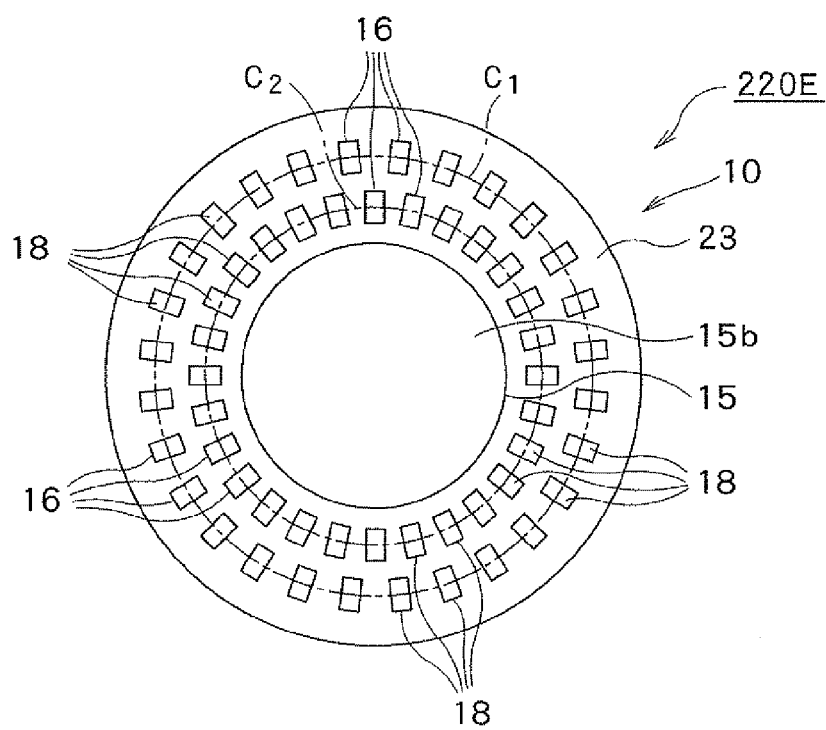
FIG. 50 is a bottom view showing the semiconductor device according to the fifth variation of the second embodiment of the present invention (i.e., variation 2-5)

FIGS. 49 and 50 show a semiconductor device 220E according to a fifth variation of the second embodiment. FIG. 49 is a plan view of the semiconductor device 220E (this plan view corresponds to FIG. 35), and FIG. 50 is a bottom view thereof (this bottom view corresponds to FIG. 36).

The semiconductor device 220E (variation 2-5) shown in FIGS. 49 and 50 is a combination of variation 2-2 shown in FIGS. 42 and 43, and variation 2-3 shown in FIGS. 44 to 46.

More specifically, the semiconductor device 220E shown in FIGS. 49 and 50 includes a sealing resin section 23 of a columnar shape and leads 16 arranged on either of two circumferences, $C_1$ and $C_2$, in a plane view.

(Variation 2-6)

Figure 51:
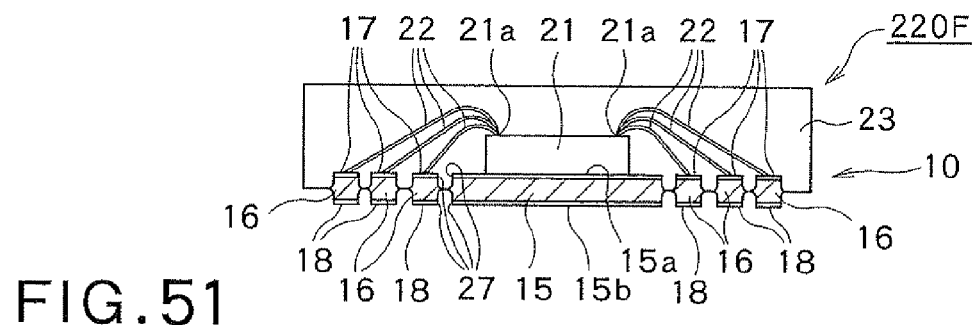
FIG. 51 is a cross-sectional view showing a semiconductor device according to a sixth variation of the second embodiment of the present invention (i.e., variation 2-6)
Figure 52:
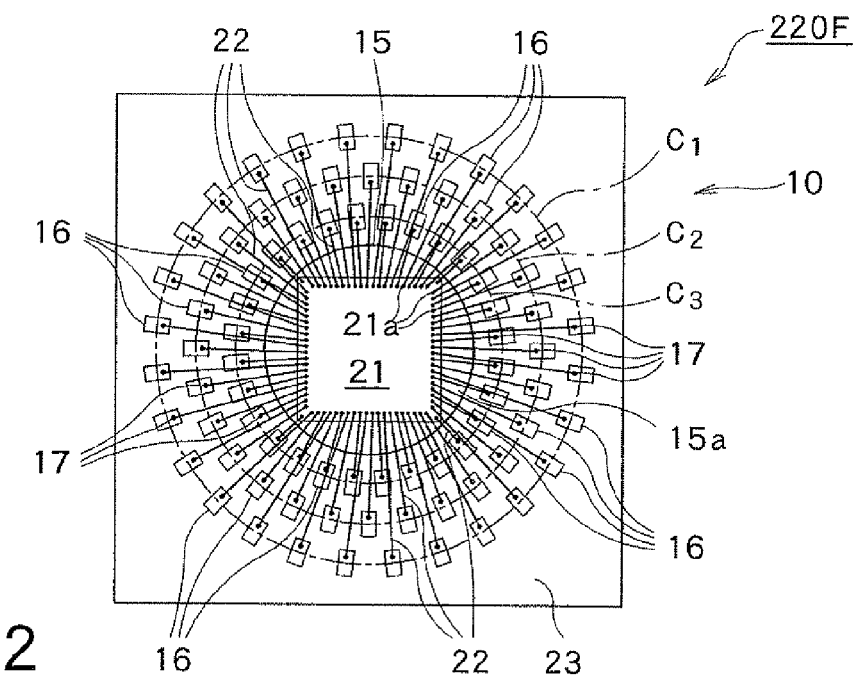
FIG. 52 is a plan view showing the semiconductor device according to the sixth variation of the second embodiment of the present invention (i.e., variation 2-6)
Figure 53:
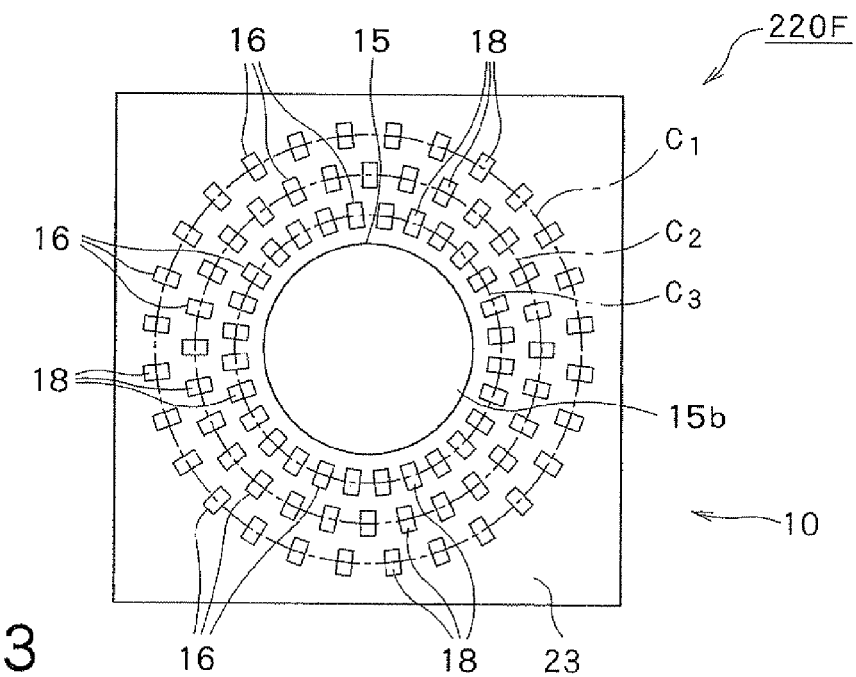
FIG. 53 is a bottom view showing the semiconductor device according to the sixth variation of the second embodiment of the present invention (i.e., variation 2-6)

FIGS. 51 to 53 show a semiconductor device 220F according to a sixth variation of the second embodiment. FIG. 51 is a cross-sectional view of the semiconductor device 220F (this cross-sectional view corresponds to FIG. 34), FIG. 52 is a plan view thereof (this plan view corresponds to FIG. 35), and FIG. 53 is a bottom view thereof (this bottom view corresponds to FIG. 36).

The semiconductor device 220F (variation 2-6) shown in FIGS. 51 to 53 differs from the embodiment shown in FIGS. 33 to 39, in that leads 16 are arranged on any of a plurality of (three) circumferences, $C_1$, $C_2$, and $C_3$, in a plane view.

More specifically, as shown in FIG. 52, internal terminals 17 of each lead 16 are arranged on any of the three circumferences $C_2$, and $C_3$, in staggered layout. The circumferences $C_1$, $C_2$, and $C_3$ are concentric with one another, and diameters of the circumferences are larger in the order of $C_1$, $C_2$, $C_3$.

Similarly, at a lower surface of the semiconductor device 220F shown in FIG. 53, external terminals 18 of each lead 16 are arranged on any of the three circumferences $C_1$, $C_2$, and $C_3$ in staggered layout.

The internal terminals 17 and the external terminals 18 may be arranged on four or more circumferences. Areas and shapes of the internal terminals 17 and external terminals 18 may differ for each circumference on which they are arranged.

Arrangement of the leads 16 on the plurality of circumferences $C_1$, $C_2$, and $C_3$ in such way improves mounting reliability of the semiconductor device 220F when thermal stresses are applied thereto. In addition, the external terminals 18 at the lower surface of the semiconductor device 220C can be arranged in an efficient layout, so that the semiconductor device 220C can be adapted for multipin semiconductor element 21.

(Variation 2-7)

Figure 54:
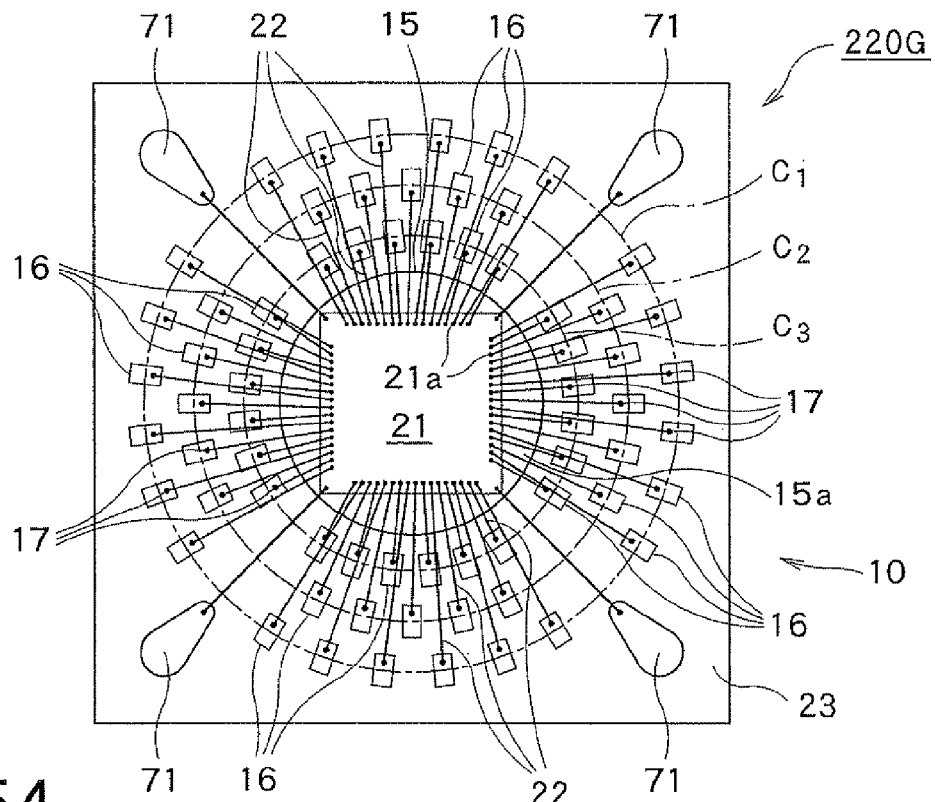
FIG. 54 is a plan view showing a semiconductor device according to a seventh, variation of the second embodiment of the present invention (i.e., variation 2-7)
Figure 55:
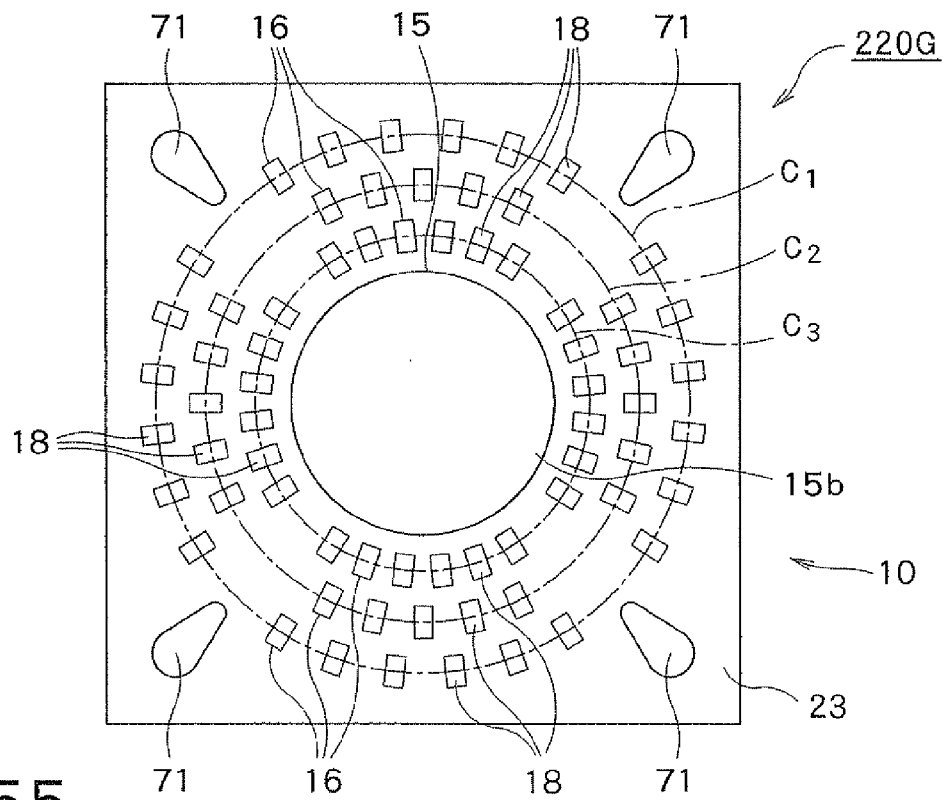
FIG. 55 is a bottom view showing the semiconductor device according to the seventh variation of the second embodiment of the present invention (i.e., variation 2-7)

FIGS. 54 and 55 show a semiconductor device 220G according to a seventh variation of the second embodiment. FIG. 54 is a plan view of the semiconductor device 220G (this plan view corresponds to FIG. 35), and FIG. 55 is a bottom view thereof (this bottom view corresponds to FIG. 36).

The semiconductor device 220G (variation 2-7) shown in FIGS. 54 and 55 is a combination of variation 2-1 shown in FIGS. 40 and 41, and variation 2-6 shown in FIGS. 51 to 53.

More specifically, in the semiconductor device 220G of FIGS. 54 and 55, an external terminal 71 (additional external terminal) of a planar oval shape is disposed at each of four corners of a sealing resin section 23, and leads 16 are arranged on any of three circumferences, $C_1$, $C_2$, and $C_3$, in a plane view.

(Variation 2-8)

Figure 56:
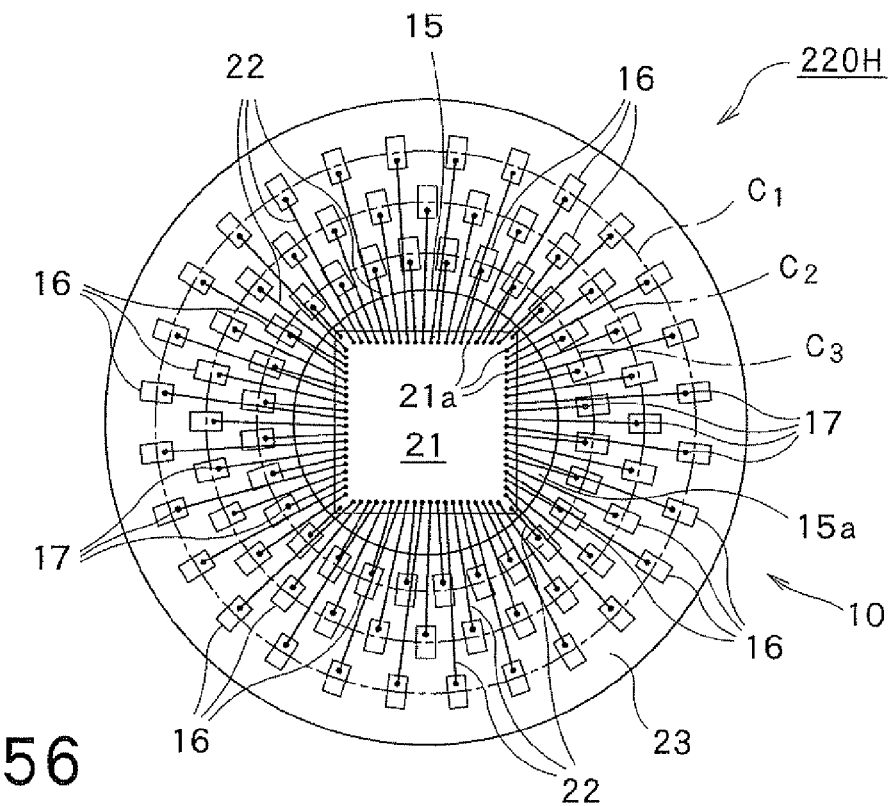
FIG. 56 is a plan view showing a semiconductor device according to an eighth variation of the second embodiment of the present invention (i.e., variation 2-8)
Figure 57:
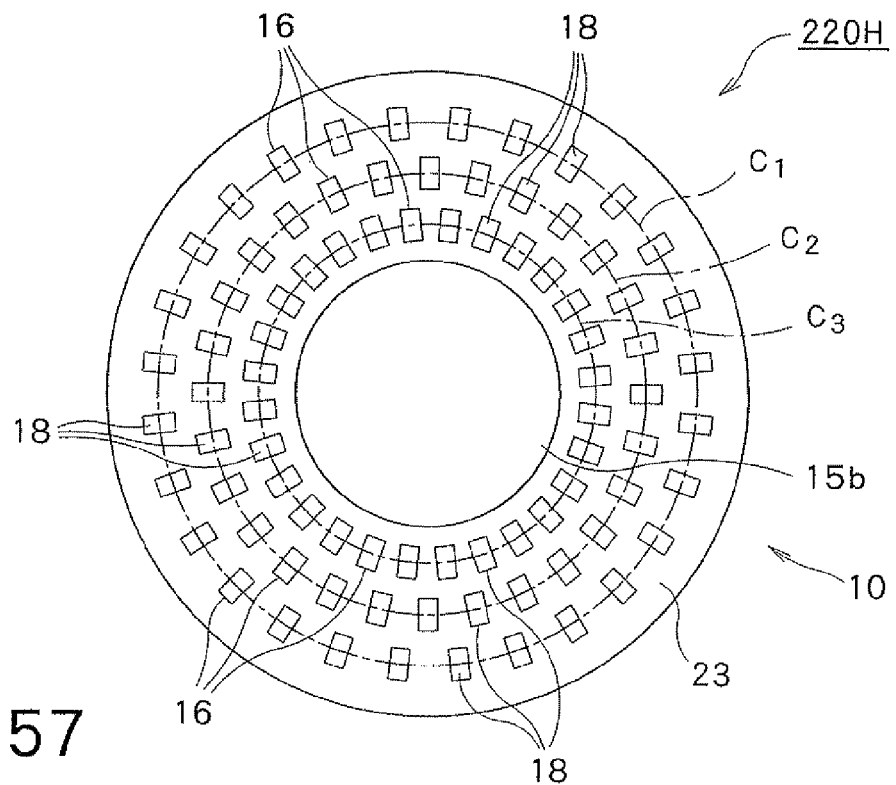
FIG. 57 is a bottom view showing the semiconductor device according to the eighth variation of the second embodiment of the present invention (i.e., variation 2-8)

FIGS. 56 and 57 show a semiconductor device 220H according to an eighth variation of the second embodiment. FIG. 56 is a plan view of the semiconductor device 220H (this plan view corresponds to FIG. 35), and FIG. 57 is a bottom view thereof (this bottom view corresponds to FIG. 36).

The semiconductor device 220H shown as variation 2-8 in FIGS. 56 and 57 is a combination of variation 2-2 shown in FIGS. 42 and 43, and variation 2-6 shown in FIGS. 51 to 53.

More specifically, the semiconductor device 220H shown in FIGS. 56 and 57 includes a sealing resin section 23 of a columnar shape and leads 16 arranged on any of three circumferences, $C_1$, $C_2$, and $C_3$, in a plane view.

(Variation 2-9)

Figure 58:
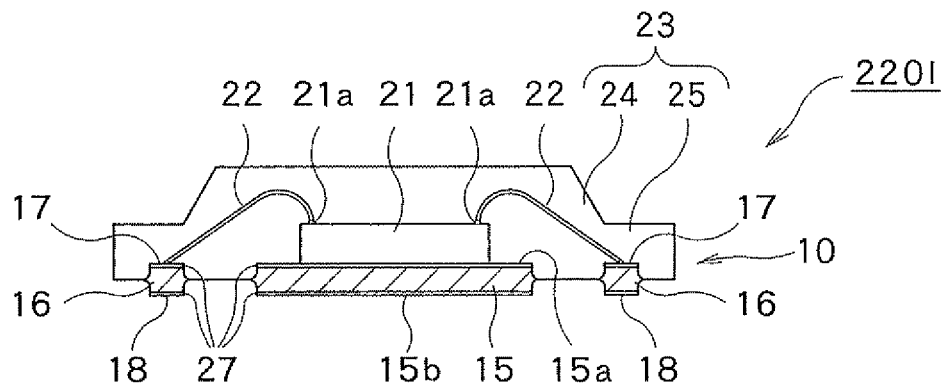
FIG. 58 is a cross-sectional view showing a semiconductor device according to a ninth variation of the second embodiment of the present invention (i.e., variation 2-9)

FIG. 58 shows a semiconductor device 220I according to a ninth variation of the second embodiment. FIG. 58 is a cross-sectional view of the semiconductor device 220I (this cross-sectional view corresponds to FIG. 34).

The semiconductor device 220I (variation 2-9) shown in FIG. 58 differs from the embodiment shown in FIGS. 33 to 39, in that a sealing resin section 23 includes a central region 24 provided over and around a semiconductor element 21, and a marginal region 25 provided around a circumferential edge of the central region 24. The thickness of the central region 24 is greater than that of the marginal region 25.

The central region 24 of the sealing resin section 23 is of a truncated conical shape with a tapered side face. The shape of the marginal region 25 may be a planar rectangle, a planar circle, or a planar polygon. The shape of the central region 24 is not limited to a truncated cone, and may be others such as a column, dome-like shape, or truncated polygonal pyramid.

When such semiconductor device 220I is to be manufactured, the truncated conical sealing resin section 23 can be formed with a truncated conical mold in a process for forming the sealing resin section 23 (see FIG. 38(c)).

Other elements constituting the semiconductor device 220I are substantially the same as those of the embodiment shown in FIGS. 33 to 39.

Since the central region 24 of the sealing resin section 23 is thickened than the marginal region 25, the volume of the sealing resin section 23, of which coefficient of thermal expansion is relatively low, can be reduced. This allows a thermal expansion coefficient of the entire semiconductor device 220I to be close to that of a mounting substrate 45. Thermal stresses caused by application of heat to the semiconductor device 220I are alleviated and mounting reliability can be improved.

(Variation 2-10)

Figure 59:
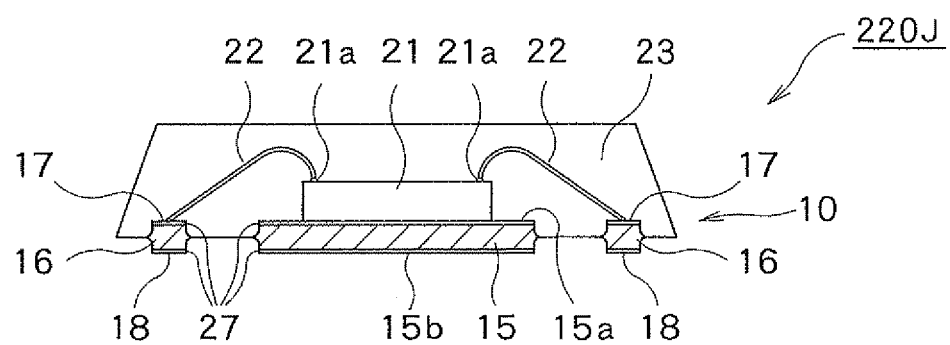
FIG. 59 is a cross-sectional view showing a semiconductor device according to a tenth variation of the second embodiment of the present invention (i.e., variation 2-10)

FIG. 59 shows a semiconductor device 220J according to a tenth variation of the second embodiment. FIG. 59 is a cross-sectional view of the semiconductor device 220J (this cross-sectional view corresponds to FIG. 34).

The semiconductor device 220J (variation 2-10) shown in FIG. 59 differs from the embodiment shown in FIGS. 33 to 39, in that the device 220J includes a sealing resin section 23 whose cross-sectional shape is a trapezoid. When such semiconductor device 220J is to be manufactured, the sealing resin section 23 can be formed with an appropriate mold, corresponding to the semiconductor device 220J, in a process for forming the sealing resin section 23 (individual molding) (FIG. 38(c)).

Since the cross-sectional shape of the sealing resin section 23 is trapezoid, the volume of the sealing resin section 23, whose thermal expansion coefficient is relatively low, can be reduced. This allows a thermal expansion coefficient of the entire semiconductor device 220J to become close to that of a mounting substrate 45 (see FIG. 39). Thermal stresses caused by application of heat to the semiconductor device 220J are alleviated and mounting reliability can be improved.

(Variation 2-11)

Figure 60:
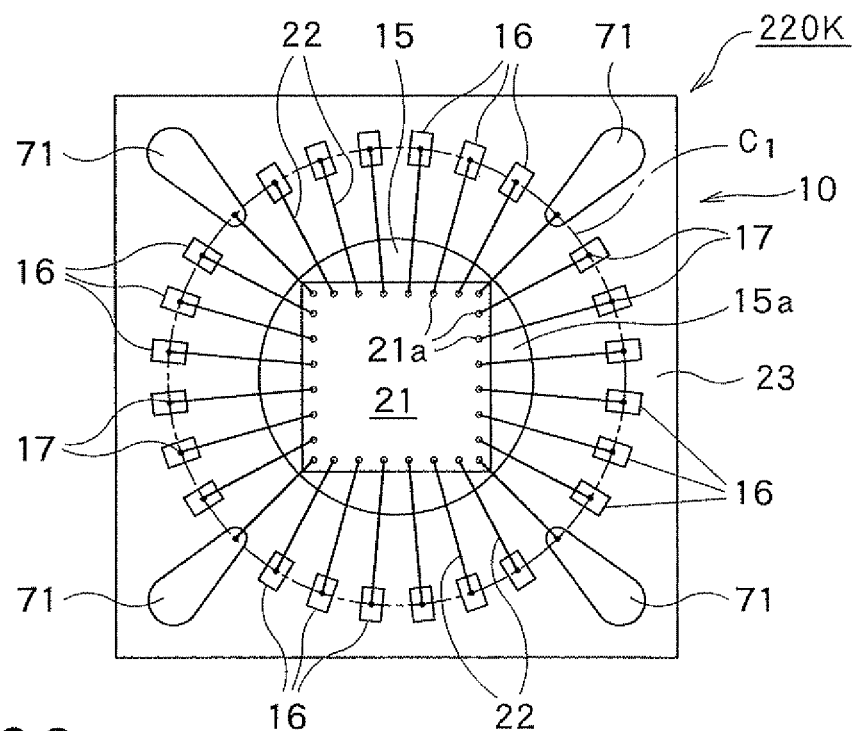
FIG. 60 is a plan view showing a semiconductor device according to an eleventh variation of the second embodiment of the present invention (i.e., variation 2-11)
Figure 61:
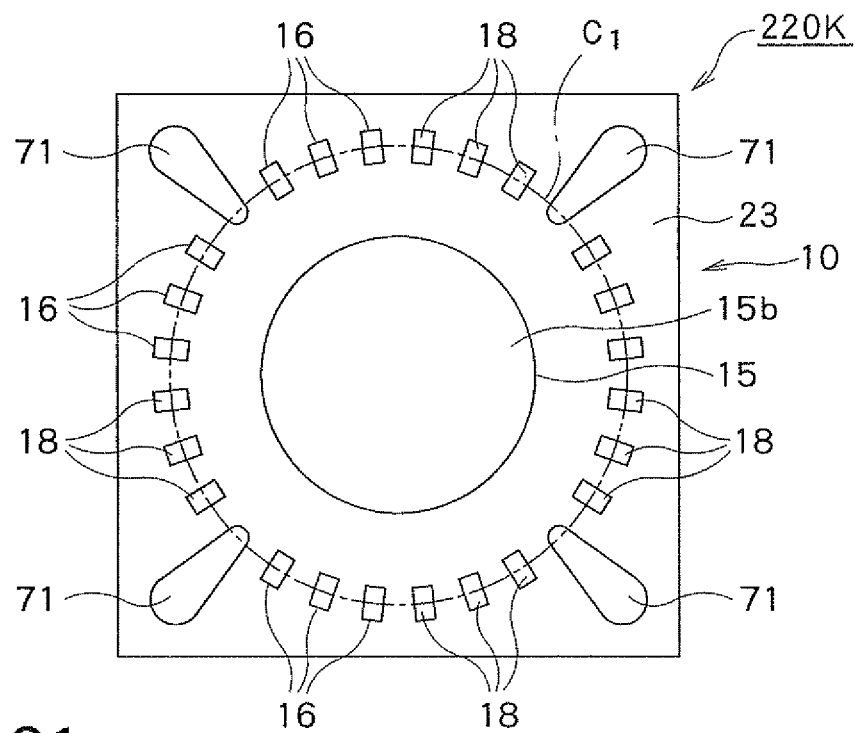
FIG. 61 is a bottom view showing the semiconductor device according to the eleventh variation of the second embodiment of the present invention (i.e., variation 2-11)

FIGS. 60 and 61 show a semiconductor device 220K according to an eleventh variation of the second embodiment. FIG. 60 is a plan view of the semiconductor device 220K (this plan view corresponds to FIG. 35), and FIG. 61 is a bottom view thereof (this bottom view corresponds to FIG. 36).

The semiconductor device 220K (variation 2-11) shown in FIGS. 60 and 61 differs from variation 2-1 shown in FIGS. 40 and 41, in that the external terminals 71 (additional external terminals) are extended inward in a radial direction from four corners of a sealing resin section 23 to a circumference $C_1$ on which leads 16 are arranged.

Extension of the external terminals 71 (additional external terminals) to a vicinity of the leads 16 as mentioned enables a mounting stress applied to the leads 16 to be further mitigated.

(Variation 2-12)

Figure 62:
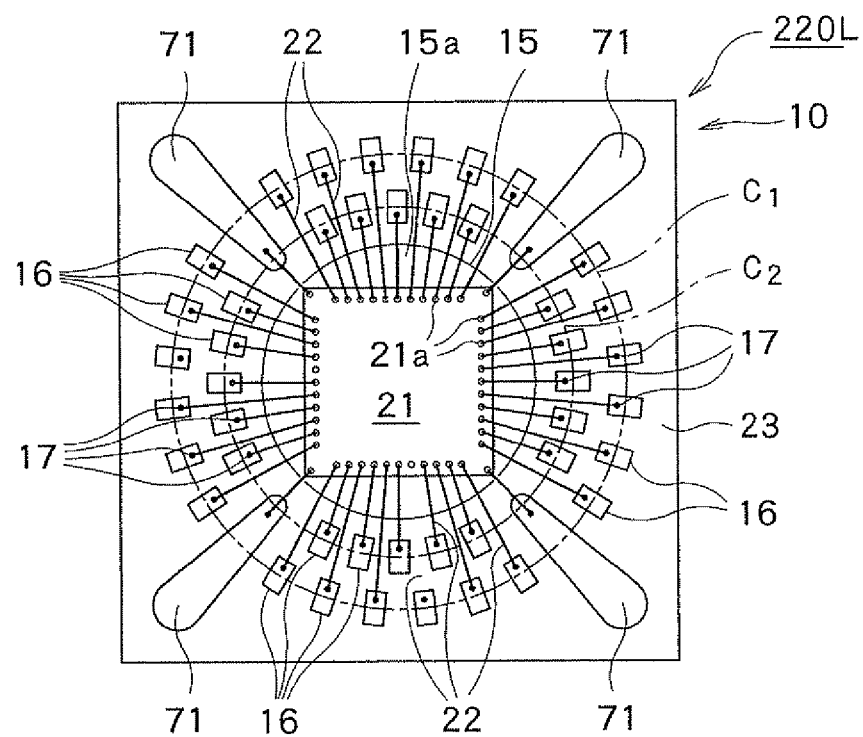
FIG. 62 is a plan view showing a semiconductor device according to a twelfth variation of the second embodiment of the present invention (i.e., variation 2-12)
Figure 63:
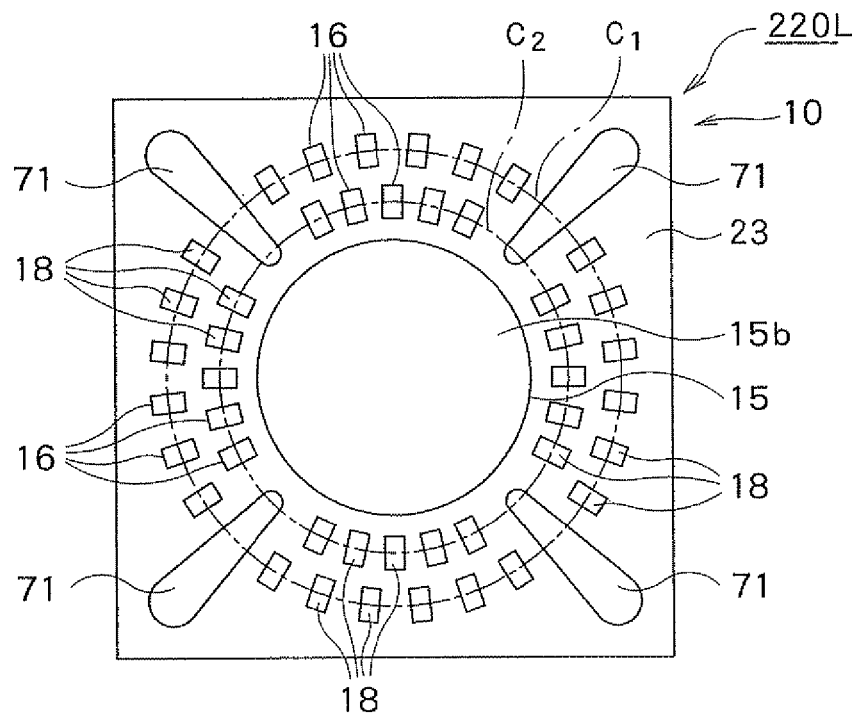
FIG. 63 is a bottom view showing the semiconductor device according to the twelfth variation of the second embodiment of the present invention (i.e., variation 2-12)

FIGS. 62 and 63 show a semiconductor device 220L according to a twelfth variation of the second embodiment. FIG. 62 is a plan view of the semiconductor device 220L (this plan view corresponds to FIG. 35), and FIG. 63 is a bottom view thereof (this bottom view corresponds to FIG. 36).

The semiconductor device 220L (variation 2-12) shown in FIGS. 62 and 63 differs from variation 2-4 shown in FIGS. 47 and 48, in that the external terminals 71 (additional external terminals) are extended inward in a radial direction from four corners of a sealing resin section 23 to a circumference $C_2$, which is the most inner circumference having leads 16 arranged thereon.

Extension of the external terminals 71 (additional external terminals) to a vicinity of the leads 16 as mentioned enables a mounting stress applied to the leads 16 to be further mitigated.

(Variation 2-13)

Figure 64:
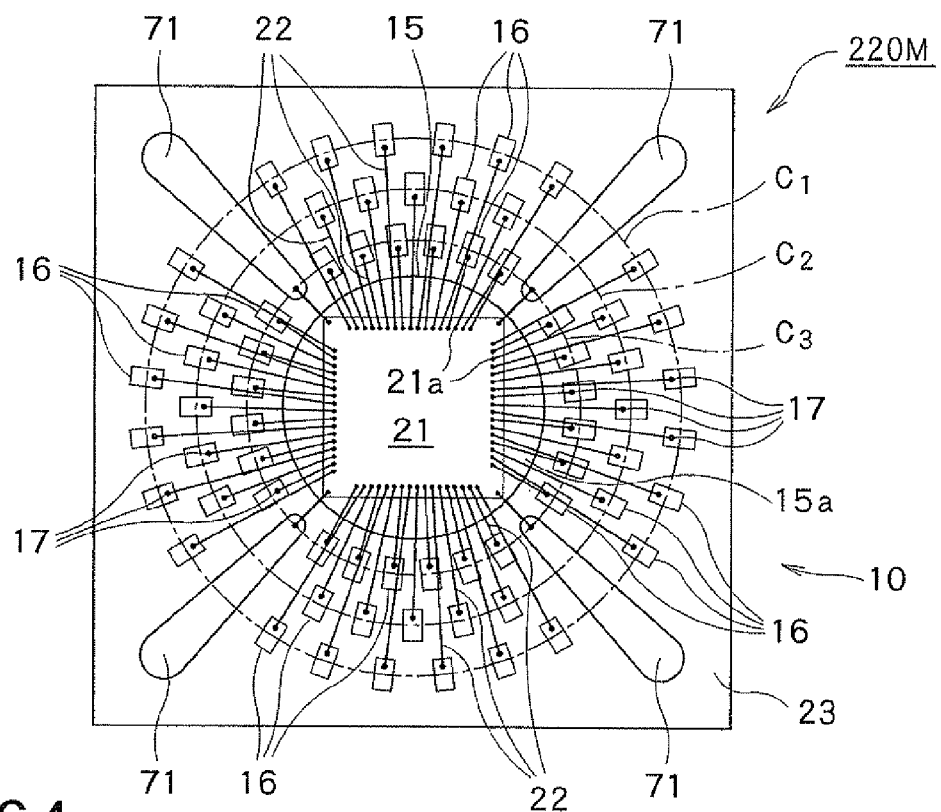
FIG. 64 is a plan view showing a semiconductor device according to a thirteenth variation of the second embodiment of the present invention (i.e., variation 2-13)
Figure 65:
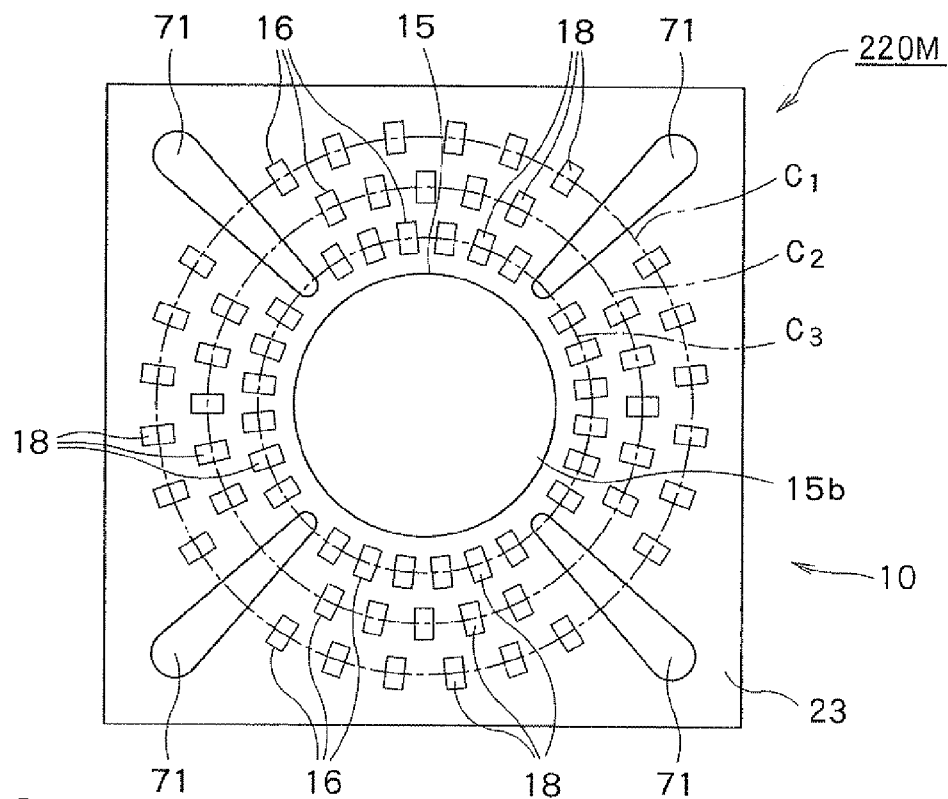
FIG. 65 is a bottom view showing the semiconductor device according to the thirteenth variation of the second embodiment of the present invention (i.e., variation 2-13)

FIGS. 64 and 65 show a semiconductor device 220M according to a thirteenth variation of the second embodiment. FIG. 64 is a plan view of the semiconductor device 220M (this plan view corresponds to FIG. 35), and FIG. 65 is a bottom view thereof (this bottom view corresponds to FIG. 36).

The semiconductor device 220M (variation 2-13) shown in FIGS. 64 and 65 differs from variation 2-7 of FIGS. 54 and 55, in that the external terminals 71 (additional external terminals) are extended inward in a radial direction from four corners of a sealing resin section 23 to a circumference $C_3$, which is the most inner circumference having leads 16 arranged thereon.

Extension of the external terminals 71 (additional external terminals) to a vicinity of the leads 16 as mentioned enables a mounting stress applied to the leads 16 to be further mitigated.

(Variation 2-14)

Figure 66:
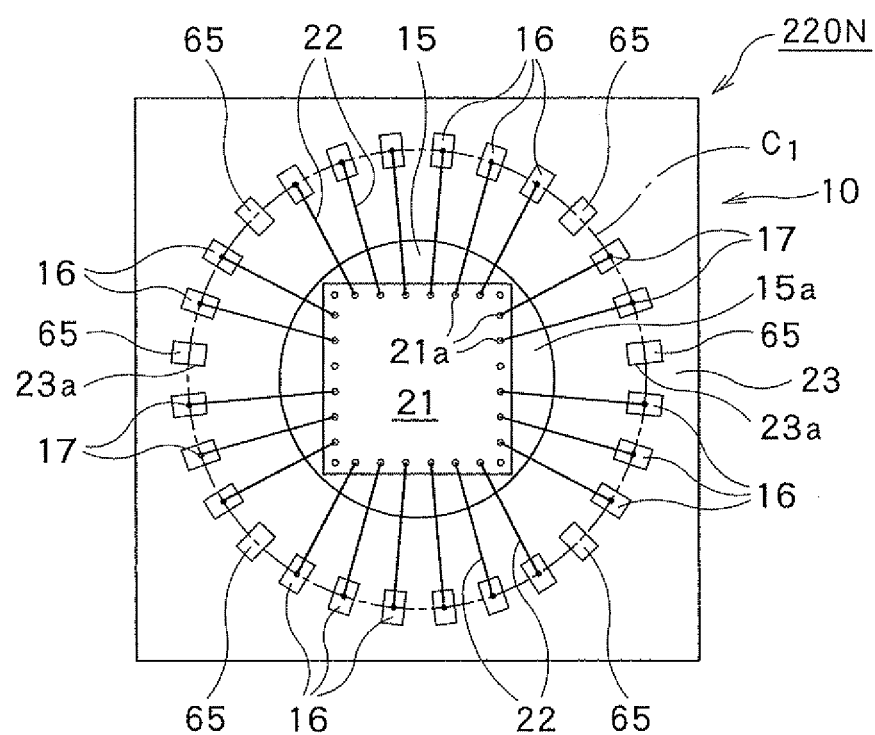
FIG. 66 is a plan view showing a semiconductor device according to a fourteenth variation of the second embodiment of the present invention (i.e., variation 2-14)
Figure 67:
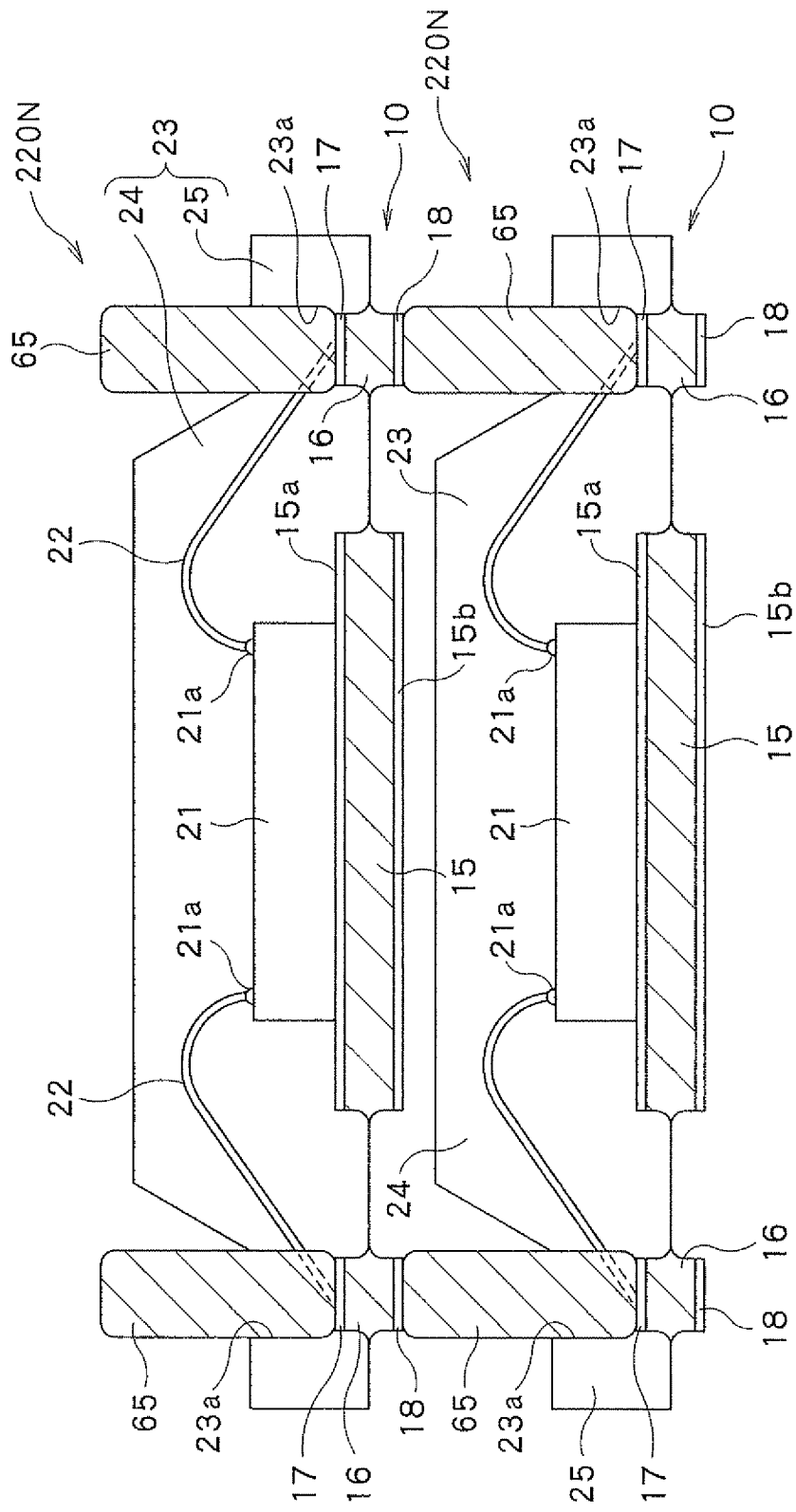
FIG. 67 is a cross-sectional view showing the semiconductor device according to the fourteenth variation of the second embodiment of the present invention (i.e., variation 2-14)

FIGS. 66 and 67 show a semiconductor device 220N according to a fourteenth variation of the second embodiment. FIG. 66 is a plan view of the semiconductor device 220N (this plan view corresponds to FIG. 35), and FIG. 67 is a cross-sectional view thereof (this cross-sectional view corresponds to FIG. 34).

In the semiconductor device 220N (variation 2-14) shown in FIGS. 66 and 67, an externally protruding terminal 65 is formed on at least one of an upper surface of a plurality of leads 16. The externally protruding terminal 65 is formed and exposed at an opening 23a in a sealing resin section 23 (marginal region 25) so that an upper surface of the semiconductor device 220N can be used for connection. The externally protruding terminal 65 may be solder, silver (Ag) paste, or any other appropriate, general connecting material.

Since the externally protruding terminal 65 is formed on the upper surface of at least one lead 16 in this way, the externally protruding terminal 65 of a lower semiconductor device 220N can be connected to the external terminal 18 of an upper semiconductor device 220N. Thus, a plurality of semiconductor devices 220N can be stacked vertically upon each other.

The constituent elements disclosed in the above embodiment and variations can also be appropriately combined as required. Alternatively, several constituent elements of all those described and shown in the above embodiment and variations may be deleted.

For example, the variations 2-1 to 2-8, 2-12 and 2-13 shown in FIGS. 40 to 57 and 60 to 65 may be combined with the variation 2-9 shown in FIG. 58. Thus, in any one of the corresponding semiconductor devices 220A to 220H and 220K to 220M shown in FIGS. 40 to 57 and 60 to 65, the central region 24 of the sealing resin section 23 may be made thicker than the marginal region 25. Alternatively, the variations 2-1 to 2-8, 2-12 and 2-13 shown in FIGS. 40 to 57 and 60 to 65 may be combined with the variation 2-10 shown in FIG. 59. Thus, the sealing resin section 23 in the particular combination of these variations may have a trapezoidal shape in cross-section.

Third Embodiment

Next, a third embodiment of the present invention will be described referring to FIGS. 68 to 99.

Semiconductor Device Configuration

A configuration of a semiconductor device according to the third embodiment of the present invention is first described below per FIGS. 68 to 71. FIGS. 68 to 71 show the semiconductor device (QFN package) according to the third embodiment of the present invention.

As shown in FIGS. 68 to 71, the semiconductor device 320 includes a lead frame 10 having a die pad 15 and a plurality of leads 16 arranged around the die pad 15.

A semiconductor element 21 is rested on the die pad 15 of the lead frame 10. The leads 16 of the lead frame 10 and terminals 21a of the semiconductor element 21 are electrically interconnected by a plurality of bonding wires 22 (electroconductive portions).

The lead frame 10, the semiconductor element 21, and the bonding wires 22 are sealed with a resin by a sealing resin section 23.

The lead frame 10 as a whole is composed from metallic materials such as copper, copper alloy, and alloy 42 (Fe alloy with 42% Ni). The die pad 15 and leads 16 of the lead frame 10 are each formed by, for example, etching one metallic substrate composed from those metallic materials.

Figure 69:
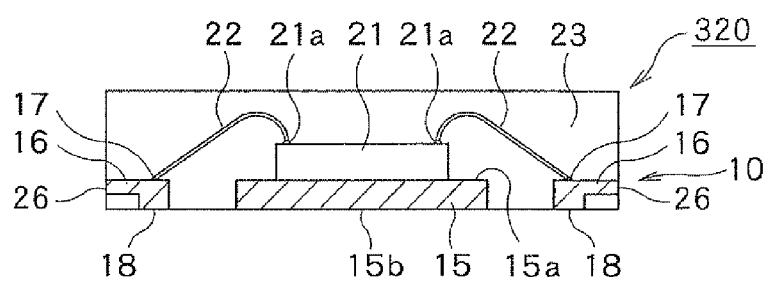
FIG. 69 is a cross-sectional view (taken along line H-H in FIG. 68) that shows the semiconductor device according to the third embodiment of the present invention.
Figure 70:
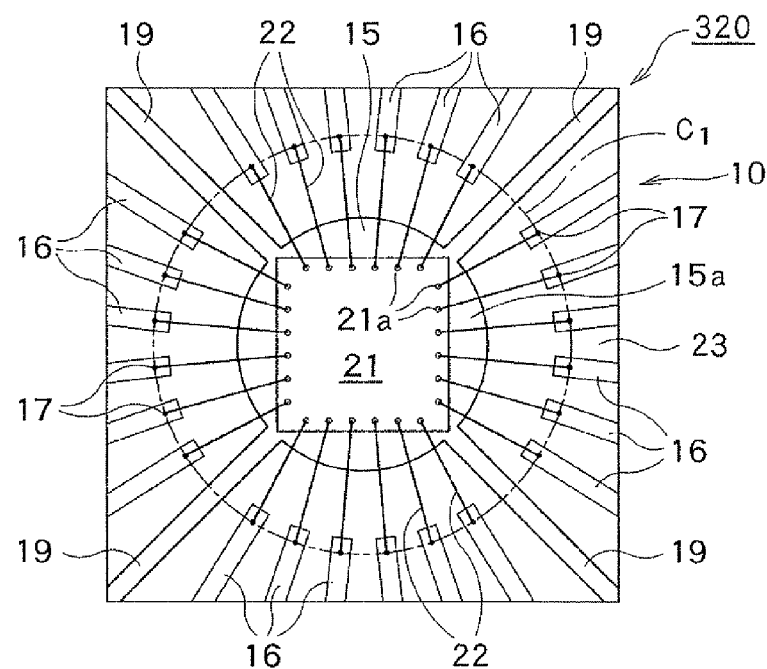
FIG. 70 is a plan view showing the semiconductor device according to the third embodiment of the present invention.
Figure 71:
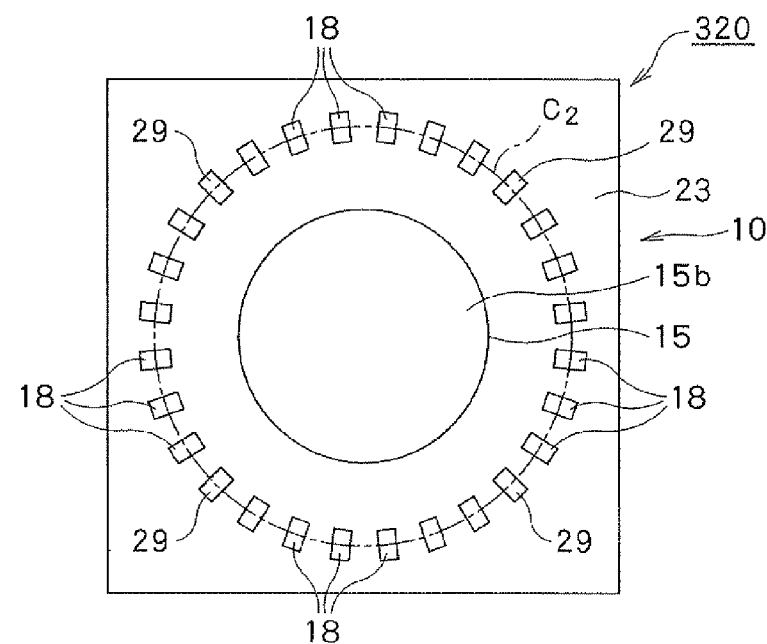
FIG. 71 is a bottom view showing the semiconductor device according to the third embodiment of the present invention.
Figure 72:
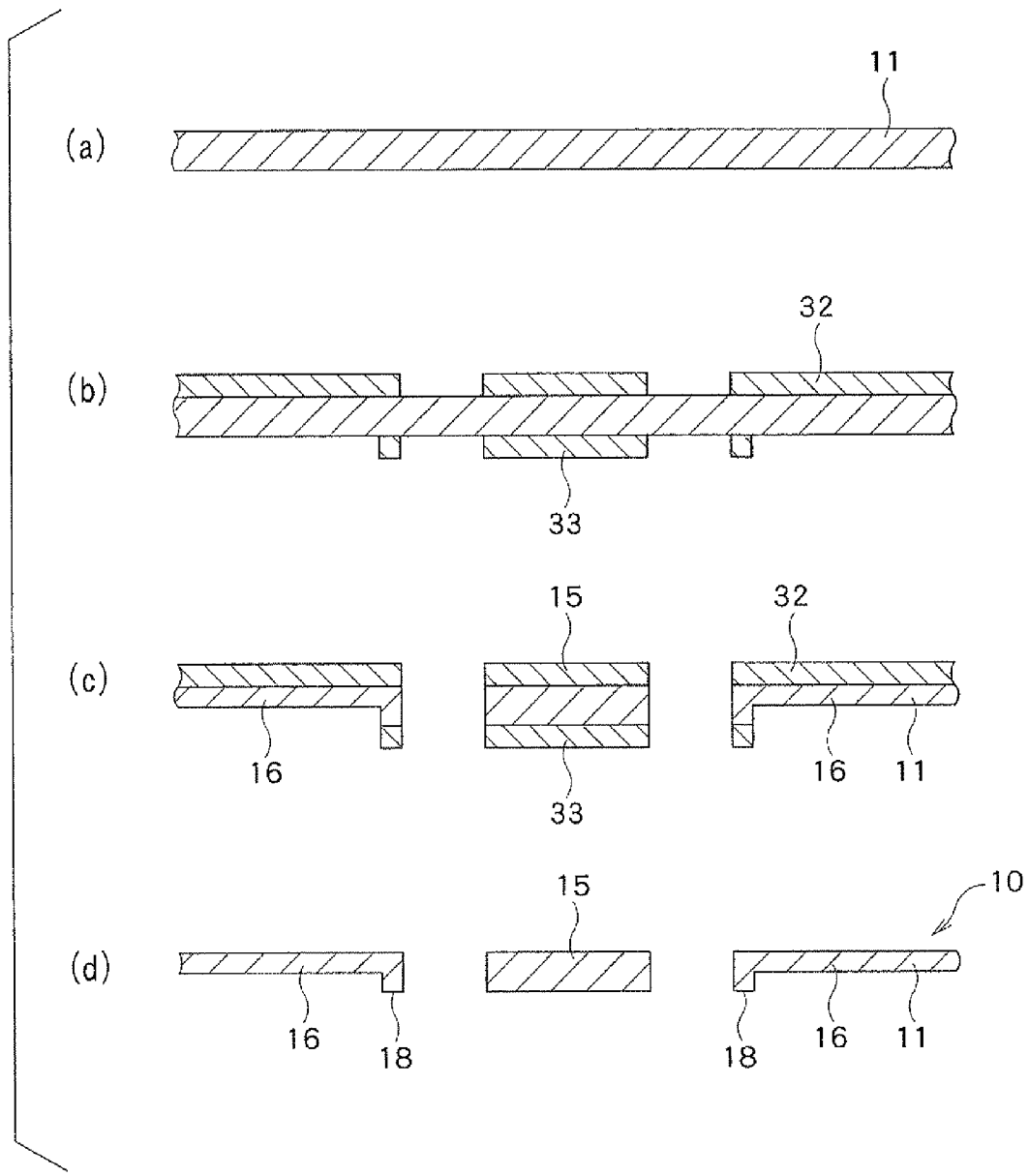
FIG. 72 is a cross-sectional view showing yet another method of manufacturing a lead frame.

The die pad 15 is circular in both top view (see FIG. 70) and bottom view (see FIG. 71). In addition, as shown in FIGS. 69 and 71, a lower surface 15b of the die pad 15 is entirely exposed to the exterior of the sealing resin section 23. An upper surface 15a of the die pad 15 serves as a resting surface for the semiconductor element 21 and is completely shrouded by the sealing resin section 23.

Each of the leads 16 have a band-like shape radially extending outward from the die pad 15 side, and adjacent leads 16 are electrically insulated from each other.

Each lead 16 also includes an internal terminal 17 to which a bonding wire 22 is connected, and external terminals 18 provided at a lower-surface side of the internal terminal 17 and exposed to the exterior thereat. In addition, each lead 16 includes a side face terminal 26 exposed on a side face of the sealing resin section 23.

As shown in FIG. 71, the shape of each external terminal 18 is a planar rectangle. The shape of each external terminal 18 may alternatively be polygon, trapezoid, circle, ellipse, etc.

Furthermore, the internal terminals 17 are arranged on the same circumference in a plane view. The external terminals 18 are arranged on the same circumference in a plane view as well.

More specifically, as shown in FIG. 70, the internal terminals 17 are arranged on a circumference $C_1$ around the die pad 15. The external terminals 18 are, as shown in FIG. 71, arranged on a circumference $C_2$ around the die pad 15. In this case, the circumferences $C_1$ and $C_2$ are the circumference of a same circle (the centers and the diameters of the two are same). The wording or phrasing of "the external terminals 18 (or the internal terminals 17) are arranged on a circumference" here means that the center of each external terminal 18 (or each internal terminal 17) is disposed on the circumference.

Figure 68:
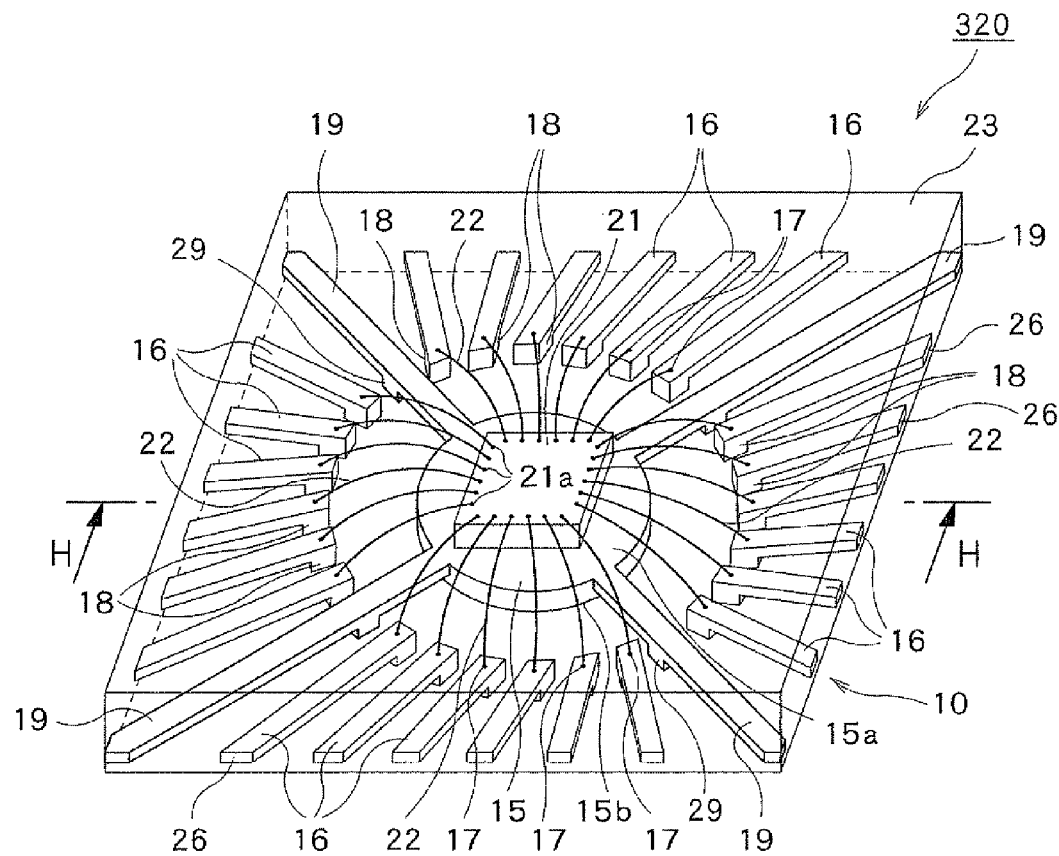
FIG. 68 is a perspective view showing a semiconductor device according to a third embodiment of the present invention.

Meanwhile, hanging leads 19 each with an external terminal 29 are connected to the die pad 15, as shown in FIGS. 68 and 70. One hanging lead 19 is provided at each four corners of the die pad 15 and extends radially from the pad 15.

Each external terminal 29 is exposed at a lower-surface of the semiconductor device 320 and has the same rectangular shape as that of each external terminal 18. The external terminal 29 may be used as a grounding (GND) terminal, for example. The hanging leads 19 and the external terminals 29 can be used effectively with such configuration. The number of hanging leads 19 is not limited to four, and may be two or other numbers.

The semiconductor element 21 and each bonding wire 22 can be substantially the same as those used in the first embodiment. The sealing resin section 23 can be substantially the same as that used in the second embodiment.

Method of Manufacturing the Semiconductor Device

Next, a method of manufacturing the semiconductor device 320 shown in FIGS. 68 to 71 is described below using FIGS. 72(a) to 72(d) and 73(a) to 73(f). While the following description refers to processes for manufacturing a plurality of semiconductor devices 320 from one metallic substrate 11, the present invention is not limited to this, and one semiconductor device 320 may be manufactured from one metallic substrate 11.

First, as shown in FIG. 72(a), a metallic substrate 11 constituting the lead frame 10 is provided. A substrate composed from materials such as copper, copper alloy, and alloy 42 (Fe alloy with 42% Ni), as described above, can be used as the metallic substrate 11. It is preferred that both upper and lower surfaces of the metallic substrate 11 have been cleaned by degreasing or the like.

Next, the upper and lower surfaces of the metallic substrate 11 are coated with a photosensitive resist, then dried, and exposed to light via a desired photomask. After the exposure, developing is conducted to form resist layers 32 and 33 for etching, as shown in FIG. 72(b). The photosensitive resist can be a conventional, known one.

After that, the metallic substrate 11 are etched with an etchant by using the resist layers 32, 33 as corrosion-resistant films, as shown in FIG. 72(c). An appropriate etchant can be selected according to the material of the metallic substrate. For example, if copper is used as the material of the metallic substrate, spray etching with a ferric chloride solution is usually performed to both surfaces of the metallic substrate 11.

The resist layers 32, 33 for etching are then stripped and removed. The lead frame 10 including the die pad 15 and the leads 16 arranged around the pad 15 can be obtained through these processes (see FIG. 72(d)). In this case, the lower surface of each lead 16, except the part of the external terminals 18, is thinned down by half-etching. In addition, the external terminals are arranged on one circumference $C_2$ in a plane view.

As shown in FIG. 73(a), the thus-obtained lead frame 10 is a multifaced lead frame having a plurality of die pads 15 and leads 16.

Next, the semiconductor element 21 is mounted on the upper surface 15a of each die pad 15 of the lead frame 10. The semiconductor element 21 is rested on and fixed to the upper surface 15a of the die pad 15 with a die-bonding paste (die attachment), as shown in FIG. 73(b).

After die attachment, the terminals 21a of the semiconductor element 21 and the internal terminals 17 of each lead 16 are electrically interconnected using bonding wires 22 (wire bonding), as shown in FIG. 73(c).

Next, a thermosetting resin or a thermoplastic resin is injection molded or transfer molded on the lead frame 10 to form a sealing resin section 23, as shown in FIG. 73(d). The lead frame 10, the semiconductor element 21, and the bonding wires 22 are thereby sealed. The lower surface 15b of the die pad 15 is entirely exposed to the exterior of the sealing resin section 23. Each external terminal 18 is also exposed to the exterior at a lower surface of the sealing resin section 23.

Next, the sealing resin section 23 between any two semiconductor elements 21 is diced to separate the lead frame 10 for each semiconductor element 21, as shown in FIG. 73(e). The lead frame 10 is first rested on and fixed to the surface of a dicing tape 37. Then, the lead frame 10 and sealing resin section 23 between the semiconductor elements 21 are cut with a rotational blade 38 constructed of a diamond grinding wheel, for example.

Figure 73:
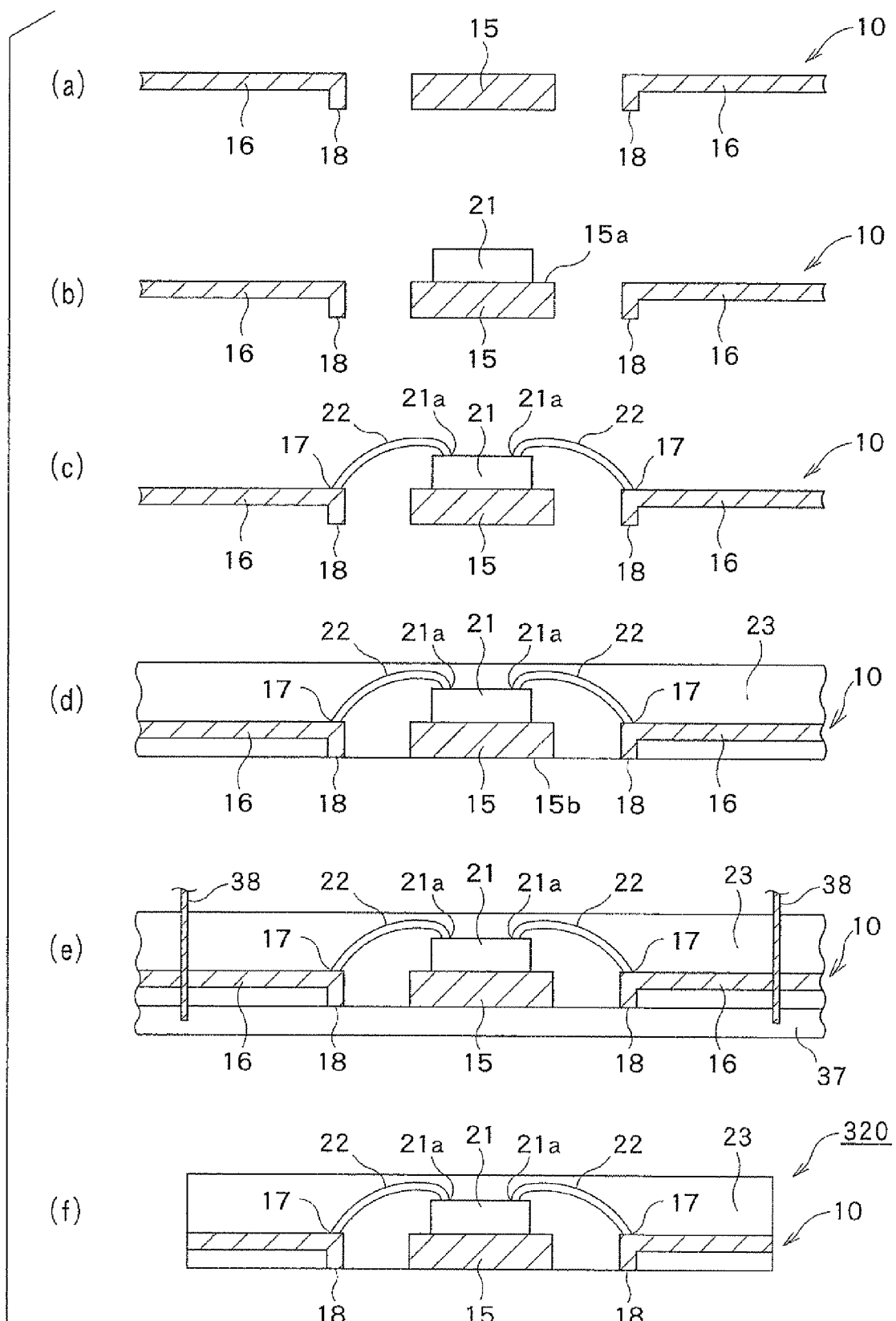
FIG. 73 is a cross-sectional view showing a method of manufacturing the semiconductor device according to the third embodiment of the present invention.

Through these processes, the semiconductor device 320 shown in FIGS. 68 to 71 can be obtained (see FIG. 73(*f*)).

Operational Effects of the Present Embodiment

Figure 74:
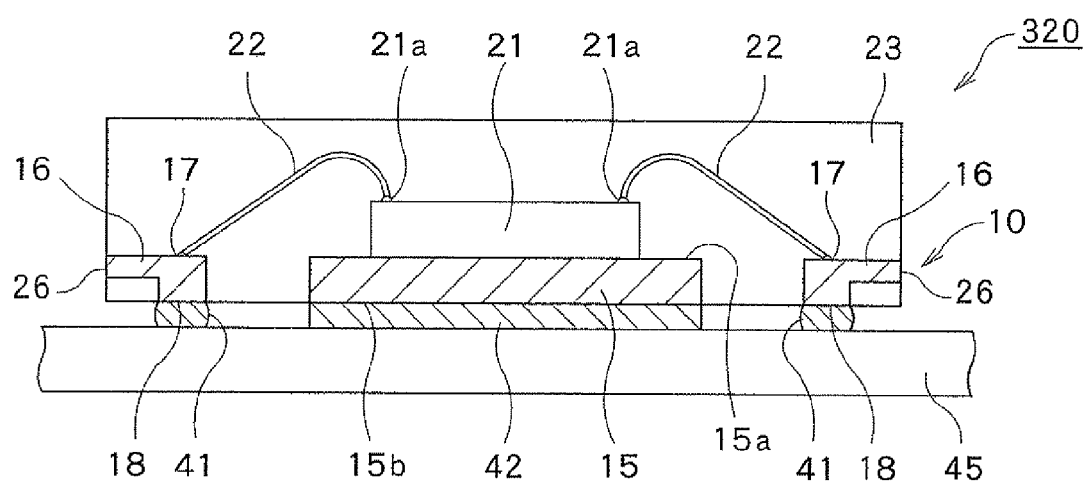
FIG. 74 is a cross-sectional view showing a state in which the semiconductor device according to the third embodiment of the present invention is mounted on a mounting substrate.

Next, operational effects of the thus-constructed present embodiment are described below using FIG. 74. FIG. 74 is a cross-sectional view showing a state in which the semiconductor device according to the present embodiment is mounted on a mounting substrate.

As shown in FIG. 74, the semiconductor device 320 according to the present embodiment is disposed and mounted on the mounting substrate 45. In this case, the semiconductor device 320 is fixed to and mounted on the mounting substrate 45 by use of solder portions 41 provided at the lower terminals 18*b* of each lead 16, and a solder portion 42 provided at the lower surface 15*b* of the die pad 15. The mounting substrate 45 is primarily formed from a glass epoxy resin.

During the mounting of the semiconductor device 320 onto the mounting substrate 45 with solder, or upon actual usage of the semiconductor device 320 (depends on operating environment), various kinds of heat is considered to be applied to the semiconductor device 320. In such situation, if a thermal expansion coefficient of the entire semiconductor device 320 differs from that of the mounting substrate 45, the difference between them will cause thermal stresses. The solder portion 41 and solder portions 42, positioning between the semiconductor device 320 and the mounting substrate 45, are particularly likely to be damaged or to occur interfacial peeling due to the thermal stresses.

According to the present embodiment, on the other hand, the external terminals 18 of the leads 16 are arranged on the circumference $C_2$ in a plane view. Thermal stresses, caused by the difference in thermal expansion coefficient between the semiconductor device 320 and the mounting substrate 45, are therefore equally applied to the solder portions 41 on the external terminals 18. This prevents a specific solder portion 41 being damaged.

Furthermore, according to the present embodiment, the side face terminals 26 are exposed on side faces of the sealing resin section 23. The semiconductor device 320 can be tested using the side face terminals 26.

In addition to the above effects, the present embodiment also offers practically the same operational effects as those produced by the second embodiment.

Variations of the Semiconductor Device

Next, variations of the semiconductor device according to the present embodiment are described below per FIGS. 75 to 99. In these figures, the same constituent elements as those of the embodiment shown in FIGS. 68 to 74 are each assigned the same reference number or symbol, and detailed description of these elements is omitted.

(Variation 3-1)

Figure 75:
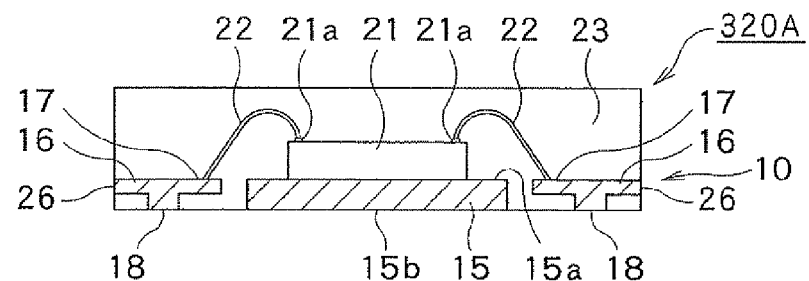
FIG. 75 is a cross-sectional view showing a semiconductor device according to a first variation of the third embodiment of the present invention (i.e., variation 3-1)
Figure 76:
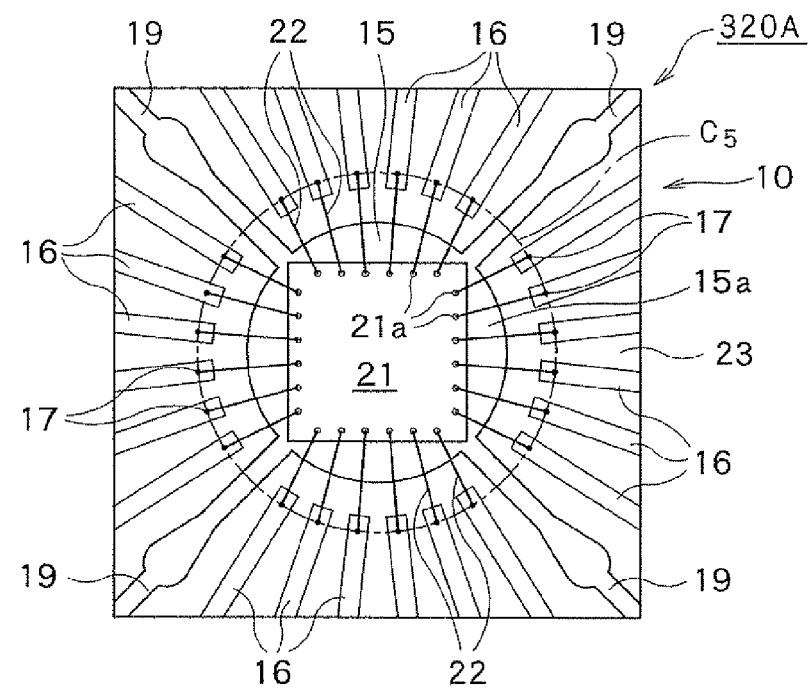
FIG. 76 is a plan view showing the semiconductor device according to the first variation of the third embodiment of the present invention (i.e., variation 3-1)
Figure 77:
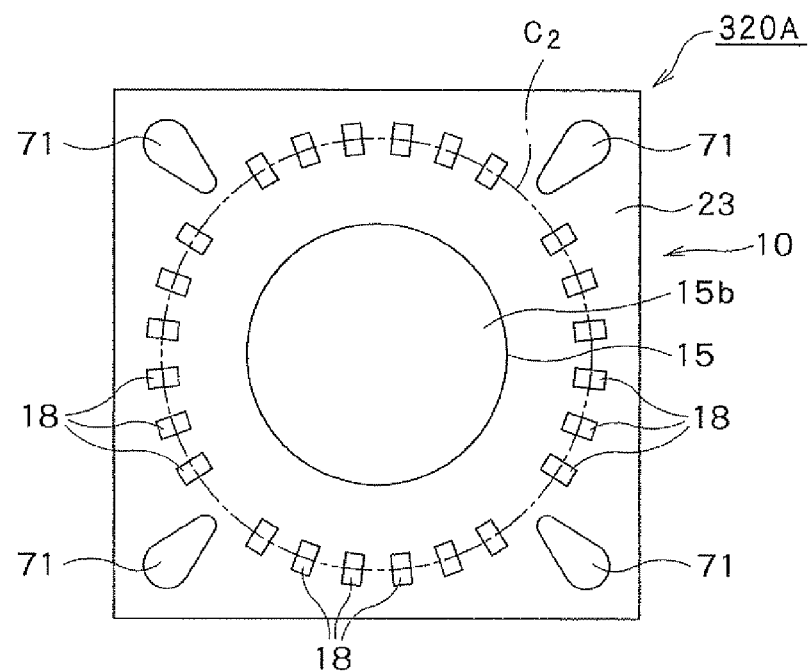
FIG. 77 is a bottom view showing the semiconductor device according to the first variation of the third embodiment of the present invention (i.e., variation 3-1)

FIGS. 75 to 77 show a semiconductor device 320A according to a first variation of the third embodiment. FIG. 75 is a cross-sectional view of the semiconductor device 320A (this cross-sectional view corresponds to FIG. 69), FIG. 76 is a plan view thereof (this plan view corresponds to FIG. 70), and FIG. 77 is a bottom view thereof (this bottom view corresponds to FIG. 71).

The semiconductor device 320A (variation 3-1) shown in FIGS. 75 to 77 differs from the embodiment shown in FIGS. 68 to 74, in that hanging leads each include an external terminal 71 (additional external terminal) of a planar substantially oval shape. Each of the external terminals 71 is exposed at a lower-surface of the semiconductor device 320A. In addition, the area of the external terminal 71 is larger than that of the external terminal 18, and its shape is tapered toward a die pad 15.

The external terminals 71 can be used as grounding (GND) terminals, for example. The use of the relatively large external terminals 71 enables the external terminals 71 to be strongly connected to a mounting substrate 45 via a solder portion 41 when the semiconductor device 320A is mounted on the mounting substrate 45. In addition, mounting reliability of the semiconductor device 320A, against thermal stresses applied thereto, can be further improved by using the relatively large external terminals 71.

The external terminals 18 are arranged on a circumference $C_2$ around the die pad 15, as shown in FIG. 77. Internal terminals 17 are arranged on a circumference $C_5$ around the die pad 15, as shown in FIG. 76. The diameter of the circumference $C_5$ is smaller than that of the circumference $C_2$.

(Variation 3-2)

Figure 78:
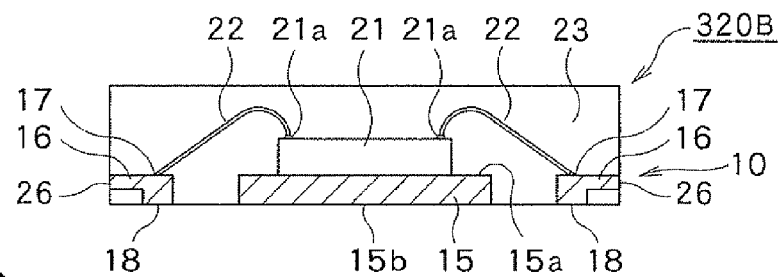
FIG. 78 is a cross-sectional view showing a semiconductor device according to a second variation of the third embodiment of the present invention (i.e., variation 3-2)
Figure 79:
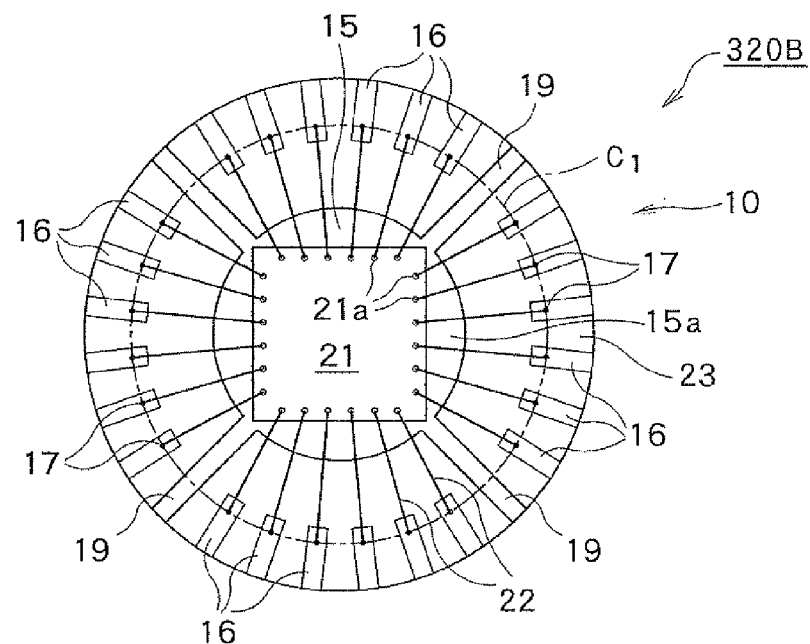
FIG. 79 is a plan view showing the semiconductor device according to the second variation of the third embodiment of the present invention (i.e., variation 3-2)
Figure 80:
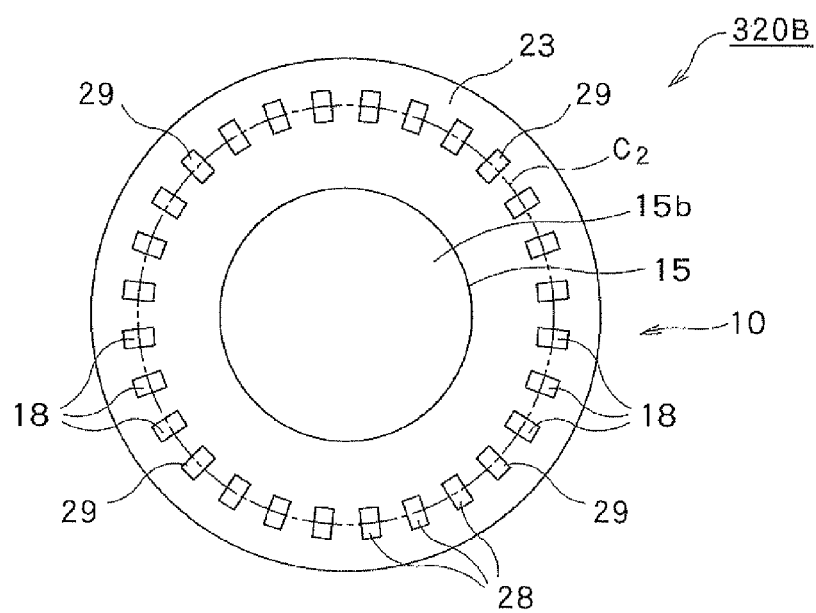
FIG. 80 is a bottom view showing the semiconductor device according to the second variation of the third embodiment of the present invention (i.e., variation 3-2)

FIGS. 78 to 80 show a semiconductor device 320B according to a second variation of the third embodiment. FIG. 78 is a cross-sectional view of the semiconductor device 320B (this cross-sectional view corresponds to FIG. 69), FIG. 79 is a plan view of the semiconductor device 320B (this plan view corresponds to FIG. 70), and FIG. 80 is a bottom view thereof (this bottom view corresponds to FIG. 71).

The semiconductor device 320B (variation 3-2) shown in FIGS. 78 to 80 differs from the embodiment shown in FIGS. 68 to 74, in that the device 320B includes a sealing resin section 23 of a columnar shape. The circle of an external surface of the sealing resin section 23 is concentric with a circumference $C_1$ ($C_2$).

In order to manufacture such semiconductor device, the columnar sealing resin section 23 can be formed with a columnar mold in a process for forming the sealing resin section 23, as shown in FIG. 73(*d*).

In this variation, since the sealing resin section 23 is circular in a plane view, when heat is applied to the semiconductor device 320B, thermal stresses caused by a difference in thermal expansion coefficient between the semiconductor device 320B and a mounting substrate 45 are uniformly distributed in a circumferential direction. Mounting reliability of the semiconductor device 320B can thus be further improved.

(Variation 3-3)

Figure 81:
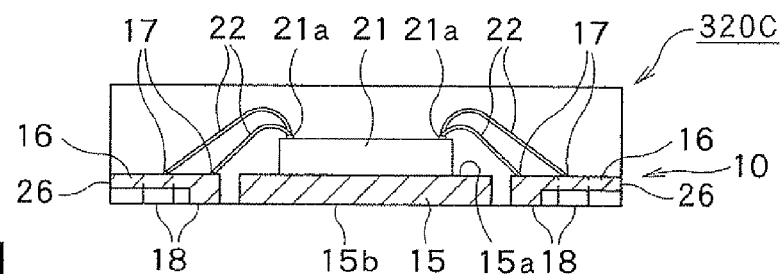
FIG. 81 is a cross-sectional view showing a semiconductor device according to a third variation of the third embodiment of the present invention (i.e., variation 3-3)
Figure 82:
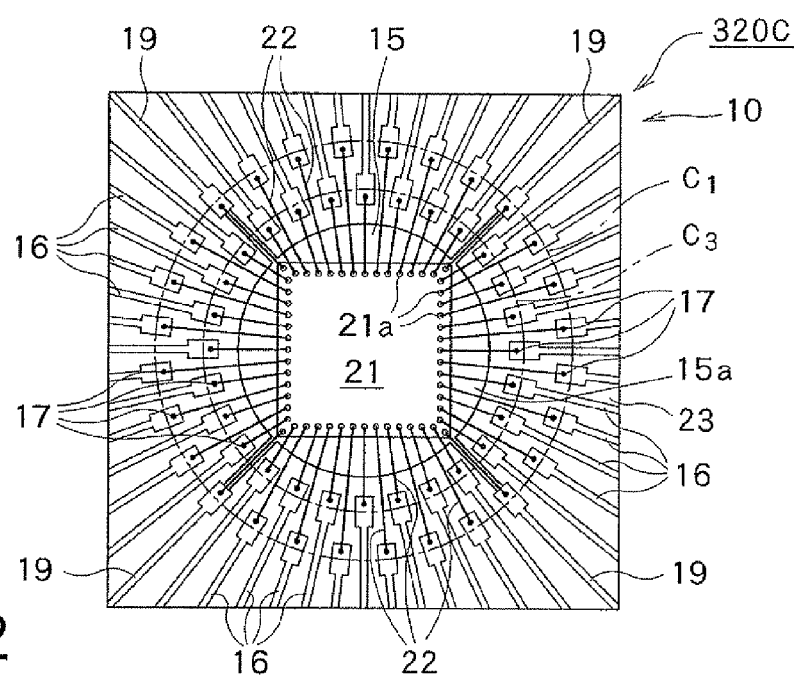
FIG. 82 is a plan view showing the semiconductor device according to the third variation of the third embodiment of the present invention (i.e., variation 3-3)
Figure 83:
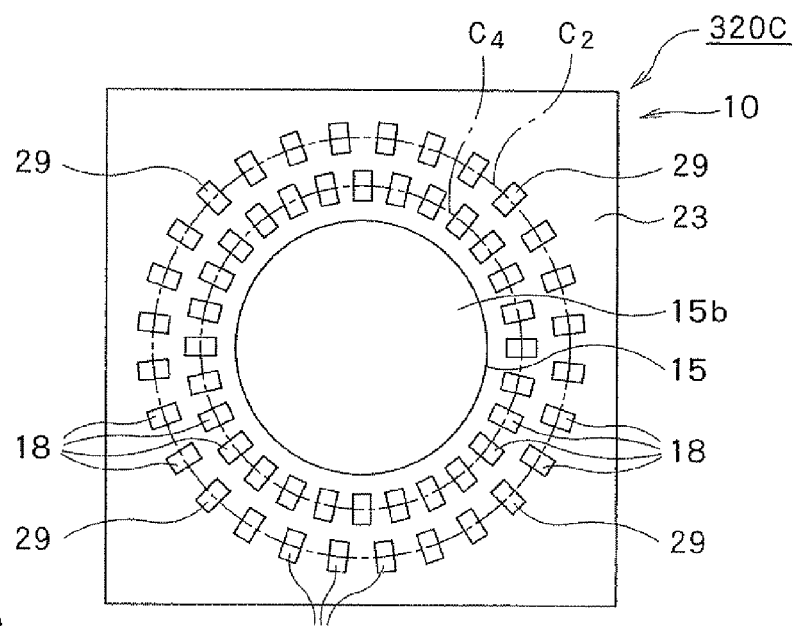
FIG. 83 is a bottom view showing the semiconductor device according to the third variation of the third embodiment of the present invention (i.e., variation 3-3)

FIGS. 81 to 83 show a semiconductor device 320C according to a third variation of the third embodiment. FIG. 81 is a cross-sectional view of the semiconductor device 320C (this cross-sectional view corresponds to FIG. 69), FIG. 82 is a plan view thereof (this plan view corresponds to FIG. 70), and FIG. 83 is a bottom view thereof (this bottom view corresponds to FIG. 71).

The semiconductor device 320C (variation 3-3) shown in FIGS. 81 to 83 differs from the embodiment shown in FIGS. 68 to 74, in that external terminals 18 of leads 16 are arranged on either of a plurality of (two) circumferences, $C_2$ and $C_4$, in a plane view.

As shown in FIG. 82, internal terminals 17 of each lead 16 have a rectangular shape. Portions of the lead 16 other than the internal terminal 17 have smaller width compared to the internal terminals 17.

The internal terminals 17 are arranged on either of two other circumferences, $C_1$ and $C_3$, in staggered layout. The circumferences $C_1$ and $C_3$ are concentric with each other, and the diameter of the circumference $C_1$ is larger.

Similarly, at a lower surface of the semiconductor device 320C shown in FIG. 83, the external terminals 18 are arranged on either of the two circumferences $C_2$ and $C_4$ in staggered layout. The circumferences $C_2$ and $C_4$ are concentric with each other, and the diameter of the circumference $C_2$ is larger.

Layout positions of the internal terminals 17 and external terminals 18 are not limited to the layout described above. For example, the internal terminals 17 and the external terminals 18 may be arranged on three or more circumferences. The areas and shapes of the internal terminals 17 and external terminals 18 may differ for each circumference on which the terminals are arranged.

Arrangement of the external terminals 18 on the circumferences $C_2$ and $C_4$ in such way, mounting reliability of a solder portion 41 when the semiconductor device 320C is subjected to thermal stresses can be improved. In addition, the external terminals 18 can be arranged in an efficient layout at the lower surface of the semiconductor device 320C, so that the semiconductor device can be adapted for a multipin semiconductor element 21.

(Variation 3-4)

Figure 84:
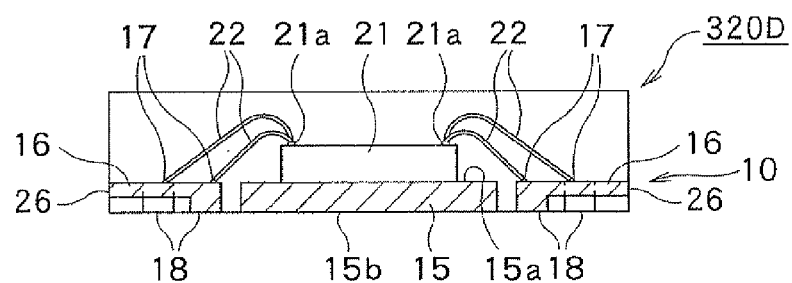
FIG. 84 is a cross-sectional view showing a semiconductor device according to a fourth variation of the third embodiment of the present invention (i.e., variation 3-4)
Figure 85:
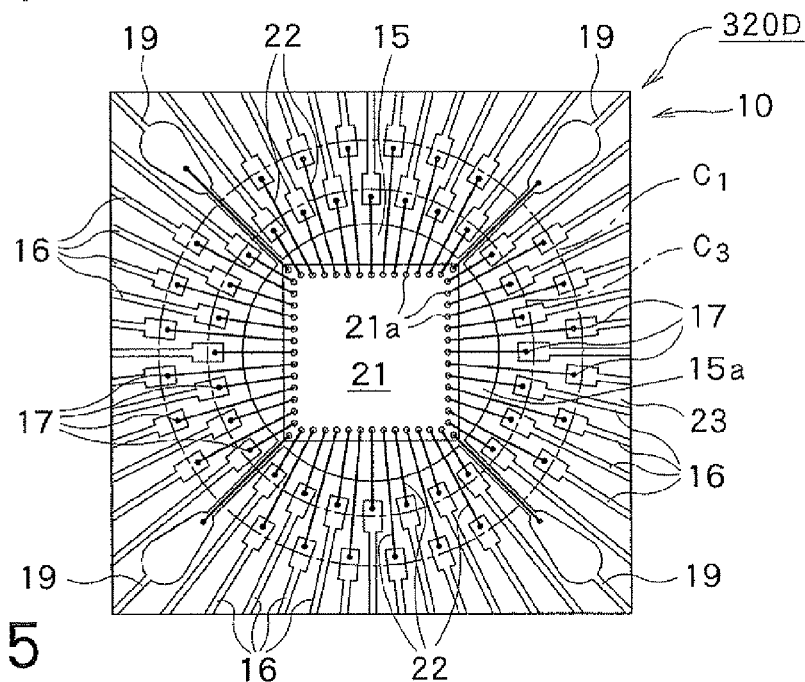
FIG. 85 is a plan view showing the semiconductor device according to the fourth variation of the third embodiment of the present invention (i.e., variation 3-4)
Figure 86:
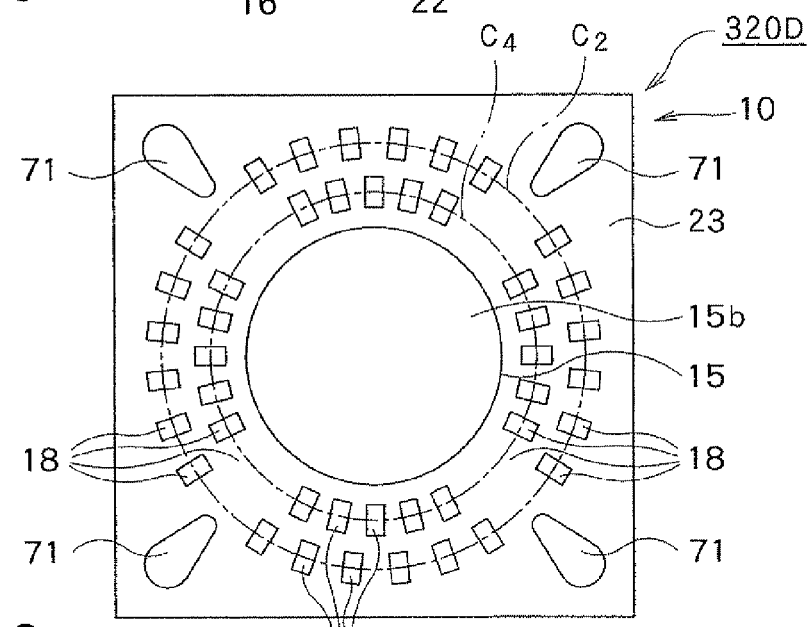
FIG. 86 is a bottom view showing the semiconductor device according to the fourth variation of the third embodiment of the present invention (i.e., variation 3-4)

FIGS. 84 to 86 show a semiconductor device 320D according to a fourth variation of the third embodiment. FIG. 84 is a cross-sectional view of the semiconductor device 320D (this cross-sectional view corresponds to FIG. 69), FIG. 85 is a plan view thereof (this plan view corresponds to FIG. 70), and FIG. 86 is a bottom view thereof (this bottom view corresponds to FIG. 71).

The semiconductor device 320D (variation 3-4) shown in FIGS. 84 to 86 is a combination of variation 3-1 shown in FIGS. 75 to 77 and variation 3-3 shown in FIGS. 81 to 83.

More specifically, in the semiconductor device 320D shown in FIGS. 84 to 86, hanging leads 19 each include a planar substantially oval external terminal 71 (additional external terminal). In addition, external terminals 18 of leads 16 are arranged on either of two circumferences, $C_2$ and $C_4$, in a plane view.

(Variation 3-5)

Figure 87:
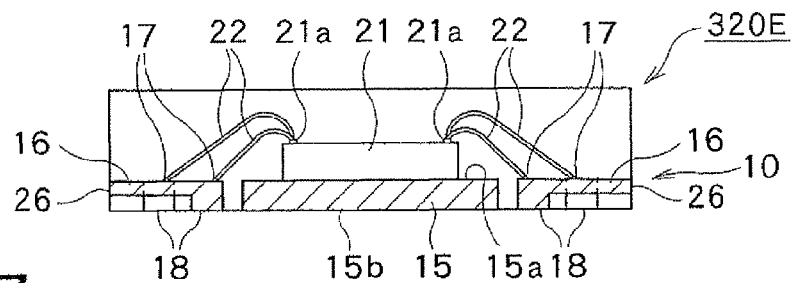
FIG. 87 is a cross-sectional view showing a semiconductor device according to a fifth variation of the third embodiment of the present invention (i.e., variation 3-5)
Figure 88:
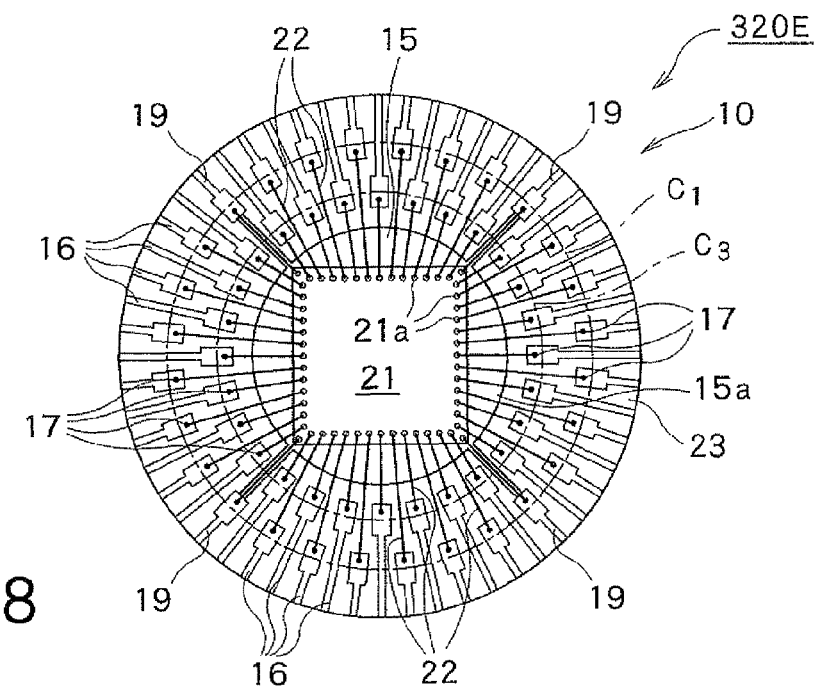
FIG. 88 is a plan view showing the semiconductor device according to the fifth variation of the third embodiment of the present invention (i.e., variation 3-5)
Figure 89:
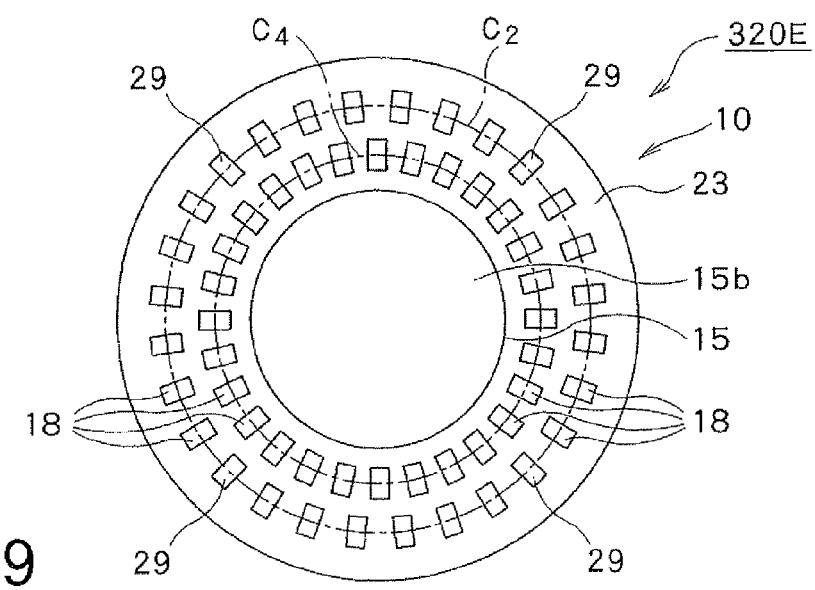
FIG. 89 is a bottom view showing the semiconductor device according to the fifth variation of the third embodiment of the present invention (i.e., variation 3-5)

FIGS. 87 to 89 show a semiconductor device 320E according to a fifth variation of the third embodiment. FIG. 87 is a cross-sectional view of the semiconductor device 320E (this cross-sectional view corresponds to FIG. 69), FIG. 88 is a plan view thereof (this plan view corresponds to FIG. 70), and FIG. 89 is a bottom view thereof (this bottom view corresponds to FIG. 71).

The semiconductor device 320E (variation 3-5) shown in FIGS. 87 to 89 is a combination of variation 3-2 shown in FIGS. 78 to 80 and variation 3-3 shown in FIGS. 81 to 83.

More specifically, the semiconductor device 320E shown in FIGS. 87 to 89 includes a sealing resin section 23 of a columnar shape. The device 320E also includes external terminals 18 of leads 16 arranged on either of two circumferences, $C_2$ and $C_4$, in a plane view.

(Variation 3-6)

Figure 90:
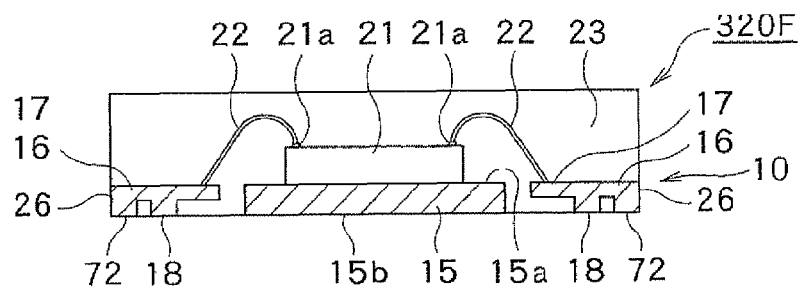
FIG. 90 is a cross-sectional view showing a semiconductor device according to a sixth variation of the third embodiment of the present invention (i.e., variation 3-6)
Figure 91:
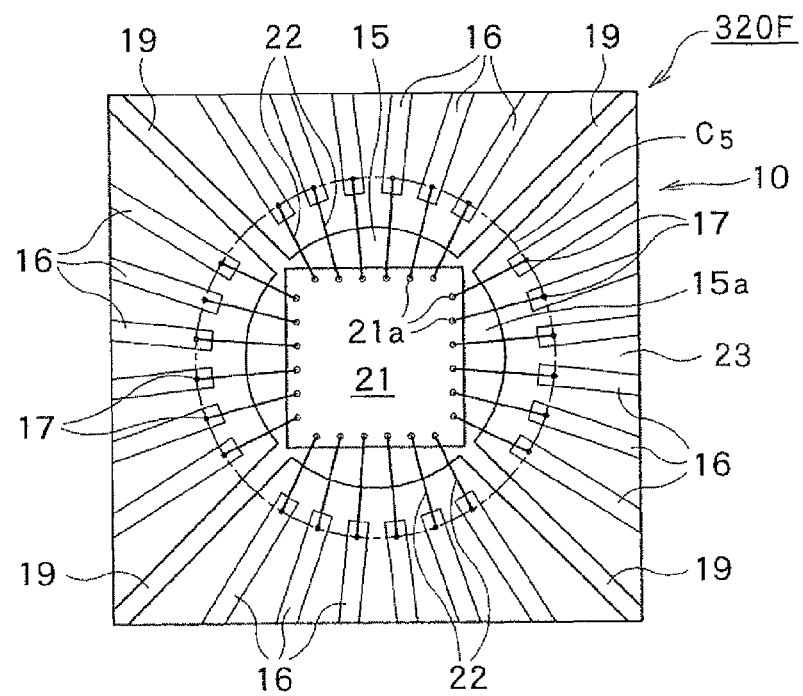
FIG. 91 is a plan view showing the semiconductor device according to the sixth variation of the third embodiment of the present invention (i.e., variation 3-6)
Figure 92:
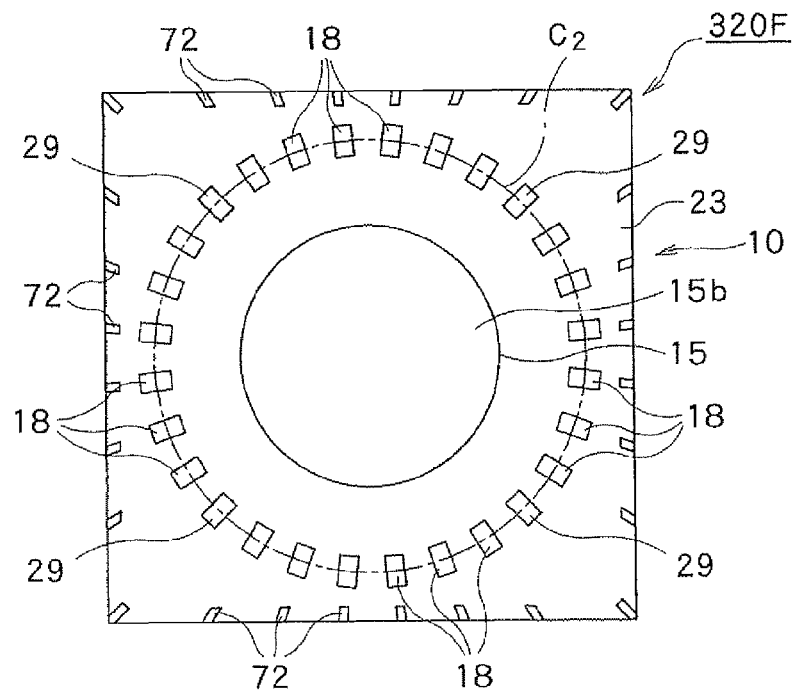
FIG. 92 is a bottom view showing the semiconductor device according to the sixth variation of the third embodiment of the present invention (i.e., variation 3-6)

FIGS. 90 to 92 show a semiconductor device 320F according to a sixth variation of the third embodiment. FIG. 90 is a cross-sectional view of the semiconductor device 320F (this cross-sectional view corresponds to FIG. 69), FIG. 91 is a plan view thereof (this plan view corresponds to FIG. 70), and FIG. 92 is a bottom view thereof (this bottom view corresponds to FIG. 71).

The semiconductor device 320F (variation 3-6) shown in FIGS. 90 to 92 differs from the embodiment shown in FIGS. 68 to 74, in that an exposed face 72, that is a face exposed to the exterior of a sealing resin section 23 at a lower surface of each lead 16, is provided at a periphery of the sealing resin section 23.

Since the exposed face 72 is provided at the periphery of the sealing resin section 23, when the semiconductor device 320F is mounted on a mounting substrate 45, a solder portion 41 (solder) is formed at the periphery of the sealing resin section 23. Thus, the existence of the solder can be confirmed from a side face of the semiconductor device 320F.

As shown in FIG. 92, external terminals 18 are arranged on a circumference $C_2$ around a die pad 15, and as shown in FIG. 91, internal terminals 17 are arranged on a circumference $C_5$ whose diameter is smaller than that of the circumference $C_2$.

(Variation 3-7)

Figure 93:
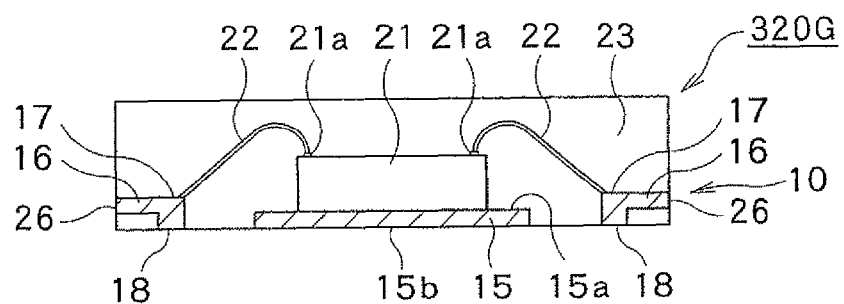
FIG. 93 is a cross-sectional view showing a semiconductor device according to a seventh variation of the third embodiment of the present invention (i.e., variation 3-7)

FIG. 93 shows a semiconductor device 320G according to a seventh variation of the third embodiment. FIG. 93 is a cross-sectional view of the semiconductor device 320G (this cross-sectional view corresponds to FIG. 69).

The semiconductor device 320G (variation 3-7) shown in FIG. 93 differ from the embodiment shown in FIGS. 68 to 74, in that its die pad 15 is thinned down from an upper-surface side by, for example, half-etching. The level of an upper surface 15a of the die pad 15 is lower than that of an upper surface of internal terminals 17 of leads 16. The semiconductor device 320G as a whole can be thinned down by thinning down the die pad 15 as mentioned.

(Variation 3-8)

Figure 94:
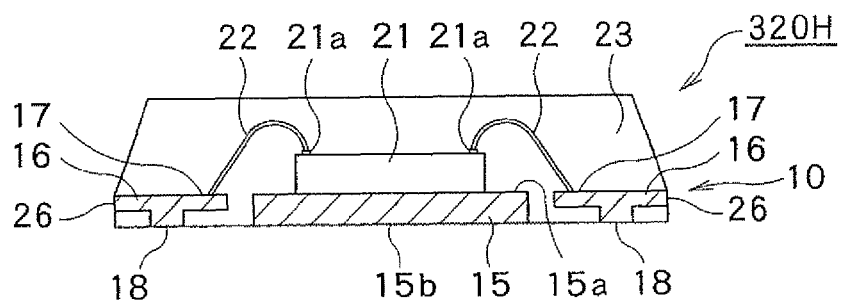
FIG. 94 is a cross-sectional view showing a semiconductor device according to an eighth variation of the third embodiment of the present invention (i.e., variation 3-8)

FIG. 94 shows a semiconductor device 320H according to an eighth variation of the third embodiment. FIG. 94 is a cross-sectional view of the semiconductor device 320H (this cross-sectional view corresponds to FIG. 69).

The semiconductor device 320H (variation 3-8) shown in FIG. 94 differs from the embodiment shown in FIGS. 68 to 74, in that a portion of a sealing resin section 23 that is above an upper surface of a lead frame 10 has a trapezoidal cross-sectional shape. In order to manufacture such semiconductor device 320H, the sealing resin section 23 with a certain shape can be formed by using a mold corresponding with individual semiconductor devices 320H, in a process for forming the sealing resin section 23 (individual molding)(see FIG. 73(d)).

When the portion of the sealing resin section 23 that is above the upper surface of the lead frame 10 is thus formed to have a trapezoidal cross-sectional shape, the volume of the sealing resin section 23, whose thermal expansion coefficient is relatively low, can be reduced. This allows a thermal expansion coefficient of the entire semiconductor device 320H to become close to that of a mounting substrate 45 (see FIG. 74). Hence, thermal stresses caused by application of heat to the semiconductor device 320H is alleviated and mounting reliability can be improved.

(Variation 3-9)

Figure 95:
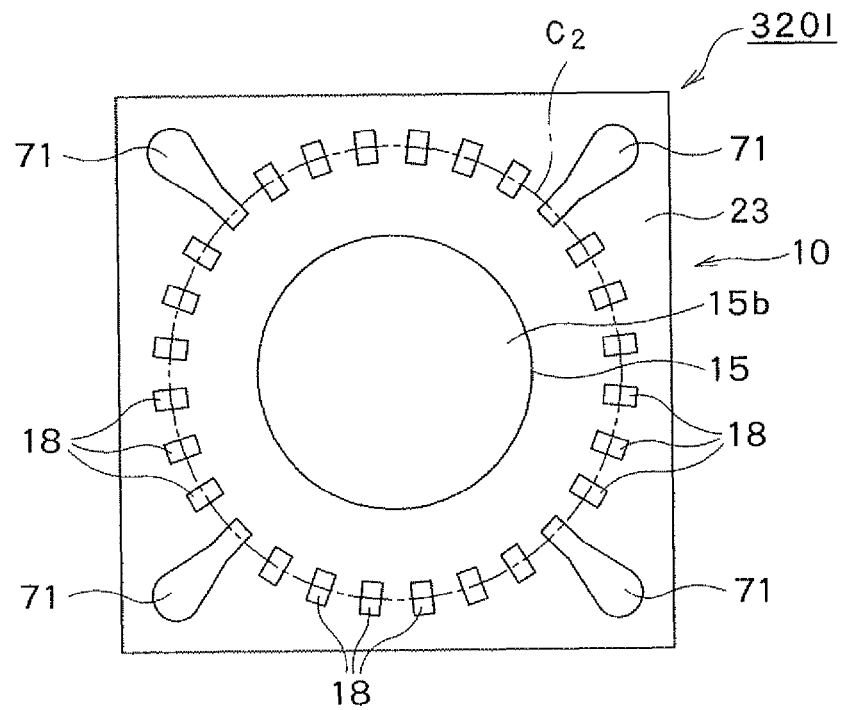
FIG. 95 is a bottom view showing a semiconductor device according to a ninth variation of the third embodiment of the present invention (i.e., variation 3-9)

FIG. 95 shows a semiconductor device 320I according to a ninth variation of the third embodiment. FIG. 95 is a bottom view of the semiconductor device 320I (this bottom view corresponds to FIG. 71).

The semiconductor device 320I (variation 3-9) shown in FIG. 95 differs from variation 3-1 shown in FIGS. 75 to 77, in that the external terminals 71 (additional external terminals) are extended inward in a radial direction from four corners of a sealing resin section 23 to a circumference $C_2$ on which external terminals 18 of leads 16 are arranged.

The external terminals 71 (additional external terminals) are extend to the vicinity of the external terminals 18. Mounting stresses applied to the external terminals 18 can be further mitigated.

(Variation 3-10)

Figure 96:
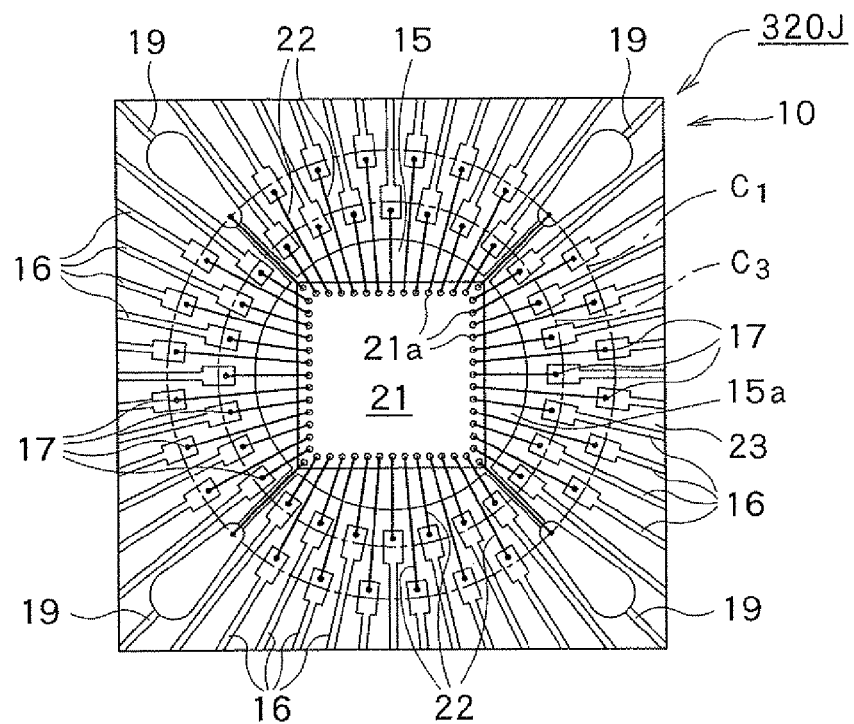
FIG. 96 is a plan view showing a semiconductor device according to a tenth variation of the third embodiment of the present invention (i.e., variation 3-10)
Figure 97:
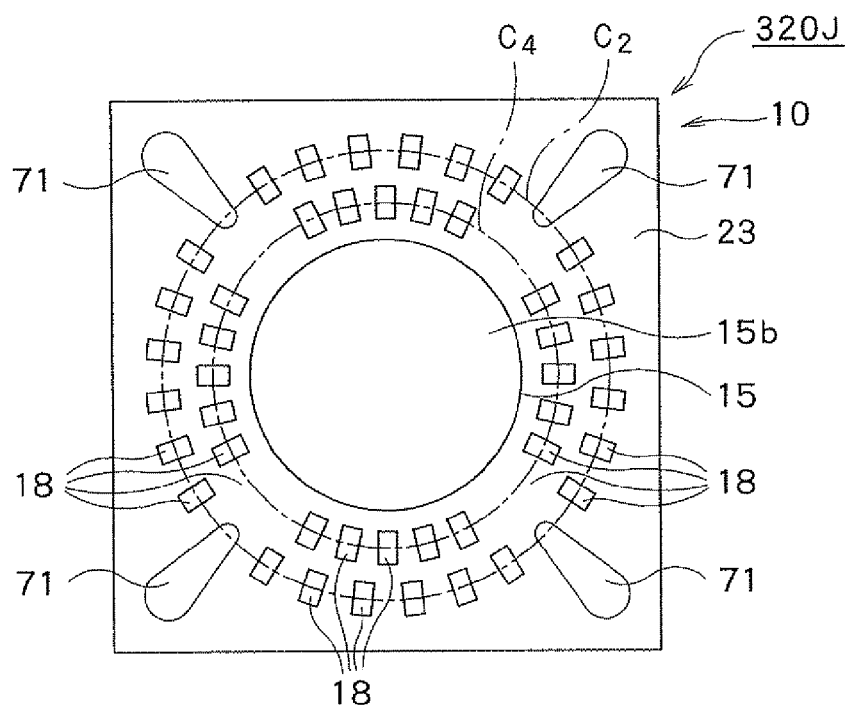
FIG. 97 is a bottom view showing the semiconductor device according to the tenth variation of the third embodiment of the present invention (i.e., variation 3-10)

FIGS. 96 and 97 show a semiconductor device 320J according to a tenth variation of the third embodiment. FIG. 96 is a plan view of the semiconductor device 320J (this plan view corresponds to FIG. 70), and FIG. 97 is a bottom view thereof (this bottom view corresponds to FIG. 71).

The semiconductor device 320J (variation 3-10) shown in FIGS. 96 and 97 differs from variation 3-4 shown in FIGS. 84 to 86, in that the external terminals 71 (additional external terminals) are extended inward in a radial direction from four corners of a sealing resin section 23 to a circumference $C_2$ on which external terminals 18 of leads 16 are arranged.

The external terminals 71 (additional external terminals) are extend to the vicinity of the external terminals 18. Mounting stresses applied to the external terminals 18 can be further mitigated.

(Variation 3-11)

Figure 98:
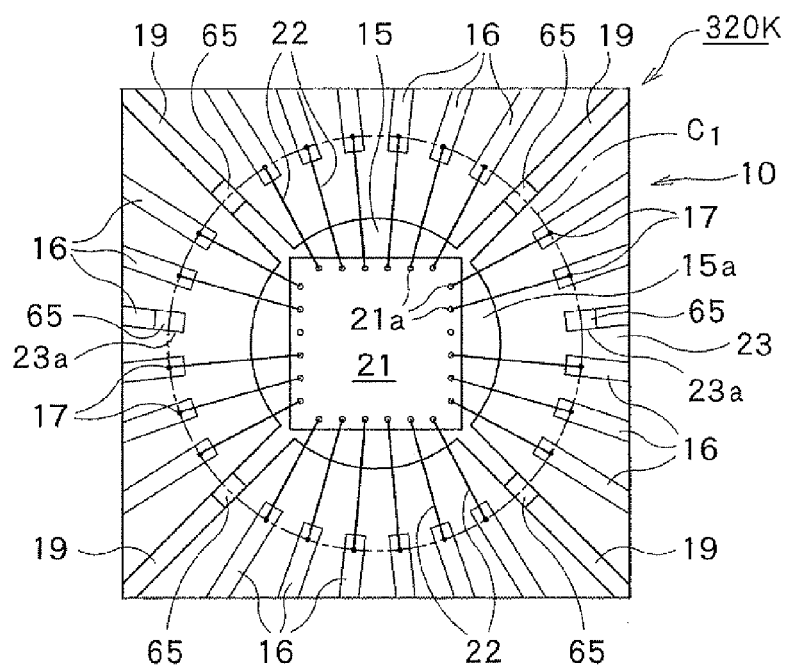
FIG. 98 is a plan view showing a semiconductor device according to an eleventh variation of the third embodiment of the present invention (i.e., variation 3-11)
Figure 99:
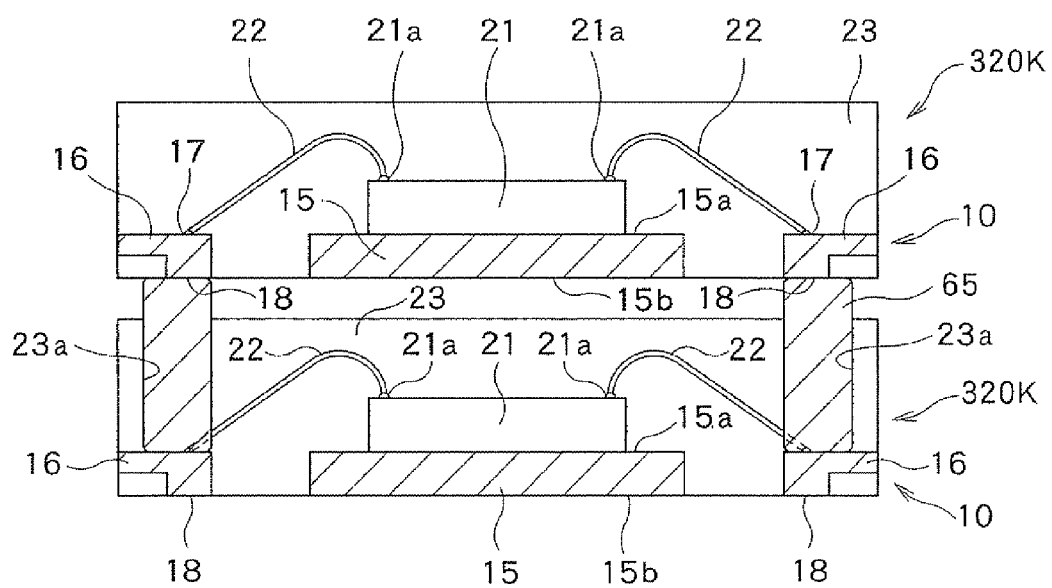
FIG. 99 is a cross-sectional view showing the semiconductor device according to the eleventh variation of the third embodiment of the present invention (i.e., variation 3-11)
Figure 100:
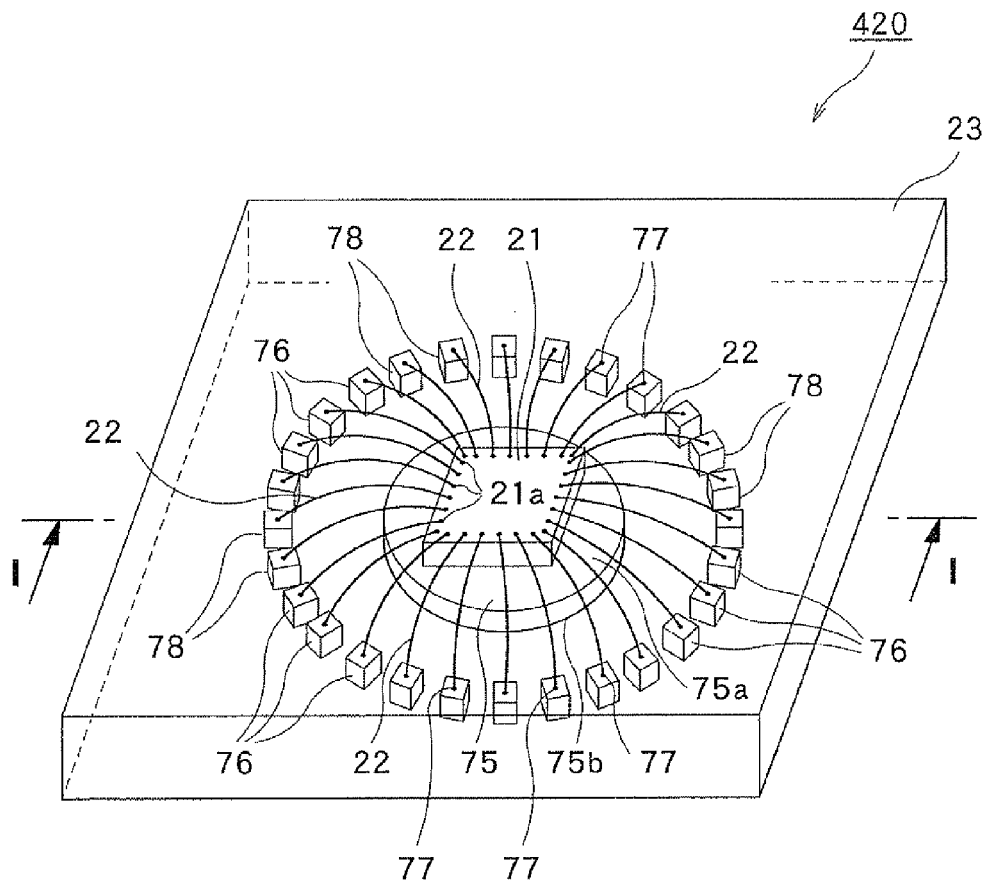
FIG. 100 is a perspective view showing a semiconductor device according to a fourth embodiment of the present invention.

FIGS. 98 and 99 show a semiconductor device 320K according to an eleventh variation of the third embodiment. FIG. 98 is a plan view of the semiconductor device 320K (this plan view corresponds to FIG. 70), and FIG. 99 is a cross-sectional view thereof (this cross-sectional view corresponds to FIG. 69).

The semiconductor device 320K (variation 3-11) shown in FIGS. 98 and 99 includes an externally protruding terminal 65 formed on at least one of an upper surface of a plurality of leads 16. The externally protruding terminal 65 is formed at an opening 23a in a sealing resin section 23 and is exposed thereat. Therefore, an upper surface of the semiconductor device 320K can be used for connection. The externally protruding terminal 65 may be solder, silver (Ag) paste, or any other appropriate, general connecting material. In addition, as shown in FIG. 98, the externally protruding terminal 65 may also be provided on an upper surface of a hanging lead 19.

Since the externally protruding terminal 65 is formed on at least one of the upper surfaces of the leads 16, the externally protruding terminal 65 of a lower semiconductor device 320K can be connected to the external terminal 18 of an upper semiconductor device 320K. Thus, a plurality of semiconductor devices 320K can be stacked vertically upon each other.

The constituent elements disclosed in the above embodiment and variations may be appropriately combined as required. Alternatively, several of all the constituent elements described in the above embodiment and variations may be deleted.

Fourth Embodiment

Next, a fourth embodiment of the present invention will be described referring to FIGS. 100 to 138.

Semiconductor Device Configuration

A configuration of a semiconductor device according to the fourth embodiment of the present invention is first described below per FIGS. 100 to 103. FIGS. 100 to 103 show the semiconductor device according to the fourth embodiment of the present invention.

As shown in FIGS. 100 to 103, the semiconductor device 420 includes a plated section 75 for semiconductor element placement, and a plurality of plated sections 76 for leads arranged around the plated section 75 and on the same plane as the plated section 75.

A semiconductor element 21 is rested on the plated section 75 for semiconductor element placement. The plated sections 76 for leads and terminals 21a of the semiconductor element 21 are electrically interconnected by independent bonding wires 22 (electroconductive portions).

The plated section 75 for semiconductor element placement, the plated sections 76 for leads, the semiconductor element 21, and the bonding wires 22 are resin sealed with a sealing resin section 23.

The plated section 75 for semiconductor element placement and the plated sections 76 for leads are each made of a metallic material formed by plating. Each of the plated sections 75 and 76 may be of a single-layer structure constituted of one kind of metal, or a multi-layer structure constituted of at least two kinds of metals.

If the plated section 75 for semiconductor element placement and the plated sections 76 for leads have a single-layer structure, the metals that constitute the plated sections 75 and 76 may be, for example, Cu, Ni, Ag, Pd, Au, or Sn.

Figure 101:
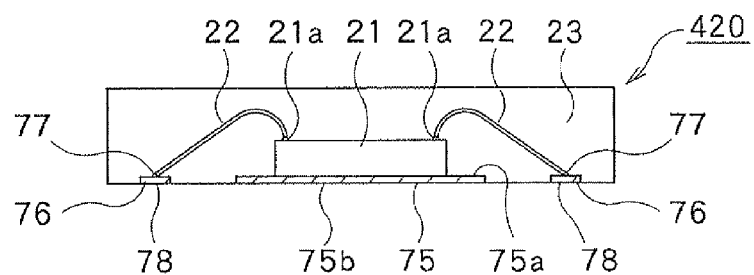
FIG. 101 is a cross-sectional view (taken along line I-I in FIG. 100) that shows the semiconductor device according to the fourth embodiment of the present invention.

If the plated section 75 for semiconductor element placement and the plated sections 76 for leads have a multi-layer structure, the plated sections 75 and 76 may each have a structure that Au, Ni, and Au are stacked in that order from a lower-surface (from the bottom in FIG. 101). Hereinafter, this layer configuration is also referred to simply as Au/Ni/Au. The configuration of the plated layers of the multilayer structure is not limited to this (Au/Ni/Au) and may instead be, for example, Pd/Ni/Pd, Au/Ni/Pd, Au/Pd/Ni/Pd/Au, Ag/Ni/Ag, Ag/Ni/Sn, Au/Ni/Sn, Ag/Cu/Ag, Au/Cu/Ag, Ag/Cu/Ni, or Au/Cu/Ni.

Although the plated section 75 for semiconductor element placement is not limited to a specific shape, it is preferred that the shape of the plated section 75 is circular. With a circular shape, when heat is applied to the semiconductor device 420, thermal stresses caused by a difference in thermal expansion coefficient between the semiconductor device 420 and a mounting substrate 45 can be uniformly distributed in a circumferential direction. In this case, the plated section 75 for semiconductor element placement is circular in both top view (see FIG. 102) and bottom view (see FIG. 103). As shown in FIG. 101, a lower surface 75b of the plated section 75 for semiconductor element placement is on the same plane as the sealing resin section 23. An upper surface 75a of the plated section 75 for semiconductor element placement serves as a resting surface for the semiconductor element 21 and is completely shrouded by the sealing resin section 23.

The plated sections 76 for leads each include an internal terminal 77 to which a bonding wire 22 is connected, and an external terminal 78 exposed to the exterior at a lower surface of the plated section 76. The internal terminal 77 is formed at an upper-surface of the plated section 76, and the external terminal 78 at the lower-surface of the plated section 76.

The external terminals 78 of the plated sections 76 for leads are each on the same plane as a lower surface of the sealing resin section 23. Adjacent plated sections 76 for leads are electrically insulated from each other.

Figure 102:
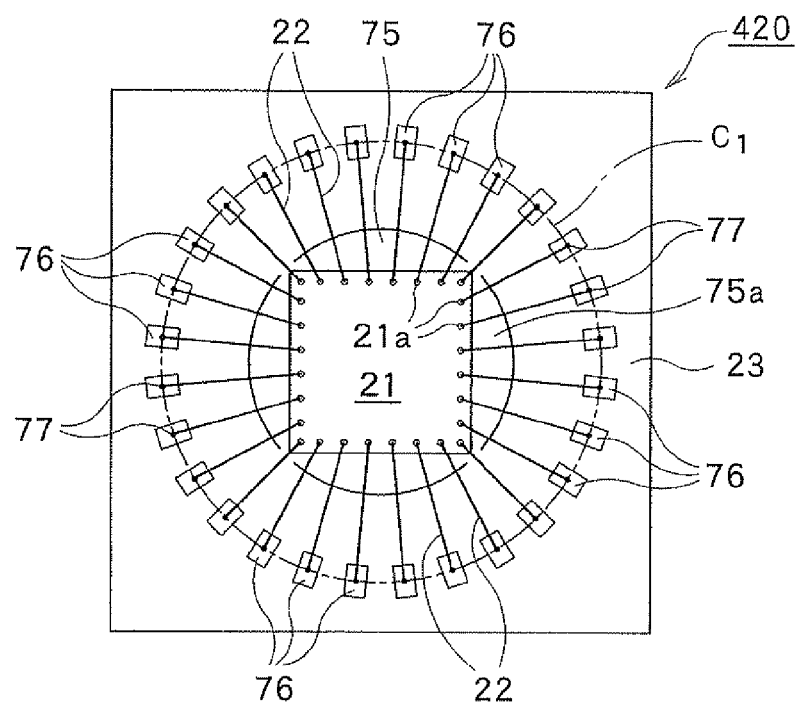
FIG. 102 is a plan view showing the semiconductor device according to the fourth embodiment of the present invention.
Figure 103:
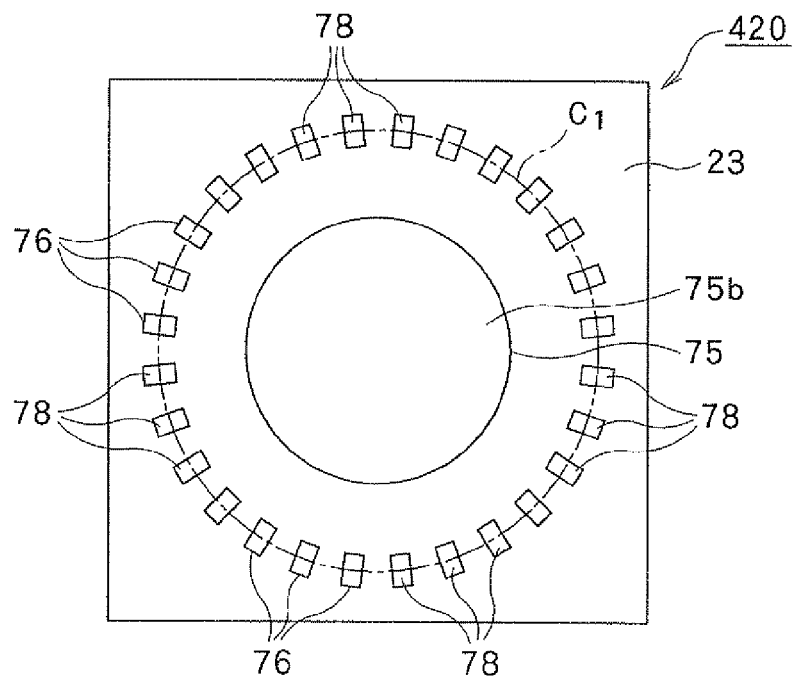
FIG. 103 is a bottom view showing the semiconductor device according to the fourth embodiment of the present invention.

As shown in FIGS. 102 and 103, the internal terminal 77 and the external terminal 78 of each plated section 76 for a lead both have a planar rectangular shape. The shape of the internal terminal 77 and external terminal 78 may alternatively be polygon, trapezoid, circle (see FIGS. 125 and 126 described later herein), ellipse, or the like.

In the present embodiment, the plated sections 76 for leads are arranged on one circumference in a plane view.

More specifically, as shown in FIGS. 102 and 103, the plated sections 76 for leads are arranged on a circumference, $C_1$, around the plated section 75 for semiconductor element placement. In this case, the internal terminals 77 are arranged on the circumference $C_1$ at the upper-surface, and the external terminals 78 are arranged on the circumference $C_1$ at the lower-surface. The wording or phrasing of "the plated sections 76 for leads are arranged on a circumference" here means that the center of each plated section 76 is disposed on the circumference.

The semiconductor element 21 and each bonding wire 22 can be substantially the same as those used in the first embodiment. The sealing resin section 23 can be substantially the same as that used in the second embodiment.

Method of Manufacturing the Semiconductor Device

Next, a method of manufacturing the semiconductor device 420 shown in FIGS. 100 to 103 is described below using FIGS. 104(*a*) to 104(*d*) and 105(*a*) to 105(*f*). While the following description refers to processes for manufacturing a plurality of semiconductor devices 420 from one metallic substrate 11, the present invention is not limited to this, and one semiconductor device 420 may be manufactured from one metallic substrate 11.

Figure 104:
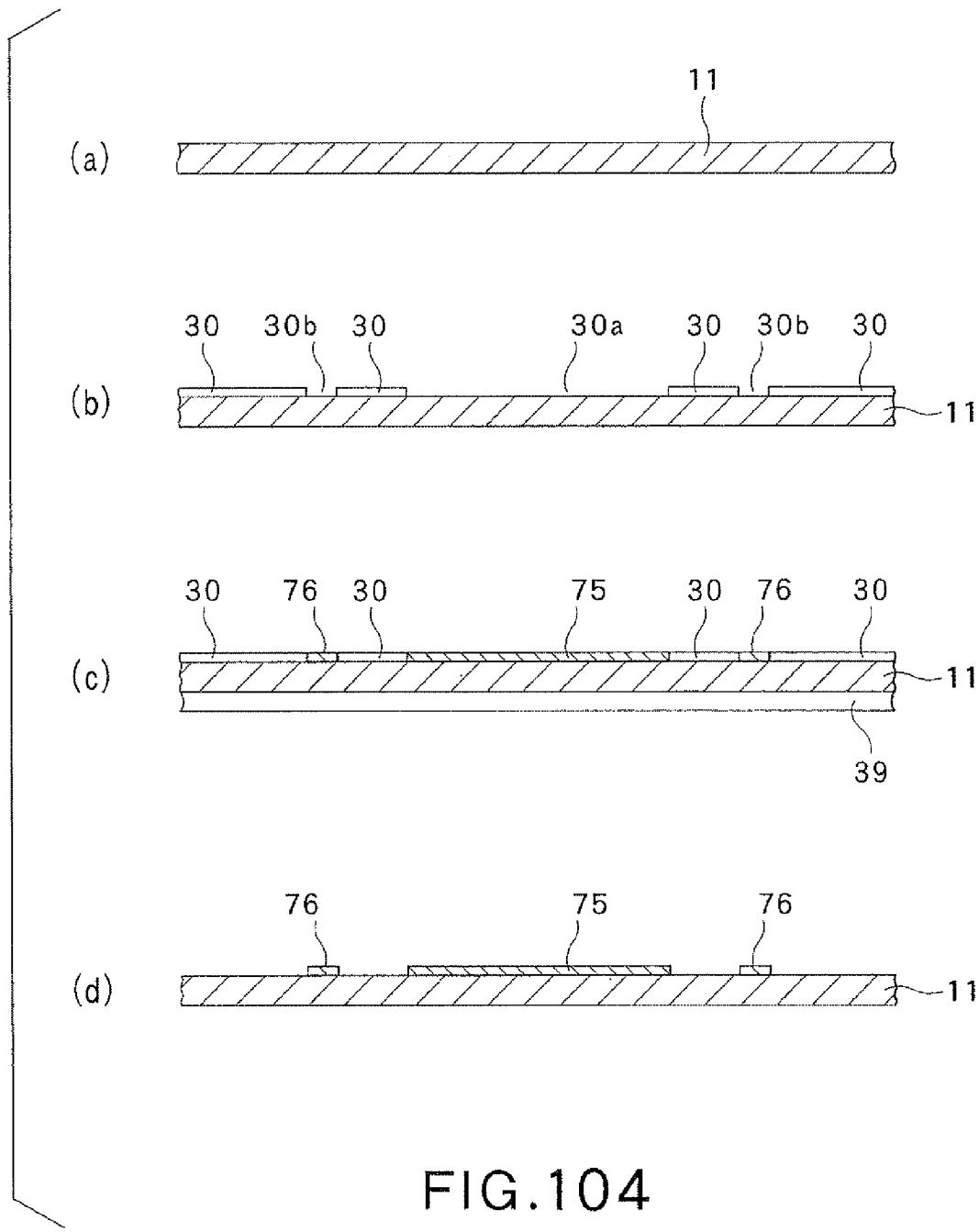
FIG. 104 is a cross-sectional view showing a method of manufacturing the semiconductor device according to the fourth embodiment of the present invention.

First, as shown in FIG. 104(*a*), a planar substrate 11 is provided. A substrate formed from materials such as copper, copper alloy, and silicon, can be used as the substrate 11.

Next, an upper surface of the substrate 11 is coated with a photosensitive resist, then dried, and exposed to light via a desired photomask. After the exposure, developing is conducted to form a plating resist layer 30 having a desired pattern. The thus-formed resist layer 30 is shown in FIG. 104(*b*). The photosensitive resist can be a conventional, known one.

During this process, openings 30*a* and 30*b* are formed at sections of the plating resist layer 30 that correspond to the sections that the plated section 75 for semiconductor element placement and the plated sections 76 for leads are to be formed. The substrate 11 is exposed at the openings 30*a* and 30*b*. Thickness of the plating resist layer 30 is preferred to be the same as or thicker than the thickness of the plated section 75 for semiconductor element placement and the plated sections 76 for leads.

Next, the lower-surface of the substrate 11 is covered with a backside tape 39, and the surface of the substrate 11 with the plating resist layer 30 on it is electrolytically plated, as shown in FIG. 104(*c*). Metal (e.g., silver) deposits are formed on the openings 30*a*, 30*b* that are not covered with the plating resist layer 30 on the substrate 11. Thus, the plated section 75 for semiconductor element placement and the plated sections 76 for leads are formed on the substrate 11.

If the plated section 75 for semiconductor element placement and the plated sections 76 for leads have a multi-layer structure, a plurality of layers, for example, an Au-plate layer, an Ni-plate layer, and an Au-plate layer, are stacked in that order upon the substrate 11. Thickness of the plated section 75 for semiconductor element placement and the plated sections 76 for leads is preferred to be, for example, between 0.5 μm and 60.0 μm.

The plating resist layer 30 is subsequently removed. A resist removal solution, for example, may be used to strip and remove the plating resist layer 30. The backside tape 39 is also removed from the lower surface of the substrate 11, as shown in FIG. 104(*d*).

Through these processes, as shown in FIG. 104(*d*), the plated section 75 for semiconductor element placement, and the plated sections 76 for leads arranged around the plated section 75 for semiconductor element placement on one circumference ($C_1$) in a plane view, are formed at the upper-surface of the substrate 11.

Next, the semiconductor element 21 is mounted on the plated section 75 for semiconductor element placement of the substrate 11. A die-bonding paste, for example, may be used to place and fix the semiconductor element 21 onto the plated section 75 for semiconductor element placement (die attachment), as shown in FIG. 105(*a*).

Figure 105:
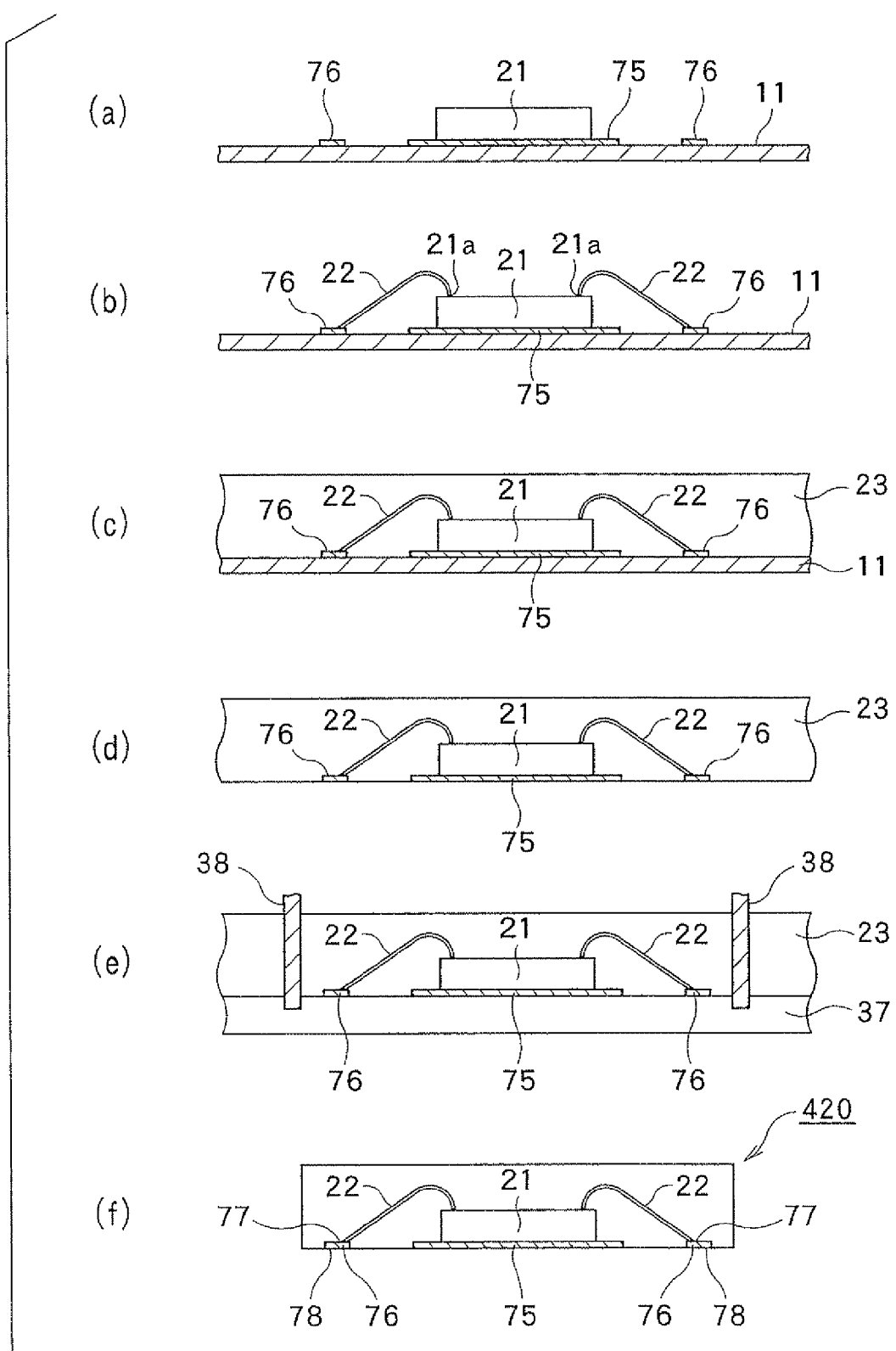
FIG. 105 is another cross-sectional view showing the method of manufacturing the semiconductor device according to the fourth embodiment of the present invention.

After die attachment, the terminals 21*a* of the semiconductor element 21 and the plated sections 76 for leads are electrically interconnected using bonding wires 22 (wire bonding), as shown in FIG. 105(*b*).

Next, as shown in FIG. 105(*c*), a thermosetting resin or a thermoplastic resin is injection molded or transfer molded on the substrate 11 with a mold not shown to form a sealing resin section 23. The upper-surface of the substrate 11, the semiconductor element 21, and the bonding wires 22 are thereby sealed.

The lower-surface side of the substrate 11 is next removed, as shown in FIG. 105(*d*). Specifically, if the substrate 11 is formed from copper, the substrate 11 is selectively removed by etching with, for example an etchant that contains ammonium chloride. The substrate 11 may be physically removed and stripped.

Next, parts that are to be the periphery of the semiconductor device 420 is diced to separate the sealing resin section 23 for each semiconductor element 21, as shown in FIG. 105(*f*). The sealing resin section 23 is first rested on and fixed to the surface of a dicing tape 37. Then, the sealing resin section 23 between the semiconductor elements 21 is cut with a rotational blade 38 constructed of a diamond grinding wheel, for example.

Through these processes, the semiconductor device 420 shown in FIGS. 100 to 103 can be obtained. See FIG. 105(*f*).

Operational Effects of the Present Embodiment

Figure 106:
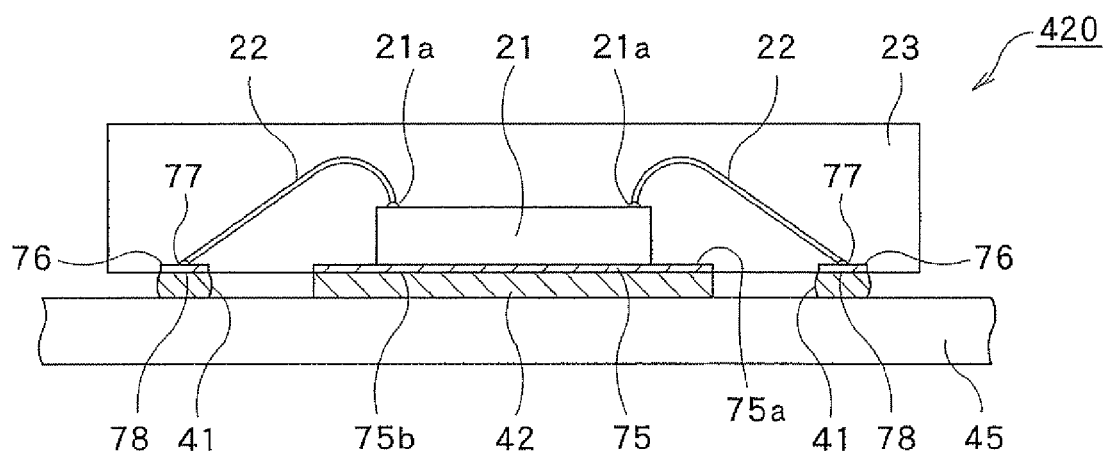
FIG. 106 is a cross-sectional view showing a state in which the semiconductor device according to the fourth embodiment of the present invention is mounted on a mounting substrate.

Next, operational effects of the thus-constructed present embodiment are described below using FIG. 106. FIG. 106 is a cross-sectional view showing a state in which the semiconductor device according to the present embodiment is mounted on a mounting substrate.

As shown in FIG. 106, the semiconductor device 420 according to the present embodiment is disposed and mounted on the mounting substrate 45. In this case, the semiconductor device 420 is fixed to and mounted on the mounting substrate 45 by use of solder portions 41 provided at the external terminals 78 of the plated sections 76 for leads, and a solder portion 42 provided at the lower surface 75*b* of the plated section 75 for semiconductor element placement. The mounting substrate 45 is formed primarily from a glass epoxy resin.

During the mounting of the semiconductor device 420 onto the mounting substrate 45 with solder, or upon actual usage of the semiconductor device 420 (depends on operational environment), various kinds of heat is considered to be applied to the semiconductor device 420. In such situation, if a thermal expansion coefficient of the entire semiconductor device 420 differs from that of the mounting substrate 45, the difference between them will cause thermal stresses. The solder portion 41 and solder portions 42, positioning between the semiconductor device 420 and the mounting substrate 45, are particularly likely to be damaged by the thermal stresses.

According to the present embodiment, on the other hand, the external terminals 78 of the plated sections 76 for leads are arranged on one circumference $C_1$ in a plane view. Thermal stresses caused by the difference in thermal expansion coefficient between the semiconductor device 420 and the mounting substrate 45 are therefore equally applied to the solder portions 41 of the external terminals 78. This prevents a specific solder portion 41 being damaged.

Furthermore, according to the present embodiment, the plated section 75 for semiconductor element placement and the plated sections 76 for leads are thinly formed by plating, and a lead frame does not exist. The device as whole can therefore be thinned.

In addition to the above effects, the present embodiment also offers practically the same operational effects as those produced by the second embodiment.

Variations of the Semiconductor Device

Next, variations of the semiconductor device according to the present embodiment are described below per FIGS. 107 to 138. In these figures, the same constituent elements as those of the embodiment shown in FIGS. 100 to 106 are each assigned the same reference number or symbol, and detailed description of these elements is omitted.

(Variation 4-1)

Figure 107:
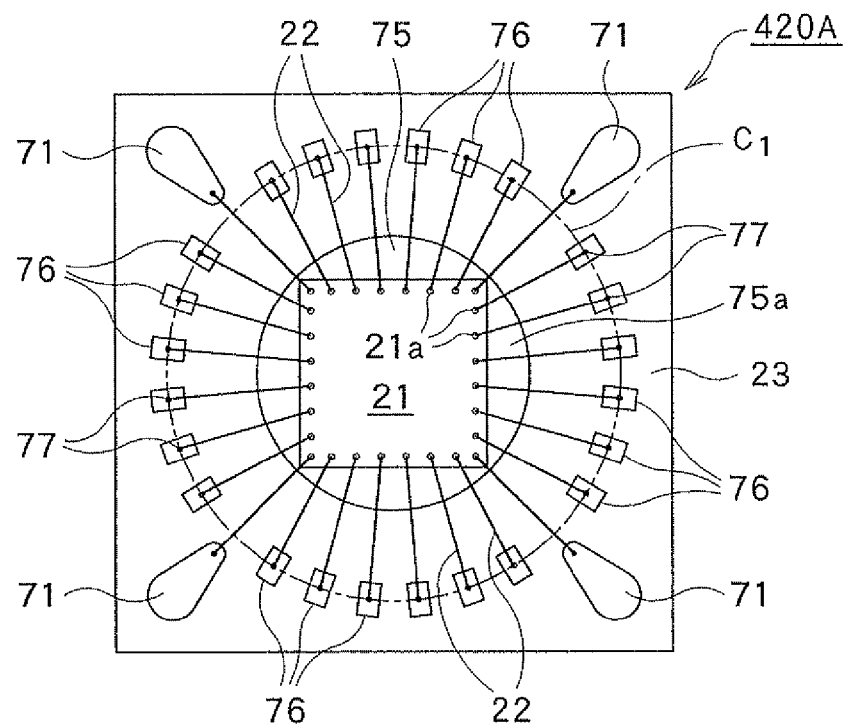
FIG. 107 is a plan view showing a semiconductor device according to a first variation of the fourth embodiment of the present invention (i.e., variation 4-1)
Figure 108:
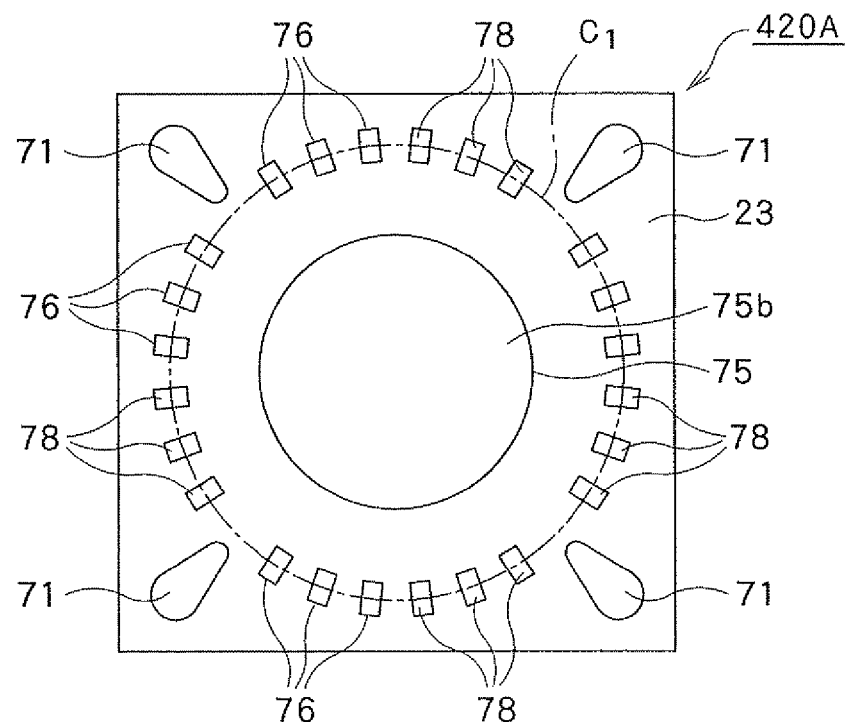
FIG. 108 is a bottom view showing the semiconductor device according to the first variation of the fourth embodiment of the present invention (i.e., variation 4-1)

FIGS. 107 and 108 show a semiconductor device 420A according to a first variation of the fourth embodiment. FIG. 107 is a plan view of the semiconductor device 420A (this plan view corresponds to FIG. 102), and FIG. 108 is a bottom view thereof (this bottom view corresponds to FIG. 103).

The semiconductor device 420A (variation 4-1) shown in FIGS. 107 and 108 differs from the embodiment shown in FIGS. 100 to 106, in that an external terminal 71 (additional external terminal) of a planar substantially oval shape is formed at each of four corners of a sealing resin section 23. The external terminals 71 are each exposed at a lower-surface of the semiconductor device 420A and positioned on the same plane as a plated section 75 for semiconductor element placement and plated sections 76 for leads. In addition, the area of the external terminal 71 is larger than that of the external terminal 78, and the shape of it is tapered toward the plated section 75 for semiconductor element placement.

The external terminals 71 can be used as grounding (GND) terminals, for example. The use of the relatively large external terminals 71 enables the external terminals 71 to be strongly connected to a mounting substrate 45 via a solder portion 41 when the semiconductor device 420A is mounted on the mounting substrate 45. Therefore, mounting reliability of the semiconductor device 420A against thermal stresses applied thereto can be further improved. The external terminals 71 may be used as an anchor member for improving the mounting reliability of the semiconductor device 420A, instead of being used as electrical connections for an element or the like.

The external terminals 71 do not need to be provided at all of the four corners of the sealing resin section 23, and may be provided at one or some corners.

(Variation 4-2)

Figure 109:
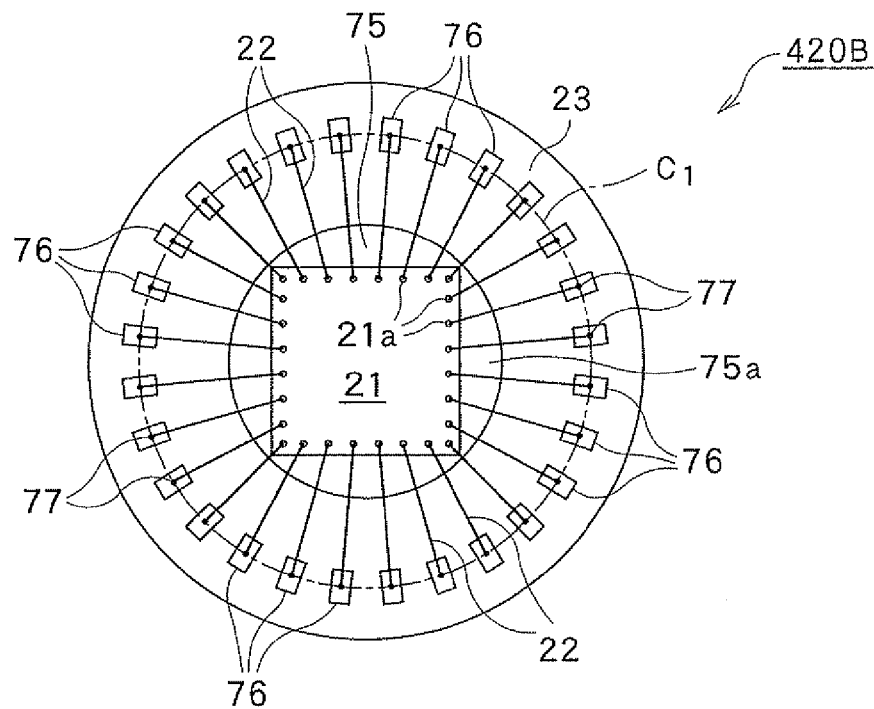
FIG. 109 is a plan view showing a semiconductor device according to a second variation of the fourth embodiment of the present invention (i.e., variation 4-2)
Figure 110:
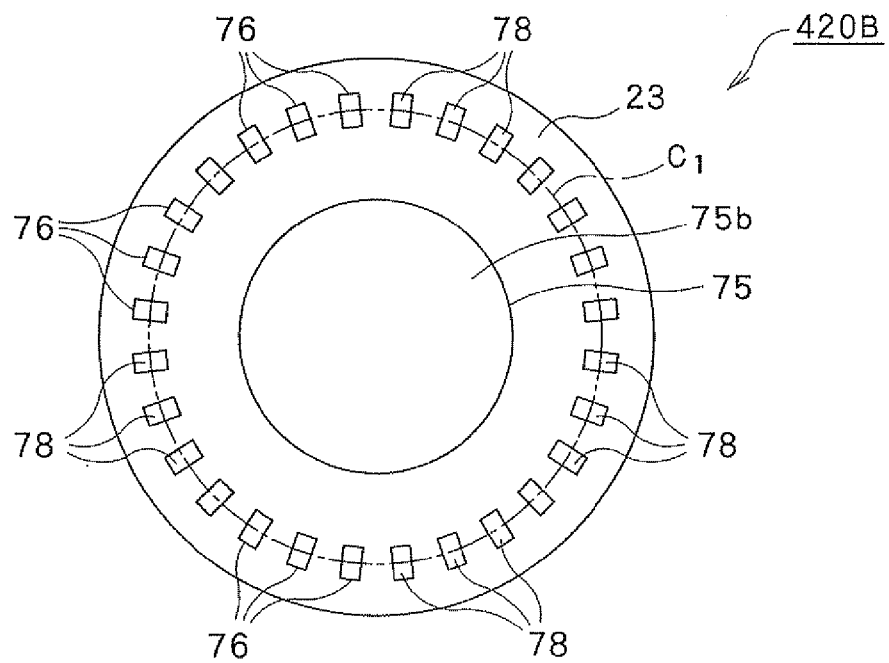
FIG. 110 is a bottom view showing the semiconductor device according to the second variation of the fourth embodiment of the present invention (i.e., variation 4-2)

FIGS. 109 and 110 show a semiconductor device 420B according to a second variation of the fourth embodiment. FIG. 109 is a plan view of the semiconductor device 420B (this plan view corresponds to FIG. 102), and FIG. 110 is a bottom view thereof (this bottom view corresponds to FIG. 103).

The semiconductor device 420B (variation 4-2) shown in FIGS. 109 and 110 differs from the embodiment shown in FIGS. 100 to 106, in that the device includes a sealing resin section 23 of a columnar shape. The circle constituting an external surface of the sealing resin section 23 is concentric with a circumference $C_1$.

In order to manufacture such semiconductor device 420B, the columnar sealing resin section 23 can be formed with a columnar mold in a process for forming the sealing resin section 23, as shown in FIG. 105(c).

Since the sealing resin section 23 is of a circular shape in a plane view, when heat is applied to the semiconductor device 420B, thermal stresses caused by a difference in thermal expansion coefficient between the semiconductor device 420B and a mounting substrate 45 are uniformly distributed in a circumferential direction. Thus, mounting reliability of the semiconductor device 420B can be further improved.

(Variation 4-3)

Figure 111:
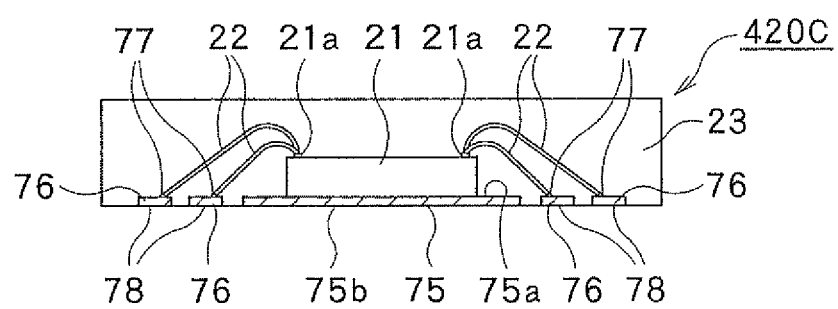
FIG. 111 is a cross-sectional view showing a semiconductor device according to a third variation of the fourth embodiment of the present invention (i.e., variation 4-3)
Figure 112:
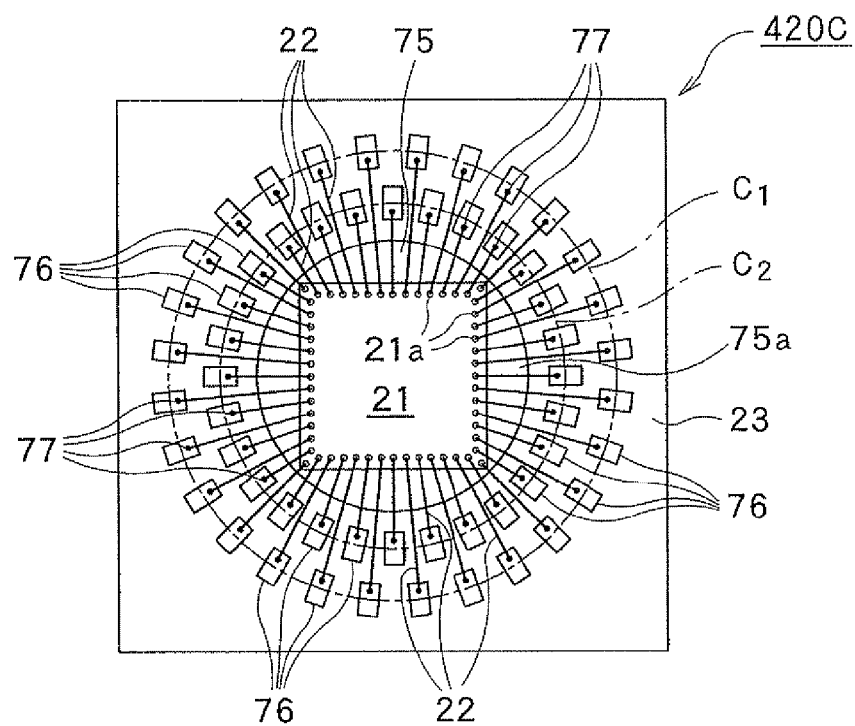
FIG. 112 is a plan view showing the semiconductor device according to the third variation of the fourth embodiment of the present invention (i.e., variation 4-3)
Figure 113:
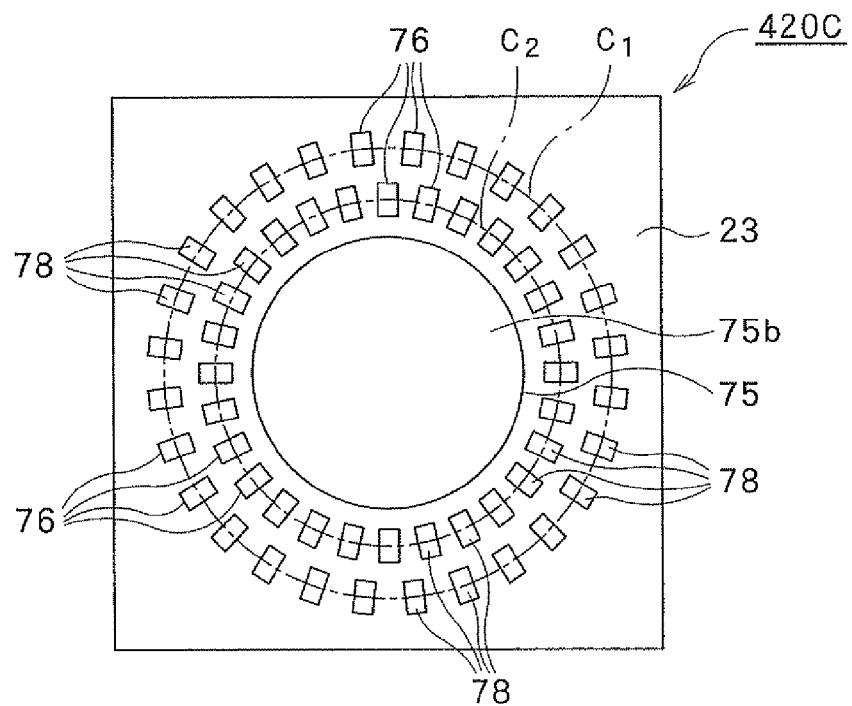
FIG. 113 is a bottom view showing the semiconductor device according to the third variation of the fourth embodiment of the present invention (i.e., variation 4-3)

FIGS. 111 to 113 show a semiconductor device 420C according to a third variation of the fourth embodiment. FIG. 111 is a cross-sectional view of the semiconductor device 420C (this cross-sectional view corresponds to FIG. 101), FIG. 112 is a plan view thereof (this plan view corresponds to FIG. 102), and FIG. 113 is a bottom view thereof (this bottom view corresponds to FIG. 103).

The semiconductor device 420C (variation 4-3) shown in FIGS. 111 to 113 differs from the embodiment shown in FIGS. 100 to 106, in that plated sections 76 for leads are arranged on either of a plurality of (two) circumferences, $C_1$ and $C_2$, in a plane view.

More specifically, as shown in FIG. 112, internal terminals 77 of the plated sections 76 for leads are arranged on any one of the two circumferences, $C_1$ and $C_2$, and in staggered layout. The circumferences $C_1$ and $C_2$ are in concentric relation to each other, and the diameter of the circumference $C_1$ is larger.

Similarly, at a lower surface of the semiconductor device 420C shown in FIG. 113, external terminals 78 of the plated sections 76 for leads are arranged on either of the two circumferences, $C_1$ and $C_2$, in staggered layout.

Areas and shapes of the internal terminals 77 and external terminals 78 may differ for each circumference on which the terminals 77 and 78 are arranged.

Arrangement of the plated sections 76 for leads on the circumferences $C_1$ and $C_2$ as mentioned allows mounting reliability of the semiconductor device 420C against thermal stresses applied thereto to be improved. In addition, the external terminals 78 are arranged in an efficient layout at the lower surface of the semiconductor device 420C, so that the semiconductor device can be adapted for a multipin semiconductor element 21.

(Variation 4-4)

Figure 114:
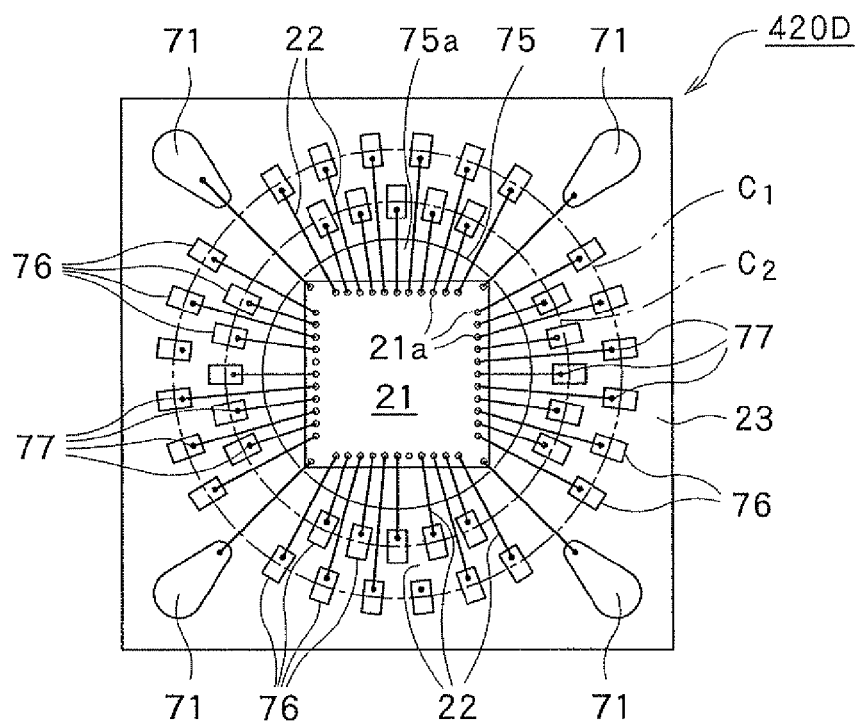
FIG. 114 is a plan view showing a semiconductor device according to a fourth variation of the fourth embodiment of the present invention (i.e., variation 4-4)
Figure 115:
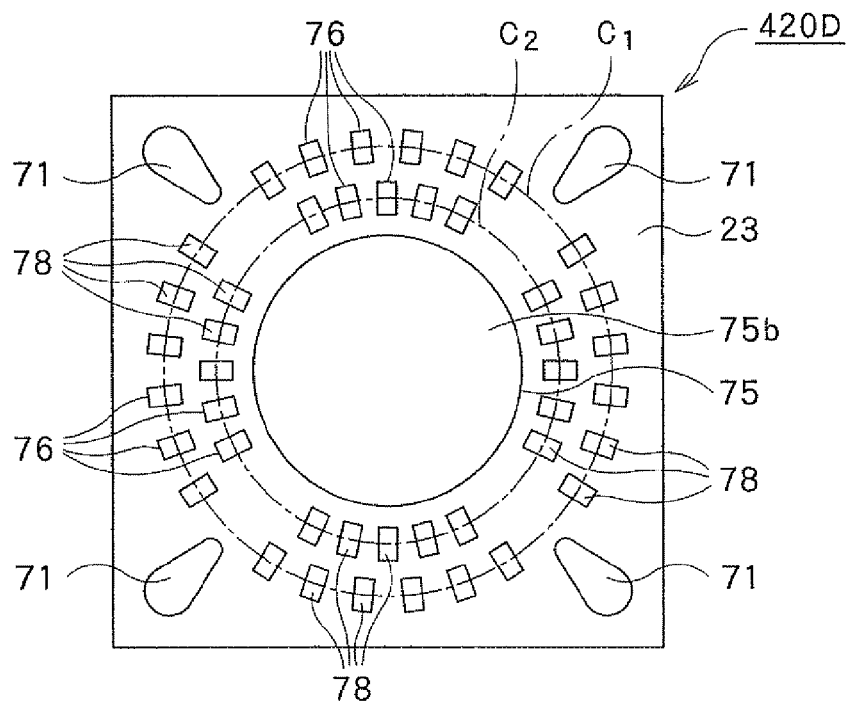
FIG. 115 is a bottom view showing the semiconductor device according to the fourth variation of the fourth embodiment of the present invention (i.e., variation 4-4)

FIGS. 114 and 115 show a semiconductor device 420D according to a fourth variation of the fourth embodiment. FIG. 114 is a plan view of the semiconductor device 420D (this plan view corresponds to FIG. 102), and FIG. 115 is a bottom view thereof (this bottom view corresponds to FIG. 103).

The semiconductor device 420D (variation 4-4) shown in FIGS. 114 and 115 is a combination of variation 4-1 shown in FIGS. 107 and 108, and variation 4-3 shown in FIGS. 111 to 113.

More specifically, in the semiconductor device 420D of FIGS. 114 and 115, an external terminal 71 (additional external terminal) of a planar substantially oval shape is formed at each of four corners of a sealing resin section 23. In addition, plated sections 76 for leads are arranged on either of two circumferences, $C_1$ and $C_2$, in a plane view. The external terminal 71 may be used as an anchor member for improving mounting reliability of the semiconductor device 420D, instead of being used as an electrical connection for an element or the like.

(Variation 4-5)

Figure 116:
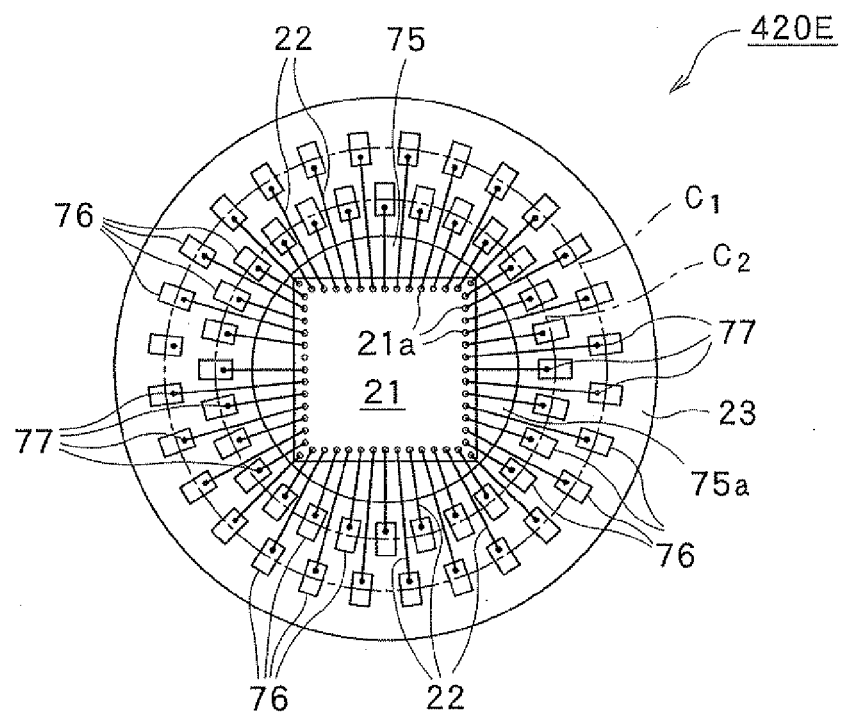
FIG. 116 is a plan view showing a semiconductor device according to a fifth variation of the fourth embodiment of the present invention (i.e., variation 4-5)
Figure 117:
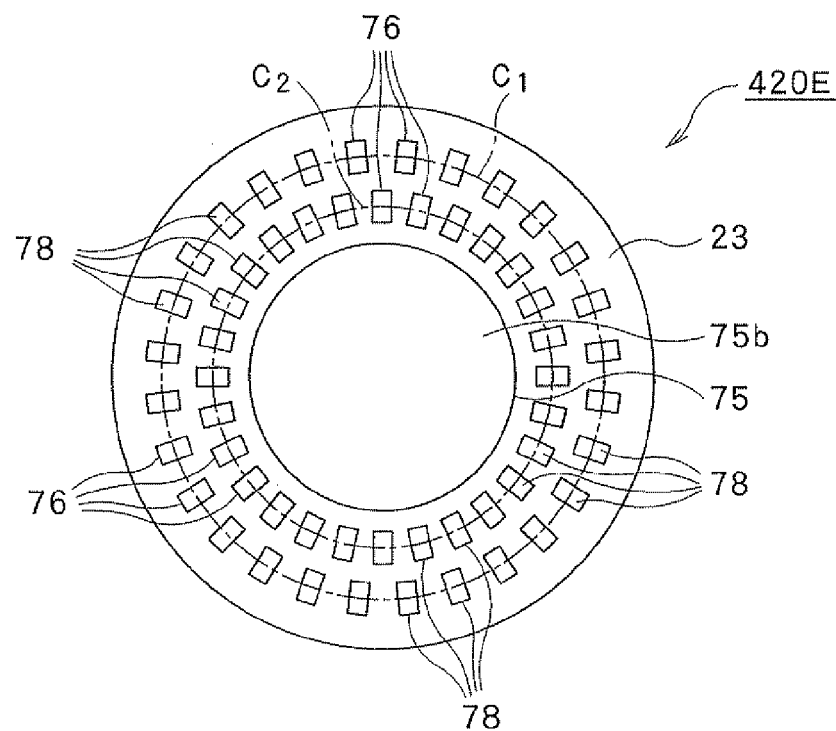
FIG. 117 is a bottom view showing the semiconductor device according to the fifth variation of the fourth embodiment of the present invention (i.e., variation 4-5)

FIGS. 116 and 117 show a semiconductor device 420E according to a fifth variation of the fourth embodiment. FIG. 116 is a plan view of the semiconductor device 420E (this plan view corresponds to FIG. 102), and FIG. 117 is a bottom view thereof (this bottom view corresponds to FIG. 103).

The semiconductor device 420E (variation 4-5) shown in FIGS. 116 and 117 is a combination of variation 4-2 shown in FIGS. 109 and 110, and variation 4-3 shown in FIGS. 111 to 113.

More specifically, the semiconductor device 420E shown in FIGS. 116 and 117 includes a sealing resin section 23 of a columnar shape. The device also includes plated sections 76 for leads, arranged on either of two circumferences, $C_1$ and $C_2$, in a plane view.

(Variation 4-6)

Figure 118:
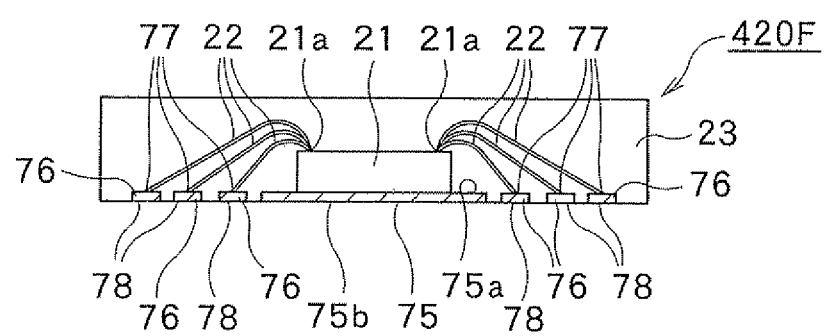
FIG. 118 is a cross-sectional view showing a semiconductor device according to a sixth variation of the fourth embodiment of the present invention (i.e., variation 4-6)
Figure 119:
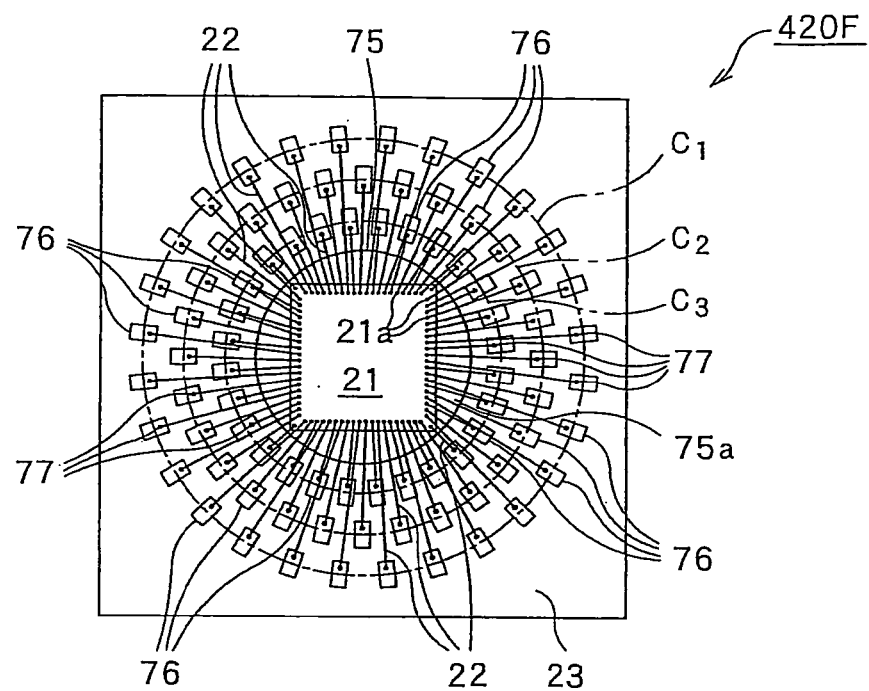
FIG. 119 is a plan view showing the semiconductor device according to the sixth variation of the fourth embodiment of the present invention (i.e., variation 4-6)
Figure 120:
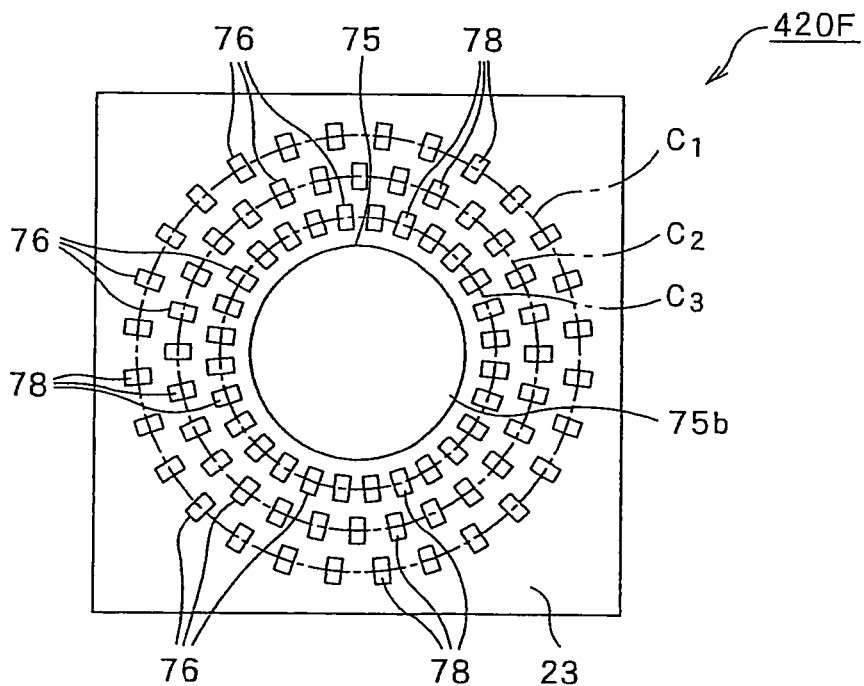

FIGS. 118 to 120 show a semiconductor device 420F according to a sixth variation of the fourth embodiment. That is to say, FIG. 118 is a cross-sectional view of the semiconductor device 420F (this cross-sectional view corresponds to FIG. 101), FIG. 119 is a plan view thereof (this plan view corresponds to FIG. 102), and FIG. 120 is a bottom view thereof (this bottom view corresponds to FIG. 103).

The semiconductor device 420F (variation 4-6) shown in FIGS. 118 to 120 differs from the embodiment shown in FIGS. 100 to 106, in that plated sections 76 for leads are arranged on any of a plurality of (three) circumferences, $C_1$, $C_2$, and $C_3$, in a plane view.

More specifically, as shown in FIG. 119, internal terminals 77 of the plated sections 76 for leads are arranged on any of the three circumferences $C_1$, $C_2$, and $C_3$ in staggered layout. The circumferences $C_1$, $C_2$, and $C_3$ are in concentric relation to one another, and the diameters of the circumferences are larger in the order of $C_1$, $C_2$, $C_3$.

Similarly, at a lower surface of the semiconductor device 420F shown in FIG. 120, external terminals 78 of the plated sections 76 for leads are arranged on any of the three circumferences $C_1$, $C_2$, and $C_3$ in staggered layout.

The internal terminals 77 and the external terminals 78 may be arranged on four or more circumferences. Areas and shapes of the internal terminals 77 and external terminals 78 may differ for each circumference on which the terminals 77 and 78 are arranged.

Arrangement of the plated sections 76 for leads are arranged on the circumferences $C_1$, $C_2$, and $C_3$ in such way allows mounting reliability of the semiconductor device 420F against thermal stresses applied thereto to be improved. In addition, the external terminals 78 are arranged in an efficient layout at the lower surface of the semiconductor device 420F, so that the semiconductor device can be adapted for a multipin semiconductor element 21.

(Variation 4-7)

Figure 121:
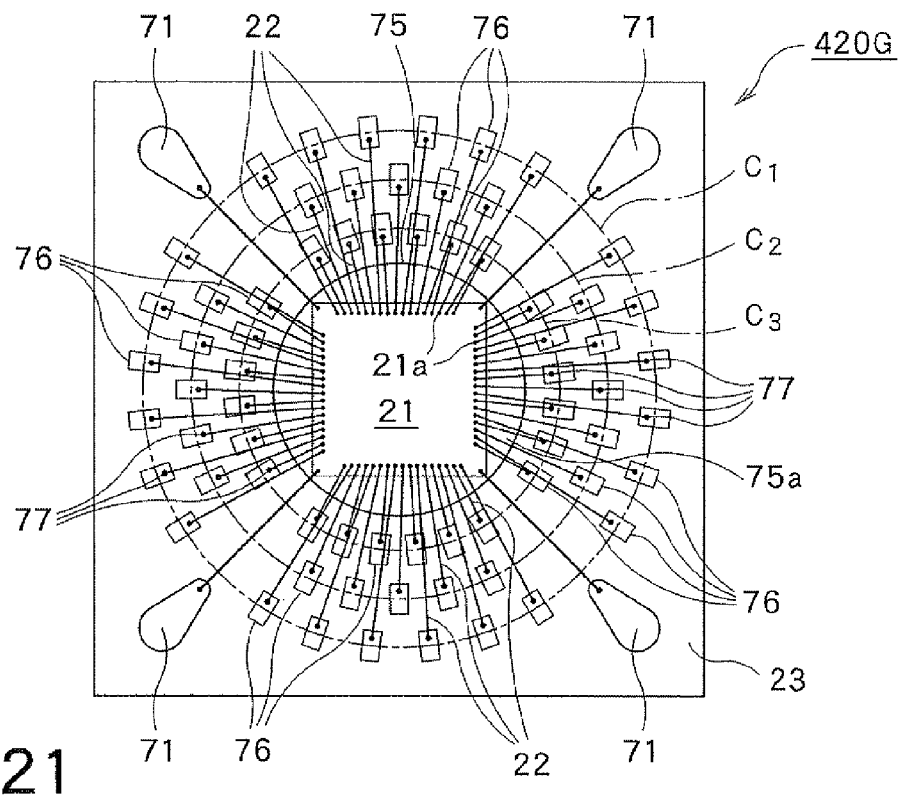
Figure 122:
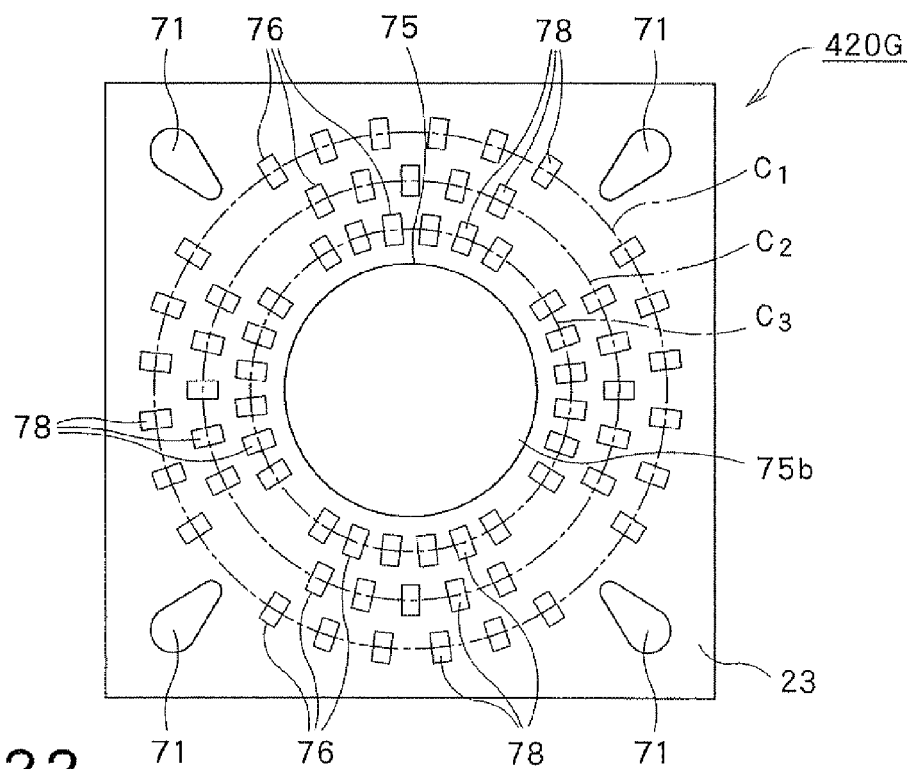

FIGS. 121 and 122 show a semiconductor device 420G according to a seventh variation of the fourth embodiment. FIG. 121 is a plan view of the semiconductor device 420G (this plan view corresponds to FIG. 102), and FIG. 122 is a bottom view thereof (this bottom view corresponds to FIG. 103).

The semiconductor device 420G (variation 4-7) shown in FIGS. 121 and 122 is a combination of variation 4-1 shown in FIGS. 107 and 108, and variation 4-6 shown in FIGS. 118 to 120.

More specifically, in the semiconductor device 420G of FIGS. 121 and 122, an external terminal 71 (additional external terminal) of a planar substantially oval shape is formed at each of four corners of a sealing resin section 23. In addition, plated sections 76 for leads are arranged on any of three circumferences, $C_1$, $C_2$, and $C_3$, in a plane view. The external terminal 71 may be used as an anchor member for improving mounting reliability of the semiconductor device 420G, instead of being used as an electrical connection for an element or the like.

(Variation 4-8)

Figure 123:
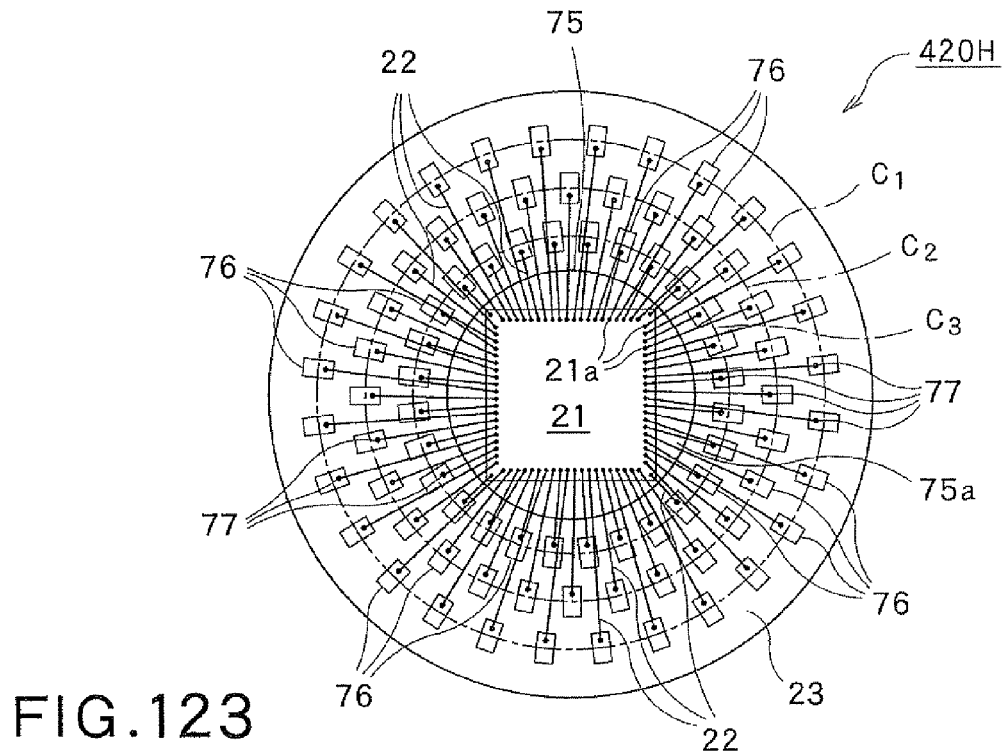
Figure 124:
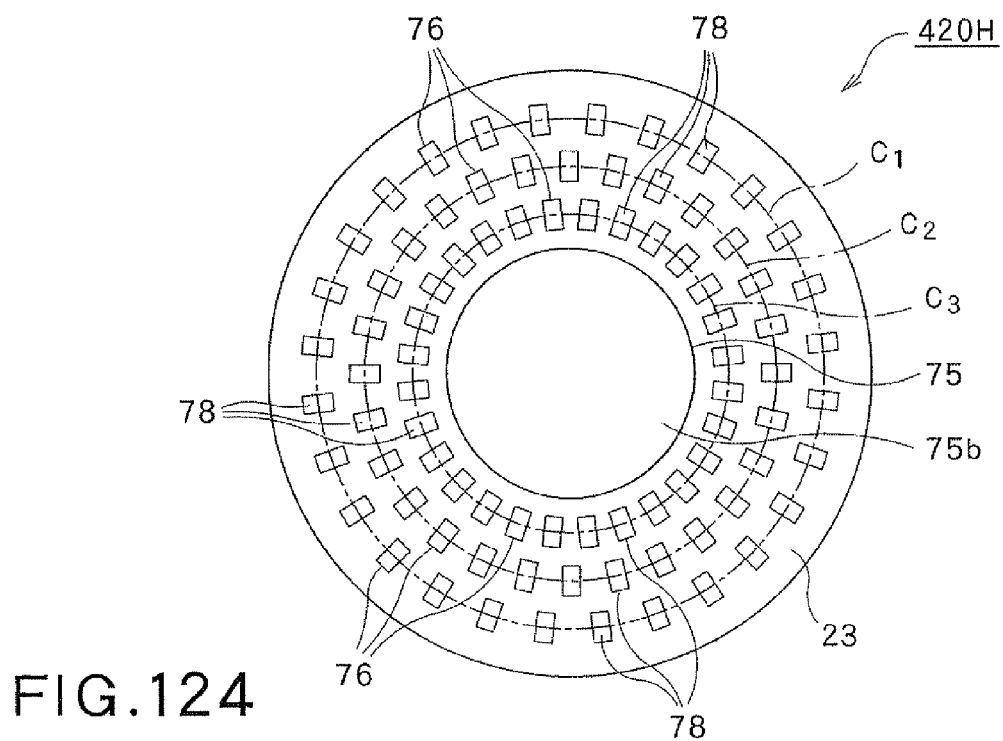

FIGS. 123 and 124 show a semiconductor device 420H according to an eighth variation of the fourth embodiment. FIG. 123 is a plan view of the semiconductor device 420H (this plan view corresponds to FIG. 102), and FIG. 124 is a bottom view thereof (this bottom view corresponds to FIG. 103).

The semiconductor device 420H (variation 4-8) shown in FIGS. 123 and 124 is a combination of variation 4-2 shown in FIGS. 109 and 110, and variation 4-6 shown in FIGS. 118 to 120.

More specifically, the semiconductor device 420H shown in FIGS. 123 and 124 includes a sealing resin section 23 of a columnar shape. The device also includes plated sections 76 for leads, arranged on any of three circumferences, $C_1$, $C_2$, and $C_3$, in a plane view.

(Variation 4-9)

Figure 125:
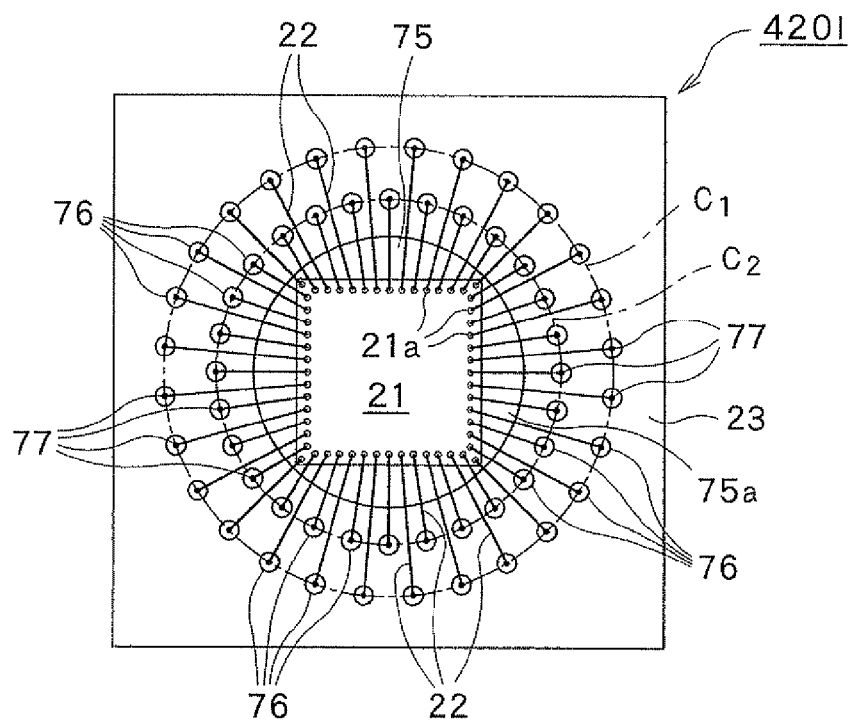
Figure 126:
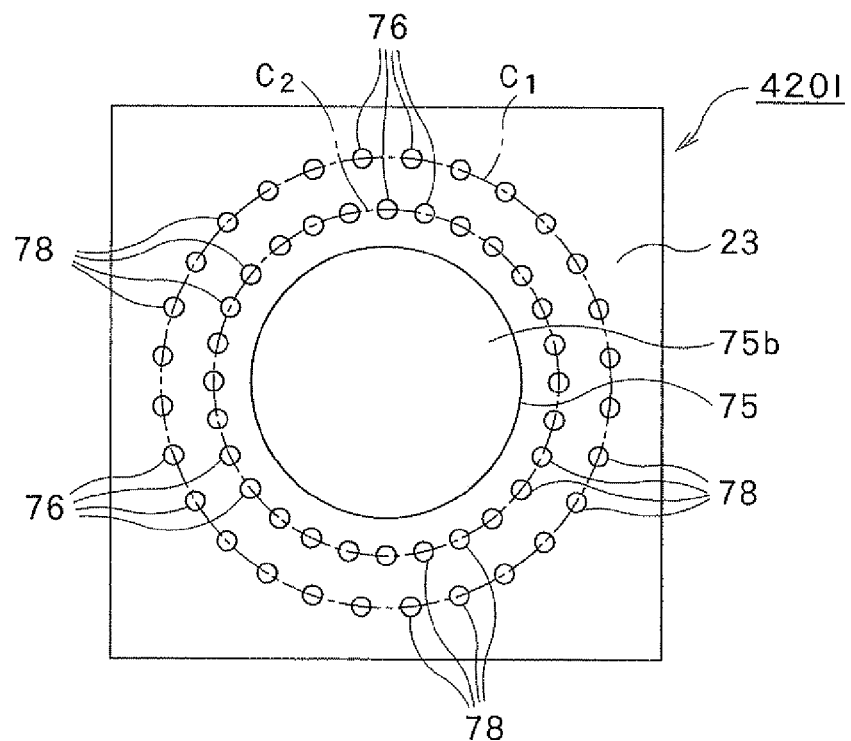

FIGS. 125 and 126 show a semiconductor device 420I according to a ninth variation of the fourth embodiment. That is to say, FIG. 125 is a plan view of the semiconductor device 420I (this plan view corresponds to FIG. 102), and FIG. 126 is a bottom view thereof (this bottom view corresponds to FIG. 103).

The semiconductor device 420I (variation 4-9) shown as FIGS. 125 and 126 differs from the embodiment shown in FIGS. 111 to 113, in that plated sections 76 for leads have a planar circle shape.

Such plated sections 76 for leads with planar circle shape may also be employed in other semiconductor devices such as shown in FIGS. 100 to 103, 107 to 110, and 114 to 129.

(Variation 4-10)

Figure 127:
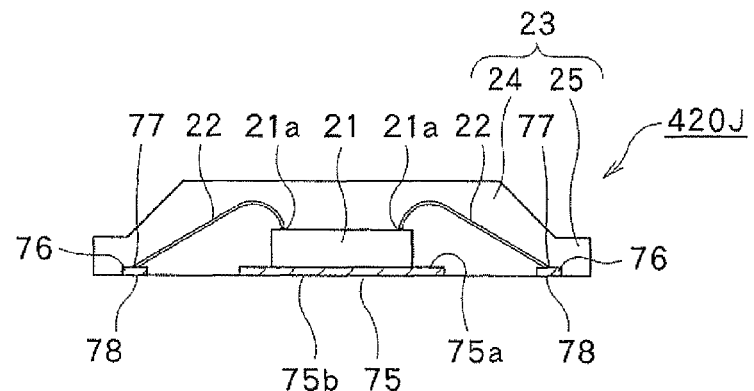

FIG. 127 shows a semiconductor device 420J according to a tenth variation of the fourth embodiment. FIG. 127 is a cross-sectional view of the semiconductor device 420J (this cross-sectional view corresponds to FIG. 101).

The semiconductor device 420J (variation 4-10) shown in FIG. 127 differs from the embodiment shown in FIGS. 100 to 106, in that a sealing resin section 23 includes a central region 24 provided over and around a semiconductor element 21, and a marginal region 25 provided around a circumference of the central region 24. The thickness of the central region 24 is greater than that of the marginal region 25.

The central region 24 of the sealing resin section 23 in this variation is of a truncated conical shape, having a tapered side face. The shape of the marginal region 25 may be planar rectangle, planar circle, or planar polygon. The shape of the central region 24 is not limited to truncated cone and may instead be column, dome-like shape, truncated polygonal pyramid, etc.

In order to manufacture such semiconductor device 420J, the truncated conical sealing resin section 23 can be formed with a truncated conical mold in a process for forming the sealing resin section 23, as shown in FIG. 105(*c*).

Other elements constituting the semiconductor device 420J are substantially the same as those of the embodiment shown in FIGS. 100 to 106.

Since the central region 24 of the sealing resin section 23 is thicker than the marginal region 25, the volume of the sealing resin section 23, whose thermal expansion coefficient is relatively low, can be reduced. This allows a thermal expansion coefficient of the entire semiconductor device 420J to become close to that of a mounting substrate 45. Hence, thermal stresses caused by application of heat to the semiconductor device 420J are alleviated and mounting reliability can be improved. In addition, warpage of the sealing resin section 23 due to heat shrinkage can be reduced.

Variation 4-1 or 4-2 shown in FIGS. 107 to 110, and variation 4-10 shown in FIG. 127 may also be combined.

(Variation 4-11)

Figure 128:
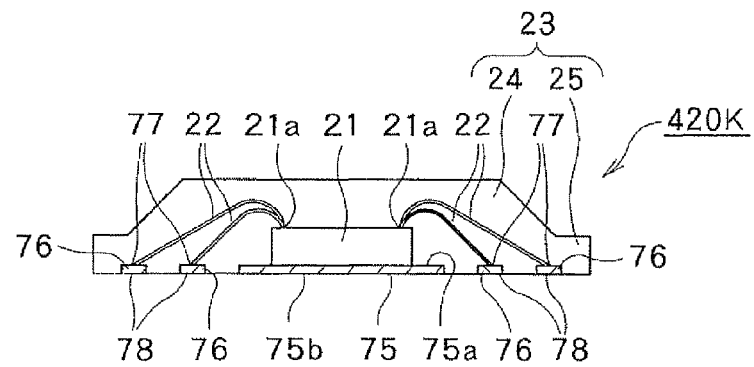

FIG. 128 shows a semiconductor device 420K according to an eleventh variation of the fourth embodiment. FIG. 128 is a cross-sectional view of the semiconductor device 420K (this cross-sectional view corresponds to FIG. 101).

The semiconductor device 420K (variation 4-11) shown in FIG. 128 is a combination of variation 4-3 shown in FIGS. 111 to 113, and variation 4-10 shown in FIG. 127.

More specifically, the thickness of a central region 24 in the semiconductor device 420K of FIG. 128 is greater than that of a marginal region 25. In addition, plated sections 76 for leads are arranged on either of two circumferences, $C_1$ and $C_2$, in a plane view.

Variation 4-4 or 4-5 shown in FIGS. 114 to 117, and variation 4-10 shown in FIG. 127 may also be combined.

(Variation 4-12)

Figure 129:
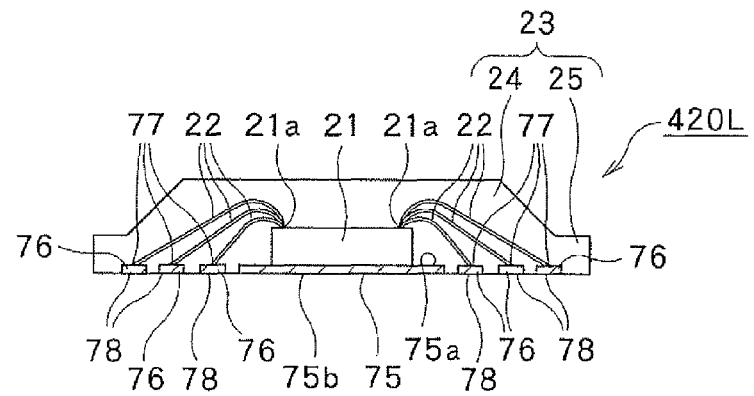

FIG. 129 shows a semiconductor device 420L according to a twelfth variation of the fourth embodiment. FIG. 129 is a cross-sectional view of the semiconductor device 420L (this cross-sectional view corresponds to FIG. 101).

The semiconductor device 420L (variation 4-12) shown in FIG. 129 is a combination of variation 4-6 shown in FIGS. 118 to 120 and variation 4-10 shown in FIG. 127.

More specifically, the thickness of a central region 24 in the semiconductor device 420L of FIG. 129 is greater than that of a marginal region 25. In addition, plated sections 76 for leads are arranged on any of three circumferences, $C_1$, $C_2$, and $C_3$, in a plane view.

Variation 4-7 or 4-8 shown in FIGS. 121 to 124, and variation 4-10 shown in FIG. 127 may also be combined.

(Variation 4-13)

Figure 130:
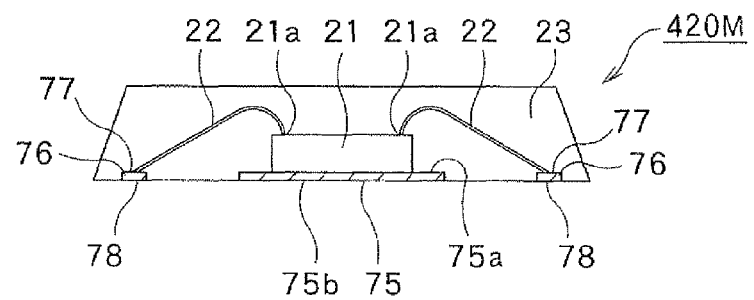

FIG. 130 shows a semiconductor device 420M according to a thirteenth variation of the fourth embodiment. FIG. 130 is a cross-sectional view of the semiconductor device 420M (this cross-sectional view corresponds to FIG. 101).

The semiconductor device 420M (variation 4-13) shown in FIG. 130 differs from the embodiment shown in FIGS. 100 to 106, in that the device 420M includes a sealing resin section 23 having a trapezoidal cross-section. In order to manufacture such semiconductor device 420M, the sealing resin section 23 having a certain shape can be formed with an appropriate mold for individual semiconductor devices 420M, in a process for forming the sealing resin section 23 (individual molding), as shown in FIG. 105(c).

Since the sealing resin section 23 has a trapezoidal cross-section, the volume of the sealing resin section 23 having a relatively low thermal expansion coefficient can be reduced. This allows a thermal expansion coefficient of the entire semiconductor device 420M to become close to that of a mounting substrate 45 (see FIG. 106). Hence, thermal stresses caused by application of heat to the semiconductor device 420M is alleviated and mounting reliability can be improved.

(Variation 4-14)

Figure 131:
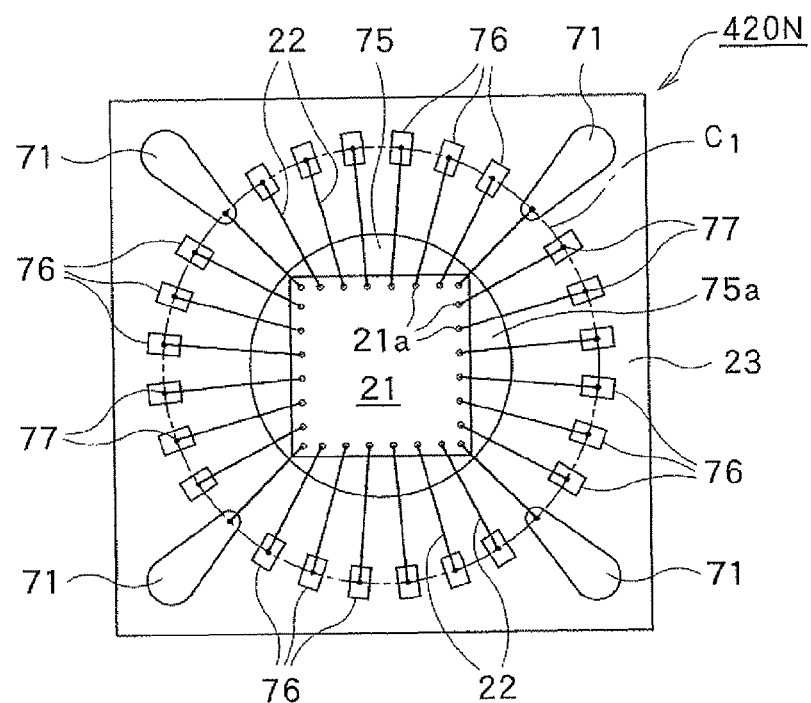

FIGS. 131 and 132 show a semiconductor device 420N according to a fourteenth variation of the fourth embodiment. FIG. 131 is a plan view of the semiconductor device 420N (this plan view corresponds to FIG. 102), and FIG. 132 is a bottom view thereof (this bottom view corresponds to FIG. 103).

The semiconductor device 420N (variation 4-14) shown in FIGS. 131 and 132 differs from variation 4-1 shown in FIGS. 107 and 108, in that the external terminals 71 (additional external terminals) are extended inward in a radial direction from four corners of a sealing resin section 23 to a circumference $C_1$ on which plated sections 76 for leads are arranged.

Since the external terminals 71 (additional external terminals) extend to the vicinity of the plated sections 76 for leads, mounting stresses applied to the plated sections 76 for leads can be further mitigated.

(Variation 4-15)

FIGS. 133 and 134 show a semiconductor device 420P according to a fifteenth variation of the fourth embodiment. FIG. 133 is a plan view of the semiconductor device 420P (this plan view corresponds to FIG. 102), and FIG. 134 is a bottom view thereof (this bottom view corresponds to FIG. 103).

The semiconductor device 420P (variation 4-15) shown in FIGS. 133 and 134 differs from variation 4-4 shown in FIGS. 114 and 115, in that the external terminals 71 (additional external terminals) are extended inward in a radial direction from four corners of a sealing resin section 23 to a circumference $C_2$, which is the most inner circumference on which plated sections 76 for leads are arranged.

Since the external terminals 71 (additional external terminals) extend to the vicinity of the plated sections 76 for leads, mounting stresses applied upon the plated sections 76 for leads can be further mitigated.

(Variation 4-16)

FIGS. 135 and 136 show a semiconductor device 420Q according to a sixteenth variation of the fourth embodiment. FIG. 135 is a plan view of the semiconductor device 420Q (this plan view corresponds to FIG. 102), and FIG. 136 is a bottom view thereof (this bottom view corresponds to FIG. 103).

The semiconductor device 420Q (variation 4-16) shown in FIGS. 135 and 136 differs from variation 4-7 shown in FIGS. 121 and 122 in that the external terminals 71 (additional external terminals) are extended inward in a radial direction from four corners of a sealing resin section 23 to a circumference $C_3$, which is the most inner circumference on which plated sections 76 for leads are arranged.

Since the external terminals 71 (additional external terminals) extend to the vicinity of the plated sections 76 for leads, mounting stresses applied upon the plated sections 76 for leads can be further mitigated.

(Variation 4-17)

FIGS. 137 and 138 show a semiconductor device 420R according to a seventeenth variation of the fourth embodiment. FIG. 137 is a plan view of the semiconductor device 420R (this plan view corresponds to FIG. 102), and FIG. 138 is a cross-sectional view thereof (this cross-sectional view corresponds to FIG. 101).

The semiconductor device 420R (variation 4-17) shown in FIGS. 137 and 138 includes an externally protruding terminal 65 formed on at least one of an upper surface of a plurality of plated sections 76 for leads. The externally protruding terminal 65 is formed at an opening 23a in a sealing resin section 23 and is exposed to the exterior. The externally protruding terminal 65 enables an upper surface of the semiconductor device 420R to be used for connection. The externally protruding terminal 65 may be of solder, silver (Ag) paste, or any other appropriate, general connecting material.

Since the externally protruding terminal 65 is formed on at least one of the upper surface of the plated sections 76 for leads, the externally protruding terminal 65 of a lower semiconductor device 420R can be connected to the external terminal 78 of an upper semiconductor device 420R. Thus, a plurality of semiconductor devices 420R can be stacked vertically upon each other.

The constituent elements disclosed in the above embodiment and variations may be appropriately combined as required. Alternatively, several of all the constituent elements described in the above embodiment or variations may be deleted.

Fifth Embodiment

Next, a fifth embodiment of the present invention will be described referring to FIGS. 139 to 192.

Semiconductor Device Configuration

A configuration of a semiconductor device according to the fifth embodiment of the present invention is first described below per FIGS. 139 to 143. FIGS. 139 to 143 show the semiconductor device according to the fifth embodiment of the present invention.

As shown in FIGS. 139 to 143, the semiconductor device 520 includes a non-electroconductive substrate 91, a semiconductor element-mounting section 95 provided centrally at an upper-surface of the non-electroconductive substrate 91, a plurality of internal terminals 97 each disposed around the semiconductor element-mounting section 95 at the upper-surface of the non-electroconductive substrate 91, and a plurality of external terminals 98 each provided at a lower-surface of the non-electroconductive substrate 91. A strengthening layer 14 is also provided below the semiconductor element-mounting section 95 at the lower-surface of the non-electroconductive substrate 91.

A semiconductor element 21 is rested on the semiconductor element-mounting section 95. The internal terminals 97 and terminals 21a of the semiconductor element 21 are electrically interconnected with bonding wires 22 (electroconductive portions).

The semiconductor element-mounting section 95, the internal terminals 97, the semiconductor element 21, and the bonding wires 22 are resin sealed with a sealing resin section 23.

The non-electroconductive substrate 91 includes vias 12 each extending therethrough (see FIG. 143). More specifically, the vias 12 are provided in portions of the non-electroconductive substrate 91 that correspond to the internal terminals 97, and a conductor 13 for electrically interconnecting the internal terminal 97 and the external terminal 98 is filled within each via 12. The conductor 13 may be constructed either integrally with the internal terminal 97 and the external terminal 98 or separately from the terminals. In addition, the conductor 13 may be provided only on an inner side face of the via 12, instead of completely filling the via 12.

A via 12 is also provided under the semiconductor element-mounting section 95 in the non-electroconductive substrate 91. A conductor 13 is provided in this via 12 as well. This conductor 13 electrically interconnects the semiconductor element-mounting section 95 and the strengthening layer 14. The conductor 13 may be constructed either integrally with the semiconductor element-mounting section 95 and the strengthening layer 14 or separately from them.

Furthermore, at the lower-surface of the non-electroconductive substrate 91, a solder portion 41 and a solder portion 42 are provided under external terminals 98 and the strengthening layer 14, respectively.

The non-electroconductive substrate 91, the semiconductor element-mounting section 95, the internal terminals 97, the external terminals 98, the conductors 13, and the strengthening layer 14 constitute a wiring substrate 90.

Constituent members of the semiconductor device 520 are described subsequently below.

The non-electroconductive substrate 91 may be either an organic substrate or an inorganic substrate. The organic substrate may be formed of polyether sulphone (PES), polyethylene naphthalate (PEN), polyamide, polybutylene terephthalate, polyethylene terephthalate, polyphenylene sulfide, polyether ether ketone, a liquid crystal polymer, a fluorocarbon resin, a polycarbonate, a polynorbonene-based resin, polysulphone, polyarylate, polyamideimide, polyetherimide, thermoplastic polyimide, or the like, or may be a composite substrate of them. The inorganic substrate may be a glass substrate, a silicon substrate, a ceramics substrate, etc.

Each via 12 in the non-electroconductive substrate 91 is formed by hole making with, for example, a drill, a carbon dioxide gas laser, a UV-YAG laser, an excimer laser, or the like. The conductor 13 filled in the via 12 may be formed of electrolytically plate of an electroconductive metal such as copper, or an electroconductive paste that contains electroconductive particles such as copper particles, silver particles, etc.

In the present embodiment, the semiconductor element-mounting section 95 is circular in plan view (see FIG. 141), and the strengthening layer 14 is substantially circular in plan view (see FIG. 142). The sizes of the circles of the semiconductor element-mounting section 95 and the strengthening layer 14 may be either the same or different. In addition, the size of the strengthening layer 14 is preferred to be larger than that of the semiconductor element 21 in a plane view, and larger than that of each external terminal 98. The shapes of the semiconductor element-mounting section 95 and the strengthening layer 14 are not limited to circular shapes and may instead be ellipse, polygon, or others.

The internal terminals 97 each have a bonding wire 22 connected thereto. The external terminals 98 are each provided at the lower-surface under the corresponding internal terminal 97, and a solder portion 41 is provided at each external terminal 98 as described above. Each internal terminal 97 is disposed at an equal spacing in a circumferential direction as shown in FIG. 141, and adjacent internal terminals 97 are electrically insulated from each other. Likewise, each external terminal 98 is disposed at an equal spacing in a circumferential direction as shown in FIG. 142, and adjacent external terminals 98 are electrically insulated from each other.

As shown in FIGS. 141 and 142, the shape of the internal terminals 97 and the external terminals 98 is a planar rectangle. The internal terminals 97 and the external terminals 98 may instead be polygon, trapezoid, circle (see FIGS. 165 and 166 described later herein), or ellipse, etc.

In the present embodiment, the internal terminals 97 and the external terminals 98 are arranged on the same circumference in a plane view.

More specifically, as shown in FIG. 141, the internal terminals 97 are arranged on one circumference $C_1$ at the upper-surface, and as shown in FIG. 142, the external terminals 98 are arranged on the circumference $C_1$ at the lower-surface. The wording or phrasing of "the internal terminals 97 and the external terminals 98 are arranged on a circumference" here means that the center of each internal terminal 97 and each external terminal 98 is disposed on the circumference.

The semiconductor element-mounting section 95, the internal terminals 97, the strengthening layer 14, and the external terminals 98 can be constructed from an electroconductive plate layer of Cu or other materials formed by electrolytic plating. In addition, an additional electroconductive plate layer such as a Ni-plated layer or Au-plated layer may also be stacked upon the semiconductor element-mounting section 95, the internal terminals 97, the strengthening layer 14, and the external terminals 98.

Furthermore, as shown in FIG. 143, a dielectric solder resist 64 is provided at a certain section of the non-electroconductive substrate 91. The solder resist 64 partly covers the semiconductor element-mounting section 95, the internal terminals 97, the strengthening layer 14, and the external terminals 98.

Incidentally, the semiconductor element 21 and each bonding wire 22 can be substantially the same as those used in the first embodiment. The sealing resin section 23 can be substantially the same as that used in the second embodiment. The semiconductor element 21 is fixed to the surface of the semiconductor element-mounting section 95 with, for example, a die-bonding paste 28 (see FIG. 143).

Method of Manufacturing the Semiconductor Device

Next, a method of manufacturing the semiconductor device 520 shown in FIGS. 139 to 143 is described below using FIGS. 144(a) to 144(f) and 145(a) to 145(e). While the following description refers to processes for manufacturing a plurality of semiconductor devices 520 from one non-electroconductive substrate 91, the present invention is not limited to this and one semiconductor device 520 may be manufactured from one non-electroconductive substrate 91.

First, as shown in FIG. 144(*a*), a copper-clad laminate 80, that is a non-electroconductive substrate 91 of which both sides are clad with a copper foil 81, is provided.

Next, as shown in FIG. 144(*b*), vias 12 (through-holes) are formed in the copper-clad laminate 80 with, for example, a drill, a carbon dioxide gas laser, a UV-YAG laser, an excimer laser, etc. The vias 12 are provided at positions corresponding to each internal terminal 97 and each external terminal 98, on the circumference $C_1$ shown in FIGS. 141 and 142.

Next, the inside of the vias 12 is cleaned. A copper-plated layer 84 of predetermined thickness is then formed on the entire surface of the copper-clad laminate 80, including the inside of the vias 12, by electroless plating to make the inside of the vias 12 electroconductive. After this, as shown in FIG. 144(*c*), a copper-plated layer 82 of predetermined thickness is further formed on the entire surface by electrolytic copper plating to electrically connect the inside of the vias 12.

Next, as shown in FIG. 144(*d*), each via 12 is filled with a conductor 13 that is formed from an electroconductive metal or an electroconductive paste, and is physically polished for surface smoothing.

After film formation using a dry film resist or a liquid resist, predetermined pattern exposure and developing is performed to form a resist pattern. The copper-plated layer 82, the copper-plated layer 84, and the copper foil 81 are pattern-etched using the resist pattern as a mask.

The semiconductor element-mounting section 95, the internal terminals 97, the strengthening layer 14, and the external terminals 98 are then formed from the copper-plated layer 82, the copper-plated layer 84, and the copper foil 81, as shown in FIG. 144(*e*). The strengthening layer 14 is formed on the lower surface of the semiconductor element-mounting section 95, and the external terminals 98 are formed on the lower surfaces of corresponding internal terminals 97. The internal terminals 97 and the external terminals 98 are arranged on the circumference $C_1$ (see FIGS. 141 and 142) around the semiconductor element-mounting section 95.

The dielectric solder resist 64 at the predetermined section of the non-electroconductive substrate 91 is provided, and thus the wiring substrate 90 is obtained.

The wiring substrate 90 is not limited to such multi-faced substrate and may instead be a build-up multilayer wiring substrate.

The thus-obtained wiring substrate 90 includes the non-electroconductive substrate 91, the semiconductor element-mounting section 95 provided at the upper-surface of the non-electroconductive substrate 91, the internal terminals 97 arranged around the semiconductor element-mounting section 95, the external terminals 98 provided at the lower-surface of the non-electroconductive substrate 91, the vias 12 extending through the non-electroconductive substrate 91, the conductor 13 filled in each via 12 of the non-electroconductive substrate 91 to electrically interconnect the internal terminals 97 and the external terminals 98, and the strengthening layer 14 formed under the lower surface of the semiconductor element-mounting section 95.

The semiconductor element 21 is next mounted on the upper surface of the semiconductor element-mounting section 95 of the wiring substrate 90. In this case, the semiconductor element 21 is rested on and fixed to the surface of the semiconductor element-mounting section 95 using, for example, a die-bonding paste 28 (die attachment), as shown in FIG. 145(*a*).

Next, the terminals 21*a* of the semiconductor element 21 and the internal terminals 97 are electrically interconnected using bonding wires 22 (wire bonding), as shown in FIG. 145(*b*).

Next, as shown in FIG. 145(*c*), a thermosetting resin or a thermoplastic resin is injection molded or transfer molded onto the wiring substrate 90 to form a sealing resin section 23. The semiconductor element-mounting section 95, the internal terminals 97, the semiconductor element 21, and the bonding wires 22 are thus sealed.

Next, as shown in FIG. 145(*d*), the sealing resin section 23 and wiring substrate 90 between semiconductor elements 21 are diced to separate the sealing resin section 23 and the wiring substrate 90 for each semiconductor element 21.

After this, solder portions 41 and 42 are provided under each external terminal 98 and the strengthening layer 14. Thus, the semiconductor device 520 shown in FIGS. 139 to 143 can obtained. See FIG. 145(*e*).

Operational Effects of the Present Embodiment

Next, operational effects of the thus-constructed present embodiment are described below using FIG. 146. FIG. 146 is a cross-sectional view showing a state in which the semiconductor device according to the present embodiment is mounted on a mounting substrate.

That is, as shown in FIG. 146, the semiconductor device 520 according to the present embodiment is disposed and mounted on the mounting substrate 45. In this case, the semiconductor device 520 is fixed to and mounted on the mounting substrate 45 by use of solder portions 41 provided under external terminals 98, and a solder portion 42 provided under the strengthening layer 14. The mounting substrate 45 is formed primarily from a glass epoxy resin.

During mounting of the semiconductor device 520 on the mounting substrate 45 with solder, or upon actual usage of the semiconductor device 520 (depending on operational environment), various kinds of heat is considered to be applied to the semiconductor device 520. In such situation, if a thermal expansion coefficient of the entire semiconductor device 520 differs from that of the mounting substrate 45, the difference between them will cause thermal stresses. The solder portion 41 and solder portions 42, positioned between the semiconductor device 520 and the mounting substrate 45, are particularly likely to be damaged by the thermal stresses.

According to the present embodiment, on the other hand, the external terminals 98 are arranged on one circumference, $C_1$, in a plane view. Thermal stresses caused by the difference in thermal expansion coefficient between the semiconductor device 520 and the mounting substrate 45 are therefore equally applied to the solder portions 41 of the external terminals 98. This prevents a specific solder portion 41 being damaged.

Furthermore, according to the present embodiment, since the strengthening layer 14 is provided on the lower surface of the semiconductor element-mounting section 95, the strengthening layer 14 can be disposed on the mounting substrate 45 by providing the solder portion 42 on an entire lower surface of the strengthening layer 14. Heat from the semiconductor element 21 can be released through the strengthening layer 14.

In addition to the above effects, the present embodiment also offers practically the same operational effects as those produced by the second embodiment.

Variations of the Semiconductor Device

Next, variations of the semiconductor device according to the present embodiment are described below per FIGS. 147 to 192. In each of these figures, the same constituent elements as those of the embodiment shown in FIGS. 139 to 146 are each assigned the same reference number or symbol, and detailed description of these elements is omitted.

(Variation 5-1)

FIGS. 147 and 148 show a semiconductor device 520A according to a first variation of the fifth embodiment. FIG. 147 is a plan view of the semiconductor device 520A (this plan view corresponds to FIG. 141), and FIG. 148 is a bottom view thereof (this bottom view corresponds to FIG. 142).

The semiconductor device 520A (variation 5-1) shown in FIGS. 147 and 148 differs from the embodiment shown in FIGS. 139 to 146, in that an external terminal 71 (additional external terminal) of a planar substantially oval shape is formed at each of four corners of a sealing resin section 23. The area of each external terminal 71 is larger than that of the external terminal 98, and the shape it is tapered toward a semiconductor element-mounting section 95.

The external terminals 71 may be used as grounding (GND) terminals, for example. The use of the relatively large external terminals 71 enables the external terminals 71 to be strongly connected to a mounting substrate 45 via a solder portion 41 when the semiconductor device 520A is mounted on the mounting substrate 45. Mounting reliability of the semiconductor device 520A against thermal stresses applied thereto can be further improved.

The external terminals 71 do not need to be provided at all of the four corners of the sealing resin section 23, and may be provided at one or some corners.

(Variation 5-2)

FIGS. 149 and 150 show a semiconductor device 520B according to a second variation of the fifth embodiment. FIG. 149 is a plan view of the semiconductor device 520B (this plan view corresponds to FIG. 141), and FIG. 150 is a bottom view thereof (this bottom view corresponds to FIG. 142).

The semiconductor device 520B (variation 5-2) shown in FIGS. 149 and 150 differs from the embodiment shown in FIGS. 139 to 146, in that the device includes a sealing resin section 23 of a columnar shape. In this variation, the circle of an external surface of the sealing resin section 23 is concentric with a circumference $C_1$.

In order to manufacture such semiconductor device 520B, the columnar sealing resin section 23 can be formed with a columnar mold in a process for forming the sealing resin section 23, as shown in FIG. 145(c).

Since the sealing resin section 23 has a circular shape in a plane view, when heat is applied to the semiconductor device 520B, thermal stresses caused by a difference in thermal expansion coefficient between the semiconductor device 520B and a mounting substrate 45 are uniformly distributed in a circumferential direction. Thus, mounting reliability of the semiconductor device 520B can be further improved.

(Variation 5-3)

FIGS. 151 to 153 show a semiconductor device 520C according to a third variation of the fifth embodiment. FIG. 151 is a cross-sectional view of the semiconductor device 520C (this cross-sectional view corresponds to FIG. 140), FIG. 152 is a plan view thereof (this plan view corresponds to FIG. 141), and FIG. 153 is a bottom view thereof (this bottom view corresponds to FIG. 142).

The semiconductor device 520C (variation 5-3) shown in FIGS. 151 to 153 differs from the embodiment shown in FIGS. 139 to 146, in that internal terminals 97 and external terminals 98 are arranged on either of a plurality of (two) circumferences, $C_1$ and $C_2$, in a plane view.

More specifically, as shown in FIG. 152, the internal terminals 97 are arranged on either of the two circumferences $C_1$ and $C_2$ in staggered layout. The circumferences $C_1$ and $C_2$ are in concentric relation to each other, and the diameter of the circumference $C_1$ is larger.

Similarly, at a lower surface of the semiconductor device 520C shown in FIG. 153, the external terminals 98 are arranged on either of the two circumferences $C_1$ and $C_2$ in staggered layout.

Areas and shapes of the internal terminals 97 and external terminals 98 may differ for each circumference on which the terminals 97 and 98 are arranged.

Since the external terminals 98 are arranged on the circumferences $C_1$ and $C_2$ in such way, mounting reliability of the semiconductor device 520C against thermal stresses applied thereto can be improved. In addition, the external terminals 98 can be arranged in an efficient layout at the lower surface of the semiconductor device 520C, so that the semiconductor device can be adapted for a multipin semiconductor element 21.

(Variation 5-4)

FIGS. 154 and 155 show a semiconductor device 520D according to a fourth variation of the fifth embodiment. FIG. 154 is a plan view of the semiconductor device 520D (this plan view corresponds to FIG. 141), and FIG. 155 is a bottom view thereof (this bottom view corresponds to FIG. 142).

The semiconductor device 520D (variation 5-4) shown in FIGS. 154 and 155 is a combination of variation 5-1 shown in FIGS. 147 and 148, and variation 5-3 shown in FIGS. 151 to 153.

More specifically, in the semiconductor device 520D of FIGS. 154 and 155, a planar substantially oval external terminal 71 (additional external terminal) is disposed at each of four corners of a sealing resin section 23. In addition, internal terminals 97 and external terminals 98 are arranged on either of two circumferences, $C_1$ and $C_2$, in a plane view.

(Variation 5-5)

FIGS. 156 and 157 show a semiconductor device 520E according to a fifth variation of the fifth embodiment. FIG. 156 is a plan view of the semiconductor device 520E (this plan view corresponds to FIG. 141), and FIG. 157 is a bottom view thereof (this bottom view corresponds to FIG. 142).

The semiconductor device 520E (variation 5-5) shown in FIGS. 156 and 157 is a combination of variation 5-2 shown in FIGS. 149 and 150, and variation 5-3 shown in FIGS. 151 to 153.

More specifically, the semiconductor device 520E shown in FIGS. 156 and 157 includes a sealing resin section 23 of a columnar shape. In addition, internal terminals 97 and external terminals 98 are arranged on either of two circumferences, $C_1$ and $C_2$, in a plane view.

(Variation 5-6)

FIGS. 158 to 160 show a semiconductor device 520F according to a sixth variation of the fifth embodiment. FIG. 158 is a cross-sectional view of the semiconductor device 520F (this cross-sectional view corresponds to FIG. 140), FIG. 159 is a plan view thereof (this plan view corresponds to FIG. 141), and FIG. 160 is a bottom view thereof (this bottom view corresponds to FIG. 142).

The semiconductor device 520F (variation 5-6) shown in FIGS. 158 to 160 differs from the embodiment shown in FIGS. 139 to 146, in that internal terminals 97 and external terminals 98 are arranged on any of a plurality of (three) circumferences, $C_1$, $C_2$, and $C_3$, in a plane view.

More specifically, as shown in FIG. 159, the internal terminals 97 are arranged on any of the three circumferences $C_1$, $C_2$, and $C_3$ in staggered layout. The circumferences $C_1$, $C_2$, and $C_3$ are in concentric relation to one another, and the diameter of the circumferences are larger in the order of $C_1$, $C_2$, $C_3$.

Similarly, at a lower surface of the semiconductor device 520F shown in FIG. 160, the external terminals 98 are arranged on any of the three circumferences, $C_1$, $C_2$, and $C_3$, in staggered layout.

The internal terminals 97 and the external terminals 98 may be arranged on four or more circumferences. In addition, areas and shapes of the internal terminals 97 and external terminals 98 may differ for each circumference on which the terminals 97 and 98 are arranged.

Since the internal terminals 97 and the external terminals 98 are arranged on the plurality of circumferences $C_1$, $C_2$, and $C_3$, mounting reliability of the semiconductor device 520F against thermal stresses applied thereto can be improved. In addition, the external terminals 98 can be arranged in an efficient layout at the lower surface of the semiconductor device 520F, so that the semiconductor device 520F can be adapted for a multipin semiconductor element 21.

(Variation 5-7)

FIGS. 161 and 162 show a semiconductor device 520G according to a seventh variation of the fifth embodiment. FIG. 161 is a plan view of the semiconductor device 520G (this plan view corresponds to FIG. 141), and FIG. 162 is a bottom view thereof (this bottom view corresponds to FIG. 142).

The semiconductor device 520G (variation 5-7) shown in FIGS. 161 and 162 is a combination of variation 5-1 shown in FIGS. 147 and 148, and variation 5-6 shown in FIGS. 158 to 160.

More specifically, in the semiconductor device 520G of FIGS. 161 and 162, an external terminal 71 (additional external terminal) of a planar substantially oval shape is disposed at each of four corners of a sealing resin section 23. In addition, internal terminals 97 and external terminals 98 are arranged on any of three circumferences, $C_1$, $C_2$, and $C_3$, in a plane view.

(Variation 5-8)

FIGS. 163 and 164 show a semiconductor device 520H according to an eighth variation of the fifth embodiment. FIG. 163 is a plan view of the semiconductor device 520H (this plan view corresponds to FIG. 141), and FIG. 164 is a bottom view thereof (this bottom view corresponds to FIG. 142).

The semiconductor device 520H (variation 5-8) shown in FIGS. 163 and 164 is a combination of variation 5-2 shown in FIGS. 149 and 150, and variation 5-6 shown in FIGS. 158 to 160.

More specifically, the semiconductor device 520H shown in FIGS. 163 and 164 includes a sealing resin section 23 of a columnar shape. In addition, internal terminals 97 and external terminals 98 are arranged on any of three circumferences, $C_1$, $C_2$, and $C_3$, in a plane view.

(Variation 5-9)

FIGS. 165 and 166 show a semiconductor device 520I according to a ninth variation of the fifth embodiment. FIG. 165 is a plan view of the semiconductor device 520I (this plan view corresponds to FIG. 141), and FIG. 166 is a bottom view thereof (this bottom view corresponds to FIG. 142).

The semiconductor device 520I (variation 5-9) shown in FIGS. 165 and 166 differs from the semiconductor device 520C (variation 5-3) shown in FIGS. 151 to 153, in that internal terminals 97 and external terminals 98 have a planar circle shape.

The internal terminals 97 and external terminals 98 with a planar circle shape may also be employed in other semiconductor devices such as those shown in FIGS. 139 to 143, 147 to 150, and 154 to 192.

(Variation 5-10)

FIGS. 167 and 168(*a*) show a semiconductor device 5203 according to a tenth variation of the fifth embodiment. FIG. 167 is a cross-sectional view of the semiconductor device 5203 (this cross-sectional view corresponds to FIG. 140), and FIG. 168(*a*) is a perspective view thereof.

The semiconductor device 5203 (variation 5-10) shown in FIGS. 167 and 168(*a*) differs from the embodiment shown in FIGS. 139 to 146, in that the device 5203 includes a sealing resin section 23 having a truncated conical shape and a tapered side face. The shape of a non-electroconductive substrate 91 of the device is a planar rectangle.

In order to manufacture such semiconductor device 5203, the sealing resin section 23 with a truncated conical shape is formed with a truncated conical mold in a process for forming the sealing resin section 23 as shown in FIG. 145(*c*).

The shape of the sealing resin section 23 is not limited to a truncated conical shape as shown in FIG. 168(*a*). The sealing resin section 23 may instead be of, for example, a column as shown in FIG. 168(*b*), a dome-like shape as shown in FIG. 168(*c*), or a truncated polygonal pyramid as shown in FIG. 168(*d*).

When the sealing resin section 23 has a shape such as a truncated cone, a column, a dome-like shape, or a truncated polygonal pyramid, the volume of the sealing resin section 23 having a relatively low thermal expansion coefficient can be reduced. This allows a thermal expansion coefficient of the entire semiconductor device 5203 to become close to that of a mounting substrate 45. Hence, thermal stresses caused by application of heat to the semiconductor device 5203 are alleviated and mounting reliability can be improved. Additionally, warpage of the sealing resin section 23 due to heat shrinkage can be reduced.

Variation 5-1 or 5-2 shown in FIGS. 147 to 150, and variation 5-10 shown in FIG. 167 can also be combined.

(Variation 5-11)

FIG. 169 shows a semiconductor device 520K according to an eleventh variation of the fifth embodiment. FIG. 169 is a cross-sectional view of the semiconductor device 520K (this cross-sectional view corresponds to FIG. 140).

The semiconductor device 520K (variation 5-11) shown in FIG. 169 is a combination of variation 5-3 shown in FIGS. 151 to 153, and variation 5-10 shown in FIG. 167.

More specifically, the semiconductor device 520K shown in FIG. 169 includes a sealing resin section 23 of a truncated conical shape. In addition, internal terminals 97 and external terminals 98 are arranged on either of two circumferences, $C_1$ and $C_2$, in a plane view.

Variation 5-4 or 5-5 shown in FIGS. 154 to 157, and variation 5-10 shown in FIG. 167 can also be combined.

(Variation 5-12)

FIG. 170 shows a semiconductor device 520L according to a twelfth variation of the fifth embodiment. FIG. 170 is a cross-sectional view of the semiconductor device 520L (this cross-sectional view corresponds to FIG. 140).

The semiconductor device 520L shown as variation 5-12 in FIG. 170 is a combination of variation 5-6 shown in FIGS. 158 to 160, and variation 5-10 shown in FIG. 167.

More specifically, the semiconductor device 520L shown in FIG. 170 includes a sealing resin section 23 of a truncated conical shape. In addition, internal terminals 97 and external terminals 98 are arranged on any one of three circumferences, $C_1$, $C_2$, and $C_3$, in a plane view.

Variation 5-7 or 5-8 shown in FIGS. 161 to 164, and variation 5-10 shown in FIG. 167 can also be combined.

(Variation 5-13)

FIG. 171 shows a semiconductor device 520M according to a thirteenth variation of the fifth embodiment. FIG. 171 is a partly enlarged cross-sectional view of the semiconductor device 520M (this cross-sectional view corresponds to FIG. 143).

The semiconductor device 520M (variation 5-13) shown in FIG. 171 includes a semiconductor element-mounting section 95 extending further outward from a semiconductor element 21 in a radial direction. The semiconductor element-mounting section 95 and one or a plurality of terminals 21a of the semiconductor element 21 are interconnected by a bonding wire 22.

In this configuration, part of the terminals 21a of the semiconductor element 21 can be connected to a mounting substrate 45 via the semiconductor element-mounting section 95, a conductor 13, a strengthening layer 14, and a solder portion 42. The terminal 21a connected to the semiconductor element-mounting section 95 can be used as a grounding (GND) terminal, a power supply terminal, or others.

It is not to mention that variation 5-13 shown in FIG. 171 may also be combined with the variations shown in FIGS. 147 to 170.

(Variation 5-14)

FIG. 172 shows a semiconductor device 520N according to a fourteenth variation of the fifth embodiment. FIG. 172 is a plan view of the semiconductor device 520N (this plan view corresponds to FIG. 141).

The semiconductor device 520N (variation 5-14) shown in FIG. 172 includes internal terminals 97 of which inner ends extend inward toward a semiconductor element-mounting section 95, and the parts extended are narrowed.

Since the internal terminals 97 extend to the vicinity of a semiconductor element 21, length of bonding wires 22 formed from gold or other materials can be reduced, which in turn reduces costs.

(Variation 5-15)

FIG. 173 shows a semiconductor device 520P according to a fifteenth variation of the fifth embodiment. FIG. 173 is a bottom view of the semiconductor device 520P (this bottom view corresponds to FIG. 142).

The semiconductor device 520P (variation 5-15) shown in FIG. 173 includes radial and/or circular slits 67 formed in strengthening layer 14 of a substantially circular shape. The strengthening layer 14 is constructed from a plurality of circular or arc-shaped members 14a.

At the portions of the slits 67, the strengthening layer 14 does not exist. The amount of solder portion 42 (solder cream) can be therefore reduced. Thus, voids due to inward entrapping of solder cream during solder-mounting can be released to the outside for improved solder mountability. Other constituent elements of this variation are substantially the same as those in the embodiment of FIGS. 139 to 146.

(Variation 5-16)

FIG. 174 shows a semiconductor device 520Q according to a sixteenth variation of the fifth embodiment. FIG. 174 is a bottom view of the semiconductor device 520Q (this bottom view corresponds to FIG. 142).

The semiconductor device 520Q (variation 5-16) shown in FIG. 174 includes a strengthening layer 14 that is composed of a plurality of circular members 14a having the same shape and arranged concentrically. The shape of the strengthening layer 14 may instead be rectangular, elliptical, fan-like, polygonal, etc.

When the strengthening layer 14 is constructed from the plurality of members 14a as described, the amount of solder portion 42 (solder cream) can be reduced. Thus, voids due to inward entrapping of solder cream during solder-mounting can be released to the outside for improved solder mountability. Other constituent elements of this variation are substantially the same as those in the embodiment of FIGS. 139 to 146.

(Variation 5-17)

FIGS. 175 to 177 show a semiconductor device 520R according to a seventeenth variation of the fifth embodiment. FIG. 175 is a partly enlarged cross-sectional view of the semiconductor device 520R (this cross-sectional view corresponds to FIG. 143), and FIGS. 176 and 177 are partly enlarged cross-sectional views representing the methods for manufacturing the same (these cross-sectional views correspond to FIGS. 144 and 145, respectively).

The semiconductor device 520R (variation 5-17) shown in FIGS. 175 to 177 includes an internal terminal 97 of which inner end extends inward towards a semiconductor element 21, and length of the radial direction of the internal terminal 97 (horizontal length in FIG. 175) is greater than that of an external terminal 98.

FIGS. 176 and 177 represent a method of manufacturing the semiconductor device 520R shown in FIG. 175. In this variation, at the step where a copper-plated layer 82, a copper-plated layer 84, and a copper foil 81, each formed on a non-electroconductive substrate 91, are pattern-etched (the step corresponding to FIG. 176(e)), an opening 86, that is to be formed at an upper-surface by etching) is extended more internally to the device relative to an opening 87 formed at a lower-surface. Thus the length of the internal terminal 97 in radial direction is made greater than that of the external terminal 98.

Since the internal terminal 97 extends to the vicinity of the semiconductor element 21, length of bonding wires 22 formed from gold or other materials can be reduced, which in turn reduces costs. Other constituent elements of this variation are substantially the same as those in the embodiment of FIGS. 139 to 146.

(Variation 5-18)

FIGS. 178 and 179 show a semiconductor device 520S according to an eighteenth variation of the fifth embodiment. FIG. 178 is a plan view of the semiconductor device 520S (this plan view corresponds to FIG. 141), and FIG. 179 is a cross-sectional view thereof (this cross-sectional view corresponds to FIG. 146).

The semiconductor device 520S (variation 5-18) shown in FIGS. 178 and 179 includes internal terminals 97 arranged more internally to the device in a radial direction compared to external terminals 98. As shown in FIG. 178, the internal terminals 97 are arranged on a circumference $C_4$ with a smaller diameter than that of a circumference $C_1$ on which the external terminals 98 are arranged.

Since the internal terminals 97 are arranged closer to a semiconductor element 21 in this form, length of bonding wires 22 formed from gold or other materials can be reduced, which in turn reduces costs. Other constituent elements of this variation are substantially the same as those in the embodiment of FIGS. 139 to 146.

(Variation 5-19)

FIGS. 180 and 181 show a semiconductor device 520T according to a nineteenth variation of the fifth embodiment. FIG. 180 is a plan view of the semiconductor device 520T (this plan view corresponds to FIG. 141), and FIG. 181 is a bottom view thereof (this bottom view corresponds to FIG. 142).

The semiconductor device 520T (variation 5-19) shown in FIGS. 180 and 181 differs from variation 5-1 shown in FIGS. 147 and 148, in that external terminals 71 (additional external terminals) are extended inward in a radial direction from four corners of a sealing resin section 23 to a circumference $C_1$ on which internal terminals 97 and the external terminals 98 are arranged.

Since the external terminals 71 (additional external terminals) extend to the vicinity of the internal terminals 97 and the external terminals 98, mounting stresses applied upon the internal terminals 97 and external terminals 98 can be further mitigated. Other constituent elements of this variation are substantially the same as those of variation 5-1 shown in FIGS. 147 and 148.

(Variation 5-20)

FIG. 182 shows a semiconductor device 520U according to a twentieth variation of the fifth embodiment. FIG. 182 is a plan view of the semiconductor device 520U (this plan view corresponds to FIG. 141).

The semiconductor device 520U (variation 5-20) shown in FIG. 182 differs from variation 5-14 shown in FIG. 172, in that the semiconductor device 520U has a terminal 21b (grounding terminals: GND) of the semiconductor element 21 electrically connected to a semiconductor element-mounting section 95 by bonding wires 22.

In this variation, the terminals 21b (grounding terminals: GND) of the semiconductor element 21 and the mounting substrate are electrically interconnected through the semiconductor element-mounting section 95 and a strengthening layer 14. Other constituent elements of this variation are substantially the same as those of variation 5-14 shown in FIG. 172.

(Variation 5-21)

FIG. 183 shows a semiconductor device 520V according to a twenty-first variation of the fifth embodiment. FIG. 183 is a cross-sectional view of the semiconductor device 520V (this cross-sectional view corresponds to FIG. 140).

The semiconductor device 520V (variation 5-21) shown in FIG. 183 differs from variation 5-3 shown in FIGS. 151 to 153, in that the internal terminals 97 are provided more internally toward the device in a radial direction than corresponding external terminals 98. The internal terminals 97 are arranged on circumferences with a diameter smaller than that of circumferences $C_1$ and $C_2$ on which the corresponding external terminals 98 are arranged.

Since the internal terminals 97 are arranged closer to a semiconductor element 21, length of bonding wires 22 formed from gold or other materials can be reduced, which in turn reduces costs. Other constituent elements of this variation are substantially the same as those of variation 5-3 shown in FIGS. 151 to 153.

(Variation 5-22)

FIGS. 184 and 185 show a semiconductor device 520W according to a twenty-second variation of the fifth embodiment. FIG. 184 is a plan view of the semiconductor device 520W (this plan view corresponds to FIG. 141), and FIG. 185 is a bottom view thereof (this bottom view corresponds to FIG. 142).

The semiconductor device 520W (variation 5-22) shown in FIGS. 184 and 185 differ from variation 5-4 shown in FIGS. 154 and 155, in that external terminals 71 (additional external terminals) are extended inward in a radial direction from four corners of a sealing resin section 23 to a circumference $C_2$, which is the most inner circumference on which internal terminals 97 and the external terminals 98 are arranged.

Since the external terminals 71 (additional external terminals) extend to the vicinity of the internal terminals 97 and the external terminals 98, mounting stresses upon the internal terminals 97 and external terminals 98 can be further mitigated. Other constituent elements of this variation are substantially the same as those of variation 5-4 shown in FIGS. 154 and 155.

(Variation 5-23)

FIGS. 186 and 187 show a semiconductor device 520X according to a twenty-third variation of the fifth embodiment. FIG. 186 is a plan view of the semiconductor device 520X (this plan view corresponds to FIG. 141), and FIG. 187 is a bottom view thereof (this bottom view corresponds to FIG. 142).

The semiconductor device 520X (variation 5-23) shown in FIGS. 186 and 187 differs from variation 5-7 shown in FIGS. 161 and 162, in that external terminals 71 (additional external terminals) are extended inward in a radial direction from four corners of a sealing resin section 23 to a circumference $C_3$, which is the most inner circumference on which internal terminals 97 and the external terminals 98 are arranged.

Since the external terminals 71 (additional external terminals) extend to the vicinity of the internal terminals 97 and the external terminals 98, mounting stresses applied upon the internal terminals 97 and external terminals 98 can be further mitigated. Other constituent elements of this variation are substantially the same as those of variation 5-7 shown in FIGS. 161 and 162.

(Variation 5-24)

FIG. 188 shows a semiconductor device 520Y according to a twenty-fourth variation of the fifth embodiment. FIG. 188 is a cross-sectional view of the semiconductor device 520Y (this cross-sectional view corresponds to FIG. 140).

The semiconductor device 520Y (variation 5-24) shown in FIG. 188 differs from variation 5-10 shown in FIGS. 167 and 168(a), in that internal terminals 97 are provided more internally in a radial direction (closer to a semiconductor element 21) compared to external terminals 98. In this variation, the internal terminals 97 are arranged on a circumference with a smaller diameter than that of a circumference $C_1$ on which the external terminals 98 are arranged.

Since the internal terminals 97 are disposed closer to the semiconductor element 21, length of bonding wires 22 formed from gold or other materials can be reduced, which in turn reduces costs. Other constituent elements of this variation are substantially the same as those of variation 5-10 shown in FIGS. 167 and 168(a).

(Variation 5-25)

FIG. 189 shows a semiconductor device 520Z according to a twenty-fifth variation of the fifth embodiment. FIG. 189 is a cross-sectional view of the semiconductor device 520Z (this cross-sectional view corresponds to FIG. 140).

The semiconductor device 520Z (variation 5-25) shown in FIG. 189 differ from variation 5-11 shown in FIG. 169, in that internal terminals 97 are provided more internally in a radial direction (closer to a semiconductor element 21) compared to corresponding external terminals 98. In this variation, the internal terminals 97 are arranged on circumferences with diameter smaller than those of circumferences $C_1$ or $C_2$ on which the corresponding external terminals 98 are arranged.

Since the internal terminals 97 are disposed closer to the semiconductor element 21, length of bonding wires 22 formed from gold or other materials can be reduced, which in turn reduces costs. Other constituent elements of this variation are substantially the same as those of variation 5-11 shown in FIG. 169.

(Variation 5-26)

FIG. 190 shows a semiconductor device 520a according to a twenty-sixth variation of the fifth embodiment. FIG. 190 is a partly enlarged cross-sectional view of the semiconductor device 520*a* (this cross-sectional view corresponds to FIG. 143).

The semiconductor device 520*a* (variation 5-26) shown in FIG. 190 differs from variation 5-13 shown in FIG. 171, in that each internal terminal 97 has its inner end extended inward in a radial direction. Thus, length of the internal terminal 97 in a radial direction (horizontal direction in FIG. 190) is greater than that of an external terminal 98.

Since the internal terminal 97 is extended to the vicinity of a semiconductor element 21, length of bonding wires 22 formed from gold or other materials can be reduced, which in turn reduces costs. Other constituent elements of this variation are substantially the same as those of variation 5-13 shown in FIG. 171.

(Variation 5-27)

FIGS. 191 and 192 show a semiconductor device 520*b* according to a twenty-seventh variation of the fifth embodiment. FIG. 191 is a plan view of the semiconductor device 520*b* (this plan view corresponds to FIG. 141), and FIG. 192 is a cross-sectional view thereof (this cross-sectional view corresponds to FIG. 142).

The semiconductor device 520*b* (variation 5-27) shown in FIGS. 191 and 192 includes an externally protruding terminal 65 formed on at least one of an upper surface of a plurality of internal terminals 97. The externally protruding terminal 65 is formed at an opening 23*a* in a sealing resin section 23 and is exposed to the exterior. The terminal 65 enables an upper surface of the semiconductor device 520*b* to be used for connection. The externally protruding terminal 65 may be of solder, silver (Ag) paste, or any other appropriate, general connecting material.

Since the externally protruding terminal 65 is formed on at least one of the upper surface of the internal terminals 97, the externally protruding terminal 65 of a lower semiconductor device 520*b* can be connected to the external terminal 98 of an upper semiconductor device 520*b*. Thus, a plurality of semiconductor devices 520*b* can be stacked vertically upon each other, as shown in FIG. 192.

The constituent elements disclosed in the above embodiment and variations may be appropriately combined as required. Alternatively, several of all the constituent elements described in the above embodiment or variations may be deleted.

What is claimed is:

1. A semiconductor device comprising:
   a lead frame including a die pad and a plurality of leads each disposed around the die pad;
   a semiconductor element rested on the die pad of the lead frame;
   electroconductive portions for electrically interconnecting the lead of the lead frame and the semiconductor element; and
   a sealing resin section for sealing the lead frame, the semiconductor element, and electroconductive portions;
   wherein the sealing resin section includes a central region provided over and around the semiconductor device, and a marginal region provided in the periphery of the central region; and
   thickness of the central region is greater than that of the marginal region, wherein:
   each of the leads includes an external terminal exposed to the exterior, the external terminal is configured to be connected to an outside member of the semiconductor device;
   the external terminals of the leads are disposed on at least two round lines including an inner round line and an outer round line, the external terminals are arranged in a staggered layout; and
   the external terminals arranged on the inner round line have a smaller size than the external terminals arranged on the outer round line.

2. The semiconductor device according to claim 1, wherein:
   each of the leads has a band-like shape radially extending outward from the die pad side.

3. The semiconductor device according to claim 2, wherein:
   each of the leads includes two external terminals, one external lead as an upper terminal provided at an upper surface of the lead, and the other external lead as a lower terminal provided at a lower surface of the lead.

4. The semiconductor device according to claim 3, wherein:
   each lead has a stepped portion between an internal terminal of the lead and the lower terminal of the lead.

5. The semiconductor device according to claim 3, wherein:
   a solder ball is provided on at least one upper terminal of the leads.

6. The semiconductor device according to claim 3, wherein:
   a heatsink fin is mounted on at least one upper terminal of the leads.

7. The semiconductor device according to claim 3, wherein:
   an electronic component is mounted on at least one upper terminal of the leads.

8. The semiconductor device according to claim 1, wherein:
   each lead is exposed at an upper surface of the marginal region of the sealing resin section.

9. The semiconductor device according to claim 1, wherein:
   the central region of the sealing resin section has a truncated conical shape, a columnar shape, a polygonal columnar shape, a truncated polygonal pyramidal shape, or a dome-like shape.

10. The semiconductor device according to claim 1, wherein:
    the die pad is circular in a top view.

11. The semiconductor device according to claim 1, wherein:
    the die pad is circular in a bottom view.

12. The semiconductor device according to claim 10, wherein:
    upper and lower surfaces of the die pad have different shapes.

13. The semiconductor device according to claim 1, wherein:
    hanging leads each including an external terminal are connected to the die pad.

14. The semiconductor device according to claim 13, wherein:
    upper and lower surfaces of the hanging lead each have a recessed portion which the sealing resin section flows into, and layouts of the recessed portions of the upper and lower surfaces of the hanging lead differ from each other in a plane view.

15. The semiconductor device according to claim 1, wherein:
a lower surface of the die pad is exposed to the exterior of the sealing resin section.

16. The semiconductor device according to claim 1, wherein:
a lower surface of the die pad is not exposed to the exterior of the sealing resin section.

17. The semiconductor device according to claim 1, wherein:
the level of an upper surface of the die pad is lower than the level of an upper surface of each lead.

18. The semiconductor device according to claim 1, wherein:
a flange is provided along a rim of an upper surface of the die pad.

19. A semiconductor device comprising:
a lead frame including a die pad and a plurality of leads each disposed around the die pad;
a semiconductor element rested on the die pad of the lead frame;
electroconductive portions for electrically interconnecting the lead of the lead frame and the semiconductor element; and
a sealing resin section for sealing the lead frame, the semiconductor element, and electroconductive portions; wherein:
each of the leads includes an external terminal exposed at a lower surface of the sealing resin section, the external terminal is configured to be connected to an outside member of the semiconductor device, each external terminal of the lead is disposed on at least two round lines including an inner round line and an outer round line, and the external terminals are arranged in a staggered layout;
the die pad and the leads protrude downward from the sealing resin section; and
the external terminals arranged on the inner round line have a smaller size than the external terminals arranged on the outer round line.

20. A semiconductor device comprising:
a lead frame including a die pad and a plurality of leads each disposed around the die pad;
a semiconductor element rested on the die pad of the lead frame;
electroconductive portions for electrically interconnecting the lead of the lead frame and the semiconductor element; and
a sealing resin section for sealing the lead frame, the semiconductor element, and electroconductive portions; wherein:
each of the leads includes external terminal exposed to the exterior of the sealing resin section, the external terminal is configured to be connected to an outside member of the semiconductor device
each external terminal of the lead is disposed on at least two round lines including an inner round line and an outer round line, the external terminals are arranged in a staggered layout; and
the external terminals arranged on the inner round line have a smaller size than the external terminals arranged on the outer round line.

21. A semiconductor device comprising:
a semiconductor element;
a plated portion for semiconductor element placement on which the semiconductor element is rested;
a plurality of plated portions for leads disposed around the plated portion for semiconductor element placement and on the same plane as the plated portion for semiconductor element placement, each of the plated portions for leads is configured to be connected to an outside member of the semiconductor device;
electroconductive portions for electrically interconnecting one of the plated portions for leads and the semiconductor element; and
a sealing resin section for sealing the plated portion for semiconductor element placement, the plated portions for leads, the semiconductor element, and the electroconductive portions; wherein:
the plated portions for leads are disposed on at least two round lines including an inner round line and an outer round line, the plated portions for leads are arranged in a staggered layout; and
the plated portions for leads arranged on the inner round line have a smaller size than the plated portions for leads arranged on the outer round line.

22. A semiconductor device comprising:
a non-electroconductive substrate;
a semiconductor element-mounting section provided at an upper-surface of the non-electroconductive substrate;
internal terminals disposed around the semiconductor element-mounting section;
external terminals provided at a lower-surface of the non-electroconductive substrate, each of the external terminals is configured to be connected to an outside member of the semiconductor device;
a semiconductor element rested on the semiconductor element-mounting section;
electroconductive portions for electrically interconnecting the internal terminal and the semiconductor element; and
a sealing resin section for sealing the semiconductor element-mounting section, the internal terminals, the semiconductor element, and the electroconductive portions; wherein:
the non-electroconductive substrate includes vias each extending through the non-electroconductive substrate;
a conductor is provided within or on a side face of each via of the non-electroconductive substrate for electrically interconnecting the internal terminal and the external terminal;
a strengthening layer is provided on a lower surface of the semiconductor element-mounting section;
the external terminals are disposed on at least two round lines including an inner round line and an outer round line, the external terminals are arranged in a staggered layout; and
the external terminals arranged on the inner round line have a smaller size than the external terminals arranged on the outer round line.

23. The semiconductor device according to claim 1, wherein:
the marginal region of the sealing resin section extends from the central region to an outer edge of the semiconductor device.

24. The semiconductor device according to claim 1, wherein at least one of the round lines forms a substantial circle.

25. The semiconductor device according to claim 19, wherein at least one of the round lines forms a substantial circle.

26. The semiconductor device according to claim 20, wherein at least one of the round lines forms a substantial circle.

27. The semiconductor device according to claim 21, wherein at least one of the round lines forms a substantial circle.

28. The semiconductor device according to claim 22, wherein at least one of the round lines forms a substantial circle.

29. The semiconductor device according to claim 1, wherein at least one of the round lines forms a circle.

30. The semiconductor device according to claim 19, wherein at least one of the round lines forms a circle.

31. The semiconductor device according to claim 20, wherein at least one of the round lines forms a circle.

32. The semiconductor device according to claim 21, wherein at least one of the round lines forms a circle.

33. The semiconductor device according to claim 22, wherein at least one of the round lines forms a circle.

34. The semiconductor device according to claim 1, wherein at least one of the round lines forms a semicircle.

35. The semiconductor device according to claim 19, wherein at least one of the round lines forms a semicircle.

36. The semiconductor device according to claim 20, wherein at least one of the round lines forms a semicircle.

37. The semiconductor device according to claim 21, wherein at least one of the round lines forms a semicircle.

38. The semiconductor device according to claim 22, wherein at least one of the round lines forms a semicircle.

* * * * *